US012046499B2

(12) United States Patent
Bussiere et al.

(10) Patent No.: US 12,046,499 B2
(45) Date of Patent: Jul. 23, 2024

(54) SUBSTRATE PROCESSING APPARATUS

(71) Applicant: Brooks Automation, Inc., Chelmsford, MA (US)

(72) Inventors: Christopher Bussiere, Groton, MA (US); Kevin M. Bourbeau, Pepperell, MA (US); Emilien Joseph Claude Auderbrand, Marlborough, MA (US); Joseph M. Hallisey, Pepperell, MA (US)

(73) Assignee: Brooks Automation US, LLC, Chelmsford, MA (US)

( * ) Notice: Subject to any disclaimer, the term of this patent is extended or adjusted under 35 U.S.C. 154(b) by 86 days.

(21) Appl. No.: 17/167,831

(22) Filed: Feb. 4, 2021

(65) Prior Publication Data
US 2021/0257241 A1 Aug. 19, 2021

Related U.S. Application Data

(60) Provisional application No. 62/970,565, filed on Feb. 5, 2020.

(51) Int. Cl.
*H01L 21/67* (2006.01)
*B65G 47/90* (2006.01)
*B65G 49/06* (2006.01)
*H01L 21/677* (2006.01)

(52) U.S. Cl.
CPC ........ *H01L 21/67742* (2013.01); *B65G 47/90* (2013.01); *B65G 49/061* (2013.01); *H01L 21/67766* (2013.01)

(58) Field of Classification Search
CPC .. B65G 47/90; B65G 49/061; H01L 21/67766
See application file for complete search history.

(56) References Cited

U.S. PATENT DOCUMENTS

| 6,084,373 A | 7/2000 | Goldenberg et al. |
| 6,779,962 B2 | 8/2004 | Poole |
| 2001/0036398 A1 | 11/2001 | Hofmeister |
| 2006/0182533 A1 | 8/2006 | Ogi |

(Continued)

FOREIGN PATENT DOCUMENTS

CN 204725494 * 10/2015

*Primary Examiner* — Ronald P Jarrett
(74) *Attorney, Agent, or Firm* — Perman & Green, LLP

(57) ABSTRACT

A substrate transport apparatus comprising a support frame an articulated arm connected to the support frame, having at least one movable arm link and an end effector connected to the movable arm link, with a substrate holding station located thereon. Wherein the movable arm link is a reconfigurable arm link having a modular composite arm link casing, formed of link case modules rigidly coupled to each other, and a pulley system cased in and extending through the rigidly coupled link case modules substantially end to end of the modular composite arm link casing, wherein the rigidly coupled link case modules include link case end modules connected by at least one interchangeable link case extension module having a predetermined characteristic determining a length of the movable arm link, wherein at least one interchangeable link case extension module is selectable for connection to link case end modules forming the reconfigurable arm link.

35 Claims, 72 Drawing Sheets

(56) References Cited

U.S. PATENT DOCUMENTS

| | | |
|---|---|---|
| 2014/0151195 A1 | 6/2014 | Niewmierzycki |
| 2017/0100844 A1* | 4/2017 | Raak ................... B25J 9/08 |
| 2018/0029237 A1 | 2/2018 | Sugawara |
| 2018/0308728 A1 | 10/2018 | Krupyshev |
| 2019/0254908 A1* | 8/2019 | Ortlieb ............. A61H 1/0244 |
| 2020/0384634 A1* | 12/2020 | Muthukamatchy ................... H01L 21/02104 |

* cited by examiner

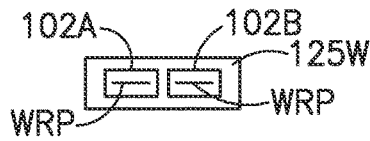
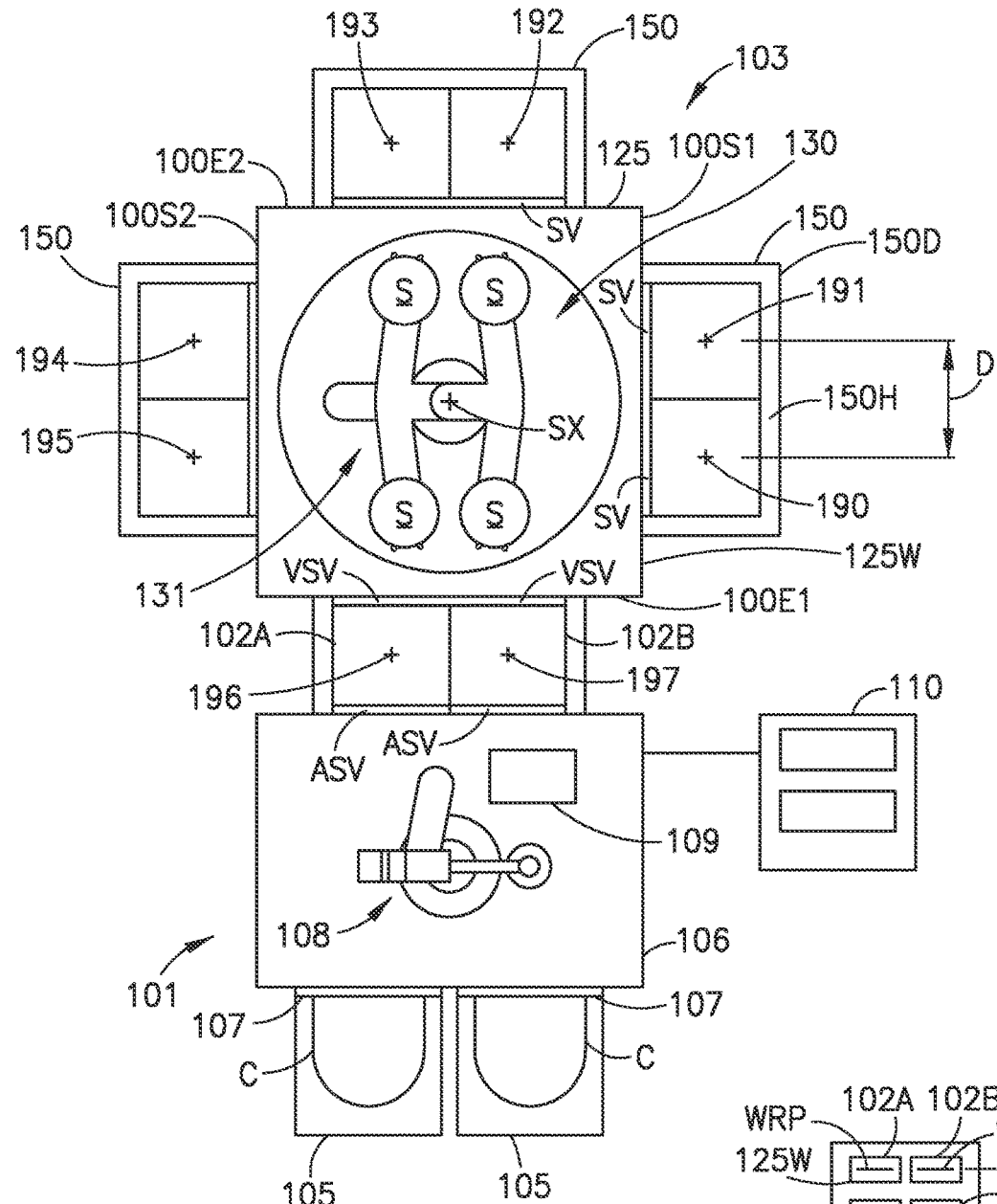
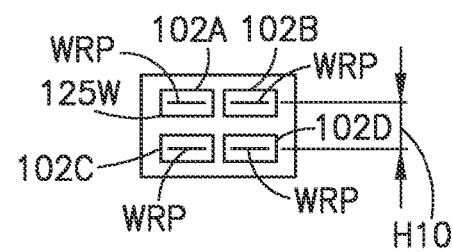

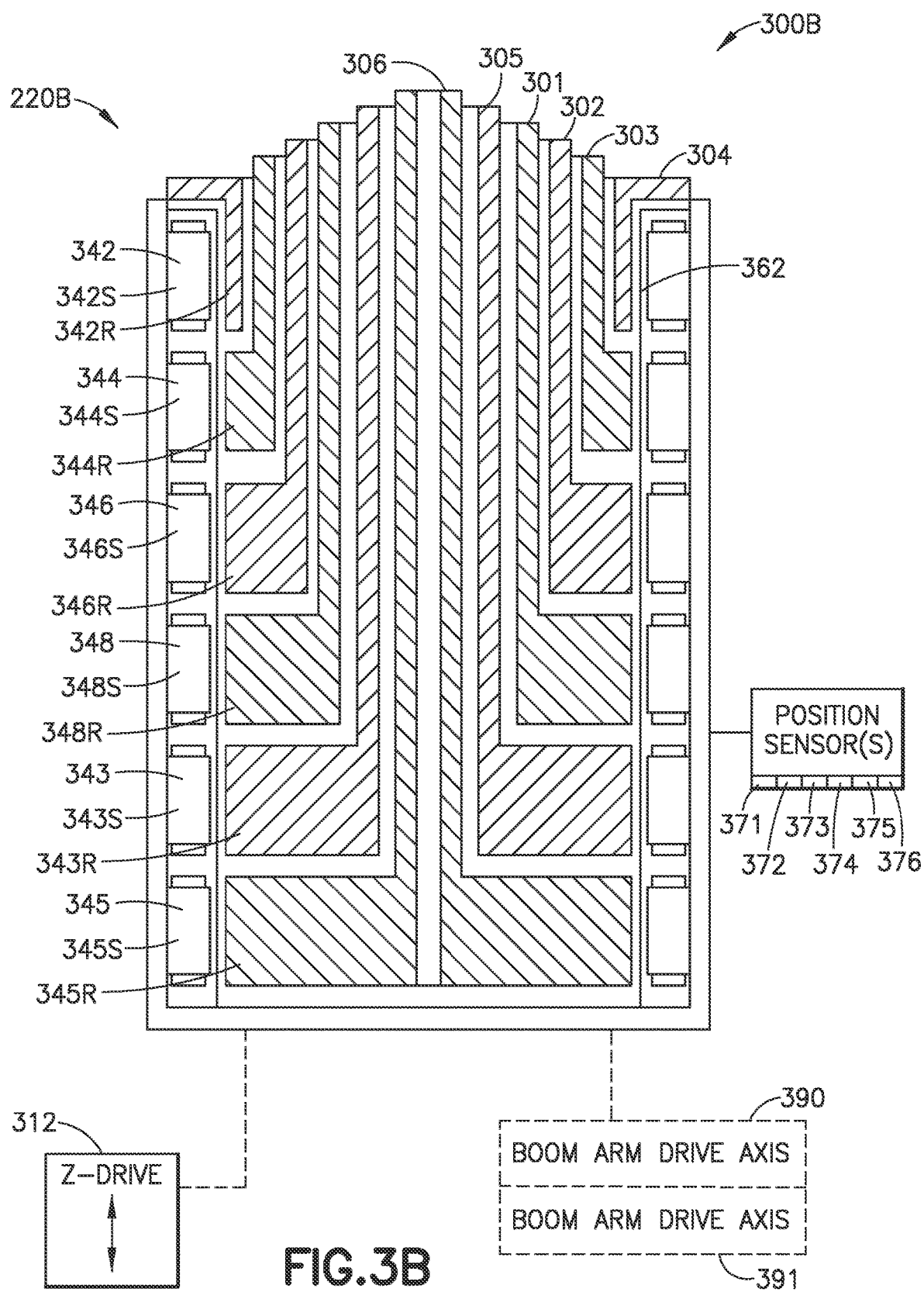

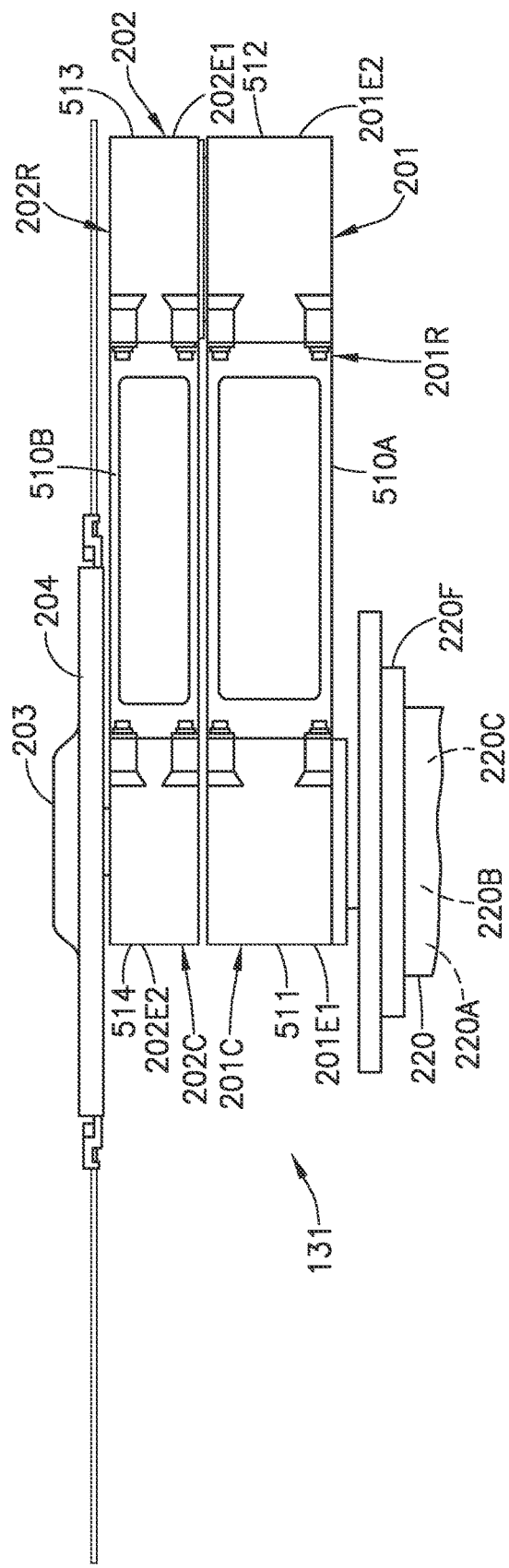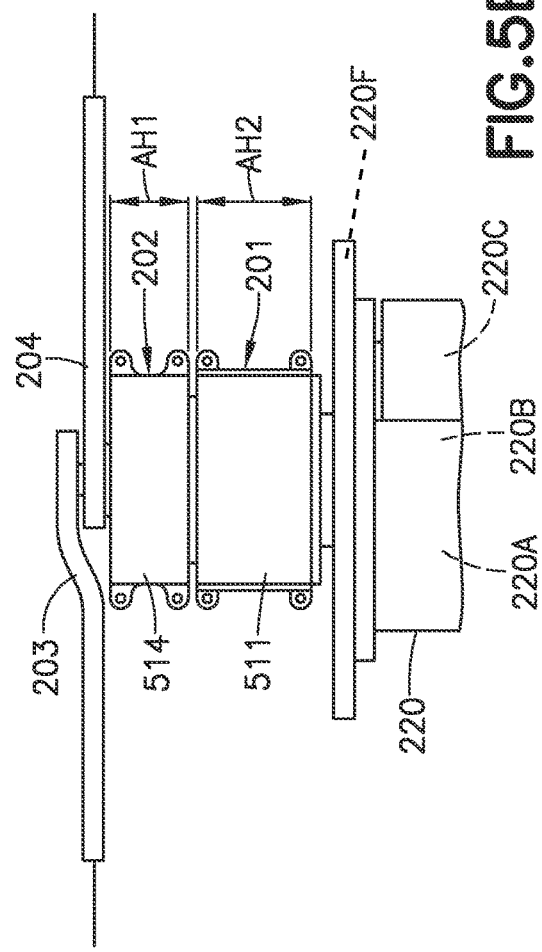

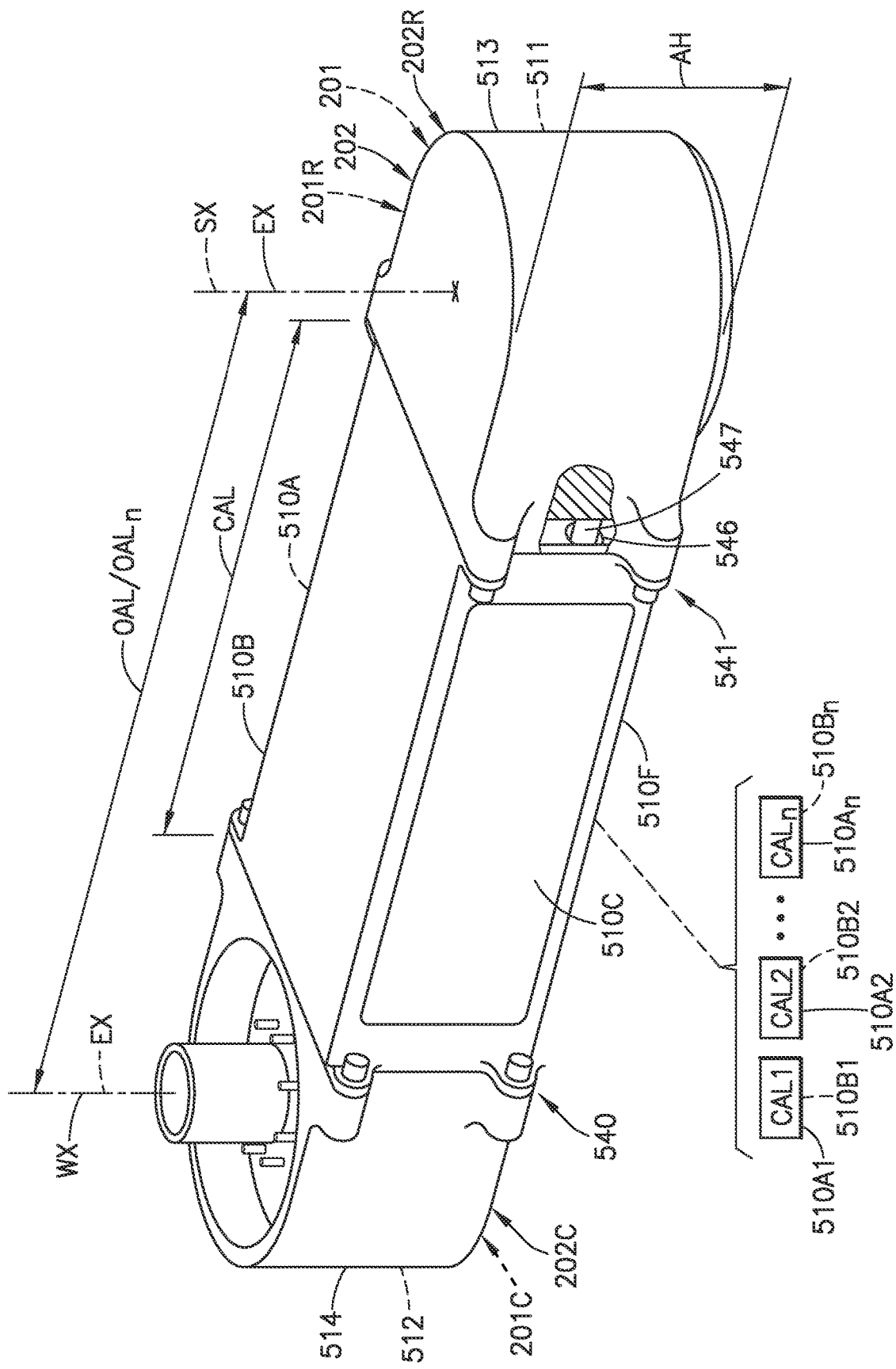

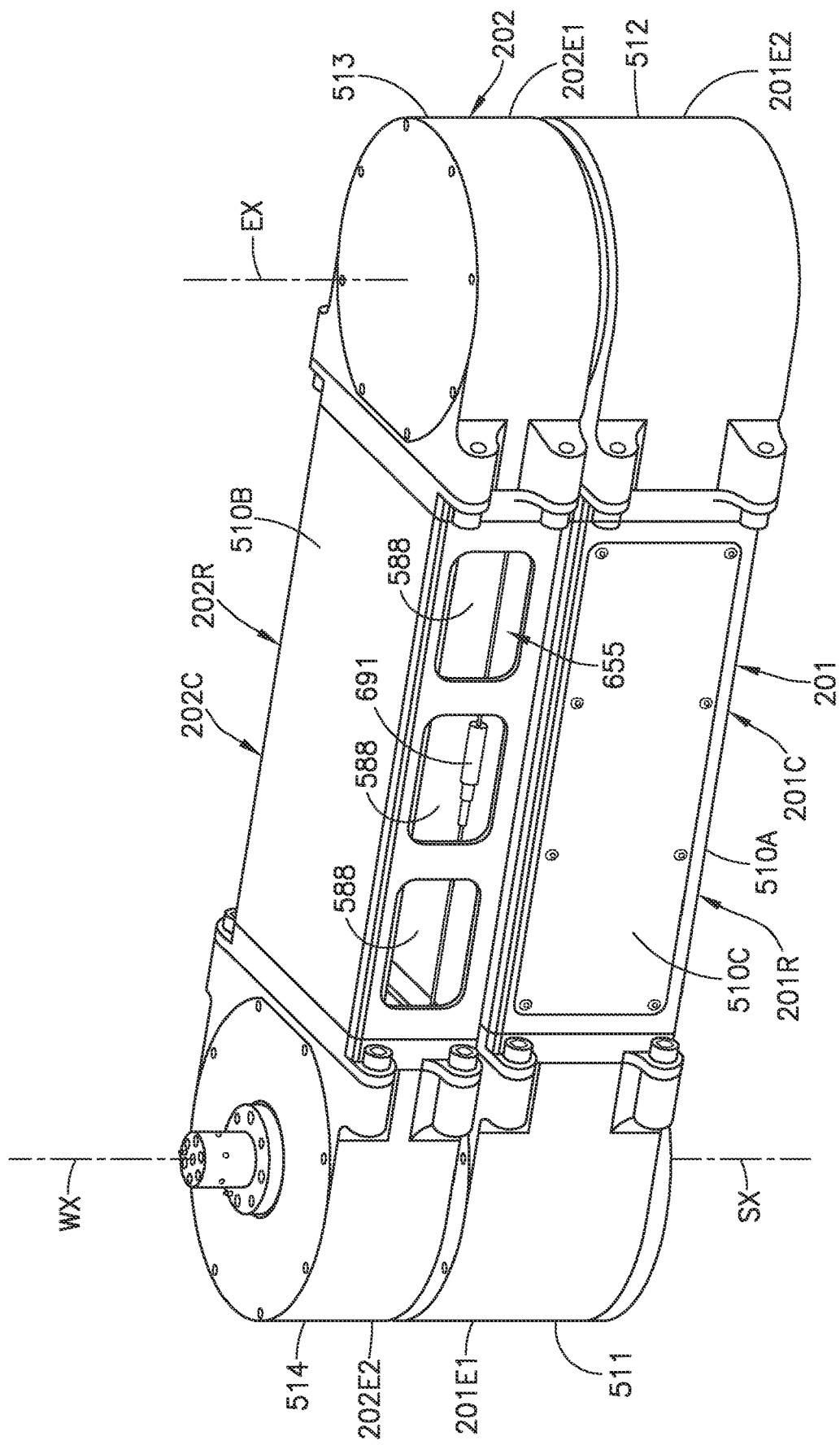

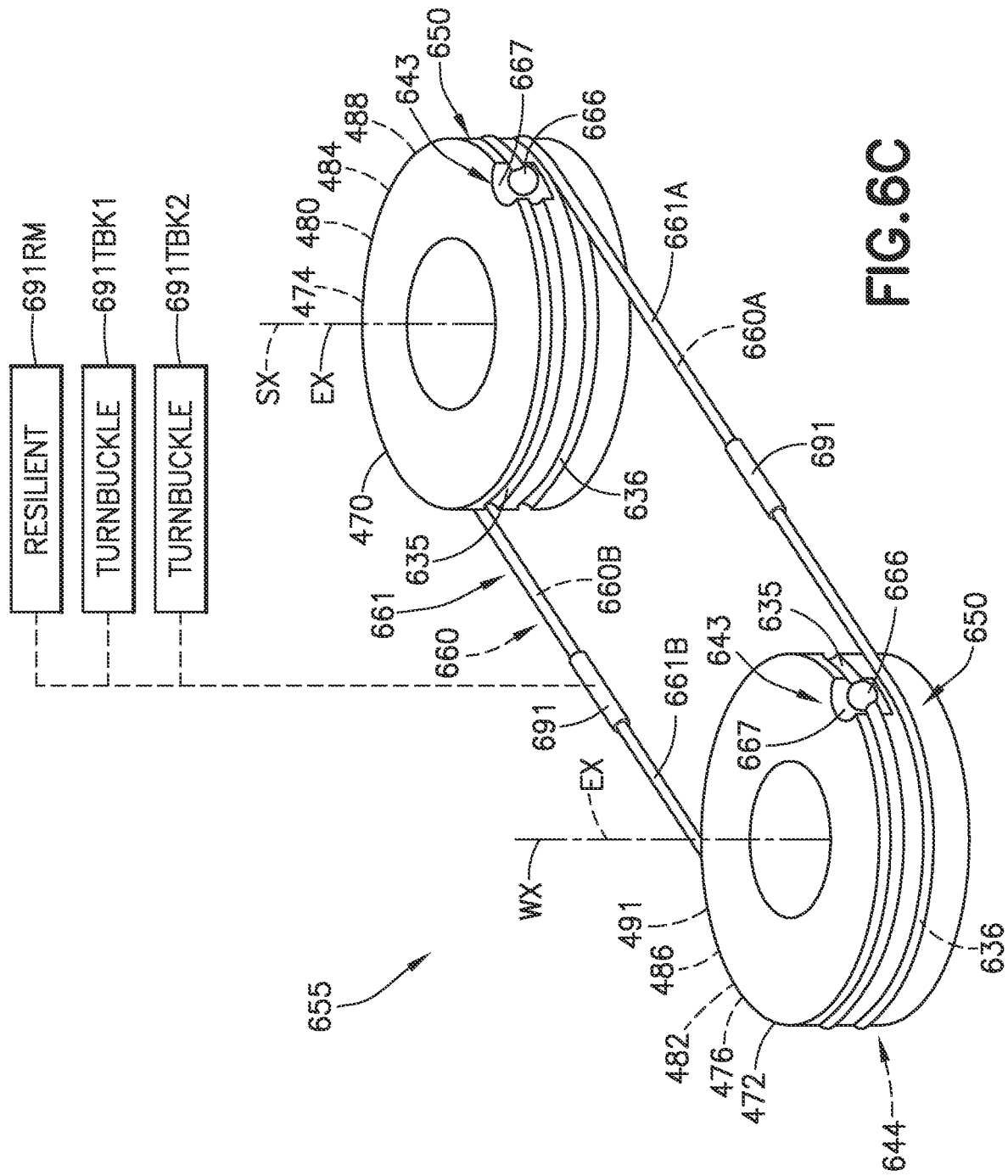

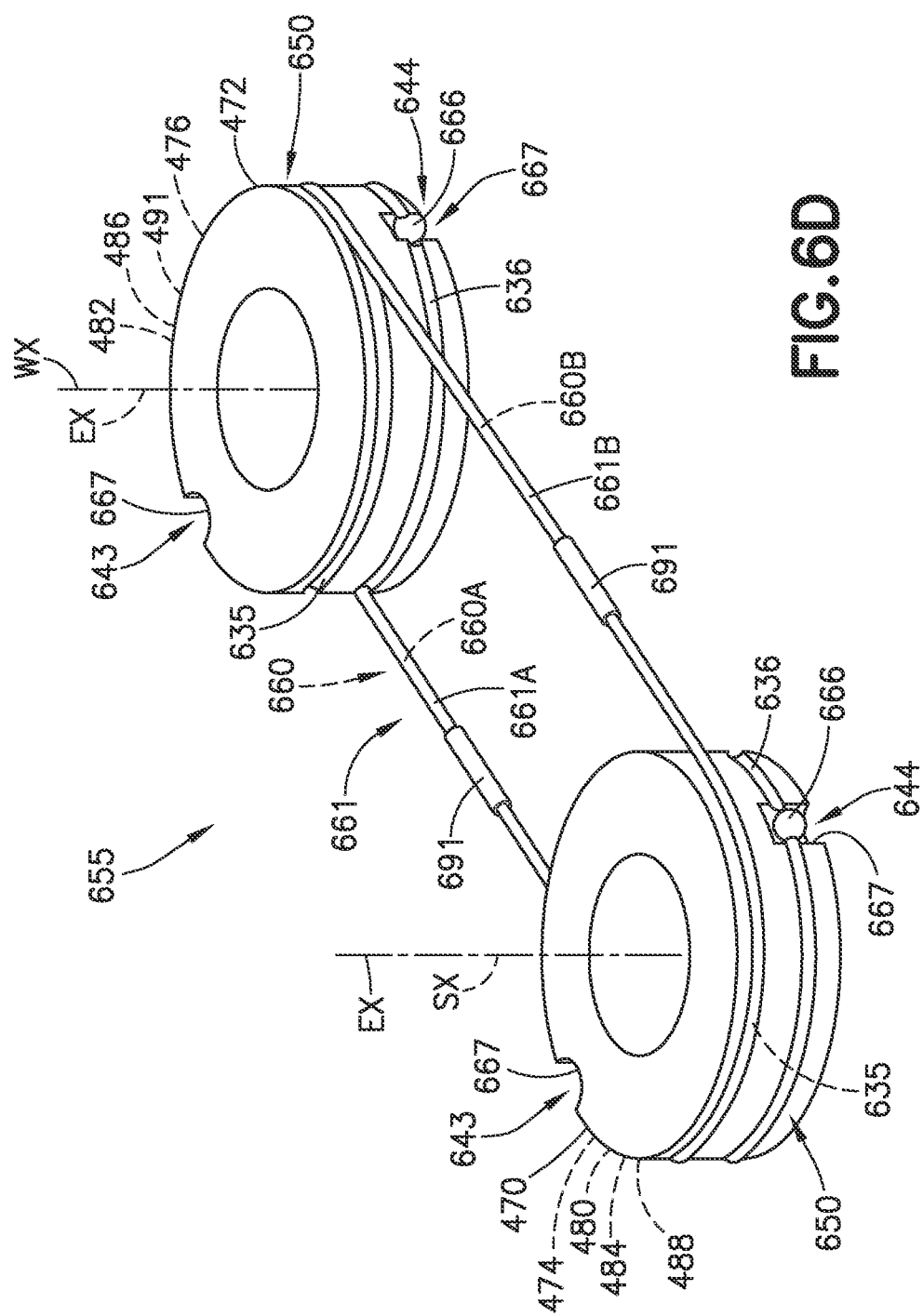

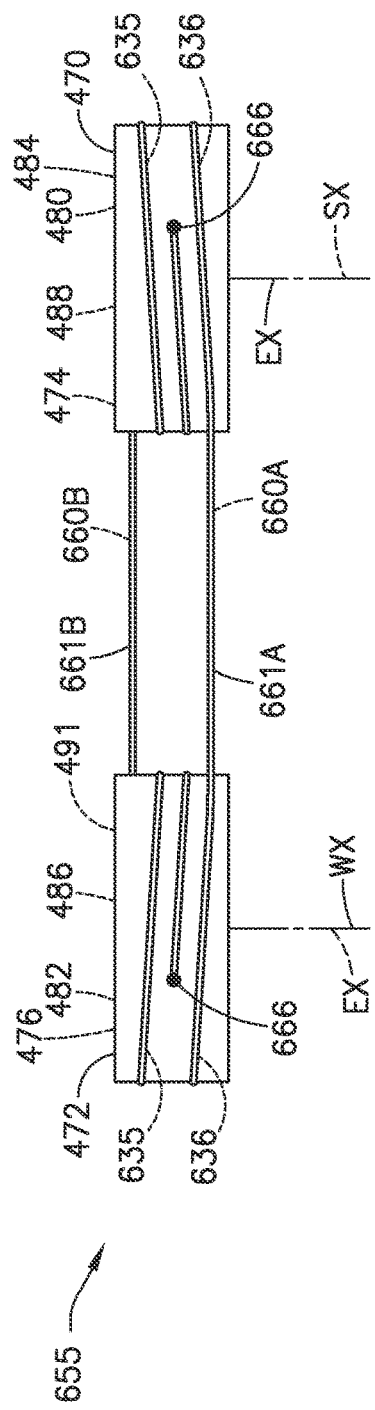
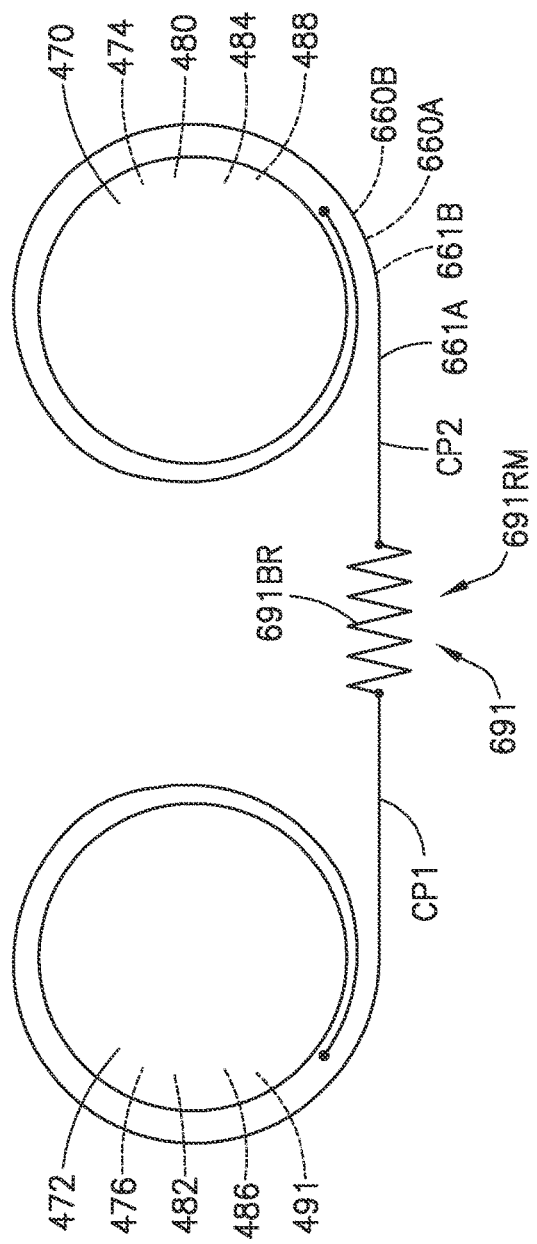

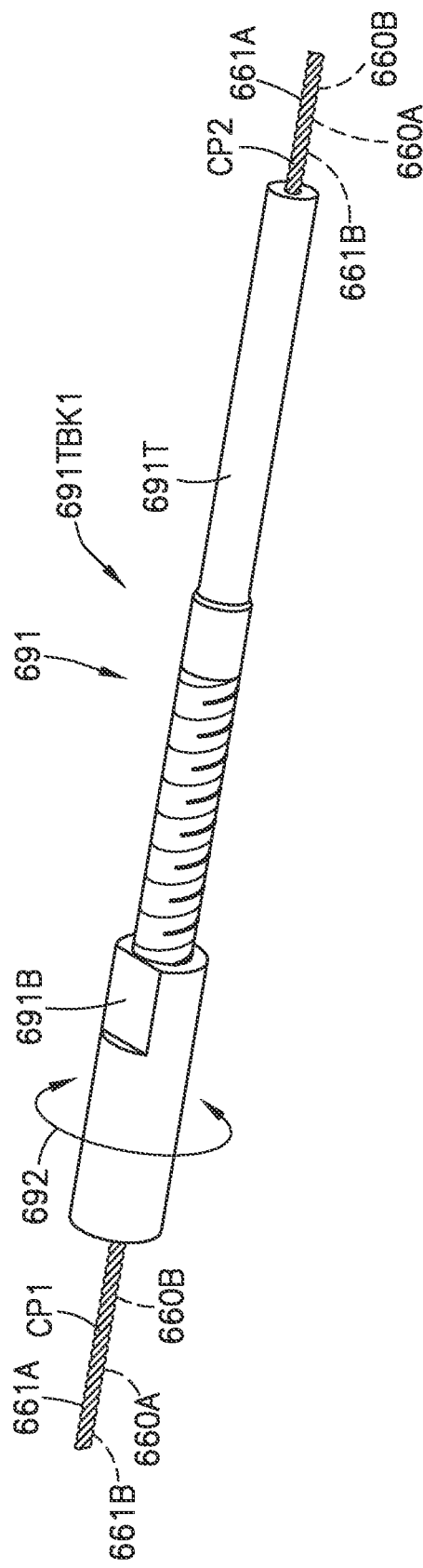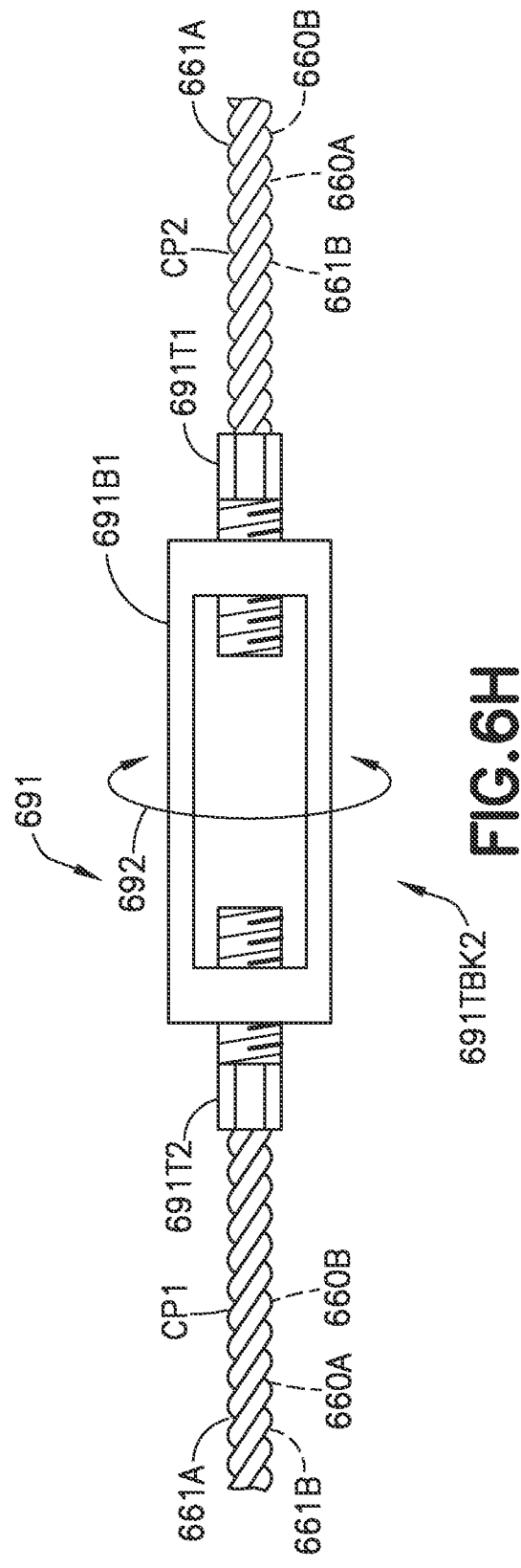
FIG. 6G
FIG. 6H

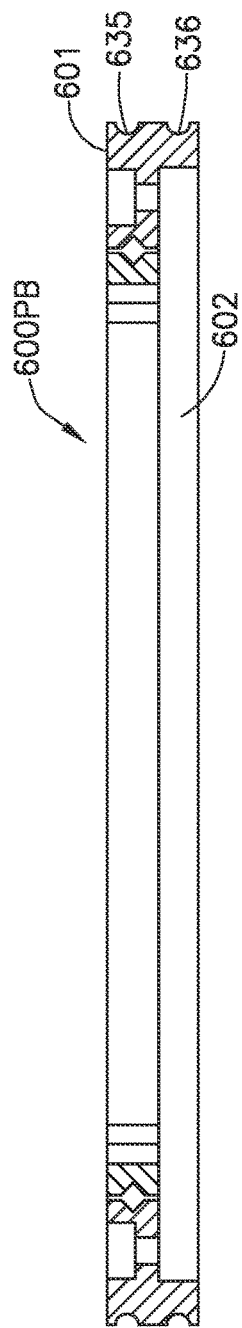
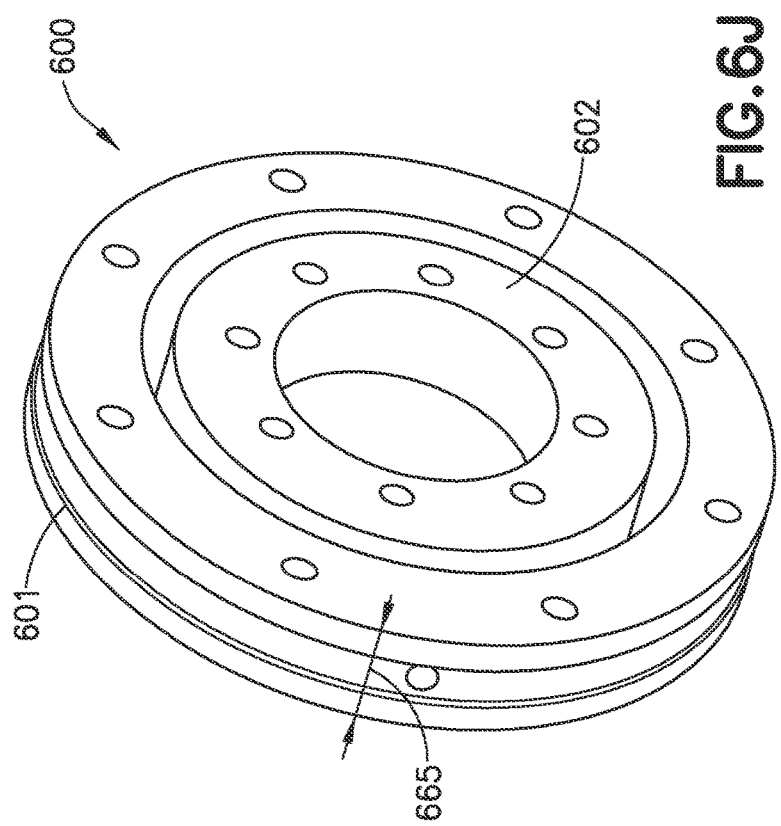

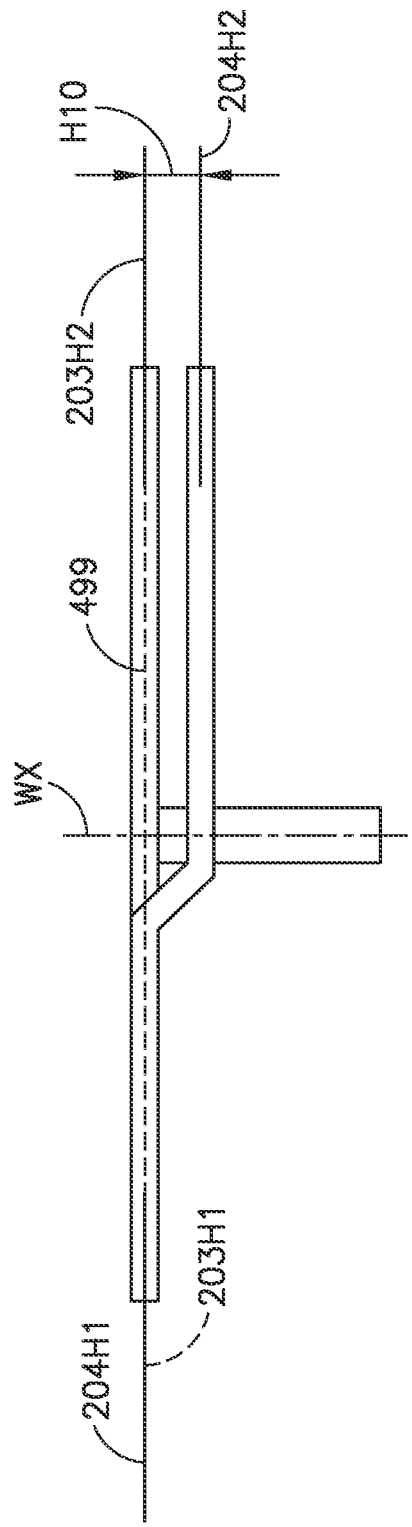
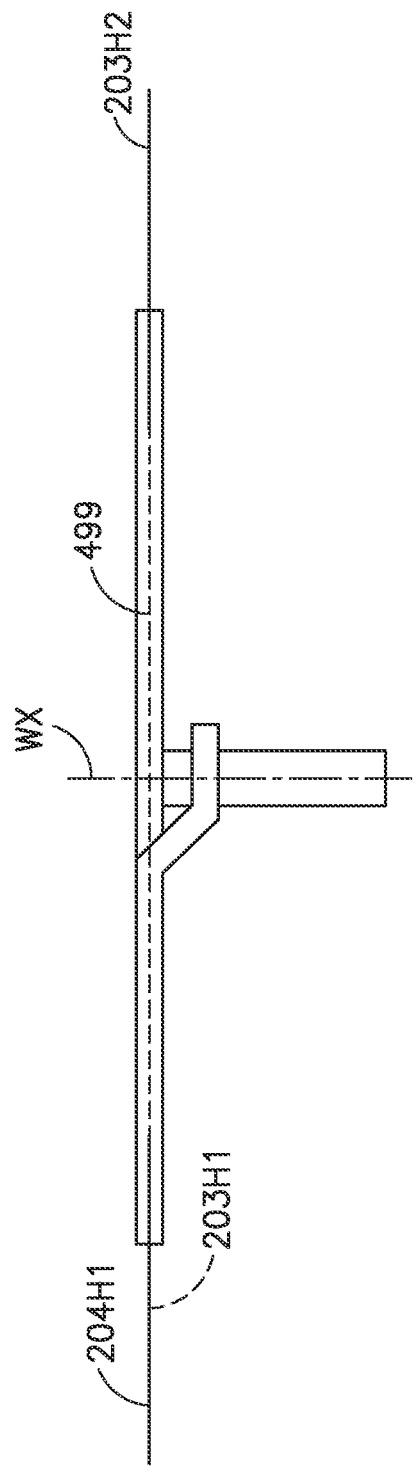

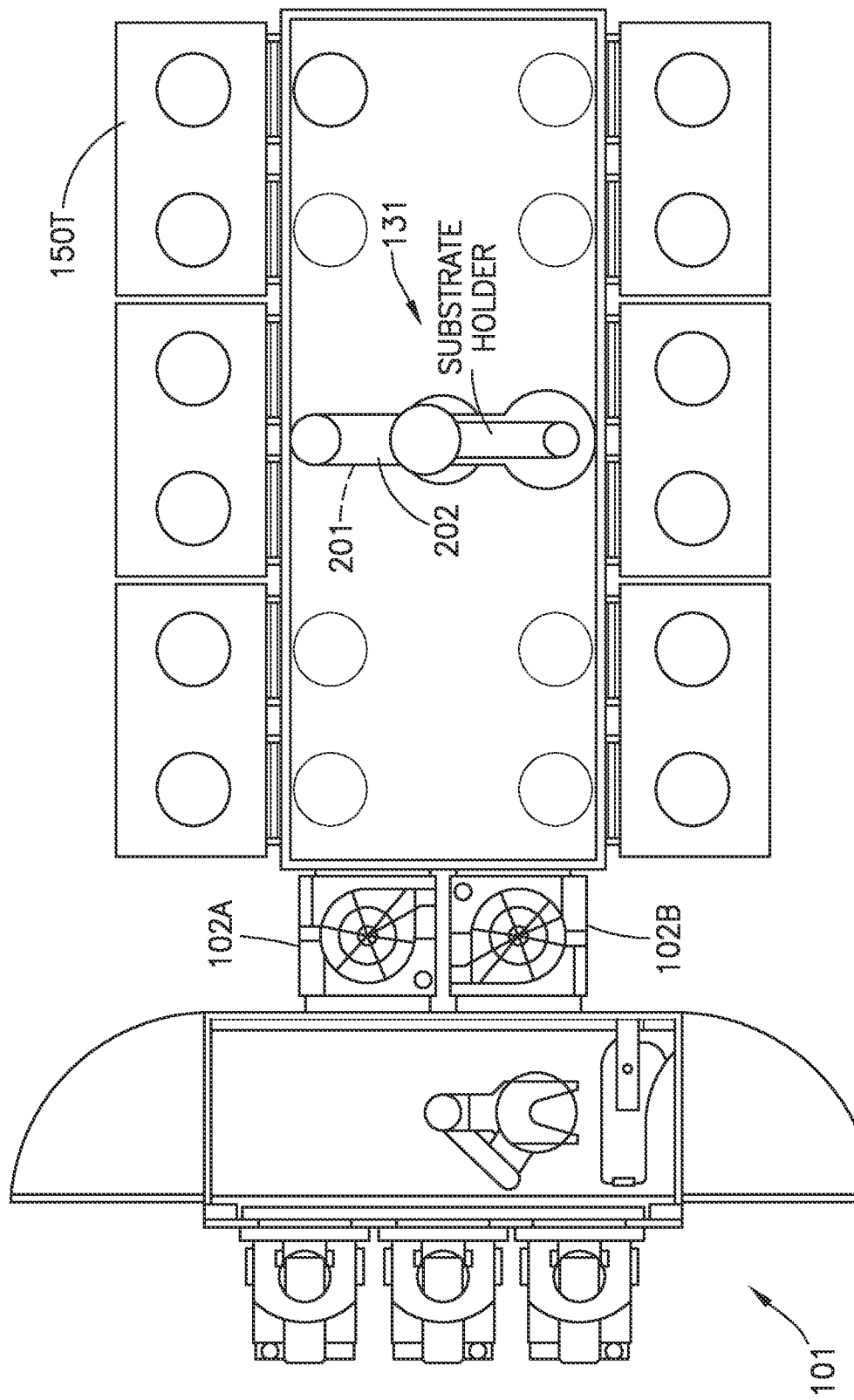

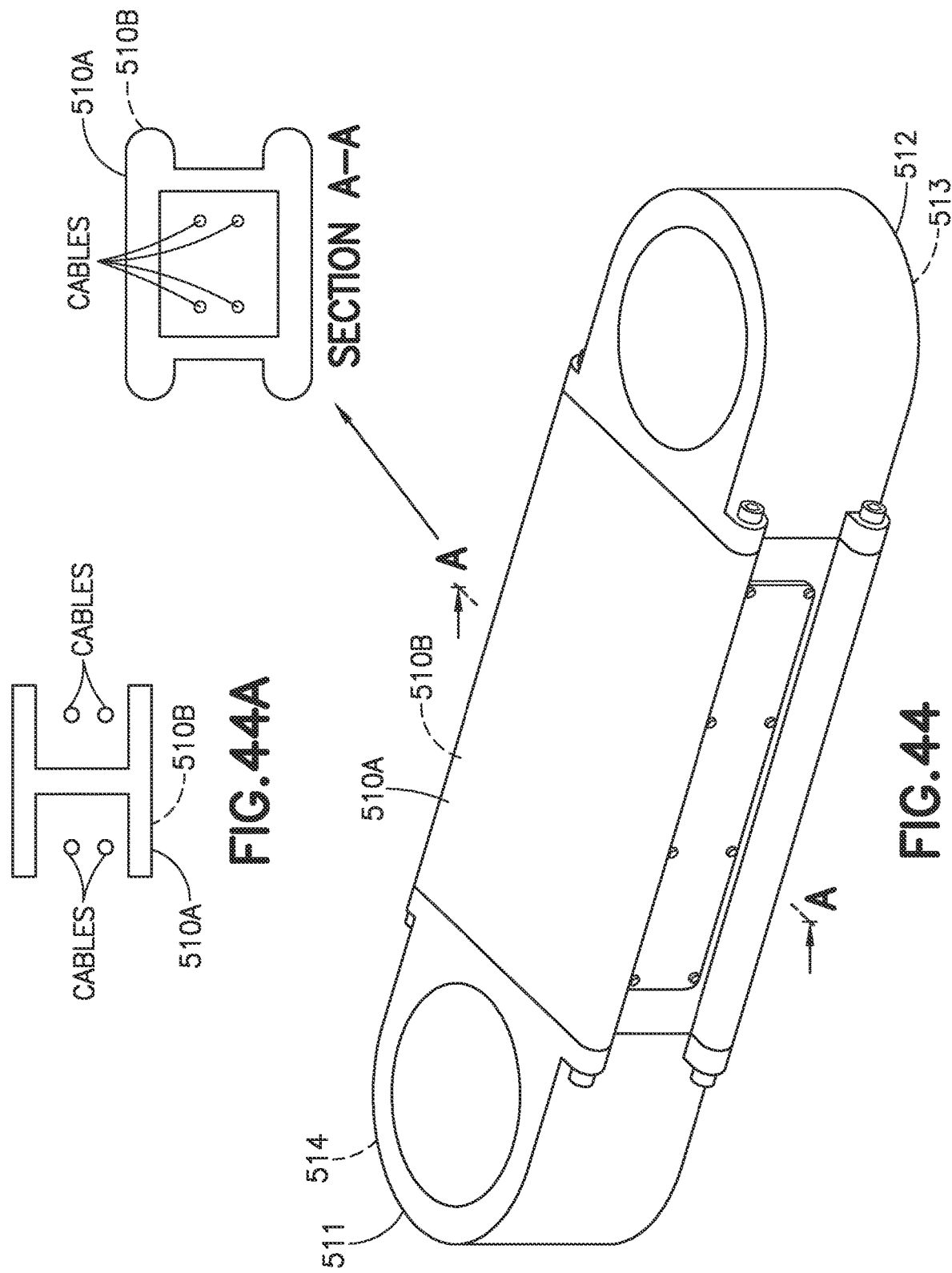

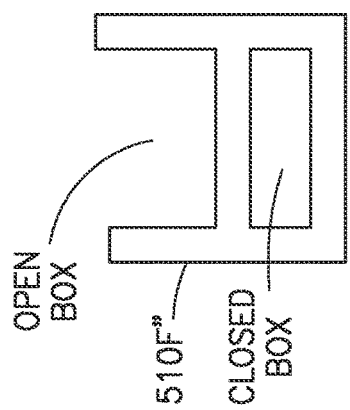
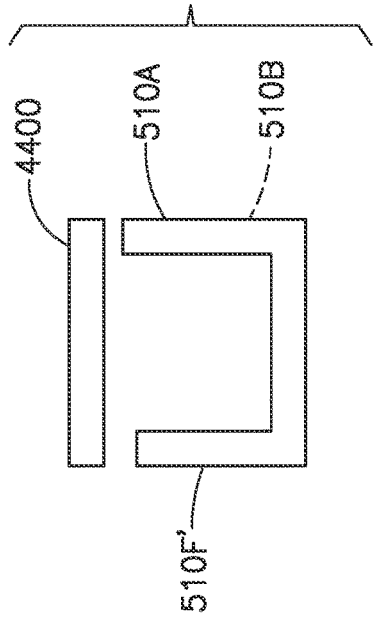
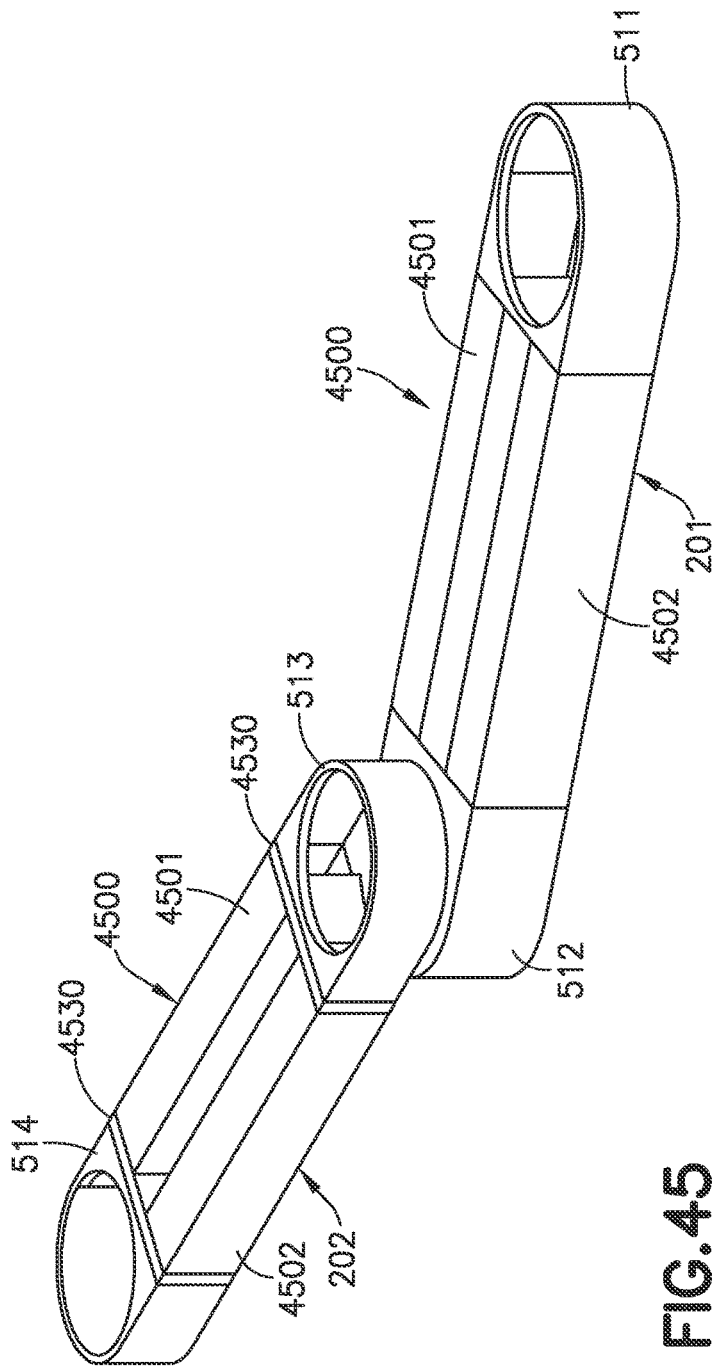

SUBSTRATE PROCESSING APPARATUS

CROSS REFERENCE TO RELATED APPLICATIONS

This application is a non-provisional of and claims the benefit of U.S. Provisional Patent Application No. 62/970,565, filed on Feb. 5, 2020, the disclosure of which is incorporated herein by reference in its entirety.

BACKGROUND

1. Field

The exemplary embodiments generally relate to substrate processing tools, and more particularly, to substrate transport apparatus.

2. Brief Description of Related Developments

Semiconductor fabrication facilities may utilize substrate processing systems that include twin process modules coupled to a common vacuum transport system. In some conventional systems semiconductor substrates (also referred to as substrates or wafers) are generally delivered to the twin process modules by transport apparatus that include side-by-side telescoping arms that can reach into side-by-side substrate holding stations of the twin process modules. In other conventional systems long reach "yaw" type transfer apparatus (e.g., having an arm comprised of arm links that allow for a non-radially aligned substrate holder extension) are used to transfer substrates one at a time to each of the substrate holding stations of the twin process modules.

Generally the above-noted yaw type transfer apparatus and other articulated link substrate transport apparatus (such as Selective Compliance Articulated Robot Arm (SCARA) type transports) that transfer substrates to and from substrate holding stations employ metal band and pulley transmissions to transmit motion to at least some of the arm links of the yaw type transfer apparatus. Size constraints of the metal band and pulley transmissions at least in part dictate, for example, a height and/or overall size of the arm links. Long arm link lengths may also lead to arm deflection from gravity loads that may affect band and pulley alignment.

The above-noted transfer apparatus generally employ duplex bearing pairs held to shafts with bearing clamps at the rotational joints between the arm links. Duplex bearings are a set of two bearings, configured for mounting to a shaft, with the inner and outer rings clamped together with preload to attain greater axial and radial rigidity. Like with the metal bands, the size constraints of the duplex bearing pairs at least in part dictate, for example, the height and/or overall size of the arm links. As may be realized, the size of the substrate transport arm may dictate, at least in part, a size of a transport chamber in which the transport arm operates where the size of the transport chamber may affect semiconductor throughput. The duplex bearings are generally installed by heating the duplex bearings and then letting the duplex bearing cool and shrink onto a shaft to produce a shrink fit between the duplex bearing and shaft. Operation of the duplex bearing in high temperature environments may affect the stiffness of the shrink fit between the duplex bearing and the shaft.

BRIEF DESCRIPTION OF THE DRAWINGS

The foregoing aspects and other features of the present disclosure are explained in the following description, taken in connection with the accompanying drawings, wherein:

FIG. 1A is a schematic illustration of an exemplary substrate processing apparatus incorporating aspects of the present disclosure;

FIGS. 1B and 1C are schematic illustrations of portions of the substrate processing apparatus of FIG. 1A in accordance with aspects of the present disclosure;

FIG. 3B is a schematic cross-sectional illustration of an exemplary drive section of a substrate transport apparatus in accordance with aspects of the present disclosure;

FIG. 5A is a schematic side illustration of a portion of the substrate transport apparatus of FIGS. 2A, 2B, 2C, and 2D in accordance with aspects of the present disclosure;

FIG. 5B is a schematic front illustration of a portion of the substrate transport apparatus of FIGS. 2A, 2B, 2C, and 2D in accordance with aspects of the present disclosure;

FIG. 5C is a schematic perspective illustration of a modular arm link of the substrate transport apparatus of FIGS. 2A, 2B, 2C, and 2D in accordance with aspects of the present disclosure;

FIG. 5F is a schematic perspective illustration of a portion of the substrate transport apparatus of FIGS. 2A, 2B, 2C, and 2D in accordance with aspects of the present disclosure;

FIG. 6A-6D are schematic illustrations of portions of the substrate transport apparatus of FIGS. 2A, 2B, 2C, and 2D in accordance with aspects of the present disclosure;

FIGS. 6E and 6F are schematic side and plan views of an exemplary cable or wire and pulley transmission of the substrate transport apparatus of FIGS. 2A, 2B, 2C, and 2D in accordance with aspects of the present disclosure;

FIGS. 6G and 6H are schematic illustrations of an inline cable or wire tensioner of the substrate transport apparatus of FIGS. 2A, 2B, 2C, and 2D in accordance with aspects of the present disclosure;

FIG. 6I is a schematic illustration of a crossed roller pulley of the substrate transport apparatus of FIGS. 2A, 2B, 2C, and 2D in accordance with aspects of the present disclosure;

FIG. 6J is a schematic illustration of a crossed roller bearing of the substrate transport apparatus of FIGS. 2A, 2B, 2C, and 2D in accordance with aspects of the present disclosure;

FIG. 10 is a schematic side illustration of exemplary substrate holders for transport apparatus as described herein and incorporated features of the present disclosure;

FIG. 11 is a schematic side illustration of exemplary substrate holders for transport apparatus as described herein and incorporated features of the present disclosure;

FIGS. 33A and 33B are schematic illustrations of a substrate transport apparatus in accordance with aspects of the present disclosure;

FIG. 44 is a schematic illustration of a portion of a substrate transport apparatus and a respective cross section of a central arm section in accordance aspects of the present disclosure;

FIG. 44A is a schematic cross-sectional illustration of a central arm section of a substrate transport apparatus in accordance with aspects of the present disclosure;

FIG. 44B is a schematic cross-sectional illustration of a central arm section of a substrate transport apparatus in accordance with aspects of the present disclosure;

FIG. 44C is a schematic cross-sectional illustration of a central arm section of a substrate transport apparatus in accordance with aspects of the present disclosure;

FIG. 45 is a schematic perspective illustration of a portion of a substrate transport apparatus in accordance with aspects of the present disclosure;

DETAILED DESCRIPTION

Figure 2A:
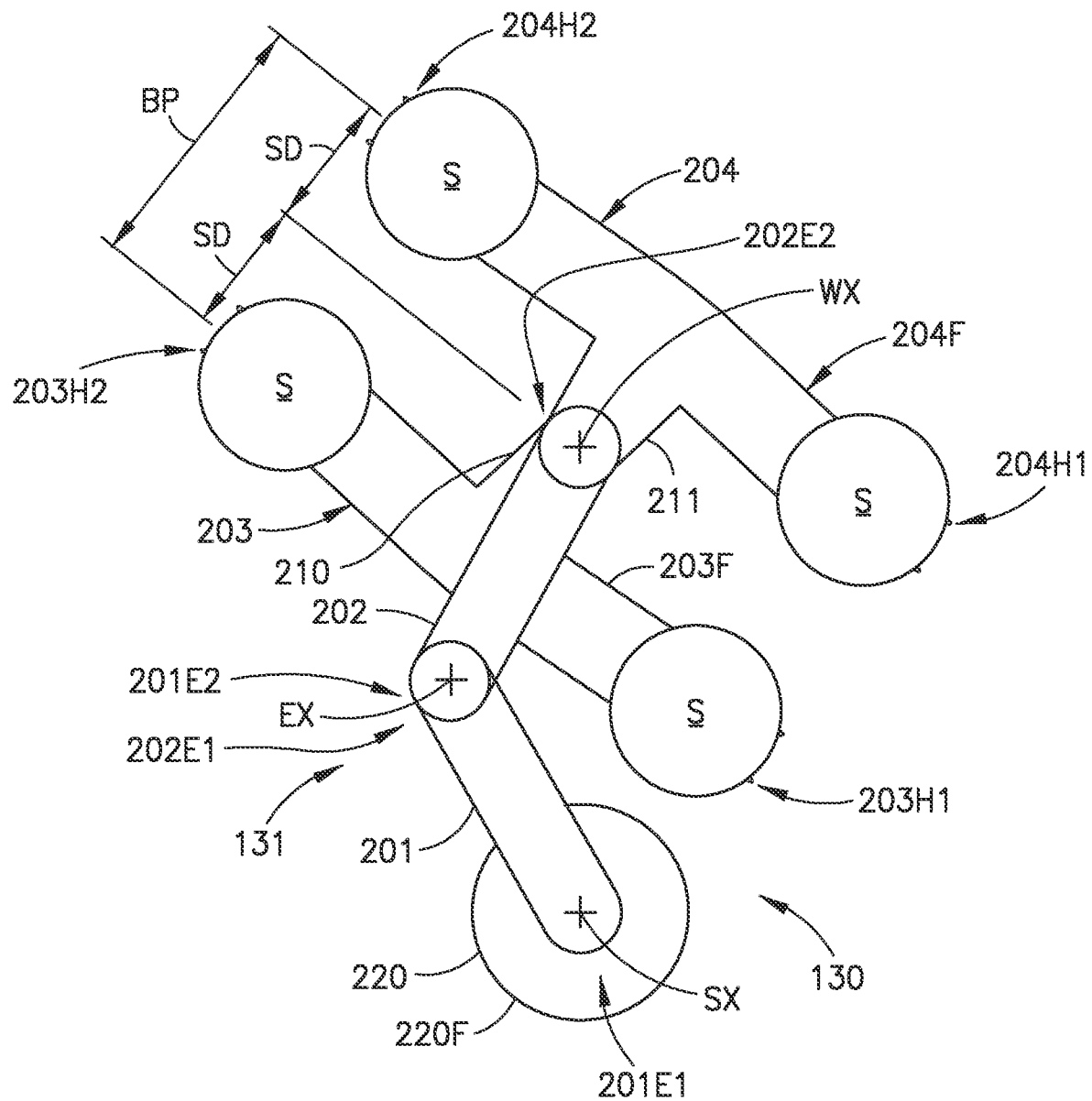
FIGS. 2A, 2B, 2C, and 2D are schematic illustrations of a substrate transport apparatus of the substrate processing apparatus of FIG. 1 in accordance with aspects of the present disclosure.

FIG. 1A illustrates an exemplary substrate processing apparatus 100 in accordance with aspects of the present disclosure. Although the aspects of the present disclosure will be described with reference to the drawings, it should be understood that the aspects of the present disclosure can be embodied in many forms. In addition, any suitable size, shape or type of elements or materials could be used.

The aspects of the present disclosure provide for a substrate processing apparatus 100 that includes a substrate transport apparatus 130. The substrate transport apparatus 130 includes an arm 131 having at least two arm links and end effectors (also referred to herein as substrate holders) rotatably joined to each other, and in one aspect having a shoulder joint/axis SX in a fixed location. The substrate transport apparatus 130 is configured to pick (and/or place) substrates substantially simultaneously to side-by-side substrate processing (or other holding) stations 190-191, 192-193, 194-195, 196-197 while providing a fast swapping of substrates S. The substrate transport apparatus 130 configuration enables picking substrates substantially simultaneously to each side-by-side substrate processing station on each side of a transfer chamber 125, 125A (as described herein) with independent automatic wafer centering for each substrate coincident with substrate transfer by the substrate transport apparatus 130. It is noted, with brief reference to FIGS. 7E-7J that the fast swapping of substrates S is the removal of substrates S (S1, S2) substantially simultaneously from one set or pair of side-by-side substrate processing stations (e.g., such as substrate processing stations 190-191) with the substrate transport apparatus 130 and placement of other different substrates S (S3, S4) substantially simultaneously to the same side-by-side substrate processing stations (i.e., substrate processing stations 188-189) with the substrate transport apparatus 130, where the removal and placement occurs in rapid succession without any intervening placement of the removed substrates S (S1, S2) (i.e., with the removed substrates S (S1, S2) being held by the substrate transport apparatus). In other aspects, the fast swapping of substrates occurs substantially without intervening Z axis motion between the picking and placement of substrate(s). In other words, there is substantially no intervening Z axis motion of the substrate transport apparatus 130 other than to lift (pick) or lower (place) a substrate to a substrate holding station. For example, each plane 499, 499A (see FIGS. 2D, 10, and 11) of the substrate holder planes (as described herein, and whether the substrate holding station(s) 203H1, 203H2, 204H1, 204H2 of the dual sided substrate holders form one or more planes) corresponds with and are aligned to at least one plane(s) (see FIGS. 1B and 1C) of transport openings in a common transport chamber for transfer at a given Z position of transport opening plane, as will be described further herein.

The aspects of the present disclosure also provide for a transport arm transmission system that employs cables or wires and pulleys that reduces at least a height of the transfer arm links compared to conventional band and pulley transmissions. The cable or wire and pulley transmissions (referred to herein as cable and pulley transmissions for ease of explanation) described may also substantially eliminate or reduce alignment issues between the cables and respective pulleys, compared to the conventional band and pulley transmissions, and may operate unaffected by arm link deflections due to gravity. The substantial elimination of or reduced alignment issues between the cables and respective pulleys may provide for longer length arm links effecting a longer reach of the substrate transport arm.

The aspects of the present disclosure may provide for a stiffer more compact transport arm through inclusion of crossed roller bearings at the rotational joints of the transport arm (e.g., compared to conventional employment of duplex bearings). In some aspects, the crossed roller bearings may form pulleys of the transport arm transmission system further decreasing a height of the transport arm links and decreasing part count of the transport arm. In accordance with aspects of the present disclosure, the crossed roller bearings may be coupled to a respective shaft(s) in a manner that is substantially unaffected by high operating temperatures and/or variations in operating temperatures of the substrate transport arm operating environment.

Also referring to FIG. 2, in accordance with aspects of the present disclosure, the arm 131 includes at least two substrate holders (also referred to as end effectors or end effector links) 203, 204. While the arm 131 is described as having at least two substrate holders, in other aspects the arm may have less than two (e.g., one or at least one) substrate holders or more than two substrate holders. In one aspect the substrate holders 203, 204 are dual end or dual pan substrate holders, where each substrate holder has two longitudinally separated ends with at least one substrate holding station or pan at each end; however, in other aspects, the substrate holders may have any suitable configuration, such as those configurations described herein. The at least two substrate holders 203, 204 rotate independent of and relative to each other about a wrist axis WX of the substrate transport apparatus 130 so as to effect one or more of automatic wafer centering and accommodation of varying pitch between the side-by-side substrate processing stations 190-191, 192-193, 194-195, 196-197.

Referring again to FIG. 1A, the substrate processing apparatus 100, such as for example a semiconductor tool station, is shown in accordance with an aspect of the present disclosure. Although a semiconductor tool station is shown in the drawings, the aspects of the present disclosure described herein can be applied to any tool station or application employing robotic manipulators. In one aspect the substrate processing apparatus 100 is shown as having a clustered arrangement (e.g. having substrate processing stations 190-197 connected to a central or common chamber) while in other aspects the processing apparatus may be a linearly arranged tool, however the aspects of the present disclosure may be applied to any suitable tool station. The substrate processing apparatus 100 generally includes an atmospheric front end 101 (also referred to herein as an atmospheric section), two or more vacuum load locks 102A, 102B and a vacuum back end 103. The two or more vacuum load locks 102A, 102B may be coupled to any suitable port(s) or opening(s) of the front end 101 and/or back end 103 in any suitable arrangement. For example, in one aspect the two or more vacuum load locks 102A, 102B (and the respective openings in the transport chamber wall 125W) may be arranged in a common horizontal plane in a side by side arrangement as can be seen in FIG. 1B. In other aspects the two or more vacuum load locks 102A, 120B may be arranged in a grid format such that the two or more vacuum load locks 102A, 102B, 102C, 102D (and the respective openings in the transport chamber wall 125W) are arranged in rows (e.g. having spaced apart horizontal planes) and columns (e.g. having spaced apart vertical planes) as shown in FIG. 1C.

It should be understood that while the two or more vacuum load locks 102A, 102B are illustrated on end 100E1 of a transport chamber 125 in other aspects the two or more vacuum load locks 102A, 102B may be arranged on any number of sides 100S1, 100S2 and/or ends 100E1, 100E2 of the transport chamber 125. Each of the two or more vacuum load locks 102A, 102B, 102C, 102D may also include one or more wafer/substrate resting planes WRP (FIGS. 1B and 1C) in which substrates are held on suitable supports within the respective vacuum load lock 102A, 102B, 102C, 102D. In other aspects, the substrate processing apparatus 100 may have any suitable configuration.

The components of each of the front end 101, the two or more vacuum load locks 102A, 102B, and back end 103 may be connected to a controller 110 which may be part of any suitable control architecture such as, for example, a clustered architecture control. The control system may be a closed loop controller having a master controller, cluster controllers and autonomous remote controllers such as those disclosed in U.S. Pat. No. 7,904,182 entitled "Scalable Motion Control System" issued on Mar. 8, 2011 the disclosure of which is incorporated herein by reference in its entirety. In other aspects, any suitable controller and/or control system may be utilized.

In one aspect, the front end 101 generally includes load port modules 105 and a mini-environment 106 such as for example an equipment front end module (EFEM). The load port modules 105 may be box opener/loader to tool standard (BOLTS) interfaces that conform to SEMI standards E15.1, E47.1, E62, E19.5 or E1.9 for 300 mm load ports, front opening or bottom opening boxes/pods and cassettes. In other aspects, the load port modules may be configured as 200 mm wafer/substrate interfaces, 450 mm wafer/substrate interfaces or any other suitable substrate interfaces such as for example larger or smaller semiconductor wafers/substrates, flat panels for flat panel displays, solar panels, reticles or any other suitable object. Although two load port modules 105 are shown in FIG. 1A, in other aspects any suitable number of load port modules may be incorporated into the front end 101. The load port modules 105 may be configured to receive substrate carriers or cassettes C from an overhead transport system, automatic guided vehicles, person guided vehicles, rail guided vehicles or from any other suitable transport method. The load port modules 105 may interface with the mini-environment 106 through load ports 107. The load ports 107 may allow the passage of substrates S between the substrate cassettes C and the mini-environment 106. The mini-environment 106 generally includes any suitable transfer robot 108 which may incorporate one or more aspects of the present disclosure described herein. In one aspect the robot 108 may be a track mounted robot such as that described in, for example, U.S. Pat. No. 6,002,840 issued on Dec. 14, 1999; U.S. Pat. No. 8,419,341 issued Apr. 16, 2013; and U.S. Pat. No. 7,648,327 issued on Jan. 19, 2010, the disclosures of which are incorporated by reference herein in their entireties. In other aspects the robot 108 may be substantially similar to that described herein with respect to the back end 103. The mini-environment 106 may provide a controlled, clean zone for substrate transfer between multiple load port modules.

The two or more vacuum load locks 102A, 102B (and 102C, 120D) may be located between and connected to the mini-environment 106 and the back end 103. In other aspects the load ports 105 may be coupled substantially directly to the at least one load lock 102A, 102B or the transport chamber 125 where the substrate carrier C is pumped down to a vacuum of the transport chamber 125 and substrates S are transferred directly between the substrate carrier C and the respective load lock 102A, 120B or transfer chamber 125. In this aspect, the substrate carrier C may function as a load lock such that a processing vacuum of the transport chamber extends into the substrate carrier C. As may be realized, where the substrate carrier C is coupled substantially directly to the vacuum load lock 102A, 120B through a suitable load port any suitable transfer apparatus may be provided within the load lock or otherwise have access to the carrier C for transferring substrates S to and from the substrate carrier C. It is noted that the term vacuum as used herein may denote a high vacuum such as $10^{-5}$ Torr or below in which the substrates S are processed. The two or more vacuum load locks 102A, 102B generally includes atmospheric slot/slit valves ASV and vacuum slot/slit valves VSV (generally referred to herein as slot valves SV). The slot valves SV of the load locks 102A, 102B (as well as for the substrate station modules 150) may provide the environmental isolation employed to evacuate the load locks 102A, 120B after loading a substrate S from the atmospheric front end 101 and to maintain the vacuum in the transport chamber 125 when venting the load lock 102A, 120B with an inert gas such as nitrogen. The slot valves SV of the processing apparatus 100 may be located in the same plane or different vertically stacked planes (as described above with respect to the vacuum load locks 102A, 102B, 120C, 120D) to accommodate transfer of substrates to and from at least the substrate station modules 150 (also referred to herein as processing stations) and load locks 102A, 102B coupled to the transport chamber 125. The two or more load locks 102A, 102B (and/or the front end 101) may also include an aligner 109 for aligning a fiducial of the substrate S to a desired position for processing or any other suitable substrate metrology equipment. In other aspects, the two or more vacuum load locks 102A, 120B may be located in any suitable location of the processing apparatus and have any suitable configuration.

The vacuum back end 103 generally includes a transport chamber 125, one or more substrate station modules 150 and any suitable number of substrate transport apparatus 130 that may include one or more aspects of the present disclosure described herein. The substrate transport chamber 125 is configured to hold an isolated atmosphere therein, and has a side wall 125W with more than one substrate transport openings (such as slot valves SV, or openings corresponding thereto such as shown in FIGS. 1B and 1C in the wall 125W to which the slot valves are coupled to sealingly close the openings) separate and juxtaposed with respect to each other along the side wall 125W on a common level (FIG. 1B), or in other aspects in rows and columns (FIG. 1C). The transport chamber 125 may have any suitable shape and size that, for example, complies with SEMI standard E72 guidelines. The substrate transport apparatus 130 will be described below and may be located at least partly within the transport chamber 125 to transport substrates between the two or more vacuum load locks 102A, 102B (or between a cassette C located at a load port) and the various substrate station modules 150. In one aspect the substrate transport apparatus 130 may be removable from the transport chamber 125 as a modular unit such that the substrate transport apparatus 130 complies with SEMI standard E72 guidelines.

Figure 7A:
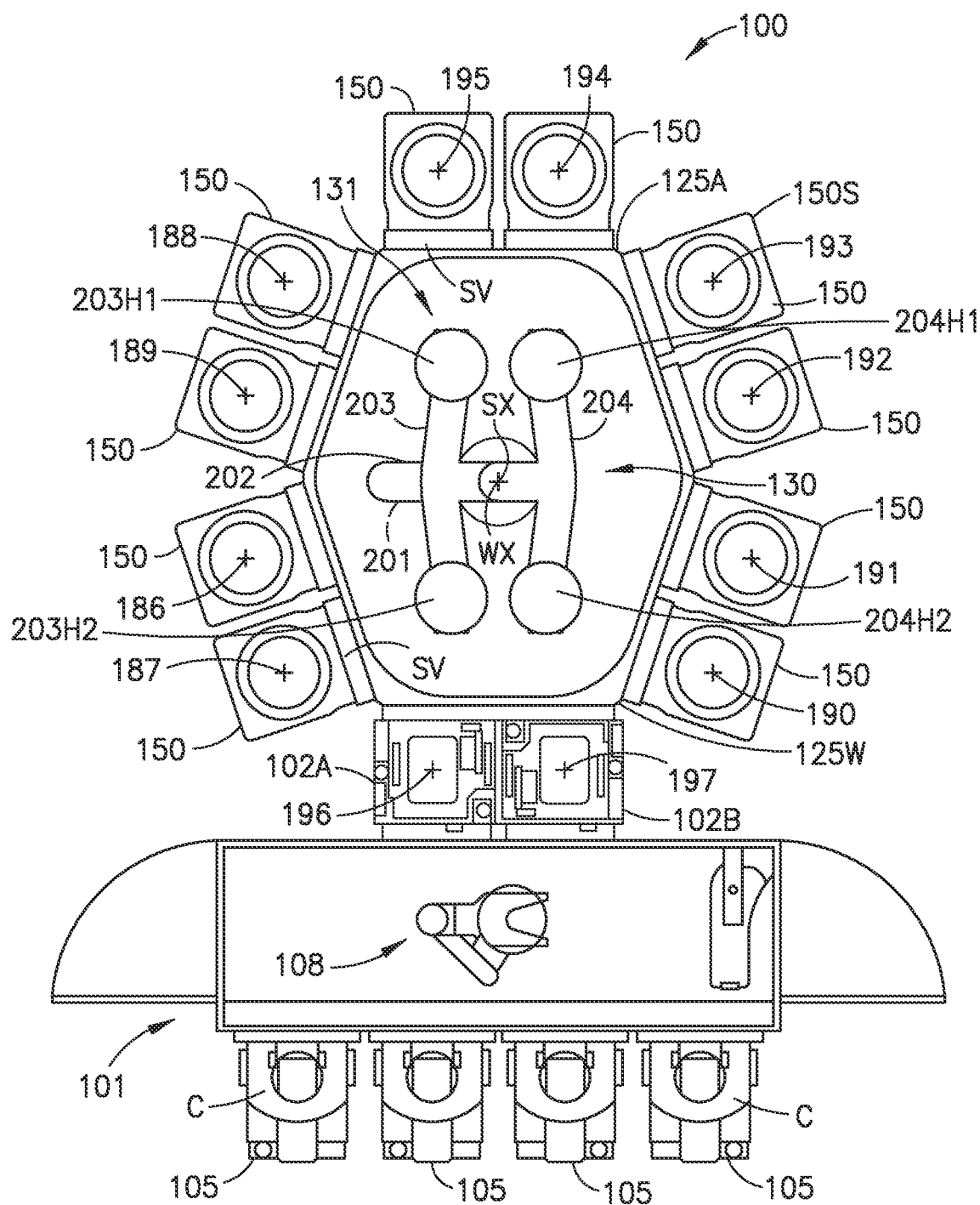
FIGS. 7A-7L are schematic illustrations of an exemplary substrate processing apparatus incorporating the substrate transport apparatus of FIGS. 2A, 2B, 2C, and 2D in accordance with aspects of the present disclosure.

The substrate station modules 150 may be arranged side-by-side on a common side or facet of the transfer chamber 125 and/or a single substrate station module 150 may be disposed on a single side or facet of the transfer chamber 125; however, in other aspects the substrate station modules may be single substrate station modules 150S (FIG. 8), triple substrate station modules 150T (FIG. 12), and/or a substrate station module having any suitable number of substrate processing/holding station(s) located within a single housing or otherwise arranged side-by-side on a common side/facet of the transport chamber 125. In one aspect, the side-by-side substrate processing stations are arranged within a common (i.e., the same) process module housing 150H (FIG. 1A) to form what may be referred to as twin or tandem substrate processing modules 150D; while in other aspects the side-by-side substrate processing stations are single substrate processing stations 150S that are separate from one another and do not share a common housing (FIG. 7A). It should be understood that twin substrate station modules 150D, the single substrate station modules 150S, the triple substrate station modules 150T, and any other substrate station module having any suitable number of substrate processing stations may be coupled to the same (i.e., a common) transfer chamber 125 in any suitable combination (see, e.g., FIG. 8 where single and twin substrate station modules are coupled to the same transfer chamber).

Referring to FIG. 1A and the substrate station module 150 on side 100S1 of the transfer chamber 125 for example, substrate processing stations 190, 191 are arranged side by side in a common housing 150H and may be accessible from within the transfer chamber 125 through a single slot valve (see, e.g., substrate processing stations 192, 193) that is common to both substrate processing stations or each substrate processing station may have a respective independently operable slot valve (see, e.g., substrate processing stations 190, 191). The side-by-side substrate processing stations, such as 190, 191 for example, are separated or spaced from one another by any suitable distance or pitch D, which as will be described herein, may be accommodated by varying a distance between substrate processing stations of the at least two dual ended substrate holders 203, 204 of the substrate transport apparatus 130.

The substrate station modules 150 may operate on the substrates S through various deposition, etching, or other types of processes to form electrical circuitry or other desired structure on the substrates. Typical processes include but are not limited to thin film processes that use a vacuum such as plasma etch or other etching processes, chemical vapor deposition (CVD), plasma vapor deposition (PVD), implantation such as ion implantation, metrology, rapid thermal processing (RTP), dry strip atomic layer deposition (ALD), oxidation/diffusion, forming of nitrides, vacuum lithography, epitaxy (EPI), wire bonder and evaporation or other thin film processes that use vacuum pressures. The substrate station modules 150 are communicably connected to the transport chamber 125 in any suitable manner, such as through slot valves SV, to allow substrates to be passed from the transport chamber 125 to the substrate station modules 150 and vice versa. The slot valves SV of the transport chamber 125 may be arranged to allow for the connection of the twin process modules.

It is noted that the transfer of substrates to and from the substrate station modules 150 and the load locks 102A, 102B (or cassette C) coupled to the transfer chamber 125 may occur when at least a portion of the at least two dual ended substrate holders 203, 204 of the substrate transport apparatus 130 are aligned with a respective substrate processing station of a predetermined set or pair of side-by-side substrate processing stations 190-191, 192-193, 194-195, 196-197. In accordance with aspects of the present disclosure two substrates S may be transferred to a respective predetermined substrate station module 150 substantially simultaneously (e.g. such as when substrates are picked/placed from the twin processing modules in the manner described herein).

The substrate transport apparatus 130 is generally described herein as having at least one articulated multi-link arm 131 with a drive section 220, 200A, 220B, 220C connected to the transport chamber 125 at a fixed location; however, in other aspects the substrate transport apparatus 130 may be mounted on a boom arm or linear carriage such as that described in U.S. patent application Ser. No. 15/103,268 titled "Processing Apparatus" and filed on Oct. 16, 2014 and International patent application number PCT/US13/25513 entitled "Substrate Processing Apparatus" and filed on Feb. 11, 2013, the disclosures of which are incorporated herein by reference in their entireties. The at least one articulated multi-link arm 131 has an upper arm 201 and a forearm 202 located in the transport chamber 125. A proximate end 201E1 of the upper arm 201 being rotatably joined to the drive section 220, 220A, 220B, 220C at the fixed location. The forearm 202 is rotatably joined to the upper arm 201 at a distal end 201E2 of the upper arm 201 and the upper arm 201 is a substantially rigid unarticulated link between the proximate end 201E1 and the distal end 201E2.

In the aspects, of the present disclosure described herein, at least one end effector link (as will be described herein) is rotatably joined to a joint (e.g., wrist joint or axis WX) at an end of the forearm 202 so that the at least one effector link rotates relative to the forearm 202 about a common axis of rotation at the joint, the at least one end effector link has more than one substrate holding station (as will be described herein) dependent therefrom juxtaposed along a common plane 499 (see, e.g., FIGS. 2D, 10, and 11) with respect to each other and configured so that rotation of the at least one end effector link about the common axis of rotation rotates the more than one substrate holding station about the common axis of rotation. As will be described herein, the drive section 220, 220A, 220B, 220C of the substrate transport apparatus 130 is configured to at least extend and retract the multi-link arm 131 (and the at least one effector coupled thereto) along a non-radial linear path, relative to the fixed location, so the more than one juxtaposed substrate holding station each traverse linearly along the non-radial path, with extension and retraction of the arm 131, and pass substantially simultaneously through separate corresponding openings of the more than one juxtaposed substrate transport openings (such as slot valves SV, or openings corresponding thereto such as shown in FIGS. 1B and 1C in the wall 125W to which the slot valves are coupled to sealingly close the openings) on the common level. In other aspect, the drive section 220, 220A, 220B, 220C of the substrate transport apparatus 130 is configured to extend and retract the multi-link arm 131 along one or both a radial linear path and a non-radial linear path, relative to the fixed location, for transporting substrates as described herein.

Still referring to FIG. 1A and also to FIGS. 2A-2D, the substrate transport apparatus 130 includes a frame 220F (also referred to herein as a support frame), a drive section 220 connected to the frame 220F, and at least one articulated arm 131 (a single arm is illustrated for exemplary purposes only) having at least one movable arm link 201, 202 and an end effector link 203, 204, connected to the movable arm link, the end effector link 203, 204 having a substrate holding station 203H1, 203H2, 204H1, 204H2 located thereon. In this aspect, the articulated arm is a multi-link arm 131. In one aspect, the arm 131 is a selective compliant articulated robot arm (referred to herein as a "SCARA arm") but in other aspects the arm may have any suitable configuration. For example, the arm 131 includes an upper arm link 201, a forearm link 202, and at least one end effector link 203, 204 (i.e., a dual link SCARA with at least one end effector); although in other aspects the arm 131 may have any suitable number of arm links and substrate holders. The upper arm link 201 is a substantially rigid link (i.e., the upper arm link 201 is unarticulated between longitudinal ends 201E1, 201E2). The upper arm link 201 is rotatably coupled to the drive section 220 at one longitudinal end 201E1 (forming what may be referred to as a shoulder joint or axis SX) so as to rotate about the shoulder axis SX of the arm 131. In one aspect, the shoulder joint or axis SX is at a fixed location (shown in the Figs. along an axis of symmetry of the transport chamber, though in other aspects may be offset from the axis of symmetry of the transport chamber). The forearm link 202 is a substantially rigid link (i.e., the forearm link 202 is unarticulated between longitudinal ends 202E1, 202E2). Longitudinal end 202E1 of the forearm link 202 is rotatably coupled to the longitudinal end 201E2 of the upper arm link 201 so that the forearm link 202 rotates about an elbow axis EX of the arm 131. Here, the forearm link 202 and upper arm link 201 are of a similar length (e.g., from joint center to joint center), although in other aspects the forearm link 202 and upper arm link 201 may have different lengths (e.g., from joint center to joint center).

Referring also to FIGS. 5A-5E, in one aspect, the movable arm link 201, 202 is a reconfigurable arm link 201R, 202R having a modular composite arm link casing 201C, 202C, formed of link case modules rigidly coupled to each other, and a pulley system 655 (e.g., formed of a transmission member and a pair of pulleys) cased in and extending through the rigidly coupled link case modules substantially end to end (e.g., between, e.g., rotational axes SX, EX, WX at each end of the arm link) of the modular composite arm link casing 201C, 202C. Here, as will be described in greater detail herein, the rigidly coupled link case modules include end couplings 511, 512, 513, 514 (also referred to herein as link case end modules) connected by at least one central arm section 510A, 510B (also referred to herein as interchangeable link case extension modules or extruded arm casing components) having a predetermined characteristic determining a length OAL of the movable arm link 201, 202. In accordance with aspects of the present disclosure, the at least one central arm section 510A, 510B is selectable, for connection to the end couplings 511, 512, 513, 514 and forms the reconfigurable arm link 201R, 202R, from a number of different central arm sections (interchangeable link case extension modules) 510A1-510An, 510B1-510Bn each with a different corresponding predetermined characteristic determining a corresponding different length of the movable arm link 201, 202, so as to selectably set the modular composite arm link casing 201C, 202C and reconfigurable arm link 201R, 202R to a predetermined arm link length OAL from a number of predetermined arm link lengths OALn (each different length OALn corresponding to the different lengths CAL1-CALn of the different central arm sections 510A1-510An, 510B1-510Bn).

As an example, each of the upper arm link 201 and forearm link 202 are modular arm links having a respective central arm section 510A, 510B and respective end couplings 511-514. For example, the upper arm link 201 includes a proximate end coupling 511 that forms the proximate end 201E1 of the upper arm link 201. A central arm section 510A is coupled to the proximate end coupling 511 in any suitable manner, such as with any suitable removable fasteners. A distal end coupling 512 is coupled to the central arm section 510A, opposite the proximate end coupling 511, so as to form the distal end 201E2 of the upper arm 201. Similarly, the forearm link 202 includes a proximate end coupling 513 that forms a proximate end 202E1 of the forearm link 202. A central arm section 510B is coupled to the proximate end coupling 511 in any suitable manner, such as with any suitable removable fasteners. A distal end coupling 514 is coupled to the central arm section 510B, opposite the proximate end coupling 513, so as to form a distal end 202E2 of the forearm link 202.

The end couplings 511, 512 for the upper arm link 201 may be substantially similar to each other so that the end couplings 511, 512 are interchangeable with each other (i.e., end coupling 511 can be coupled to either end of the central arm section 510A so as to form either the distal end 201E2 or proximate end 201E1 of the upper arm link 201 and end coupling 512 can be coupled to either end of the central arm section 510A so as to form either the distal end 201E2 or proximate end 201E1 of the upper arm link 201). Similarly, the end couplings 513, 514 for the forearm link 202 may be substantially similar to each other so that the end couplings 513, 514 are interchangeable with each other (i.e., end coupling 513 can be coupled to either end of the central arm section 510B so as to form either the distal end 202E2 or proximate end 202E1 of the forearm link 202 and end coupling 514 can be coupled to either end of the central arm section 510B so as to form either the distal end 202E2 or proximate end 202E1 of the forearm link 202). In some aspects, the end couplings for the upper arm link 201 may be interchangeable with the end couplings of the forearm link 202. Interchangeable end coupling may reduce part count for the transport arm and reduce costs associated with manufacture of different parts.

The central arm sections 510A, 510B, as described herein, have a closed cross section (e.g., closed box shape). For example, the central arm section 510A, 510B comprises a monolithic tube frame 510F that may have any suitable cross section. In the examples illustrated in FIGS. 5A-5E the tube frame 510F is shown as having a rectangular cross section however, in other aspects the cross section may be square, circular, ovoid, "I" beam shaped (see FIG. 44 where cables extend on an interior of the "I" beam (section A-A) or on an exterior of the "I" beam (FIG. 44A)), etc. In still other aspects, central arm section 510A, 510B may have an open box shape (see FIG. 44B, where one or more sides of the frame 510F' is open (e.g., with or without panel(s) 4400 to close the open side(s)). In other aspects, the central arm section 510A, 510B may have a frame 510F" that is a hybrid closed-open box shape as illustrated in FIG. 44C, where a portion of the frame 510F" is a closed box while another adjacent portion of the frame 510F" is an open box (e.g., where the cables of the pulley transmissions extend through one or more of the open box and closed box). As may be realized, the open box shape, closed box shape, "I" beam shape, or any other suitable cross sectional shape of the central arm section 510A, 510B may be formed in a manner described herein, such as by extrusion. It is noted that the closed box shape may provide for improved stiffness and performance of the substrate transport apparatus 130 compared to the open box shaped (e.g., "U" shaped) cross section (e.g., depending on a stiffness of material chosen for the "U" shaped section).

Figure 4:
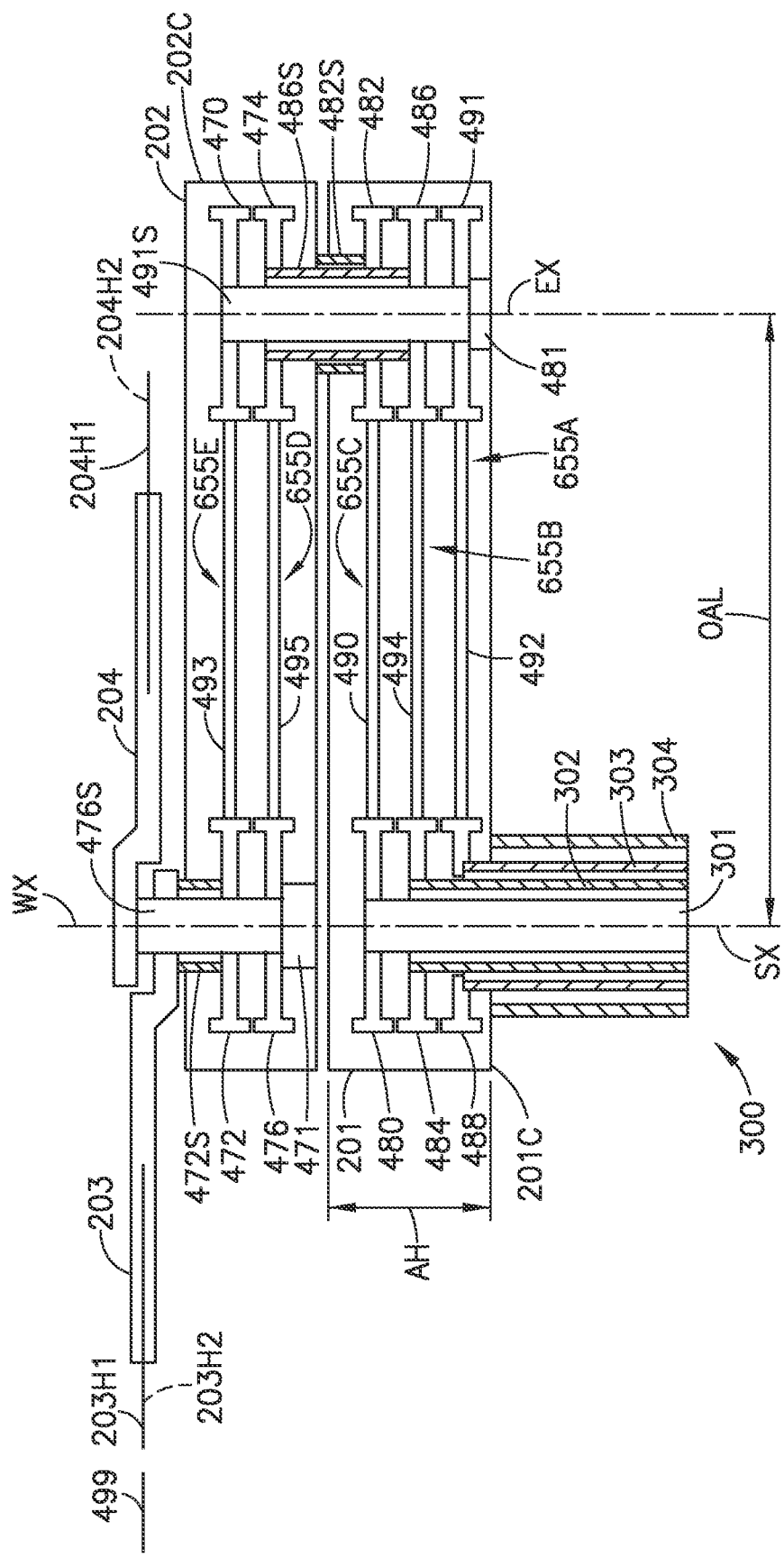
FIG. 4 is a schematic cross-section illustration of a portion of the substrate transport apparatus of FIGS. 2A, 2B, 2C, and 2D in accordance with aspects of the present disclosure.

The central arm section 510A, 510B is mechanically fastened to each of the (respective) end couplings 511, 512, 513, 514 to form the modular composite arm link casing 201C, 202C and arranged so that the modular composite arm link casing 201C, 202C formed matches a misalignment tolerance of a pulley transmission (such as transmission members 490, 492, 493, 494, 495—FIG. 4) connecting pulley wheels (such as pulleys 480, 484, 488, 482, 486, 491, 470, 474, 472, 476—FIG. 4) of the (respective) pulley system (such as pulleys systems 655A-655E—FIG. 4) for a selected predetermined arm link length OAL, OALn (FIG. 5C). In one aspect, the central arm section 510A, 510B is mechanically fastened with mechanical fastener joints (including removable mechanical fasteners as will be described herein) to each of the end couplings 511, 512, 513, 514 to form the modular composite arm link casing 201C, 202C, and the mechanical fastener joints are configured so that the modular composite arm link casing 201C, 202C formed matches the misalignment tolerance of the pulley transmission connecting pulley wheels of the pulley system for a selected predetermined arm link length. As an example, the fit and conversely the clearance between mating and/or complimenting portions of the mechanical fasteners of the joint, for example the fit pf bolts or pins into corresponding holes at each individual interface and joint, and collectively across the arm link, are configured so as to match (so that the fit up of the mechanical fasteners does not cause play in excess to the acceptable design tolerance of misalignment of the pulley system in a given arm link length. By way of further example, referring briefly to FIG. 6B, as the length of the arm link 201, 202 increases the free end of the arm may also sag or droop due to gravitation effects and/or loading on the arm links 201, 202 by a predetermined amount as described in U.S. patent application Ser. No. 15/880,387 filed on Jan. 25, 2018 and titled "Method and Apparatus for Substrate Transport Apparatus Position Compensation" (published on Oct. 4, 2018 as United States pre-grant publication number 2018/0286728), the disclosure of which is incorporated herein by reference in its entirety. The drop of the arm link may define a further misalignment that must also be accommodated within the misalignment tolerance of the respective pulley systems 655A-655E (i.e., an allowable amount the transmission segments may be angled or move axially relative to their respective pulleys without substantially causing arm position errors). This drooping of the arm links 201, 202 may cause the pulley transmission (which in FIG. 6B includes cable (or wire) segments 660A, 660B) to become angled by angle β (within the predetermined misalignment tolerance) relative to a rotational plane of the pulley 476 or axially travel (within the predetermined misalignment tolerance) along the peripheral face/side surface of the pulley. In some aspects, the angle β of the cable segments 660A, 660B may misalign the cable segments 660A, 660B with the pulley 476. Here, the couplings between the central arm section 510A, 510B and the end couplings 511, 512, 513, 514 are such that any tolerances in the coupling match (or in some aspects negate or cure) the misalignment tolerance between the pulley transmission and the pulley 476.

Figure 41:
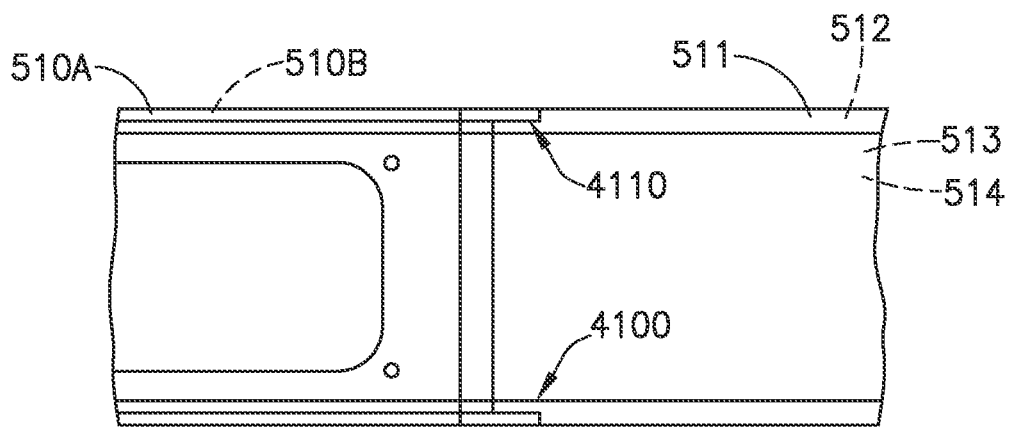
FIG. 41 is a schematic section view of a coupling between an end coupling and a central arm section in accordance with aspects of the present disclosure.

The tube frame 510F includes end flanges 540, 541 configured for coupling any one of the end couplings 511, 512, 513, 514 to the tube frame 510F. The flanges 540, 541 may be integrally formed with the tube frame 510F or coupled to the tube frame 510F in any suitable manner. For example, the flanges 540, 541 may be forged, cast, or molded with the tube frame 510F; while in other aspect, the flanges 540, 541 may be coupled to the tube frame by welding, mechanical fasteners, adhesive, friction fit (e.g., shrink fits, press fits, etc.), clamps or in any other suitable manner. The end flanges 540, 541 may include locating features (such as a hole 545 and a slot 546) and the end couplings 511, 512, 513, 514 may include mating locating features (e.g., such as pins 547 or other protrusions that engage the locating features of the end flanges 540, 541—see FIG. 5C) that orient/locate each of the end couplings 511, 512 of the upper arm link 201 (or with respect to the forearm link 202, the end couplings 513, 514) to the central arm section 510A (or with respect to the forearm link 202, the central arm section 510B) and to each other in at least two degrees of freedom. The locating features and mating locating features are, in one aspect, asymmetric so that the coupling is poka-yoke (e.g., the asymmetric locating features substantially avoid assembly errors when the end couplings are coupled to a respective central arm section). Referring also to FIG. 41, the locating features may include protrusions 4100 and recesses 4110 that are formed into the central arm sections 510A, 510B and end couplings 511, 512, 513, 514 where the protrusions 4100 and recesses 4110 are configured to locate the end couplings 511, 512, 513, 514 relative to a respective central arm section 510A, 510B at a predetermined location. For example, the central arm section 510A, 510B may include recess(es) 4110 and the end couplings 511, 512, 513, 514 may include protrusion(s) 4100 where the recess 4110 receives a respective protrusion 4100 to locate the end coupling 511, 512, 513, 514 relative to the respective central arm section 510A, 510B at the predetermined location. In other aspects, the end couplings may include the recess and the central arm sections may include the protrusion. In one aspect, the recesses and protrusions may be continuous and extend around an entire peripheral edge of the respective end coupling and central arm section; while in other aspects the recesses and protrusions may be discontinuous so as to extend around predetermined portions of the peripheral edge of the respective end coupling and central arm section. In one aspect, the protrusions and recesses may be employed with one or more pins/holes/slots so that the pins/holes/slot define a directional assembly orientation (e.g., which surface of the end coupling is the top, bottom, etc.) of the end coupling relative to the central arm section while the recess and protrusion locate the end coupling relative to the central arm section in the predetermined position. In one aspect, the end couplings 511, 512, 513, 514 may be coupled to a respective central arm section 510A, 510B without locating features where the end coupling and central arm section assembly is secondarily machined to predetermined dimensional tolerances from one end coupling to the opposite end coupling.

Figure 42:
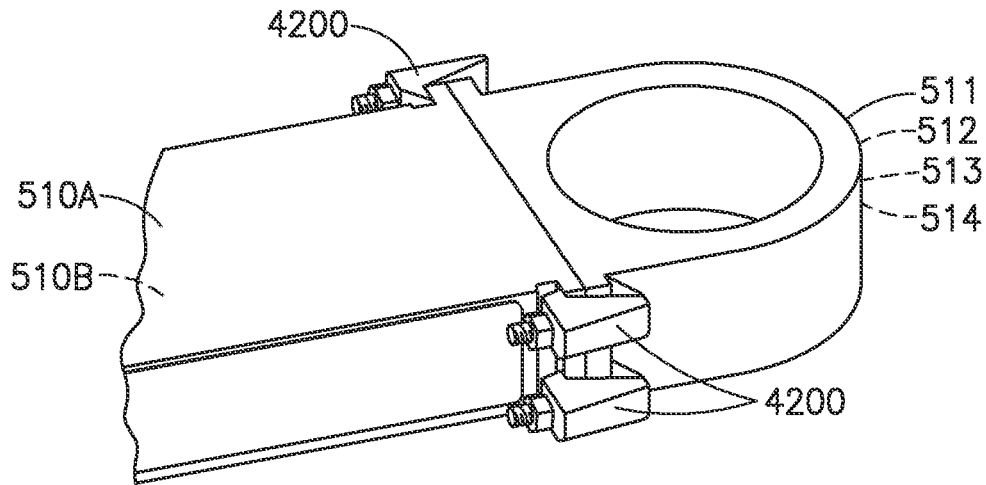
FIG. 42 is a schematic section view of a coupling between an end coupling and a central arm section in accordance with aspects of the present disclosure.
Figure 43:
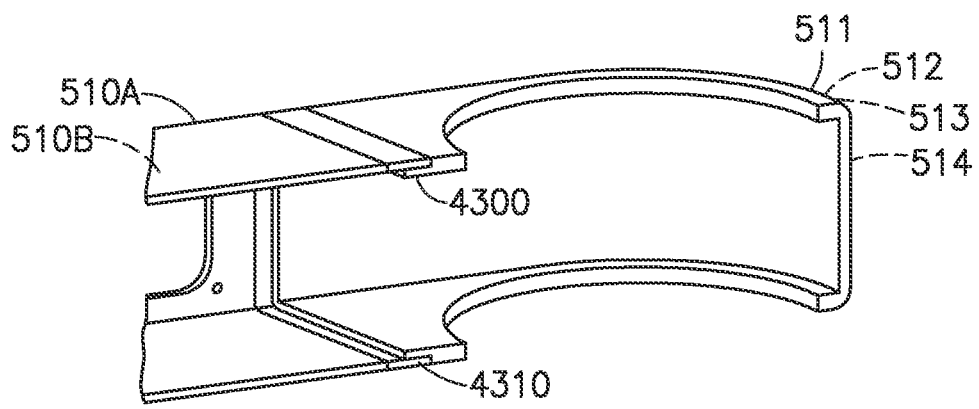
FIG. 43 is a schematic section view of a coupling between an end coupling and a central arm section in accordance with aspects of the present disclosure.

In one aspect, the end flanges 540, 541 also include fastener couplings 560-563 and the end couplings 511, 512, 513, 514 include mating fastener couplings 560A-563A that together effect coupling of the end couplings 511, 512, 513, 514 to the central arm section 510A, 510B. For example, the fastener couplings 560-563 and mating fastener couplings 560A-563A may be in the form of threaded holes and apertures into which bolts/screws are inserted or any other removable fastener system. Referring also to FIG. 42, and as noted herein, the end coupling 511, 512, 513, 514 is illustrated as being coupled to the central arm section 510A, 510B with clamps 4200 where each clamp engages both the end coupling 511, 512, 513, 514 and the central arm section 510A, 510B so as to form a compression coupling between the end coupling 511, 512, 513, 514 and the central arm section 510A, 510B. Referring also to FIG. 43, and as noted herein, the end coupling 511, 512, 513, 514 is illustrated as being coupled to the central arm section 510A, 510B by a friction fit (e.g., shrink fits, press fits, etc.) where a protrusion 4300 on the end coupling 511, 512, 513, 514 frictionally engages a recess 4310 (or internal or external surface of) on the central arm section 510A, 510B (or vice versa) so as to couple the end coupling 511, 512, 513, 514 to the central arm section 510A, 510B. The recess 4310 and protrusion 4300 may be substantially similar to the recess 4110 and protrusion 4100 described above but for having a friction fit (also known as a press fit or interference fit which is a fastening between two parts achieved by friction after the parts are forcibly pushed together—there is no clearance between parts being assembled) (FIG. 43) rather than a sliding fit (e.g., the end coupling and central arm section slide easily relative to one another during assembly—there is clearance between the parts being assembled) (as in FIG. 41).

In one aspect, the end flanges 540, 541 may be substantially similar to each other so that the central arm section 510A, 510B may be installed in the upper arm link 201 or forearm link 202 with the end flange 541 towards either the distal end 201E2, 202E2 or proximate end 201E1, 202E1 of the arm (or vice versa).

In one aspect, the tube frame 510F includes one or more apertures 588 that are configured to provide access to an interior of a respective one of the upper arm link 201 and forearm link 202. Access to the interior may facilitate any suitable maintenance of the upper arm link 201 and forearm link 202 substantially without disassembling the substrate transport apparatus and/or the arm links thereof. In one aspect, a cover 510C (FIG. 5C) may be provided to cover the one or more access apertures 588, such as to contain any particulates that may be generated by the arm links. As may be realized, referring also to FIG. 5F, removal of the cover 510C provides access, through the access apertures 588, to an interior of the respective arm link. For example, adjustments may be made through the access apertures 588 to the cable and pulley transmissions described herein (e.g., such as adjusting a tension in one or more of the cables/cable segments by manipulating an inline cable tensioner 691 as will be described herein).

In one aspect, the central arm sections 510A, 510B may have a length CAL that with the respective end couplings 511, 512, 513, 514 defines an overall length OAL (from joint center to joint center—see FIG. 5C) of the respective upper arm link 201 or forearm link 202. The arm 131 (and other arms described herein) may be configured/re-configured by changing a length CAL of the central arm sections 510A, 510B. As noted herein, the central arm sections 510A, 510B may be manufactured as described herein so as to have different predetermined lengths CAL, CAL1-CALn. Accordingly, each of the central arm sections 510A, 510B may be selectable from a number of central arm sections 510A1-510An, 510B1-510Bn where "n" is a whole number signifying an upper limit to the number of central arm sections. Each of the selectable central arm sections 510A1-510An, 510B1-510Bn may have a length CAL1-CALn that is different from a length of another of the selectable central arm sections 510A1-510An, 510B1-510Bn. Here, selection of a selectable arm section 510A1-510An, 510B1-510Bn for installation in a respective upper arm link 201 or forearm link 202 defines, together with the respective end couplings 511, 512, 513, 514 a variable (i.e., through selection of a central arm section 510A1-510An, 510B1-510Bn) length of the upper arm link 201 or forearm link 202. As may be realized, the overall length OAL of one or more of the upper arm link 201 and the forearm link 202 may be increased or decreased through selection of the selectable central arm sections 510A1-510An, 510B1-510Bn.

Figure 40:
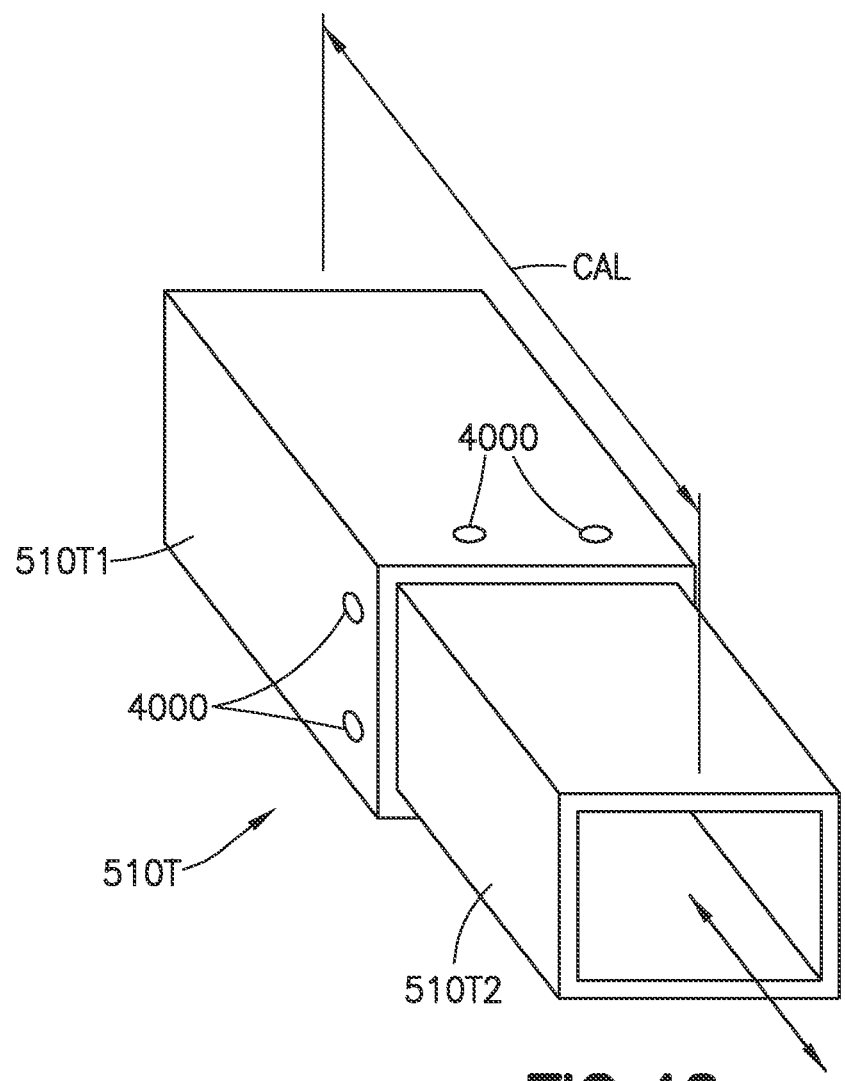
FIG. 40 is a schematic perspective illustration of a telescoping central arm section in accordance with aspects of the present disclosure.

In other aspects, referring also to FIG. 40, one or more of the central arm sections 510A, 510B may be a telescoping central arm section 510T (e.g., arm portions of the telescoping arm portions slide one into another to change a length in a manner similar to that of a segmented optical telescope). In this aspect, the telescoping central arm section 510T includes a first frame portion 510T1 and a second frame portion 510T2. The first frame portion 510T1 is shaped and sized to receive the second frame portion 510T2 in a sliding fit so that first frame portion 510T1 or the second frame portion 510T2 linearly slides in a longitudinal direction relative to another of the first frame portion 510T1 or the second frame portion 510T2 to increase or decrease the length CAL of the telescoping central arm section 510T. The telescoping central arm section 510T may include any suitable removable or non-removable fasteners 4000 (e.g., screws, bolts, pins, clips, welding, etc.) to lock movement of the first frame portion 510T1 relative to the second frame portion 510T2 so as to set/fix the length CAL of the telescoping central arm section 510T. Where the fasteners are removable the length of the arm links may be adjusted as desired to conform with additional or removed substrate processing modules, transfer chamber portions (e.g., the arm reach may be increased or decreased as desired).

Figure 40A:
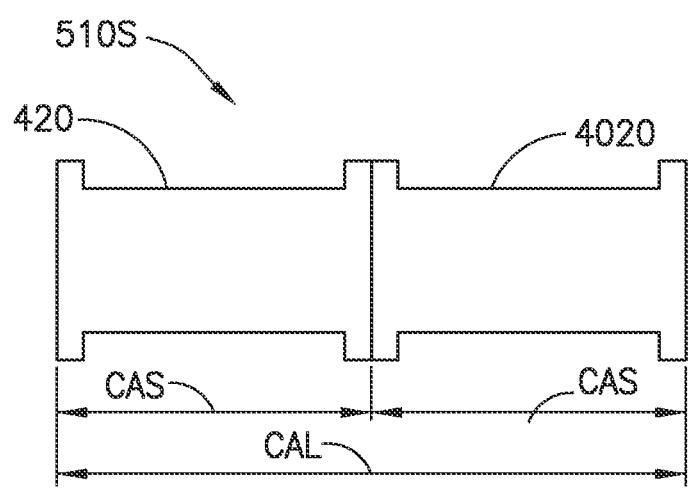
FIG. 40A is a schematic illustration of a segmented arm section in accordance with aspects of the present disclosure.

In other aspects, referring to FIG. 40A, one or more of the central arm sections 510A, 510B may be a segmented arm section 510S, where each segment 4020 has a fixed length CAS and are coupled to each other in an abutting manner (e.g., end to end) so that when coupled together end to end the segments have the length CAL of the central arm section 510A, 510B. In one aspect, the fixed length CAS of the different segments 4020 may be the same, while in other aspects the fixed lengths of the segments 4020 may be different. In still other aspects, referring to FIG. 45 one or more of the central arm sections 510A, 510B may be a multiple case module 4500, each multiple case module 4500 having first and second frame members 4501, 4502 (each of which may be substantially similar to the frames 510F, 510F', 510F" described herein) that are arranged side-by-side and extend between and couple respective end couplings 511, 512, 513, 514. Here, the cables of the transmission systems may extend within respective first and second frame members 4501, 4502. In this aspect, the first and second frame members 4501, 4501 may be separately coupled to the respective end couplings 511, 512, 513, 514 (e.g., the coupling of frame member 4501 to end coupling 511 is independent of the coupling of frame member 4502 to end coupling 512); while in other aspects, the frame members 4501, 4502 may be coupled to end plates 4030 where the end plates 4030 effect coupling of the frame members 4501, 4502 to the respective end couplings 513, 514.

The different length central arm sections 510A, 510B, 510A1-510An, 510B1-510Bn may be manufactured in any suitable manner from any suitable material as noted herein. For example, the at least one interchangeable central arm section 510A, 510B and each of the number of different interchangeable central arm sections 510A1-510An, 510B1-510Bn have a box shape cross section 598 corresponding thereto, and the predetermined characteristic is that the interchangeable central arm section 510A, 510B and each of the number of different interchangeable central arm sections 510A1-510An, 510B1-510Bn have a different corresponding length CAL, CAL1-CALn.

The box shaped cross section 598 provides for a tubular shape of the tube frame 510F and facilitates the manufacturing of the central arm sections 510A, 510B, 510A1-510An, 510B1-510Bn with lower cost and/or high volume manufacturing methods. For example, the central arm sections 510A, 510B, 510A1-510An, 510B1-510Bn may be manufactured by extrusion or casting (e.g., so as to form an extrusion member with a box shaped cross section 598) which reduces machining requirements (e.g., compared to conventional arm links which are machined from billets of material). Other manufacturing methods that may be employed include but are not limited to additive manufacturing, conventional machining, folded and welded sheet metal, forging, and injection molding. The tubular form of the tube frame 510F, which may be achieved through the above-noted manufacturing process, effects an extrusion member with a monolithic box section 598 that is significantly stiffer when compared to the conventionally machined arm links noted above. The stiffer box shaped cross section 598 provides for longer arm lengths and manufacture of the tube frame 510F with thinner side walls 510W than would otherwise be achieved with conventionally machined arm links, which reduces weight of the arm links and provides for increased operating speeds of the substrate transport apparatus 130.

Figure 46:
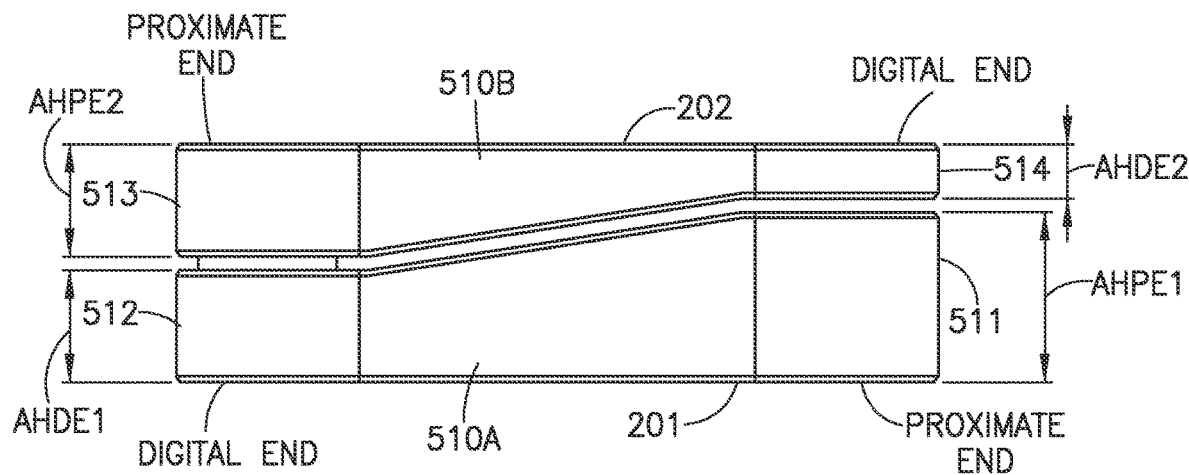
FIG. 46 is a schematic perspective illustration of a portion of a substrate transport apparatus in accordance with aspects of the present disclosure.
Figure 47:
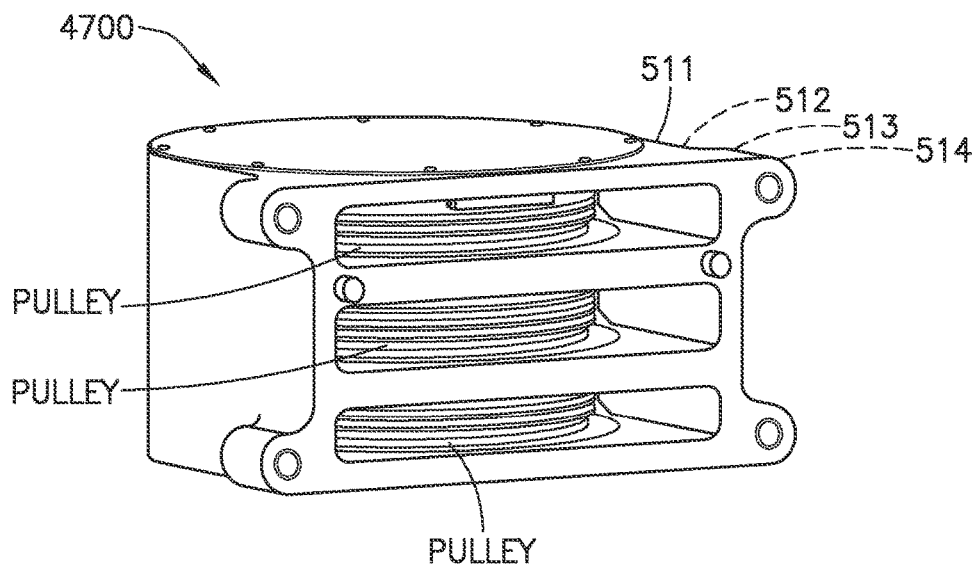
FIG. 47 is a schematic perspective illustration of a portion of a substrate transport apparatus in accordance with aspects of the present disclosure.

In one aspect, the corresponding box shape cross section 598 is sized and shaped commensurate to the different corresponding lengths CAL, CAL1-CALn so as to maintain a predetermined stiffness (end to end) for each different interchangeable central arm section 510A, 510A1-510An, 510B, 510B1-510Bn. In another aspect, the corresponding box shape cross section 598 is sized and shaped commensurate to the different corresponding length CAL, CAL1-CALn so as to maintain a predetermined stiffness (end to end) for each different selectable predetermined arm link length OAL, OALn. For example, with respect to the predetermined stiffnesses, as the length CAL, CAL1-CALn of the central arm section 510A, 510A1-510An, 510B, 510B1-510Bn increases the thickness THK (FIG. 5E) of one or more of the walls 510W of the box shaped cross section 598 may also increase. In other aspects, the thickness THK of one or more of the walls 510W may be tapered along the respective length CAL, CAL1-CALn with the wall being thickest at a proximate end of the arm link (relative to the shoulder axis SX) and thinnest at a distal end of the arm link (relative to the shoulder axis SX; e.g., considering the arm link 202, the wall thickness may be greatest adjacent the elbow axis AX and thinnest adjacent the wrist axis WX). In other aspect, stiffening ribs may be formed in the box shaped cross section 598 during, for example, extrusion of the box shaped cross section 598. In other aspects, referring also to FIG. 46, the central arm sections 510A, 510B may have a tapered length where a respective proximate end (e.g., a supported end) of the central arm section 510A, 510B has a height AHPE1, AHPE2 that is greater than a height AHDE1, AHDE2 of a respective distal end (e.g., a free or unsupported end) of the respective central arm section 510A, 510B. The tapered lengths as illustrated in FIG. 46 may maintain a predetermined stiffness of the arm links while reducing weight of the arm links, which may provide for increased operational speeds of the substrate transport apparatus 130. In other aspects, the box shape cross section 598 may be sized and shaped in any suitable manner that is commensurate to the different corresponding lengths CAL, CAL1-CALn so as to maintain a predetermined stiffness (end to end) for each different interchangeable central arm section 510A, 510A1-510An, 510B, 510B1-510Bn.

Figure 48:
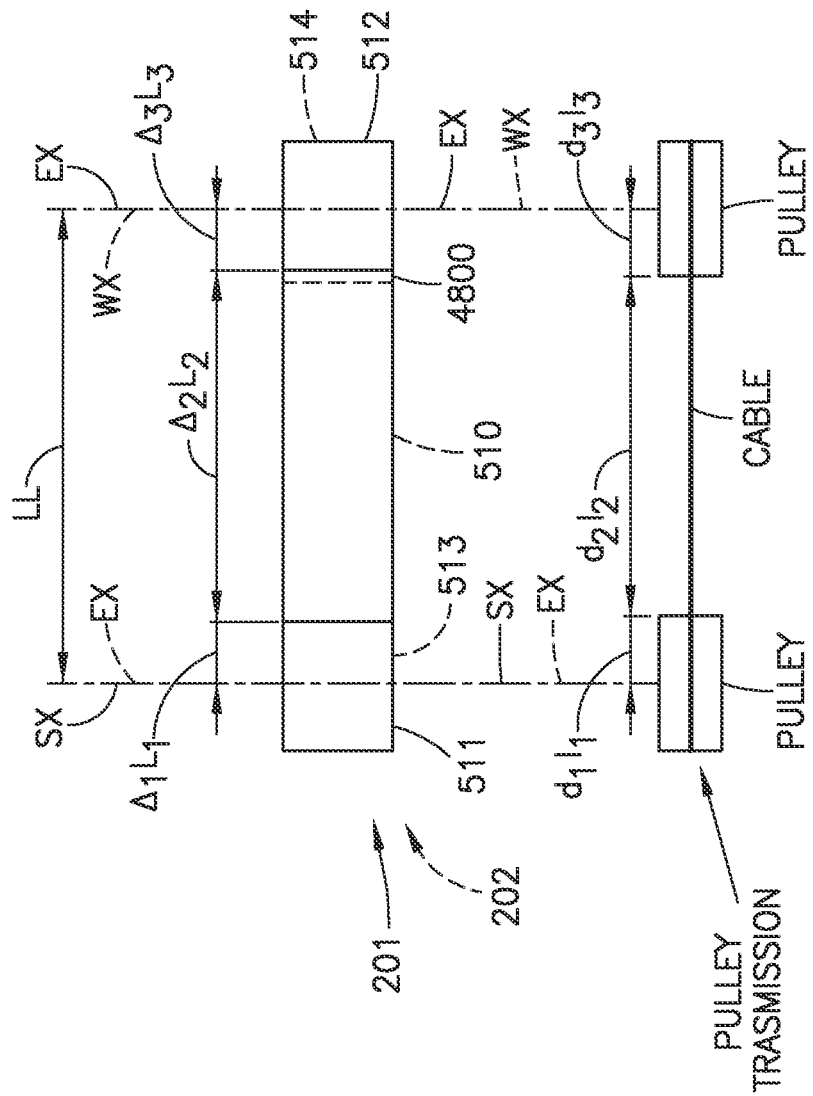
FIG. 48 is a schematic illustration of thermal expansion of substrate transport arm link components in accordance with aspects of the present disclosure.

In one aspect, the central arm sections 510A, 510B, 510A1-510An, 510B1-510Bn may be manufactured out of the same material as used for (or have the same coefficient of thermal expansion as) the arm link transmission cables (described herein), such as aluminum, stainless steel, Inconel or other metallic alloys, or any other suitable material as noted herein (noting that the use of stainless steel may be prohibitive in conventional arm links manufactured from billet due to cost and weight). Manufacturing the central arm sections 510A, 510B, 510A1-510An, 510B1-510Bn from the same material as the motion transmission hardware (e.g., cables, bands, pulleys, etc.) provides for the same coefficient of thermal expansion between components increasing the accuracy of pick/place movements of the substrate transport apparatus 130. In one aspect, the central arm sections 510A, 510A1-510An, 510B, 510B1-510Bn are made of a material that is the same as (or has the same coefficient of thermal expansion as) a material of one or both of the end couplings 511, 512, 513, 514; while in other aspects, the central arm sections 510A, 510A1-510An, 510B, 510B1-510Bn are made of a material different from a material of one or both of the end couplings 511, 512, 513, 514. In one aspect, the central arm sections 510A, 510B, 510A1-510An, 510B1-510Bn, the end couplings 511, 512, 513, 514, and the motion transmission hardware are made of the same material (or have the same coefficient of thermal expansion). Referring to FIG. 48, the thermal expansion of the arm link components are illustrated where the central arm sections 510A, 510A1-510An, 510B, 510B1-510Bn are generally referred to with reference numeral 510. Here, the materials of the central arm sections 510A, 510B, 510A1-510An, 510B1-510Bn, the end couplings 511, 512, 513, 514, and the motion transmission hardware may be selected so as to maintain the following equation that represents the total change in length due to thermal expansion (and contraction) of the casing components of the arm link and the pulley transmission therein respectively normalized over the length of the arm link:

$$\frac{\sum \Delta_i L_i}{LL} = \frac{\sum d_j \ell_j}{LL} \quad [1]$$

where, i is a whole number that represents the movable arm link segment casing component (e.g., in FIG. 48 i=1 represents end coupling 511 (or 513), i=2 represents central arm section 510, i=3 represents end coupling 512 (or 514)), j is a whole number that represents the motion transmission hardware component (e.g., in FIG. 48 j=1 represents the first pulley, j=2 represents the cable, j=3 represents the second pulley), L is a length for a respective arm link component, l is the a length (in the case of cables) or a radius (in the case of pulleys) of a respective motion transmission hardware component, LL is the length of the arm link from joint center to joint center, and the symbols $\Delta$ and d denote a "change" in a corresponding length L, l due to thermal expansion (and contraction). In one aspect, $\Delta_i L_i = d_j l_j$ for each corresponding component respectively of the casing and pulley transmission (i.e., i=j and $L_i = l_j$) and is substantially satisfied by matching thermal expansion (and contraction) of a respective casing component (i) with a corresponding pulley transmission component (j) therein. However, in a different aspect where at least one casing component has a thermal expansion (and contraction) that differs from the corresponding pulley transmission component (e.g., $\Delta_i L_i > d_j l_j$) any suitable thermal expansion compensating insert 4800

(made of any suitable material such as ceramic, composites, metals, polymers, etc.) having a coefficient of thermal expansion that compensates for (e.g., may be substantially dimensionally invariant over large thermal changes or otherwise may be deemed to have a negligible thermal expansion coefficient) the difference between $\Delta_i L_i$ and $d_j l_j$ may be provided between one or more of the movable arm link segment casing components (and of sufficient length) so that equation [1] above is maintained. Such thermal expansion compensating inserts 4800 may also be modular, fastened to casing components as previously described, or may be formed integrally with, for example, formation of the central arm section 510A, 510B of a desired length.

In one aspect, the material of the at least one interchangeable central arm section 510A, 510B, and each of the number of different interchangeable central arm sections 510A1-510An, 510B1-510Bn has a higher stiffness (spring modulus) than the material of the end couplings 511, 512, 513, 514. In one aspect, the material of the at least one interchangeable central arm section 510A, 510B and each of the number of different interchangeable central arm sections 510A1-510An, 510B1-510Bn has a stiffness commensurate with a material stiffness of a pulley transmission 490, 492, 493, 494, 495 of a respective pulley system 655A-655E (FIG. 4).

As may be realized, the modular arm link configuration also simplifies manufacture of the arm link ends. For example, with conventional arm links, the ends of the arm links to which the arm pulleys and pulley shafts are coupled are machined from a billet of material with the central part of the arm as a unit. In accordance with the aspects of the present disclosure, the modular form of the arm links provides for separate manufacturing techniques to be employed for the end couplings 511, 512, 513, 514 and the central arm sections 510A, 510B, 510A1-510An, 510B1-510Bn. For example, while the central arm sections 510A, 510B, 510A1-510An, 510B1-510Bn may be extruded (or manufactured with other methods as noted herein), the end couplings 511, 512, 513, 514 may be manufactured by casting, forging, additive manufacturing, conventional machining, and injection molding so that the end couplings 511, 512, 513, 514 are cast or forged in near net shape (i.e., the initial production of an end coupling is very close to the final (net) shape of the end coupling, reducing the need for surface finishing) so as to reduce machining of and cost of the end couplings 511, 512, 513, 514, which in turn reduces overall costs of the substrate transport apparatus 130. In some aspects, the end couplings 511, 512, 513, 514 may be provided as a pre-assembled/manufactured arm joint 4700 where at least a portion of one transmission member (such as at least a pulley of one or more of transmission members 490, 492, 493, 494, 495) is preinstalled in the pre-assembled arm joint 4700. Pre-assembling the arm joints 4700 may reduce manufacturing costs and reduce lead time for transport arm assembly.

Figure 37:
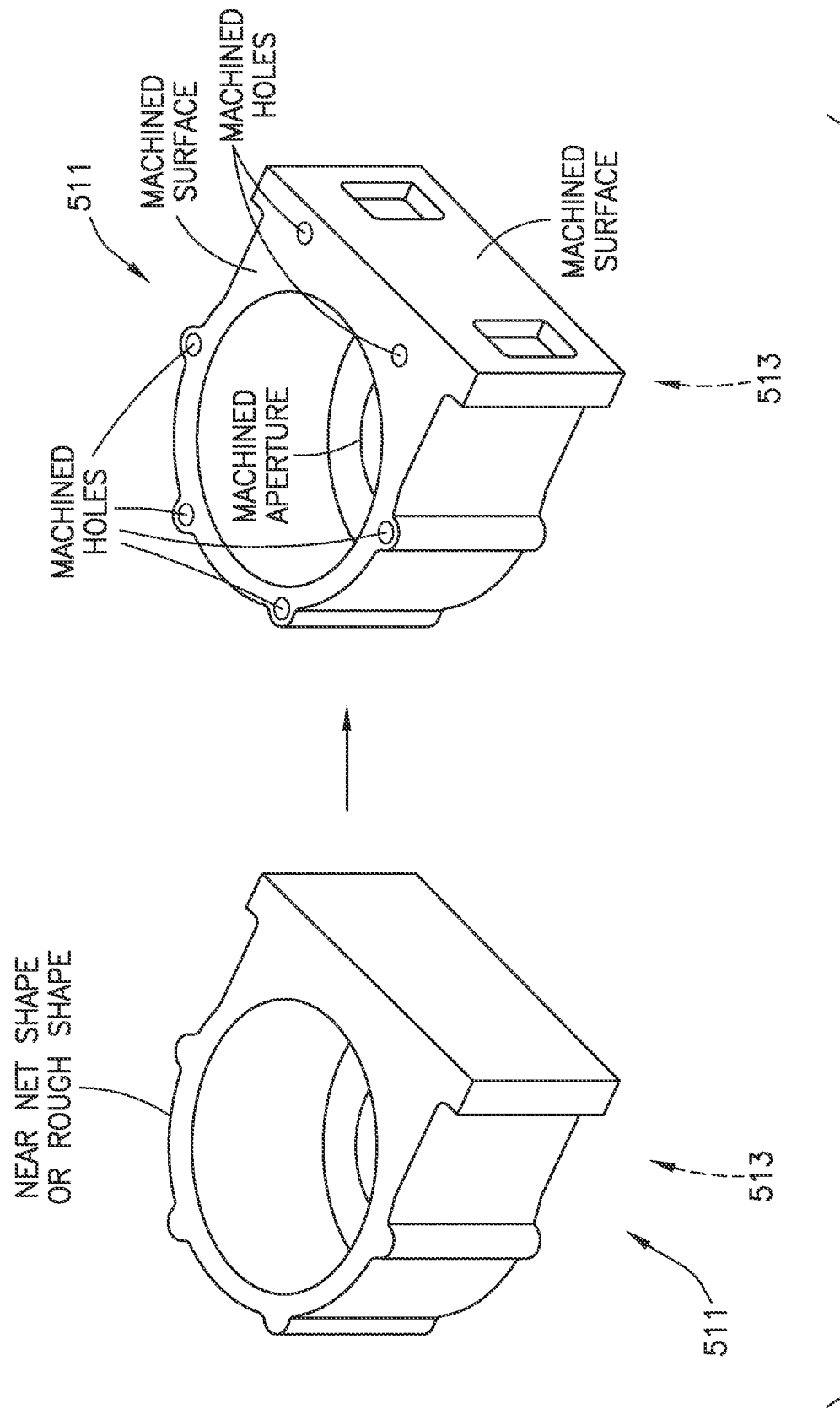
FIG. 37 is a schematic comparative illustration of an as formed end coupling and a finished end coupling in accordance with aspects of the present disclosure.
Figure 38:
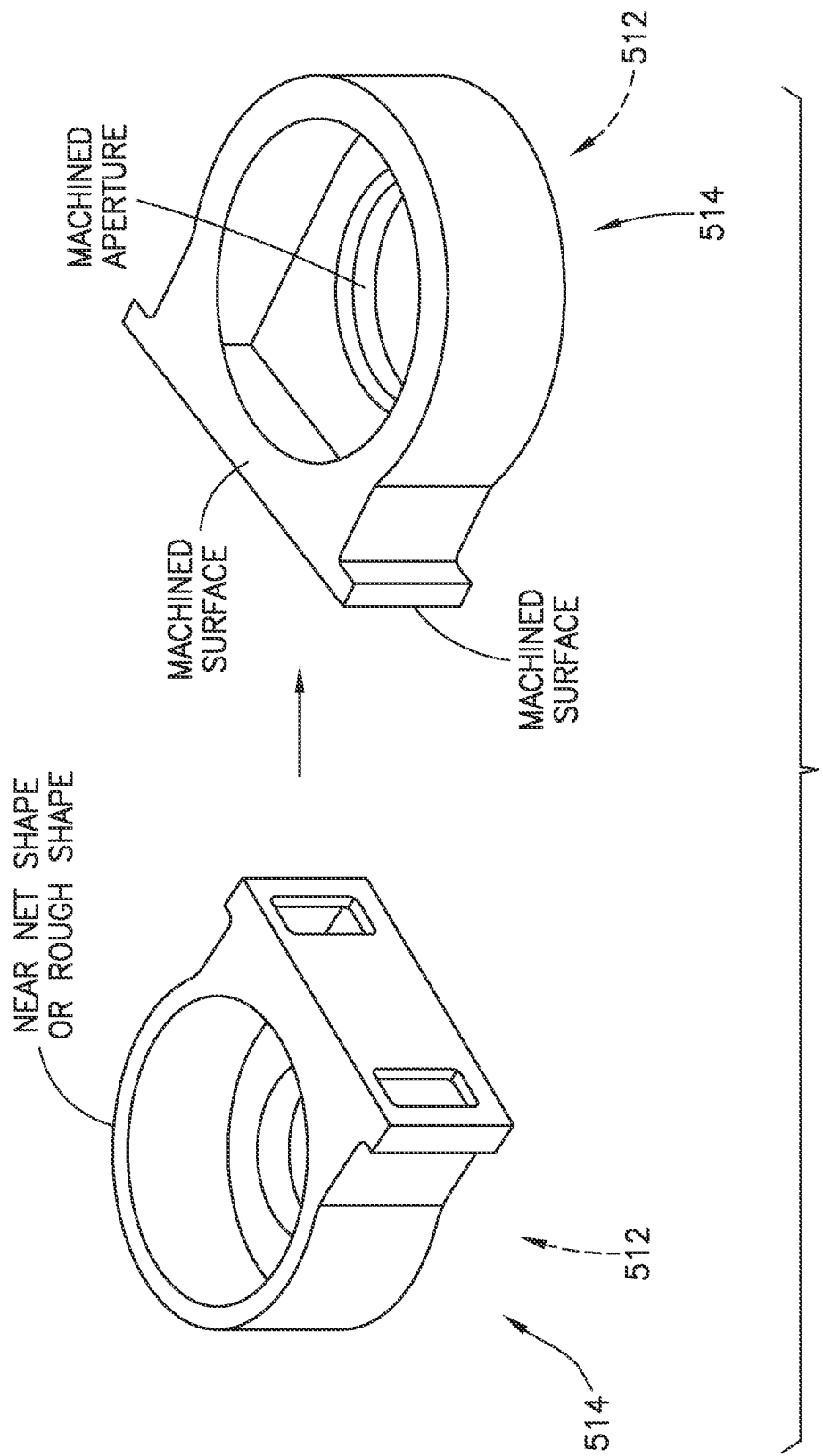
FIG. 38 is a schematic comparative illustration of another as formed end coupling and a finished end coupling in accordance with aspects of the present disclosure.
Figure 39:
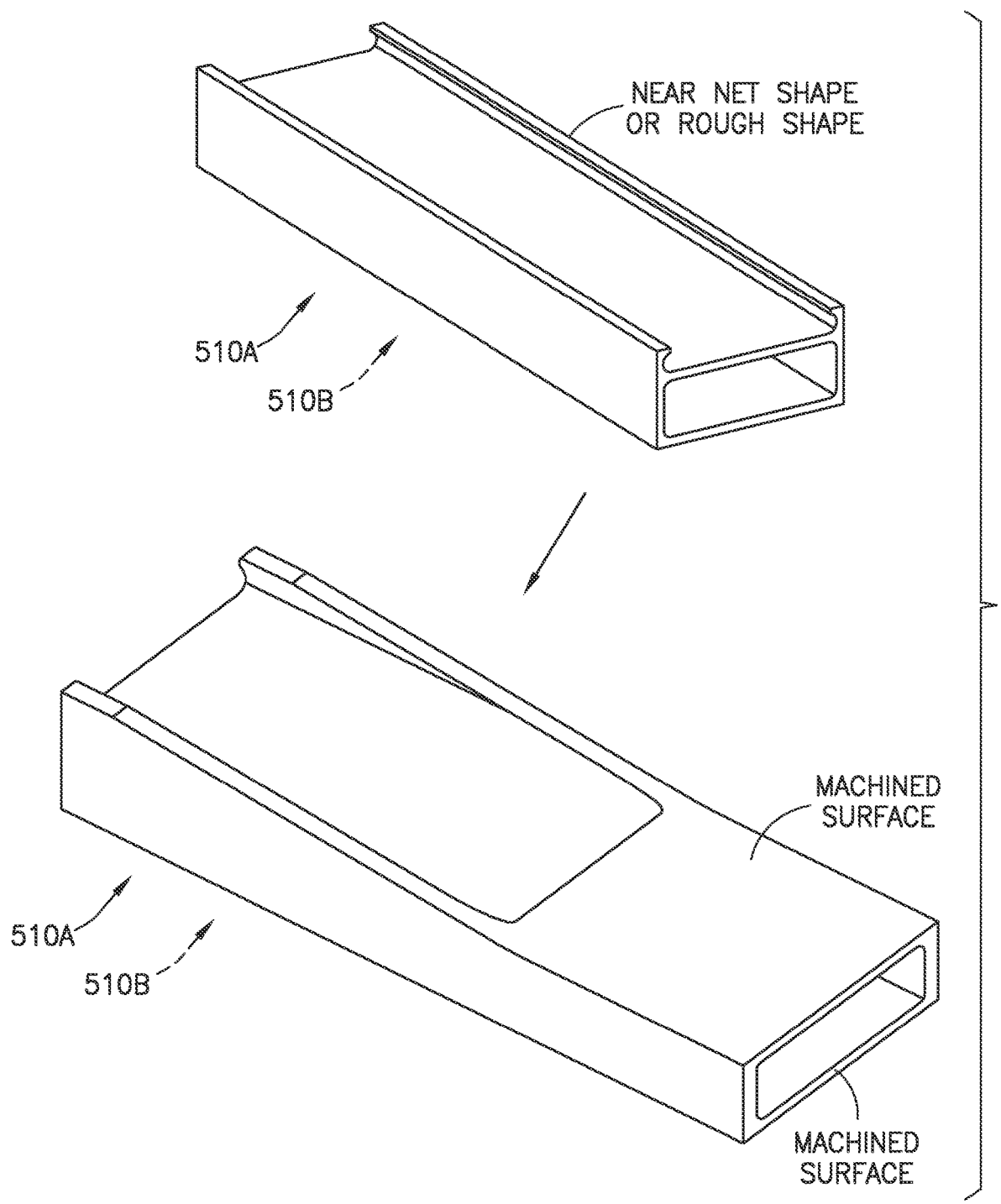
FIG. 39 is a schematic comparative illustration of an as formed central arm section and a finished central arm section in accordance with aspects of the present disclosure.

In one aspect, one or more of the central arm section 510A, 510B, 510A1-510An, 510B1-510Bn and the end couplings 511, 512, 513, 514 may be constructed of metallic components such as, for example, one or more of aluminum, stainless steel, Inconel or other metallic alloys, or any other suitable material. In other aspects, one or more of the central arm section 510A, 510B, 510A1-510An, 510B1-510Bn and the end couplings 511, 512, 513, 514 may be constructed of any suitable material including non-metallic materials including, but not limited to, ceramics, polymers, composites, and carbon fiber. As described herein, one or more of the central arm section 510A, 510B, 510A1-510An, 510B1-510Bn and the end couplings 511, 512, 513, 514 may be constructed using high-volume manufacturing methods (e.g., molding, casting, forging, extruded, etc.) in one or more of the near net shape or a rough shape (which requires more extensive secondary machining operations than near net shape casting, forging, molding, etc.), noting that an interior of the one or more of the central arm section 510A, 510B, 510A1-510An, 510B1-510Bn and the end couplings 511, 512, 513, 514 may be forged, cast, etc. to near net shape while an exterior is forged, cast, etc. to a rough shape. The secondary machining operations may include, but are not limited to conventional machining, cutting, grinding, electromagnetic discharge machining, etc. Examples, of arm components that have both as formed (e.g., cast, forged, extruded, etc.) surface(s) and machined surface(s)/features are illustrated in FIGS. 37-39. It is noted that in FIGS. 37-39 the secondarily machined surfaces/features are shown as "shaded" (e.g., darkened areas) while the as formed (non-machined) surfaces/features are not shaded. FIG. 37 illustrates an end coupling 511, 513 as formed (e.g., in near net shape or rough shaped) and a corresponding finished end coupling 511, 513 with machined (using methods as noted herein) surfaces/features. FIG. 38 illustrates an end coupling 512, 514 as formed (e.g., in near net shape or rough shaped) and a corresponding finished end coupling 512, 514 with machined (using methods as noted herein) surfaces/features. FIG. 39 illustrates a central arm section 510A, 510B as formed (e.g., in near net shape or rough shaped) and a corresponding finished central arm section 510A, 510B with machined (using methods as noted herein) surfaces/features.

As can be seen in FIGS. 5A, 5B, and 5C, each of the upper arm link 201 and forearm link 202 has a respective height AH. In one aspect, the height AH1 of the forearm link 202 may be less than the height AH2 of the upper arm link 201 (or vice versa), while in other aspects the height AH1 of the forearm link 202 may be substantially the same as the height AH2 of the upper arm link 201. In one aspect, the respective heights AH1, AH2 may depend on a number of transmission members disposed in the arm (see for example FIG. 4 where the upper arm link 201 includes three sets of transmission members 490, 492, 494 and the forearm link 202 includes two sets of transmission members 493, 495). As may be realized, where the heights of the upper arm link 201 and the forearm link 202 are different the end couplings 513, 514 and central arm section(s) 510B of the forearm link 202 may not be interchangeable with the end couplings 511, 512 and the central arm section(s) 510A of the upper arm link 201.

Referring again to FIGS. 1A and 2A-2D, in one aspect the at least one end effector link 203, 204 (also referred to herein as a substrate holder) comprises two dual (ended) substrate holders 203, 204; however, in other aspects, as described herein, the at least one substrate holder may have any suitable configuration. The dual substrate holders 203, 204 are separate and distinct from each other. Each of the dual substrate holders 203, 204 is rotatably and separately joined to a joint at a common end of the forearm link 202 so that each end substrate holder 203, 204 rotates relative to the forearm link 202 about the joint, or a common axis of rotation formed thereby (see, e.g., the wrist axis or joint WX). Each of the dual substrate holders 203, 204 has a corresponding at least one substrate holding station 203H1, 203H2, 204H1, 204H2 dependent therefrom, and extending from the joint so that the more than one substrate holders 203, 204 are juxtaposed along a common plane 499 (see FIGS. 2D, 4, 10, and 11) with respect to each other. The common plane 499 is determined by at least three of the substrate holding stations 203H1, 203H2, 204H1, 204H2 of more than one substrate holders 203, 204, where two substrate holding stations (e.g., substrate holding stations 203H1, 203H2 or 204H1, 204H2) of the at least three substrate holding stations 203H1, 203H2, 204H1, 204H2, correspond to a common substrate holder 203, 204 of the more than substrate holders 203, 204. As described herein, the two substrate holding stations (e.g., substrate holding stations 203H1, 203H2 or 204H1, 204H2) are disposed one each at opposite ends of the common substrate holder 203, 204.

The corresponding at least one substrate holding station 203H1, 203H2, 204H1, 204H2 dependent from at least one substrate holder 203, 204 includes one substrate holding station 203H1, 203H2, 204H1, 204H2 at opposite ends of the at least one substrate holder 203, 204. The at least one substrate holder 203, 204 being substantially rigid and unarticulated between the opposite ends, and the substrate holding station 203H1, 203H2, 204H1, 204H2 at one of the opposite ends is substantially coplanar with the corresponding at least one substrate holding station 203H1, 203H2, 204H1, 204H2 of each other separate and distinct substrate holder 203, 204. In one aspect, the substrate holding station (see substrate holding stations 203H1, 203H2 of substrate holder 203 and substrate holding stations 204H1, 204H2 of substrate holder 204) at opposite ends of the at least one substrate holder 203, 204 are substantially coplanar with each other. In other aspects, the substrate holding station (see substrate holding stations 203H1, 203H2 or 204H1, 204H2) at opposite ends of the at least one substrate holder (see one of substrate holder 203 or 204) are substantially coplanar with the corresponding at least one substrate holding station (see the other of substrate holding stations 203H1, 203H2 or 204H1, 204H2) of each other separate and distinct end effector link (see the other of substrate holder 203 or 204). In still other aspects, the corresponding at least one substrate holding station (see substrate holding stations 203H1, 203H2, 204H1, 204H2) of each separate and distinct substrate holder (see each of substrate holders 203, 204) includes one substrate holding station at opposite ends of the at least one substrate holder 203, 204, and each of the separate and distinct substrate holders 203, 204 is substantially rigid and unarticulated between opposite ends.

Referring still to FIGS. 2A-2D the dual substrate holders 203, 204 will be described in greater detail. For example, in one aspect, each of the dual substrate holders 203, 204 includes a longitudinally extended frame 203F, 204F (FIG. 2A) having respective substrate holding stations 203H1, 203H2, 204H1, 204H2 disposed at opposite longitudinal ends of the frame 203F, 204F. In one aspect, the two substrate holding stations (e.g., substrate holding stations 203H1, 203H2 or 204H1, 204H2) at opposite ends of a common substrate holder are substantially coplanar with each other; while in other aspects the two substrate holders may be in different stacked planes (see, e.g., FIG. 10). As noted above, each plane 499, 499A (see FIGS. 2D, 10, and 11) of the substrate holder planes (as described herein, and whether the substrate holding station(s) 203H1, 203H2, 204H1, 204H2 of the dual sided substrate holders form one or more planes) corresponds with and are aligned to at least one plane(s) (see FIGS. 1B and 1C) of transport openings in a common transport chamber for transfer at a given Z position of transport opening plane, so that substrate transfer through each respective opening on each plane is effected with at least one substrate holding station 203H1, 203H2, 204H1, 204H2 of each dual ended substrate holder 203, 204 substantially without Z axis movement, i.e., extension into the substrate processing stations (for each plane) with the substrate holding station(s) 203H1, 203H2, 204H1, 204H2 at one end of the substrate holders 203, 204, picking and/or placing of substrate(s) at the substrate processing stations, retraction from the substrate processing stations, and extension into each other different substrate processing station with the same or a different dual substrates at the same or different end of the dual ended substrate holders 203, 204 effects (independent of an intervening Z axis movement or decoupled from intervening Z axis movement between substrate transfers) a fast swapping of substrates substantially independent of Z axis movement. Each of the frames 203F, 204F forms a substantially rigid link from respective substrate holding station 203H1, 204H1 to respective substrate holding station 203H2, 204H2 (i.e., the dual ended substrate holders 203, 204 are unarticulated between their respective longitudinally separated substrate holding stations 203H1, 203H2, 204H1, 204H2). Each of the dual ended substrate holders 203, 204 includes an offset mounting protrusion 210, 211 that extends laterally from frame 203F, 204F. The offset mounting protrusion 210, 211 of the dual ended substrate holders 203, 204 is rotatably coupled to the forearm 202 about a wrist axis WX so that each of the dual ended substrate holders 203, 204 rotate independent of each other about the wrist axis WX.

The offset mounting protrusion 210, 211 may have any suitable length that sets or otherwise defines any suitable base pitch BP (between the side-by side substrate holding stations 203H1-204H1 and (such as to be commensurate with the base pitch BP) between the side-by side substrate holding stations 203H2-204H2) and/or any suitable substrate holder offset distance SD of each of the substrate holdings locations 203H1, 203H2, 204H1, 204H2 relative to the wrist axis WX. In one aspect, the base pitch BP may be substantially equal to the pitch D between side-by-side substrate processing stations, such as 190, 191 for example (see FIG. 1A). In other aspects, as described herein automatic wafer centering is effected by varying the base pitch BP (e.g., the distance between the side-by side substrate holding stations 203H1-204H1, 203H2-204H2 may be increased or decreased) to accommodate variances in the pitch D and/or to effect automatic wafer centering for placing wafers at the substrate processing stations 190-197. For example, one or more of the substrate holders 203, 204 may be independently rotated about the wrist axis WX so as to increase or decrease (or otherwise change) a respective offset distance SD and make a corresponding change in the base pitch BP as described herein. In one aspect, the drive section 220 is configured, as described herein, to independently align a corresponding at least one substrate holding station 203H1, 203H2, 204H1, 204H2 of each of the substrate holders 203, 204 relative to the corresponding substrate holding station(s) 203H1, 203H2, 204H1, 204H2 of another of the substrate holders 203, 204.

Figure 2B:
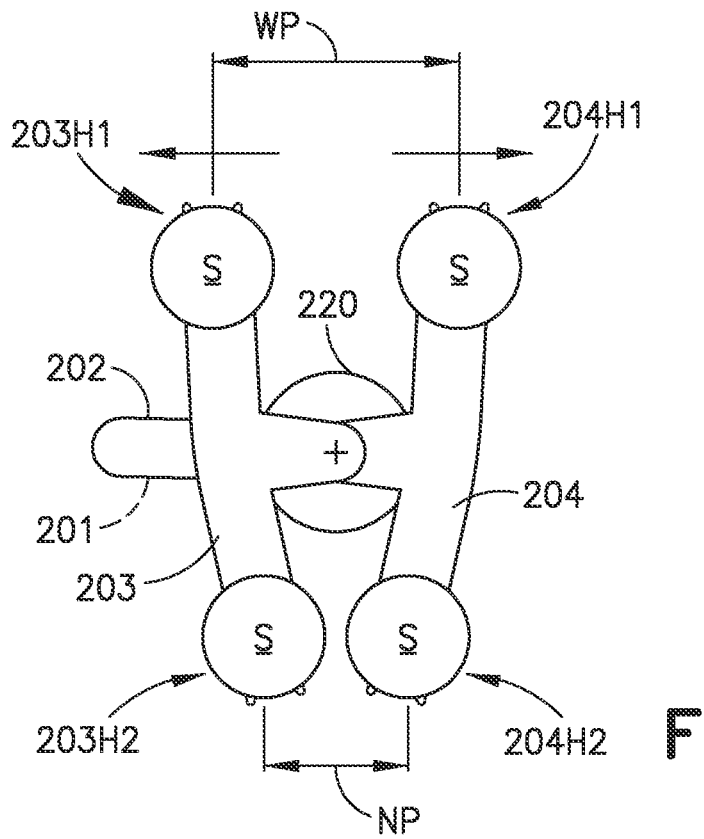
Figure 2C:
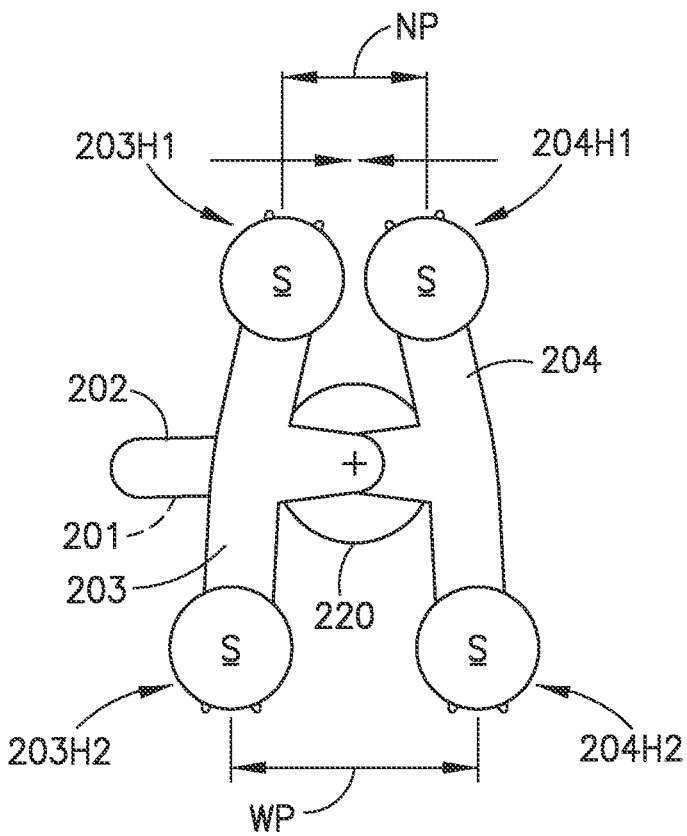
Figure 2D:
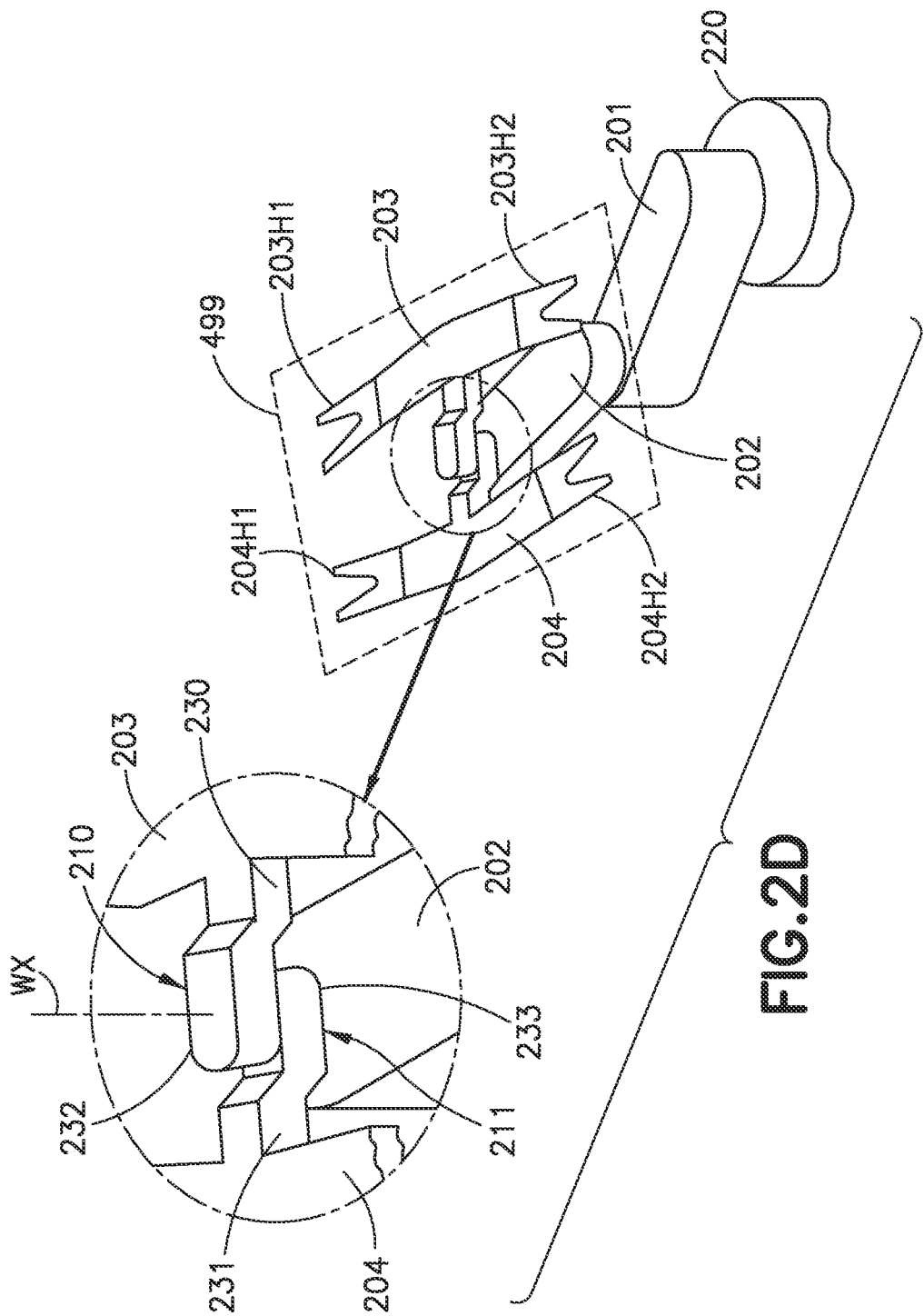

The dual ended substrate holders 203, 204 are configured in any suitable manner so that the substrate holding stations 203H1, 203H2, 204H1, 204H2 are disposed in a common plane 499 (see FIGS. 2D and 4). For example, the offset mounting protrusions 210, 211 may each include a first portion 230, 231 that is substantially coplanar with a respective frame 203F, 204F. The offset mounting protrusions 210, 211 may each include a second portion 232, 233 that is offset so as to extend outside of a plane define by the respective frame 203F, 204F. The offset of the second portions 232, 233 is such that the substrate holding stations 203H1, 203H2, 204H1, 204H2 are disposed in the common plane 499 when the second portions are stacked one above the other (see FIG. 2D) and rotatably coupled to the forearm 202 about the wrist axis WX.

The dual substrate holders 203, 204 are disposed so that radial extension and retraction of the arm 131 effects substantially simultaneous extension and retraction of the corresponding at least one substrate holding station 203H1, 203H2, 204H1, 204H2 of each substrate holder 203, 204 through respective separate openings (see slot valves SV) in a transport chamber wall 125W (FIG. 1A) that are juxtaposed with respect to each other at a substantially common level (see the one or more wafer/substrate resting planes WRP in FIGS. 1B and 1C). In other aspects, the substrate holders 203, 204 may extend through openings in the transport chamber wall that are stacked in different planes.

Figure 7B:
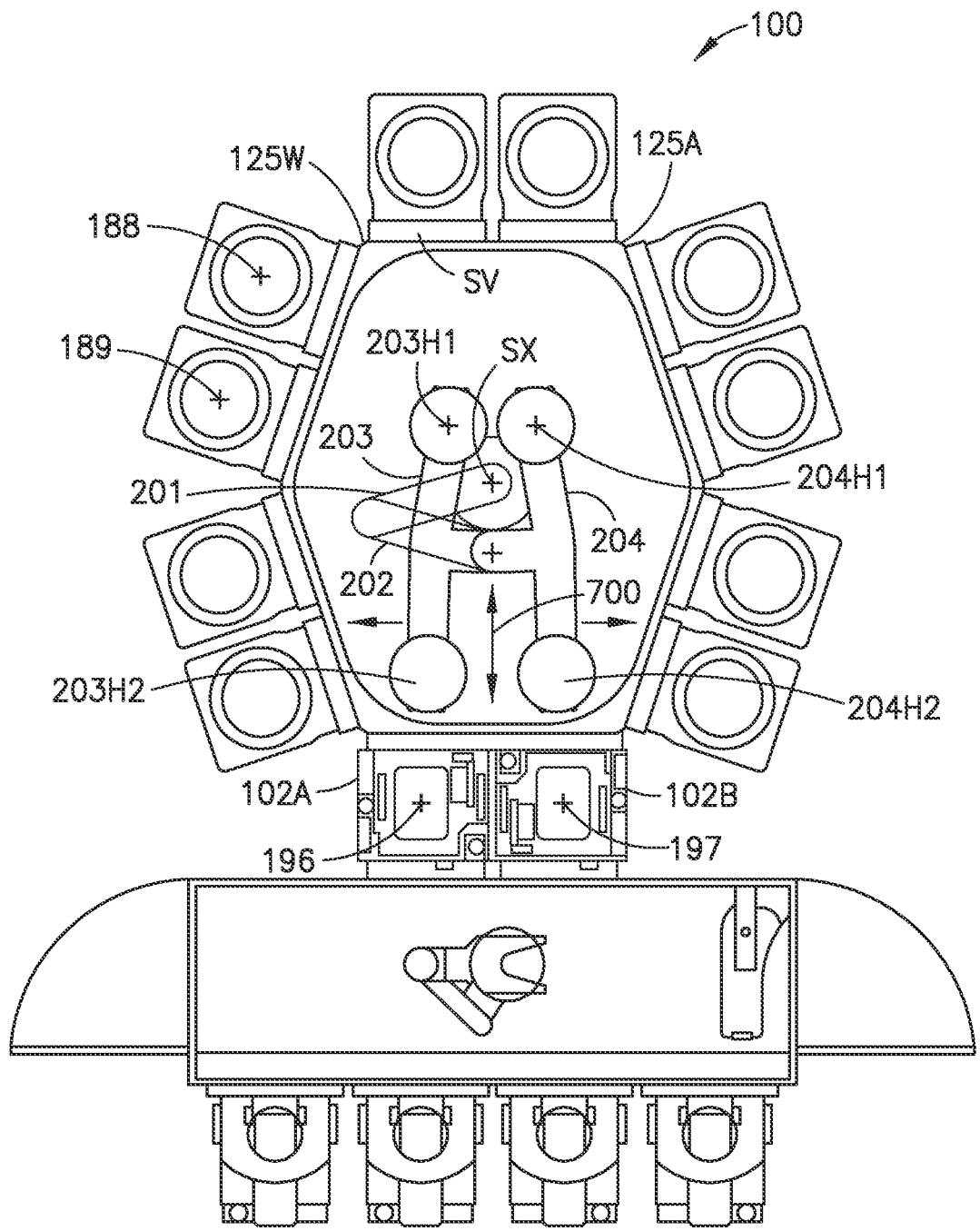
Figure 7C:
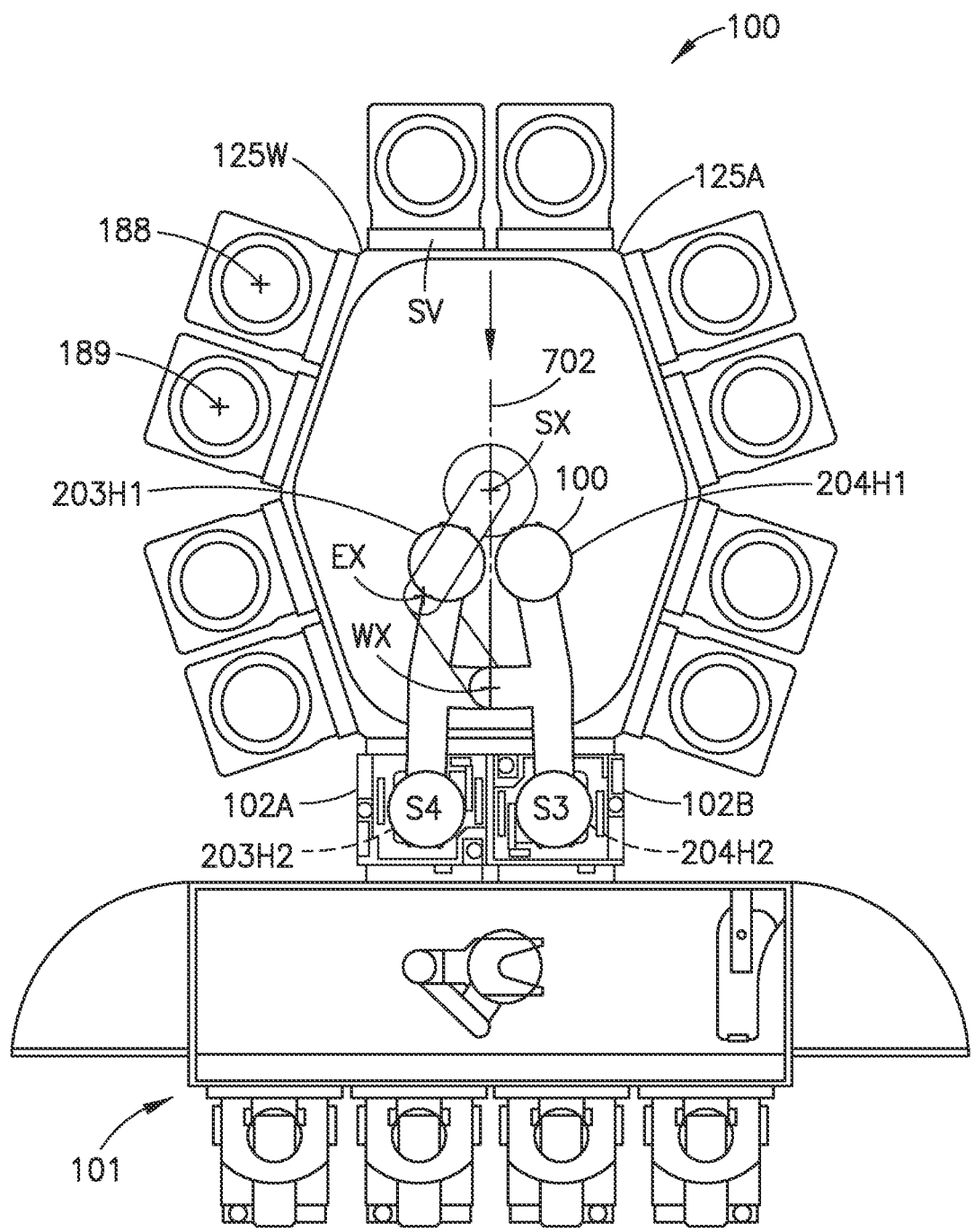
Figure 7D:
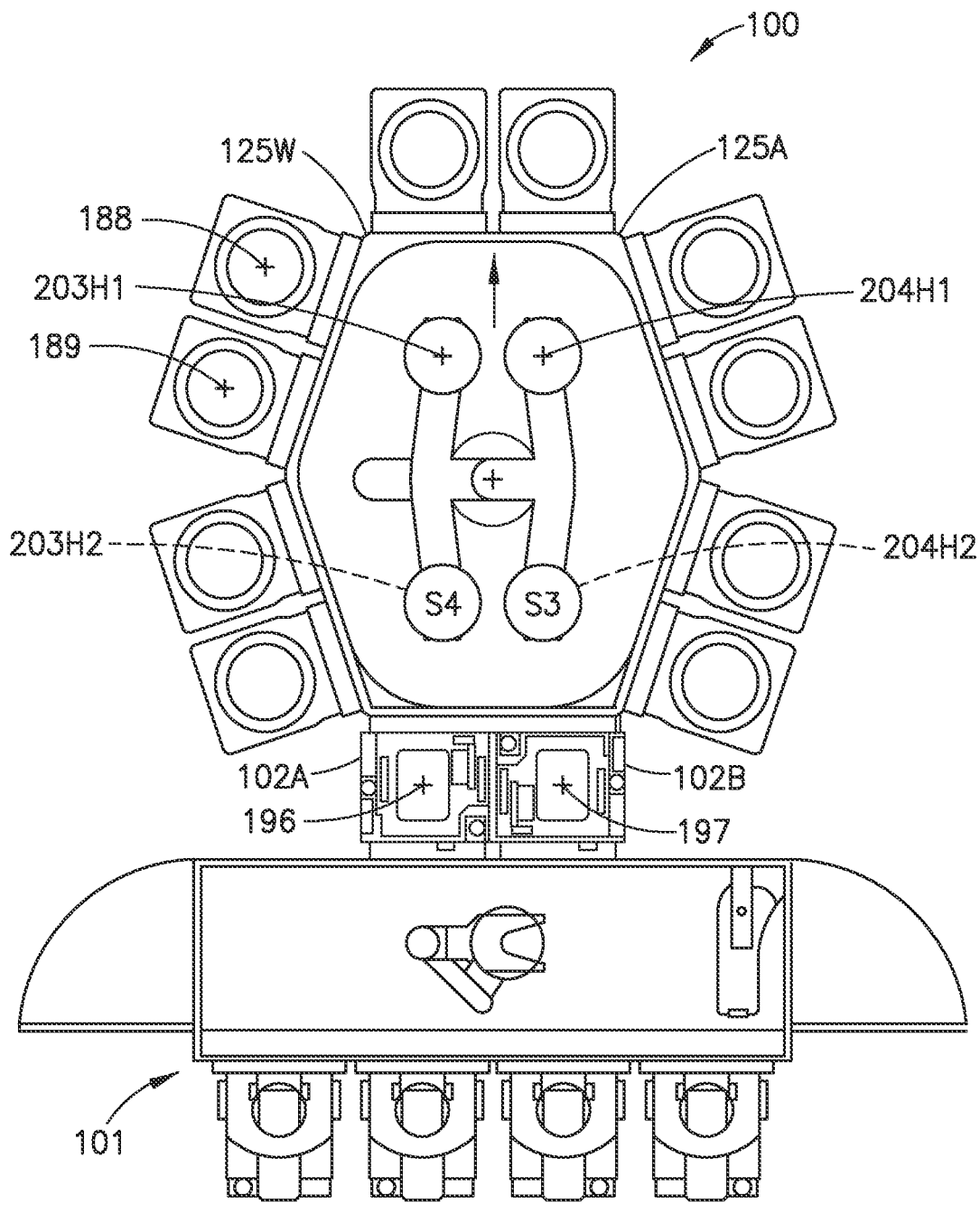

Referring now to FIG. 2A-3A, an exemplary drive section 220 is shown in accordance with aspects of the present disclosure. In one aspect, the drive section 220 is configured to extend (and retract) the arm 131 in a radial extension where movement of the wrist axis WX is maintained along an axis or path of radial extension/retraction 700 that extends through the shoulder axis SX (FIG. 7B) so that the substrate holding stations 203H1, 203H2, 204H1, 204H2 (that are offset from the radial axis) pick and place substrates S from the side-by-side substrate processing stations. In another aspect, the drive section 220 is configured to extend (and retract) the arm 131 in a non-radial extension where movement of the wrist travels along a path 701 (FIG. 7F) that is offset and/or angled from the axis of radial extension/retraction 700 (i.e., the path 701 does not pass through or radiate from the shoulder axis SX—it is noted that FIG. 7C illustrates a radial path of extension 702 where the wrist axis WX moves along a path of movement that extends through or radiates from the shoulder axis SX). In still other aspects, the drive section 220 is configured to extend the arm along both radial and non-radial paths (see FIGS. 7A-7L).

In one aspect the drive may have a coaxial drive arrangement, while in other aspects the drive section may have any suitable drive arrangement including but not limited to side-by-side motors, harmonic drives, switched or variable reluctance motors, etc. Suitable examples of drive section arrangements are described in U.S. Pat. Nos. 6,485,250; 5,720,590; 5,899,658; 5,813,823; 8,283,813; 8,918,203; and 9,186,799, the disclosures of which are incorporated by reference herein in their entireties. In this aspect, the drive section 220 includes a housing 310 for at least partially housing a quad-coaxial drive shaft assembly 300 (see also FIG. 4) having four drive shafts 301-304 and four motors 342, 344, 346, 348 (e.g. a four-degree of freedom motor). In other aspects of the present disclosure the drive section 220 may have any suitable number of drive shafts and motors, such as for example, two or three coaxial motors or more than four coaxial motors and associated drive shafts. The drive section 220 may also include a Z-axis drive 312 configured to, e.g., raise and lower the arm 131 for picking and placing substrates S; however, in other aspects the substrate processing stations coupled to the transfer chamber in which the arm 131 is located may include Z-axis drives for lifting and lowering the substrates from and to the arm 131 in lieu of or in addition to the Z-drive axis 312 of the drive section 220.

In one aspect, the drive section 220 is a multi-axis drive section that defines an independent degree of freedom for at least one substrate holder 203, 204 relative to the other substrate holder 203, 204; while in other aspects there is an independent degree of freedom for at least one substrate holder of multiple substrate holders; while in still other aspects, there is an independent degree of freedom for each substrate holder. The independent degree of freedom for each substrate holder 203, 204 enables independent automatic wafer centering at the corresponding at least one substrate holding station 203H1, 203H2, 2034H1, 204H2 of each one of the dual substrate holders 203, 204. In one aspect, the drive section 220 is a multi-axis drive section configured to effect independent automatic wafer centering at the corresponding at least one substrate holding station 203H1, 203H2, 2034H1, 204H2 of each one of the dual substrate holders 203, 204 substantially coincident with substantially simultaneous extension of the corresponding at least one substrate holding station 203H1, 203H2, 2034H1, 204H2 of each of the dual substrate holders 203, 204 through respective separate openings (see slot valves SV) in the transport chamber wall 125W.

Figure 3:
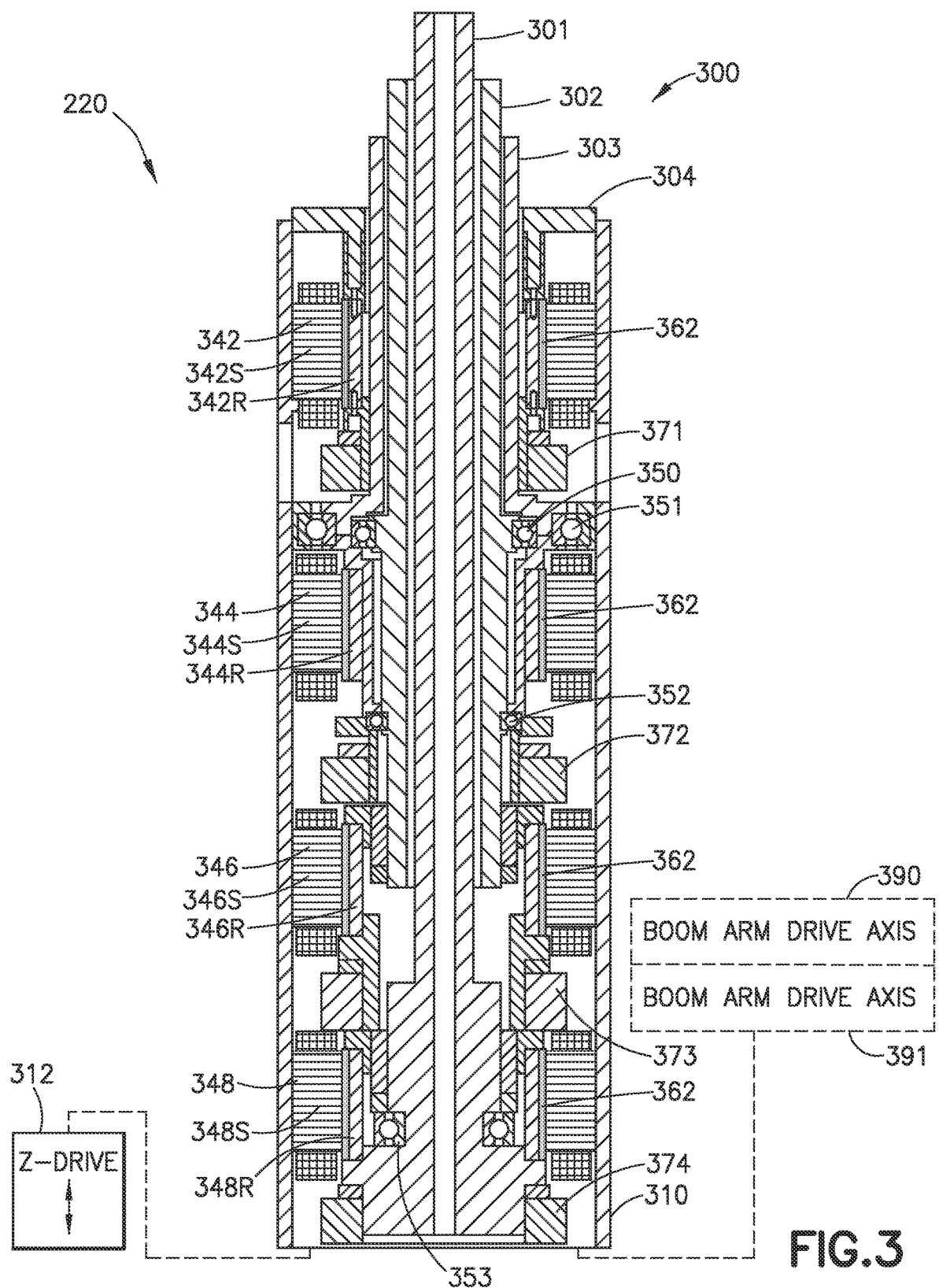
FIG. 3 is a schematic cross-sectional illustration of an exemplary drive section of a substrate transport apparatus in accordance with aspects of the present disclosure.
Figure 3A:
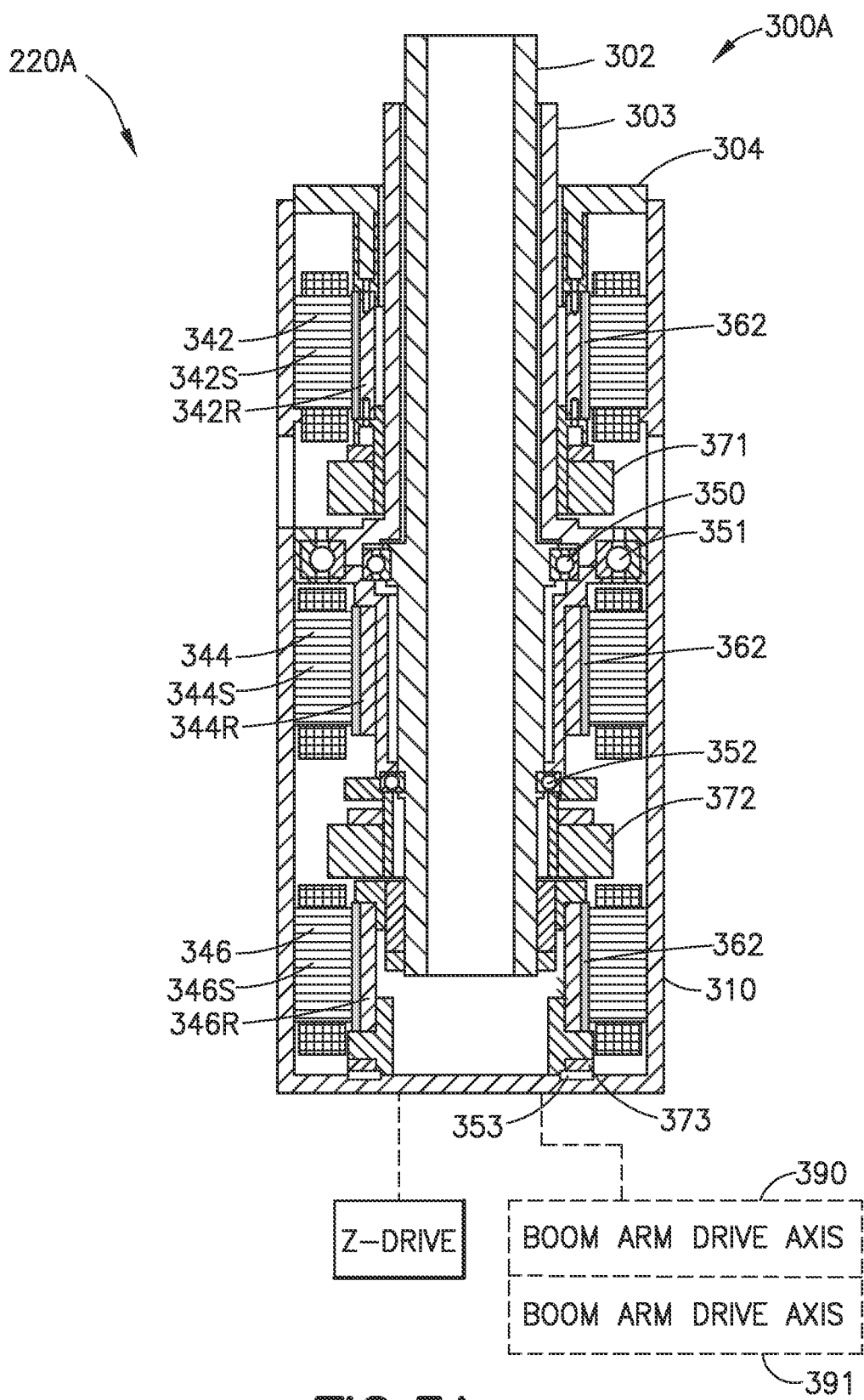
FIG. 3A is a schematic cross-sectional illustration of an exemplary drive section of a substrate transport apparatus in accordance with aspects of the present disclosure.

Referring to FIG. 3A, the drive section includes at least motors 342, 344, 346, 348. The first motor 342 of the drive section 220 includes a stator 342S and a rotor 342R connected to the outer shaft 304. The second motor 344 includes a stator 344S and a rotor 344R connected to shaft 303. The third motor 346 includes a stator 346S and a rotor 346R connected to shaft 302. The fourth motor 348 includes a stator 348S and a rotor 348R connected to the fourth or inner shaft 301. The four stators 342S, 344S, 346S, 348S are stationarily attached to the housing 310 at different vertical heights or locations within the housing. Each stator 342S, 344S, 346S, 348S generally comprises an electromagnetic coil. Each of the rotors 342R, 344R, 346R, 348R generally comprises permanent magnets, but may alternatively comprise a magnetic induction rotor that does not have permanent magnets. In still other aspects, the motors 342, 344, 346, 348 may be variable or switched reluctance motors such as those described in U.S. Pat. Nos. 10,348,172 and 9,948,155 and U.S. patent application Ser. No. 14/540,058 titled "Position Feedback for Sealed Environments" filed on Nov. 13, 2014, the disclosures of which are incorporated herein by reference in their entireties. In still other aspects, the motors 342, 344, 346, 348 may be harmonic drives such as those described in U.S. Pat. No. 9,656,386 the disclosure of which is incorporated herein by reference in its entirety. Where the substrate transport apparatus 130 is used in a sealed environment, such as for non-limiting exemplary purposes only, a vacuum environment, sleeves 362 may be located between the rotors 342R, 344R, 346R, 3418R and the stators 342S, 344S, 346S, 348S so that the coaxial drive shaft assembly 300 is located in the sealed environment and the stators are located outside the sealed environment. It should be realized that the sleeves 362 need not be provided if the substrate transport apparatus 130 is only intended for use in an atmospheric environment, such as within the atmospheric section 101 of the substrate processing apparatus 100 (FIG. 1).

The fourth or inner shaft 301 extends from the bottom or fourth stator 348S and includes the rotor 348R, which is substantially aligned with the stator 348S. The shaft 302 extends from the third stator 346S and includes rotor 346R, which is substantially aligned with the stator 346S. The shaft 303 extends from the second stator 344S and includes the rotor 344R, which is substantially aligned with the stator 344S. The shaft 304 extends from the top or first stator 342S and includes rotor 342R, which is substantially aligned with the stator 342S. Various bearings 350-353 are provided about the shafts 301-304 and the housing 310 to allow each shaft 301-304 to be independently rotatable relative to each other and the housing 310. It is noted that each shaft may be provided with a position sensor 371-374. The position sensors 371-374 may be used to provide a signal to any suitable controller, such as controller 170, regarding the rotational position of a respective shaft 301-304 relative to each other and/or relative to the housing 310. The sensors 371-374 may be any suitable sensors, such as for non-limiting exemplary purposes, optical or induction sensors.

Referring to FIG. 3A, in other aspects, the exemplary drive section 220A, which is substantially similar to drive section 220, includes a housing 310 for at least partially housing a tri-coaxial drive shaft assembly 300A having three drive shafts 302-304 and three motors 342, 344, 346 (e.g. a three-degree of freedom motor). The drive section 220A may also include a Z-axis drive 312 configured to, e.g., raise and lower the arm (such as those described herein) of the substrate transport apparatus 130 for picking and placing substrates S; however, in other aspects the substrate holding stations coupled to the transfer chamber in which the arm is located may include Z-axis drives for lifting and lowering the substrates from and to the arm in lieu of or in addition to the Z-drive axis 312 of the drive section 220.

The first motor 342 of the drive section 220A includes a stator 342S and a rotor 342R connected to the outer shaft 304. The second motor 344 includes a stator 344S and a rotor 344R connected to shaft 303. The third motor 346 includes a stator 346S and a rotor 346R connected to shaft 302. The three stators 342S, 344S, 346S are stationarily attached to the housing 310 at different vertical heights or locations within the housing. Each stator 342S, 344S, 346S generally comprises an electromagnetic coil. Each of the rotors 342R, 344R, 346R generally comprises permanent magnets, but may alternatively comprise a magnetic induction rotor that does not have permanent magnets. In still other aspects, the motors 342, 344, 346 may be variable or switched reluctance motors such as those described in U.S. Pat. Nos. 10,348,172 and 9,948,155 and U.S. patent application Ser. No. 14/540,058 titled "Position Feedback for Sealed Environments" filed on Nov. 13, 2014, the disclosures of which are incorporated herein by reference in their entireties. In still other aspects, the motors 342, 344, 346 may be harmonic drives such as those described in U.S. Pat. No. 9,656,386 the disclosure of which is incorporated herein by reference in its entirety. Where the substrate transport apparatus 130 is used in a sealed environment, such as for non-limiting exemplary purposes only, a vacuum environment, sleeves 362 may be located between the rotors 342R, 344R, 346R and the stators 342S, 344S, 346S so that the coaxial drive shaft assembly 300A is located in the sealed environment and the stators are located outside the sealed environment. It should be realized that the sleeves 362 need not be provided if the substrate transport apparatus 130 is only intended for use in an atmospheric environment, such as within the atmospheric section 101 of the substrate processing apparatus 100 (FIG. 1).

The shaft 302 extends from the third stator 346S and includes rotor 346R, which is substantially aligned with the stator 346S. The shaft 303 extends from the second stator 344S and includes the rotor 344R, which is substantially aligned with the stator 344S. The shaft 304 extends from the top or first stator 342S and includes rotor 342R, which is substantially aligned with the stator 342S. Various bearings 350-353 are provided about the shafts 302-304 and the housing 310 to allow each shaft 302-304 to be independently rotatable relative to each other and the housing 310. It is noted that each shaft may be provided with a position sensor 371-373. The position sensors 371-373 may be used to provide a signal to any suitable controller, such as controller 170, regarding the rotational position of a respective shaft 302-304 relative to each other and/or relative to the housing 310. The sensors 371-373 may be any suitable sensors, such as for non-limiting exemplary purposes, optical or induction sensors.

Referring to FIG. 3B, in other aspects, the exemplary drive section 220B, which is substantially similar to drive section 220, includes a housing 310 for at least partially housing a sextuple-coaxial drive shaft assembly 300B having six drive shafts 301-306 and six motors 342, 344, 346, 348, 343, 345 (e.g. a six-degree of freedom motor). The drive section 220B may also include a Z-axis drive 312 configured to, e.g., raise and lower the arm (such as those described herein) of the substrate transport apparatus 130 for picking and placing substrates S; however, in other aspects the substrate holding stations coupled to the transfer chamber in which the arm is located may include Z-axis drives for lifting and lowering the substrates from and to the arm in lieu of or in addition to the Z-drive axis 312 of the drive section 220.

The first motor 342 of the drive section 220A includes a stator 342S and a rotor 342R connected to the outer shaft 304. The second motor 344 includes a stator 344S and a rotor 344R connected to shaft 303. The third motor 346 includes a stator 346S and a rotor 346R connected to shaft 302. The fourth motor 348 includes a stator 348S and a rotor 348R connected to shaft 301. The fifth motor 343 includes a stator 343S and a rotor 343R connected to shaft 305. The sixth motor 345 includes a stator 345S and a rotor 345R connected to shaft 306. The six stators 342S, 344S, 346S, 348S, 343S, 345S are stationarily attached to the housing 310 at different vertical heights or locations within the housing. Each stator 342S, 344S, 346S, 348S, 343S, 345S generally comprises an electromagnetic coil. Each of the rotors 342R, 344R, 346R, 348R, 343R, 345R generally comprises permanent magnets, but may alternatively comprise a magnetic induction rotor that does not have permanent magnets. In still other aspects, the motors 342, 344, 346, 348, 343, 345 may be variable or switched reluctance motors such as those described in U.S. Pat. Nos. 10,348,172 and 9,948,155 and U.S. patent application Ser. No. 14/540,058 titled "Position Feedback for Sealed Environments" filed on Nov. 13, 2014, the disclosures of which are incorporated herein by reference in their entireties. In still other aspects, the motors 342, 344, 346, 348, 343, 345 may be harmonic drives such as those described in U.S. Pat. No. 9,656,386 the disclosure of which is incorporated herein by reference in its entirety. Where the substrate transport apparatus 130 is used in a sealed environment, such as for non-limiting exemplary purposes only, a vacuum environment, sleeves 362 may be located between the rotors 342R, 344R, 346R, 348R, 343R, 345R and the stators 342S, 344S, 346S, 348S, 343S, 345S so that the coaxial drive shaft assembly 300B is located in the sealed environment and the stators are located outside the sealed environment. It should be realized that the sleeves 362 need not be provided if the substrate transport apparatus 130 is only intended for use in an atmospheric environment, such as within the atmospheric section 101 of the substrate processing apparatus 100 (FIG. 1).

The shaft 306 extends from the sixth stator 345S and includes rotor 345R, which is substantially aligned with the stator 345S. The shaft 305 extends from the fifth stator 343S and includes rotor 343R, which is substantially aligned with the stator 343S. The shaft 302 extends from the third stator 346S and includes rotor 346R, which is substantially aligned with the stator 346S. The shaft 301 extends from the fourth stator 348S and includes rotor 348R, which is substantially aligned with the stator 348S. The shaft 303 extends from the second stator 344S and includes the rotor 344R, which is substantially aligned with the stator 344S. The shaft 304 extends from the top or first stator 342S and includes rotor 342R, which is substantially aligned with the stator 342S. Various bearings (such as those described above) are provided about the shafts 301-306 and the housing 310 to allow each shaft 301-306 to be independently rotatable relative to each other and the housing 310. It is noted that each shaft may be provided with a position sensor 371-376. The position sensors 371-376 may be used to provide a signal to any suitable controller, such as controller 170, regarding the rotational position of a respective shaft 301-306 relative to each other and/or relative to the housing 310. The sensors 371-376 may be any suitable sensors, such as for non-limiting exemplary purposes, optical or induction sensors.

Figure 3C:
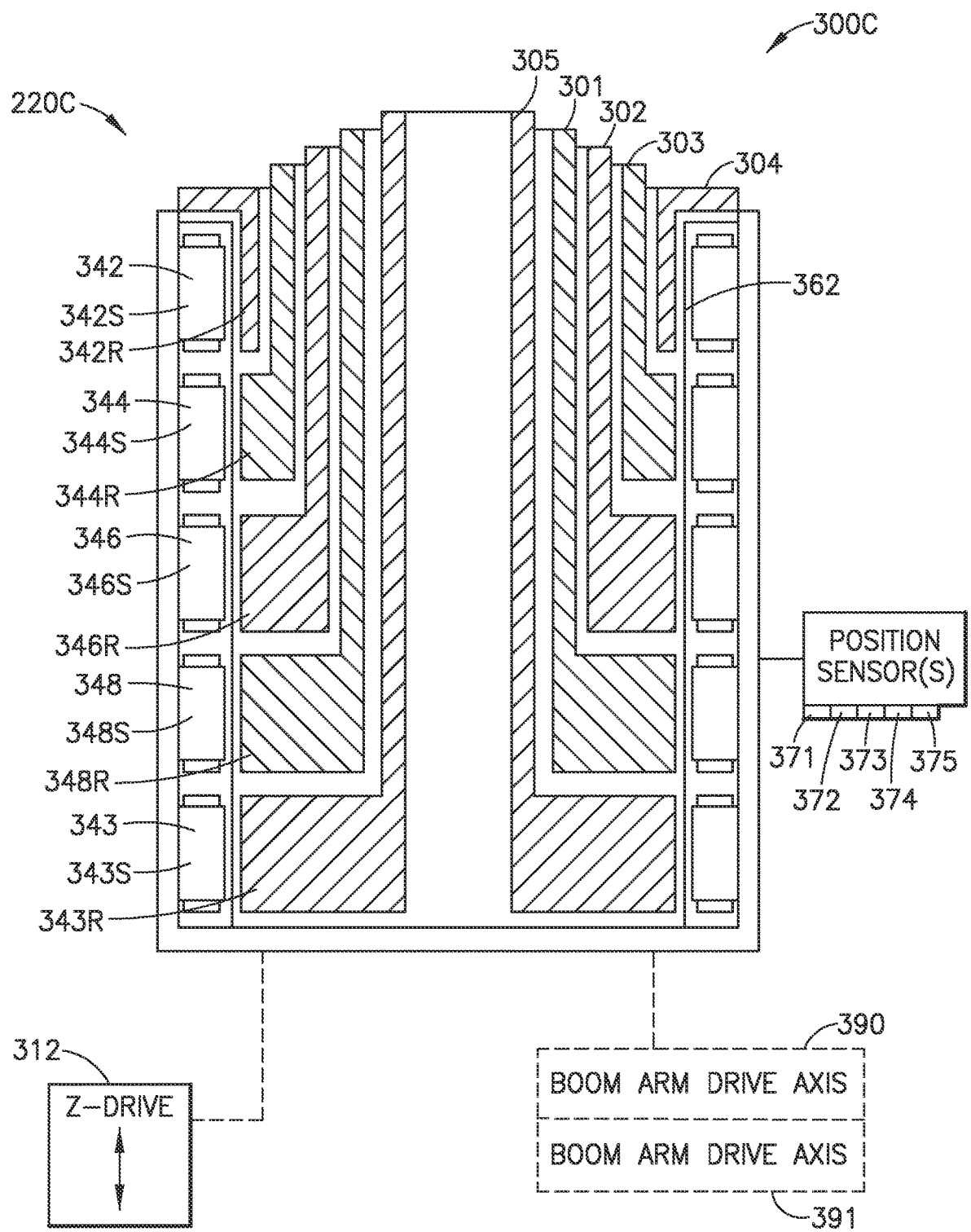
FIG. 3C is a schematic cross-sectional illustration of an exemplary drive section of a substrate transport apparatus in accordance with aspects of the present disclosure.

Referring to FIG. 3C, in other aspects, the exemplary drive section 220C, which is substantially similar to drive section 220, includes a housing 310 for at least partially housing a quintuple-coaxial drive shaft assembly 300C having five drive shafts 301-305 and five motors 342, 344, 346, 348, 343 (e.g. a five-degree of freedom motor). The drive section 220C may also include a Z-axis drive 312 configured to, e.g., raise and lower the arm (such as those described herein) of the substrate transport apparatus 130 for picking and placing substrates S; however, in other aspects the substrate holding stations coupled to the transfer chamber in which the arm 131 is located may include Z-axis drives for lifting and lowering the substrates from and to the arm in lieu of or in addition to the Z-drive axis 312 of the drive section 220.

The first motor 342 of the drive section 220A includes a stator 342S and a rotor 342R connected to the outer shaft 304. The second motor 344 includes a stator 344S and a rotor 344R connected to shaft 303. The third motor 346 includes a stator 346S and a rotor 346R connected to shaft 302. The fourth motor 348 includes a stator 348S and a rotor 348R connected to shaft 301. The fifth motor 343 includes a stator 343S and a rotor 343R connected to shaft 305. The five stators 342S, 344S, 346S, 348S, 343S are stationarily attached to the housing 310 at different vertical heights or locations within the housing. Each stator 342S, 344S, 346S, 348S, 343S generally comprises an electromagnetic coil. Each of the rotors 342R, 344R, 346R, 348R, 343R generally comprises permanent magnets, but may alternatively comprise a magnetic induction rotor that does not have permanent magnets. In still other aspects, the motors 342, 344, 346, 348, 343 may be variable or switched reluctance motors such as those described in U.S. Pat. Nos. 10,348,172 and 9,948,155 and U.S. patent application Ser. No. 14/540,058 titled "Position Feedback for Sealed Environments" filed on Nov. 13, 2014, the disclosures of which are incorporated herein by reference in their entireties. In still other aspects, the motors 342, 344, 346, 348, 343 may be harmonic drives such as those described in U.S. Pat. No. 9,656,386 the disclosure of which is incorporated herein by reference in its entirety. Where the substrate transport apparatus 130 is used in a sealed environment, such as for non-limiting exemplary purposes only, a vacuum environment, sleeves 362 may be located between the rotors 342R, 344R, 346R, 348R, 343R and the stators 342S, 344S, 346S, 348S, 343S so that the coaxial drive shaft assembly 300C is located in the sealed environment and the stators are located outside the sealed environment. It should be realized that the sleeves 362 need not be provided if the substrate transport apparatus 130 is only intended for use in an atmospheric environment, such as within the atmospheric section 101 of the substrate processing apparatus 100 (FIG. 1).

The shaft 305 extends from the fifth stator 343S and includes rotor 343R, which is substantially aligned with the stator 343S. The shaft 302 extends from the third stator 346S and includes rotor 346R, which is substantially aligned with the stator 346S. The shaft 301 extends from the fourth stator 348S and includes rotor 348R, which is substantially aligned with the stator 348S. The shaft 303 extends from the second stator 344S and includes the rotor 344R, which is substantially aligned with the stator 344S. The shaft 304 extends from the top or first stator 342S and includes rotor 342R, which is substantially aligned with the stator 342S. Various bearings (such as those described above) are provided about the shafts 301-305 and the housing 310 to allow each shaft 301-305 to be independently rotatable relative to each other and the housing 310. It is noted that each shaft may be provided with a position sensor 371-375. The position sensors 371-375 may be used to provide a signal to any suitable controller, such as controller 170, regarding the rotational position of a respective shaft 301-306 relative to each other and/or relative to the housing 310. The sensors 371-375 may be any suitable sensors, such as for non-limiting exemplary purposes, optical or induction sensors.

As described herein, the drive section 220, 220A, 220B, 220C is configured to extend and retract at least one multi-link arm 131 along the non-radial linear path and substantially simultaneously pass the at least one corresponding substrate holding station of each end effector link (e.g., substrate holder) respectively through the separate substrate transport openings (such as shown in FIGS. 1B and 1C) juxtaposed along the side wall of, e.g., the transfer chamber 125, and to independently align the at least one corresponding substrate holding station relative to another of the more than one end effector links (e.g., substrate holders).

Referring to FIGS. 2A, 3A, and 4, as described above the substrate transport apparatus 130 includes at least one arm 131 having two dual ended substrate holders 203, 204. It is noted that the two dual ended substrate holders 203, 204 of the substrate transport apparatus 130 described herein may allow for substantially simultaneous picking and placing of substrates (e.g. the two dual ended substrate holders 203, 204 are extended and retracted to and from respective substrate processing stations of the side-by-side substrate processing stations 190-191, 192-193, 194-195, 196-197 at substantially the same time for substantially picking and/or placing substrates) described herein.

In one aspect of the present disclosure, the upper arm link 201 is driven in rotation about the shoulder axis SX by outer shaft 304, the forearm link 202 is driven in rotation about the elbow axis EX by inner shaft 301, dual ended substrate holder 203 is driven in rotation about the wrist axis WX by shaft 303, and dual ended substrate holder 204 is driven in rotation about the wrist axis WX by shaft 302. For example, the upper arm link 201 is fixedly attached to the outer shaft 304 such that the upper arm link 201 rotates with the shaft 304 as a unit on a center axis of rotation (e.g. shoulder axis SX).

The forearm link 202 is coupled to the inner shaft 301 by any suitable transmission. For example, a pulley 480 is fixedly attached to the shaft 301. The upper arm link 201 includes a post 481. A pulley 482 is rotatably mounted to or otherwise supported by the post 481. The post 481 is stationarily mounted to an inner surface of the upper arm link 201. A first set of transmission members 490 extend between the pulley 480 and pulley 482. It should be realized that any suitable type of transmission members may be used to couple the pulleys 480, 482, such as for example, belts, bands or chains. It should also be realized that while two transmission members are shown (see FIGS. 6A and 6B) coupling the pulleys 480, 482, in other aspects any suitable number of transmission members may be used to couple the pulleys 480, 482 (e.g. more or less than two). A shaft 482S is fixedly coupled to the pulley 482 so that the shaft 482S rotates with the pulley 482 about elbow axis EX. The shaft 482S may be rotatably supported on the post 481 in any suitable manner. The forearm link 202 is fixedly mounted to the shaft 482S so that the forearm link 202 rotates with the shaft 482S as a unit about elbow axis EX.

The dual ended substrate holder 203 is coupled to shaft 303 by any suitable transmission. For example, pulley 488 is fixedly coupled to shaft 303 so that the pulley 488 rotates with the shaft 303 as a unit about the shoulder axis SX. Pulley 491 is rotatably coupled to or otherwise supported on post 481. A second set of transmission members 492 (substantially similar to transmission members 490) extend between the pulley 488 and pulley 491. A shaft 491S is fixedly coupled to the pulley 491 so that the shaft 491S rotates with the pulley 491 as a unit about elbow axis EX. The shaft 491S may be rotatably supported on the post 481 in any suitable manner. The forearm link 202 includes pulley 470 that is fixedly mounted to a top end of the shaft 491S so that the pulley 470 rotates with the shaft 491S (and the pulley 491) as a unit about elbow axis EX. The forearm link 202 also includes a post 471 and a pulley 472 rotatably mounted to or otherwise supported by the post 471. A third set of transmission members 493 (substantially similar to transmission members 490) extends between and couples the pulleys 470, 472. The dual ended substrate holder 203 is fixedly mounted to the pulley 472 through shaft 472S so that the pulley 472 and dual ended substrate holder 203 rotate as a unit about wrist axis WX.

The dual ended substrate holder 204 is coupled to shaft 302 by any suitable transmission. For example, pulley 484 is fixedly coupled to shaft 302 so that the pulley 484 rotates with the shaft 302 as a unit about the shoulder axis SX. Pulley 486 is rotatably coupled to or otherwise supported on post 481. A fourth set of transmission members 494 (substantially similar to transmission members 490) extend between the pulley 484 and pulley 486. A shaft 486S is fixedly coupled to the pulley 486 so that the shaft 486S rotates with the pulley 486 as a unit about elbow axis EX. The shaft 486S may be rotatably supported on the post 481 in any suitable manner. The forearm link 202 includes pulley 474 that is fixedly mounted to a top end of the shaft 486S so that the pulley 474 rotates with the shaft 486S (and the pulley 486) as a unit about elbow axis EX. The forearm link 202 also includes a pulley 476 rotatably mounted to or otherwise supported by the post 471. A fifth set of transmission members 495 (substantially similar to transmission members 490) extends between and couples the pulleys 474, 476. The dual ended substrate holder 204 is fixedly mounted to the pulley 476 through shaft 476S so that the pulley 476 and dual ended substrate holder 204 rotate as a unit about wrist axis WX.

Referring to FIGS. 2A-2C, 3A, and 4, as may be realized, each of the upper arm link 201, the forearm link 202, the dual ended substrate holder 203, and the dual ended substrate holder 204 are independently driven in rotation about the respective axes (e.g., shoulder axis SX, elbow axis AX, and wrist axis WX) by the respective drive motor 342, 344, 346, 348. Independent rotation of each dual ended substrate holder 203, 204 about the wrist axis WX provides independent automatic wafer centering at each of the substrates S at each of the substrate holding stations 203H1, 204H1, 203H2, 204H2 substantially coincident with transport of the substrates through openings (see FIGS. 1B, 1C) of respective juxtaposed substrate processing stations by the dual ended substrate holders 203, 204. The automatic wafer centering described herein may be performed with any suitable sensors disposed in/on the transport chamber 125, 125A, on a slot valve SV, on the transport arm 131, etc. in manners similar to those described in U.S. patent application Ser. No. 16/257,595 filed on Jan. 25, 2019 and titled "Automatic Wafer Centering Method and Apparatus", U.S. Pat. No. 10,134,623 issued on Nov. 20, 2018 and titled "On The Fly Automatic Wafer Centering Method and Apparatus", U.S. Pat. No. 9,514,974 issued on Dec. 6, 2016 and titled "Process Apparatus with On-The-Fly Substrate Centering", U.S. Pat. No. 7,792,350 issued on Sep. 7, 2010 and titled "Wafer Center Finding", U.S. Pat. No. 8,934,706 issued on Jan. 13, 2015 and titled "Wafer Center Finding with Kalman Filter", and U.S. Pat. No. 7,925,378 issued on Apr. 12, 2011 and titled "Process Apparatus with On-The-Fly Workpiece Centering", the disclosures of which are incorporated herein by reference in their entireties. Correspondingly automatic wafer centering is effected by varying of the base pitch BP between the side-by-side substrate holding stations 203H1, 204H1 and between the side-by-side substrate holding stations 203H2, 204H2. For example by rotating shafts 302, 303 in opposite directions, the dual ended substrate holder 203, 204 are caused to rotate in opposite directions about the wrist axis WX. For example, shafts 302, 303 may be driven in opposite directions to increase the distance (FIG. 2B) between the side-by-side substrate holding stations 203H1, 204H1 so as to effect any suitable increased pitch WP between the side-by-side substrate holding stations 203H1, 204H1 (and any suitable corresponding decreased pitch NP between substrate holding stations 203H2, 204H2). Shafts 302, 303 may also be driven in opposite directions to decrease the distance (FIG. 2C) between the side-by-side substrate holding stations 203H1, 204H1 so as to effect any suitable decrease pitch NP between the side-by-side substrate holding stations 203H1, 204H1 (and any suitable corresponding increased pitch WP between substrate holding stations 203H2, 204H2). Rotation of the shafts 302, 303 in the same direction, substantially at the same rotational rate, rotates the dual ended substrate holder 203, 204 as a unit about the wrist axis WX to effect fast swapping of the substrates S. As such, the transmissions 490, 492, 493, 494, 495 are configured so that the dual ended substrate holder 203, 204 rotate as a unit about the wrist axis WX by an amount that is at least 180° (degrees) of rotation. Again, each plane 499, 499A (see FIGS. 2D, 10, and 11) of the substrate holder planes (as described herein, and whether the substrate holding station(s) 203H1, 203H2, 204H1, 204H2 of the dual sided substrate holders form one or more planes) corresponds with and are aligned to at least one plane(s) (see FIGS. 1B and 1C) of transport openings in a common transport chamber for transfer at a given Z position of transport opening plane, so that substrate transfer through each respective opening on each plane is effected with at least one substrate holding station 203H1, 203H2, 204H1, 204H2 of each dual ended substrate holder 203, 204 substantially without Z axis movement, i.e., extension into the substrate processing stations (for each plane) with the substrate holding station(s) 203H1, 203H2, 204H1, 204H2 at one end of the substrate holders 203, 204, picking and/or placing of substrate(s) at the substrate processing stations, retraction from the substrate processing stations, and extension into each other different substrate processing station with the same or a different dual substrates at the same or different end of the dual ended substrate holders 203, 204 effects (independent of an intervening Z axis movement or decoupled from intervening Z axis movement between substrate transfers) a fast swapping of substrates substantially independent of Z axis movement.

Figure 5D:
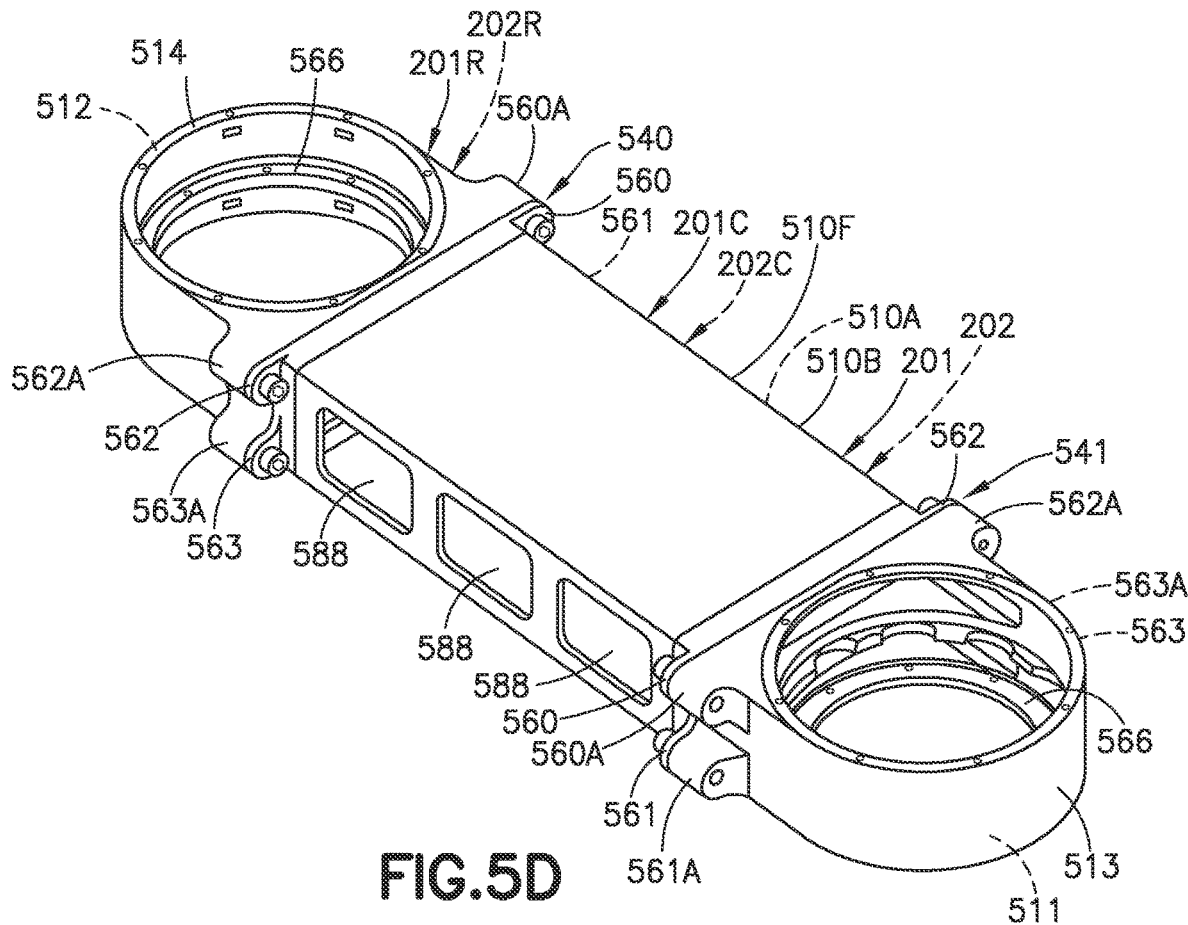
FIG. 5D is another schematic perspective illustration of the modular arm link of FIG. 5C in accordance with aspects of the present disclosure.
Figure 5E:
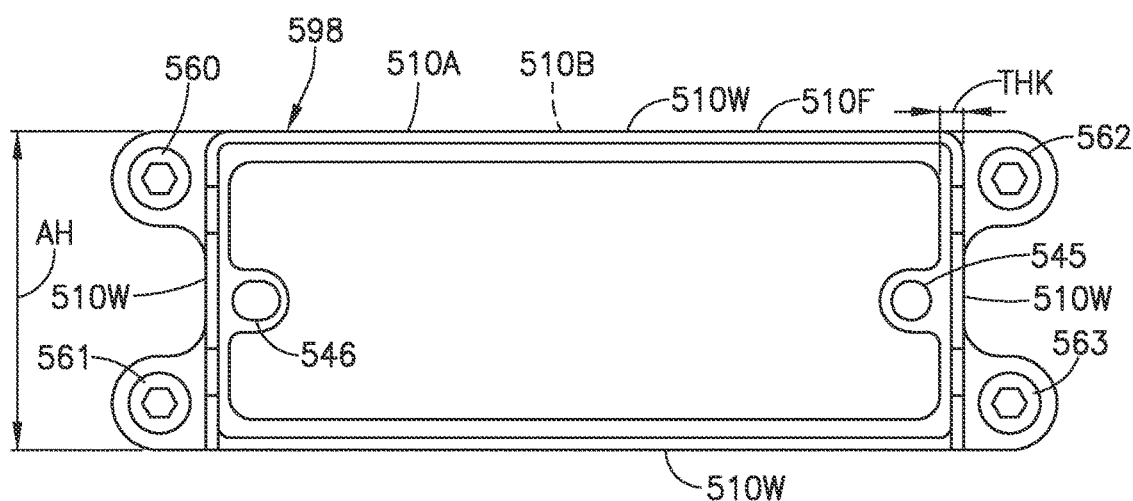
FIG. 5E is a schematic end view of a portion of the modular arm link of FIG. 5C in accordance with aspects of the present disclosure.
Figure 6A:
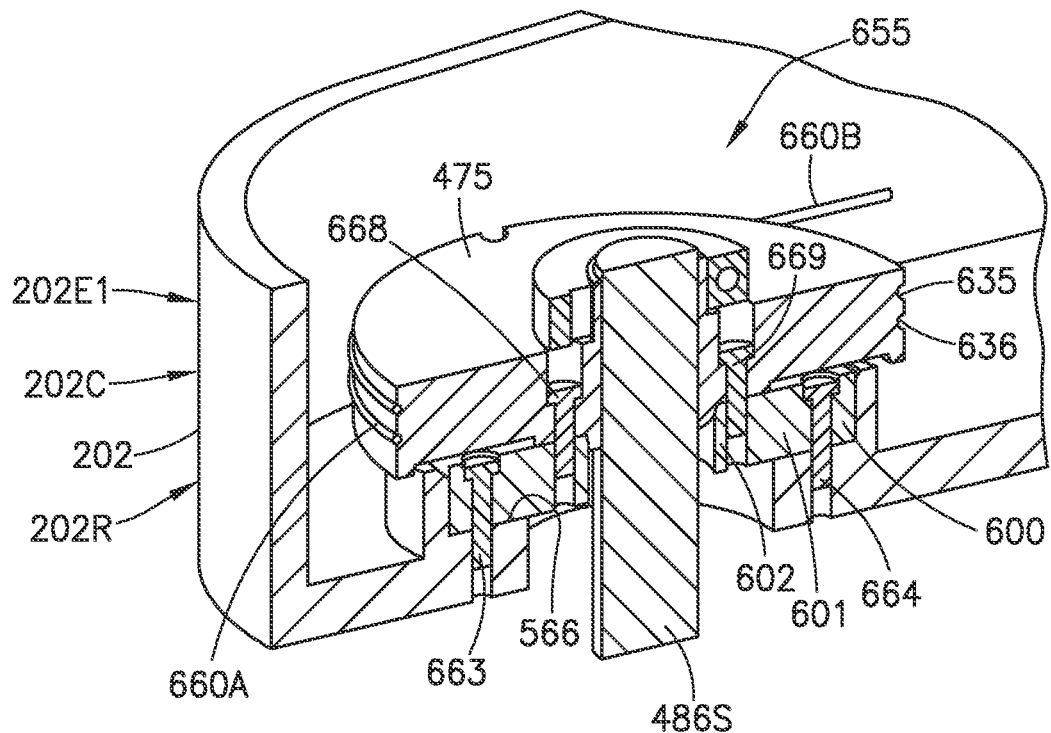
Figure 6B:
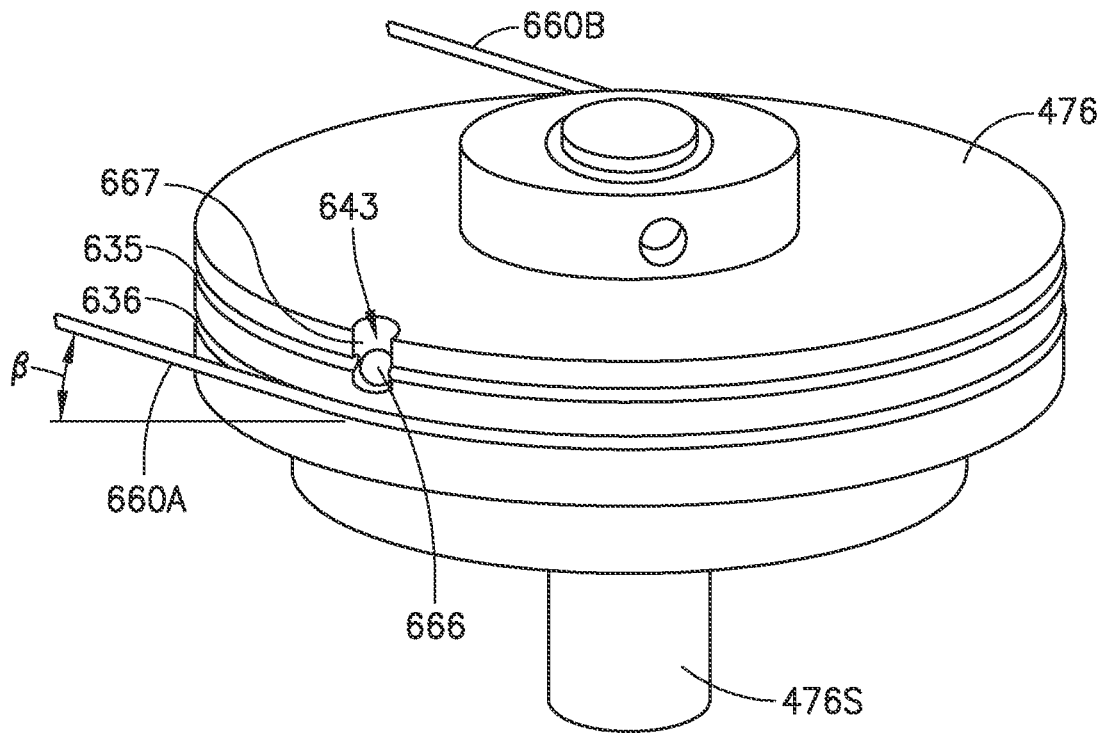

The transmission members 490, 492, 493, 494, 495 and the pulleys 480, 484, 488, 470, 474, 482, 486, 491, 472, 476 form the respective pulley systems 655A-655E described herein. As described herein, one or more of the pulley systems 655A-655E is engaged to the modular composite arm link casing 201C, 202C, and is arranged so that, powered by the drive section 220, the one or more pulley system 655A-655E effects articulation of the at least one arm link 201, 202 or the end effector 203, 204. It is noted that the pulleys 480, 484, 488, 470, 474 may be referred to as "drive" pulleys while pulleys 482, 486, 491, 472, 476 may be referred to as "driven" or "idler" pulleys. Referring to FIGS. 5D, 6A, and 6J, at least one of the end coupling 511, 512, 513, 514 houses at least one pulley wheel 480, 484, 488, 470, 474, 482, 486, 491, 472, 476 of at least one of the pulley systems 655A-655E. As an example, one or more of the pulleys (such as pulleys 488, 484, 480, 486, 482, 470, 474, 472) is coupled to a respective end coupling 511, 512, 513, 514 by, for example, a crossed roller bearing 600 (also referred to as a table bearing—e.g., the end coupling houses a pulley wheel of the pulley system mounted with a crossed roller bearing so that position and alignment of the pulley wheel is dependent and controlled by engagement with the crossed roller bearing as described herein) or in any other suitable manner. In one aspect, the end couplings 511, 512, 513, 514 include a bearing seat 566 (see FIGS. 5D and 6A) to which an outer race 601 (or inner race depending on a configuration of the bearing seat) of the crossed roller bearing 600 is coupled. For example, the outer race 601 may be coupled to the bearing seat 566 with any suitable fasteners or retainer features 663 and located with respect to the arm with any suitable locating pins 664 that extend into both the outer race 601 and the bearing seat 566. In other aspects, outer race 601 may be coupled to the bearing seat 566 in any suitable manner. The pulley (such as pulley 474 illustrated in FIG. 6A with other pulleys omitted for clarity) may be coupled to the inner race 602 (or the outer race depending on a configuration of the bearing seat) using any suitable fasteners 668 and any suitable locating pins 669. In other aspects, inner race 602 may be coupled to the pulley 474 in any suitable manner. The shaft, such as shaft 486S, may be coupled to the pulley in any suitable manner, such as by a friction fit, a clamp, or in any other suitable manner so that the shaft 186S and pulley 474 rotate as a unit about the respective axis of rotation (such as axis EX).

The crossed roller bearing 600 provides several advantages over duplex (i.e., paired) bearings and other types of bearings generally employed in semiconductor transport arms. For example, the crossed roller bearing 600 has a thinner form factor such that a decreased height/thickness 665 (compared to a height/thickness of the duplex or other generally employed bearings for the same size shaft and loading requirements) allows for a smaller arm link height AH for a given bearing diameter. The crossed roller bearing 600 may also reduce part count, cost, and complexity of the substrate transport apparatus 130 because bearing clamps (such as used with the duplex or other generally employed bearings) are not needed for coupling the crossed roller bearing to the arm link and pulley. In addition, because fasteners are used to couple the crossed roller bearing 600 to the arm link and pulley, installation of the bearing is made easier compared to the installation of the duplex or other generally employed bearings (which are typically installed by a shrink/interference fit). The cross roller bearings 600 may increase the stiffness of the transport arm and are less dependent on machining tolerances and operating temperatures of the arm links (e.g., compared to the friction fit duplex or other generally employed bearing where the friction fit may be affected by one or more of the machining tolerances and operating temperatures).

It is noted that the modular composite arm link casing 201C, 202C is a low profile casing having the compact height AH (FIGS. 5C and 5E) for a selected predetermined arm length OAL, OALn commensurate with a crossed roller bearing mounted pulley wheel (as described above) of at least one of the pulley systems 655A-655E housed in at least one of the end couplings 511, 512, 513, 514. The compact height AH is smaller than a band pulley transmission housing height for a comparable number of pulley systems having comparable lengths. For example, referring briefly to FIG. 4A, the arm link 201 has the compact height AH and the length OAL. In this example, the arm link 201 includes the three pulley systems 655A-655C, where each pulley system includes opposing cable segments (as described herein) and a pair of pulleys. When compared to an arm link having the same length OAL and the same number of pulley systems where each pulley system includes conventional duplex bearings, the height AH of the arm link 201 including three of the cable/pulley transmissions and crossed roller bearings described herein is less than a height of the arm link including three of the band/pulley transmissions and conventional duplex bearings.

Figure 4A:
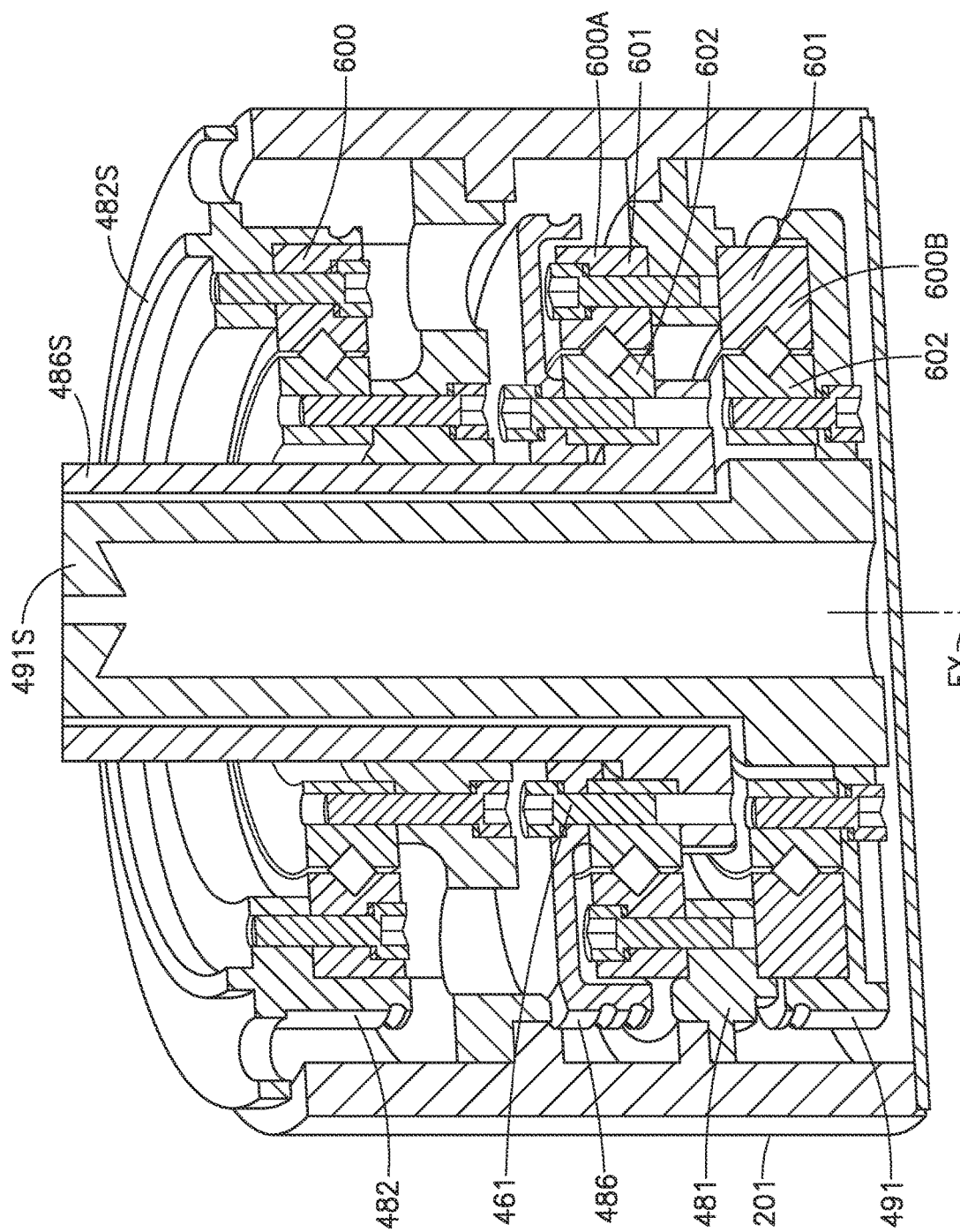
FIG. 4A is a schematic illustration of a portion of the substrate transport apparatus of FIGS. 2A, 2B, 2C, and 2D in accordance with aspects of the present disclosure.

Referring also to FIGS. 4 and 4A, the crossed roller bearings 600 provide for mounting of a pulley 486 and respective shaft 486S to a common flange of a respective crossed roller bearing 600A. As can be seen in FIG. 4A, both the pulley 486 and the shaft 486S are mounted to the same flange (e.g., inner race 602 flange) of the crossed roller bearing 600A by any suitable fastener 461, such as screws or bolts in any suitable manner. For example, the fasteners 461 may extend through both the pulley 486 and shaft 486S flange to couple both the pulley 486 and shaft 486S to the crossed roller bearing 600A; while in other aspects, the pulley 486 and shaft 486S may be coupled to the crossed roller bearing 600A by respective fasteners 461 where alternating screw holes of the crossed roller bearing 600A inner race 602 are used to couple the pulley 486 and shaft 486S to the crossed roller bearing 600A in a manner similar to that described herein with respect to FIG. 4B.

Figure 4B:
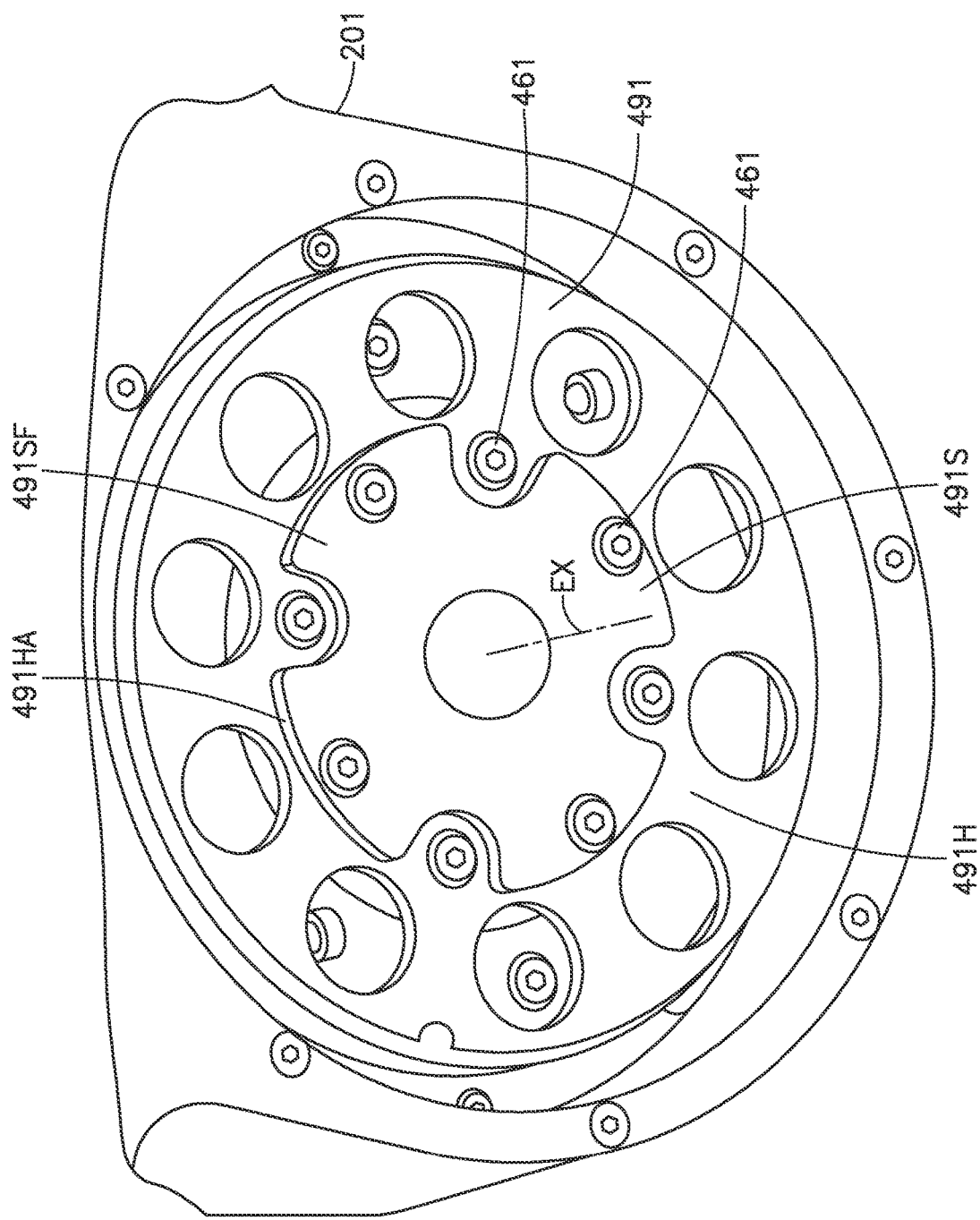
FIG. 4B is a schematic illustration of a portion of the substrate transport apparatus of FIGS. 2A, 2B, 2C, and 2D in accordance with aspects of the present disclosure

As can also be seen in FIG. 4A and also referring to FIG. 4B, the stack height of an arm joint may be reduced where the pulley and the flange of the respective drive shaft are interlocked/interleaved together to facilitate coupling of the pulley and respective shaft to a respective crossed roller bearing. For example, the outer race 601 of crossed roller bearing 600B may be coupled to post 481 so that the crossed roller bearing 600B is suspended underneath the post 481 (although in other aspects the post 481 may have any suitable configuration and the crossed roller bearing may be seated on or suspended from the post). In this example, both the pulley 491 and the shaft 491S are coupled to the inner race 602 of the crossed roller bearing 600B. The pulley 491 includes a hub 491H and the shaft 491S includes a flange 491SF, where the hub 491H and the flange 491SF have complimentary shapes so that the hub 491H and flange 491SF are coplanar (lie within the same plane and are not stacked one above the other—see FIGS. 4A and 4B) when coupled to the crossed roller bearing 600B. For example, the hub 491H includes a central aperture 491HA that is shaped and sized to that fasteners 461 extend through the hub 491H and engage every other fastener hole of the inner race 602 of the crossed roller bearing 600B. The flange 491SF is shaped and sized to compliment and fit within the bounds of the central aperture 491HA (e.g., the flange 491SF interlocks/is interleaved with the hub 491H) and so that fasteners 461 extend through the flange 491SF and engage every other fastener hole (not used to couple the pulley 491 to the inner race 602) of the inner race 602 of the crossed roller bearing 600B (e.g., the pulley 491 and shaft 491S are coupled to the crossed roller bearing 600B in an alternating manner).

In one aspect, a crossed roller bearing 600 may be configured as an integrated or combined crossed roller pulley 600PB. For example, referring also to FIGS. 6I and 6J, one or more of the pulleys described herein may be replaced by the crossed roller pulley 600PB so as to further eliminate stacking of a pulley and respective bearing, to further reduce at least a height of the transport arm links. In this aspect, the crossed roller pulley 600PB is mounted to a fixed shaft (such as any one of, e.g., shafts 491S, 476S in FIG. 4) in place of the pulleys 470, 474, 482, 486, 491, 472, 476 (and their bearings) where the peripheral edge of the outer race 601 of the crossed roller pulley 600PB includes grooves 635, 636 and cable anchors 643, 644 in a manner substantially similar to that described herein with respect to the different pulleys. In this aspect, the separate pulley and bearing pairs may be eliminated and replaced by the crossed roller pulley 600PB decreasing part count of the transport arm and reducing costs.

Referring to FIGS. 4 and 6A-6J, the third and fifth set of transmission members 493, 495 located, at least in part, within the forearm link 202 will be described. It is noted that the third and fifth set of transmission members 493, 495 may be substantially similar to the other transmission members 490, 492, 494 described herein.

The idler pulley 472 has an end effector interface where a surface of the idler pulley 472 is seated against the respective dual ended substrate holder 203, or in other aspects the end effector interface is formed by shaft 472S as described above. The idler pulley 472 is coupled to a respective elbow drive pulley 470 by a respective segmented transmission loop 661 (i.e., the third set of transmission members 493). The segmented transmission loop 661 includes separate cable segments 661A, 661B or any other suitable transmission link such as band segments) coupled to both the idler pulley 472 and the elbow drive pulley 470 effecting rotation of the idler pulley 472.

The idler pulley 472 includes a perimeter edge 650 that forms cable wrap grooves 635, 636 (noting that the pulley grooves described herein effect tracking/guiding of the respective cables as the cables are wound around the pulleys) that interface with respective cables 661A, 661B of the segmented transmission loop 661. For example, the perimeter edge 650 forms an upper cable wrap groove 635 around which the cable 661B is wrapped. The perimeter edge 650 also forms a lower cable wrap groove 636 around which the cable 661A is wrapped. The upper and lower cable wrap grooves 635, 636 are disposed at different heights on the idler pulley 472 so that the cables 661A, 661B are disposed in different planes relative to each other (i.e., one cable does not wrap over the other cable). Referring to FIG. 6D, the elbow drive pulley 470 is substantially similar to the idler pulley 472 described above.

Any suitable cable anchor points 643, 644 (FIGS. 6B-6J) join each of the separate cable segments 661A, 661B to the idler pulley 472. For example, each terminal end of cable segment 661A, 661B includes a retainer feature 666 (e.g., ball, cylinder, etc.) that is coupled to (or integrally formed with) the cable segment end in any suitable manner. The pulleys 470, 472 include respective mating retention features 667 (such as grooves, etc.). Each of the mating retention features 667 intersects a respective one of the upper and lower cable wrap groove 635, 636 of a respective pulley 470, 472. The retainer feature 666 of the cable segments 661A, 661B may be inserted into a respective mating retention feature 667 and wound around the respective pulley 470, 472 at least partially within a respective one of the upper and lower cable wrap grooves 635, 636. In other aspects, the terminal ends of cable segments 661A, 661B may be coupled to the respective pulley 470, 472 in any suitable manner. It is noted that the cables segments described herein are thinner (e.g., smaller in height) compared to conventional bands providing for smaller arm link heights AH1, AH2 than would otherwise be achieved with band and pulley transmissions.

In this aspect, referring also to FIGS. 6G and 6H, one or more of the opposing cable segments 661A, 661B includes any suitable inline cable tensioner 691. While each of the cable segments 661A, 661B are illustrated as including the inline cable tensioner 691 in other aspects only one of the cable segments 661A, 661B may include the inline cable tensioner 691. In one aspect, as shown in FIG. 6G, the inline cable tensioner 691 is a turn-buckle cable tensioner 691TBK1 that includes a body 691B and a threaded portion 691T. It is noted that the inline cable tensioner 691 may reduce transmission arm part count and costs when compared to conventional band tensioning devices that employ multiple opposing wedges and screws for tensioning the bands. The body 691B may be coupled to the respective portion CP1 of cable segment 661A, 661B so that the body 691B rotates in direction 692 about its longitudinal axis independent of cable rotation so that as the body 691B is rotated the cable segment 661A, 661B does not twist in direction 692. The threaded portion 691T may be coupled to the respective portion CP2 of cable segment 661A, 661B in any suitable manner, and in one aspect in a manner substantially similar to that described above with respect to the body 691B. Here, the body 691B is rotated in direction 692 so that the threaded portion 691T is threaded into or threaded out of the body to adjust a tension in the respective cable segment 661A, 661B. It is noted that the cable segments 661A, 661B (as well as the other cable segments described herein) are pre-stretched (e.g., pre-tensioned) so as to substantially eliminate stretching of the cable segments 661A, 661B during operation of the transport arm under normal (e.g., designed for) loads (the cable segments do not stretch under normal operating loading of the transport arm).

FIG. 6H, illustrates another example of a turnbuckle style cable tensioner 691TBK2 in accordance with aspects of the present disclosure. In this example, each cable portion CP1, CP2 includes a threaded portion 691T1, 691T2 substantially similar to that described above. The threaded portions 691T1, 691T2 are engaged with a turnbuckle body 691B1 so that as the turnbuckle body 691B1 rotates in direction 692 the threaded portions 691T1, 691T2 moves towards each other or away from each other so as to increase or decrease tension in the cable segment 661A.

While the inline cable tensioner 691 is described above as a turnbuckle type cable tensioner, in other aspects (as noted above) the inline cable tensioner 691 may be any suitable cable tensioner that shortens the cable length so as to apply tension to the cable. For example, in one aspect, the inline cable tensioner 691 may be a resilient type cable tensioner 691RM (FIGS. 6C and 6F) that is coupled to each of the cable portions CP1, CP2 of a respective cable segment in a manner similar to that described above with respect to FIGS. 6G and 6H. Here the resilient type cable tensioner 691RM includes a resilient member 691BR that couples each of the cable portions CP1, CP2 to each other. The resilient member 691BR may be a spring, or other suitable resilient member, that has a spring force greater than any operating loads that may be exerted on the cables 661A, 661B, 660A, 660B during operation of the substrate transport arms described herein, so that the tension on the respective cable 661A, 661B, 660A, 660B remains steady state (or constant) despite the resiliency of the resilient member 691BR. In this aspect, the resilient member 691BR may be stretched to install the cable segment 661A, 661B, 660A, 660B on the respective pulleys where, once the cable segments 661A, 661B, 660A, 660B are installed on the respective pulleys, the resilient member 691BR at least partially relaxes to automatically set a predetermined tension on the opposing respective cable segment 661A, 661B, 660A, 660B.

Similarly, the idler pulley 476 has an end effector interface where a surface of the idler pulley 476 is seated against the respective dual ended substrate holder 204, or in other aspects the end effector interface is formed by shaft 476S as described above. The idler pulley 476 is coupled to a respective elbow drive pulley 474 by a respective segmented transmission loop 660 (i.e., the fifth set of transmission members 495). The segmented transmission loop 660 includes separate cable segments 660A, 660B or any other suitable transmission link such as band segments) coupled to both the idler pulley 476 and the elbow drive pulley 474 effecting rotation of the idler pulley 476.

The idler pulley 476 includes a perimeter edge 650 that forms cable wrap grooves 635, 636 that interface with respective cables 660A, 660B of the segmented transmission loop 660. Cable anchor points 643, 644 (FIG. 6C) join each of the separate cable segments 660A, 660B to the idler pulley 476. For example, the perimeter edge 650 forms an upper cable wrap groove 635 around which the cable 660B is wrapped. The perimeter edge 650 also forms a lower cable wrap groove 636 around which the cable 660A is wrapped. The upper and lower cable wrap grooves 635, 636 are disposed at different heights on the idler pulley 476 so that the cables 660A, 660B are disposed in different planes relative to each other (i.e., one cable does not wrap over the other cable). Referring to FIG. 6D, the elbow drive pulley 474 is substantially similar to the idler pulley 476 described above.

In one aspect the idler pulley 472, 476 and the respective elbow drive pulley 470, 474 to which the idler pulley 472, 476 is coupled by the segmented transmission loops 660, 661 have any suitable drive ratio that provides sufficient rotation of the respective dual ended substrate holder 203, 204 for the transport of substrate as shown in FIGS. 7A-7L. For example, the ratio between the idler pulley 472, 476 and the elbow pulley 470, 474 may be 1:2 or any other suitable ratio. It is noted that conventional band and pulley transmissions provide about +/−160° rotation of an end effector at the wrist joint WX. The aspects of the present disclosure employing the cable and pulley transmissions provide greater than +/−160° degree rotation of an end effector at the wrist joint WX or of a pulley (such as those described herein) about a respective axis SX, EX, WX.

For example, in one aspect, a pulley transmission 490, 492, 493, 494, 495 to pulley wheel 480, 484, 488, 482, 486, 491, 470, 474, 472, 476 engagement of a respective pulley wheel 480, 484, 488, 482, 486, 491, 470, 474, 472, 476 of the pulley system 655A-655E is arranged so as to determine rotation of a respective pulley wheel 480, 484, 488, 482, 486, 491, 470, 474, 472, 476 of the pulley system 655A-655E through at least 360° rotation of the respective pulley wheel 480, 484, 488, 482, 486, 491, 470, 474, 472, 476 between wound and unwound positions of the pulley transmission 490, 492, 493, 494, 495 on the respective pulley wheel 480, 484, 488, 482, 486, 491, 470, 474, 472, 476. For example, referring to FIG. 4, the pulley transmission 493 of pulley system 655E may be wound around pulleys 470, 472 to that pulley 472 (driven by rotation of pulley 470) rotates through at least 360° rotation between wound and unwound positions of the pulley transmission 493 on the pulley 472. Pulley transmission 495 of pulley system 655D may also be wound around pulleys 474, 476 to that pulley 476 (driven by rotation of pulley 474) rotates through at least 360° rotation between wound and unwound positions of the pulley transmission 495 on the pulley 476. In some aspects, the other pulley systems 655A-655C may be similarly configured for at least 360° rotation of the driven pulleys.

In one aspect, a pulley transmission 490, 492, 493, 494, 495 to pulley wheel 480, 484, 488, 482, 486, 491, 470, 474, 472, 476 engagement of a respective pulley wheel 480, 484, 488, 482, 486, 491, 470, 474, 472, 476 of the pulley system 655A-655E is arranged so as to determine rotation of a respective end effector 203, 204 through at least 360° rotation of the end effector 203, 204 relative to the at least one movable arm link 201, 202 between wound and unwound positions of the pulley transmission 490, 492, 493, 494, 495 on a respective pulley wheel 480, 484, 488, 482, 486, 491, 470, 474, 472, 476. For example, referring to FIG. 4, the pulley transmission 493 of pulley system 655E may be wound around pulleys 470, 472 to that end effector 203 (driven by rotation of pulley 472) rotates through at least 360° rotation relative to arm links 201, 202 between wound and unwound positions of the pulley transmission 493 on the pulley 472. Pulley transmission 495 of pulley system 655D may also be wound around pulleys 474, 476 to that end effector 204 (driven by rotation of pulley 476) rotates through at least 360° rotation relative to arm links 201, 202 between wound and unwound positions of the pulley transmission 495 on the pulley 476.

In one aspect, referring also to FIGS. 6E and 6F, an exemplary cable and pulley transmission is illustrated. The cable and pulley transmission may be substantially similar to those described herein. In this aspect, each of the grooves 635, 636 may be formed in the outer peripheral surface of the respective pulley 470, 472 so as to form a helix that is configured to guide wrapping of a respective cable 661A, 661B around the respective pulley 470, 472 along a helical path without overlapping the cables on themselves or each other. This helical winding of the cables 661A, 661B around the respective pulleys 470, 472 allows the cables to wrap around each of the respective pulleys 470, 472 more than one turn (e.g., any suitable number of turns—see FIG. 6F) so as to provide the greater than +/−160° or at least 360° degree rotation of an end effector at the wrist joint WX or of a pulley wheel about a respective axis SX, EX, WX.

The pulleys 470, 472 in FIGS. 6E and 6F are illustrated as having substantially a 1:1 drive ratio but in other aspects the pulleys may have any suitable drive ratio such as a 2:1 or 3:1 drive ratio so as to increase (alone or in combination with the spiral wound cables) the amount of rotation of the end effector about the wrist axis. It is noted that the pulley to pulley drive ratios described herein with respect to the cable and pulley transmissions may be effected with smaller diameter pulleys compared to pulleys used with band and pulley transmissions. For example, the cables described herein may generally be more flexible than the bands and provide for smaller bend radii when compared to the bands. The smaller bend radii of the cables provides for smaller diameter pulleys with cabled transmissions described herein than would otherwise be provided for with banded transmissions.

The first set of transmission members 490, the second set of transmission members 492, fourth set of transmission members 494, the shoulder drive pulleys 480, 484, 488 and the elbow idler pulleys 482, 486, 491 are substantially similar to that described above with respect to the idler pulleys 472, 476, the drive pulleys 470, 474, and the segmented transmission loops 660, 661 (see FIGS. 6C and 6D). As noted above the cable anchor points for the first set of transmission members 490, the second set of transmission members 492, fourth set of transmission members 494 are substantially similar to those described above with respect to cable anchor point 643.

As noted herein, the modular composite arm link casing 201C, 202C is a low profile casing having the compact height AH (FIGS. 5C and 5E) for a selected predetermined arm length OAL, OALn commensurate with a bi-symmetrically flexible pulley transmission (such as the transmission members 490, 492, 493, 494, 495), connecting respective pulley wheels of the respective pulley system 655A-655E, that has a compact substantially by-symmetrical cross section. For example, the cable segments (such as cable segments 660A, 660B illustrated in FIGS. 6A and 6B) have a substantially circular cross section, however the cable segments may have any other suitable bi-symmetric cross section. The compact height AH is smaller than a band pulley transmission housing height for a comparable number of pulley systems having comparable lengths. For example, referring briefly to FIG. 4A, the arm link 201 has the compact height AH and the length OAL. In this example, the arm link 201 includes the three pulley systems 655A-655C, where each pulley system includes opposing cable segments (as described herein) and a pair of pulleys. When compared to an arm link having the same length OAL and the same number of pulley systems where each pulley system includes opposing band segments and a pair of pulleys, the height AH of the arm link 201 including three of the cable/pulley transmissions described herein is less than a height of the arm link including three of the band/pulley transmissions.

Figure 8:
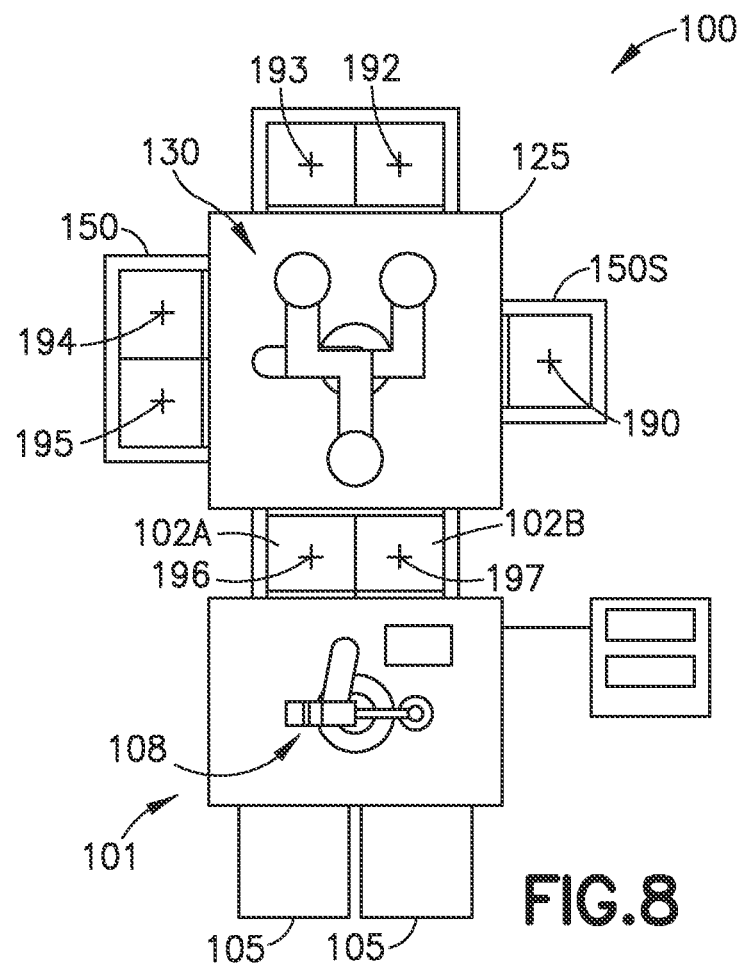
FIG. 8 is a schematic illustration of a substrate processing apparatus incorporating a substrate transport apparatus in accordance with aspects of the present disclosure.
Figure 9:
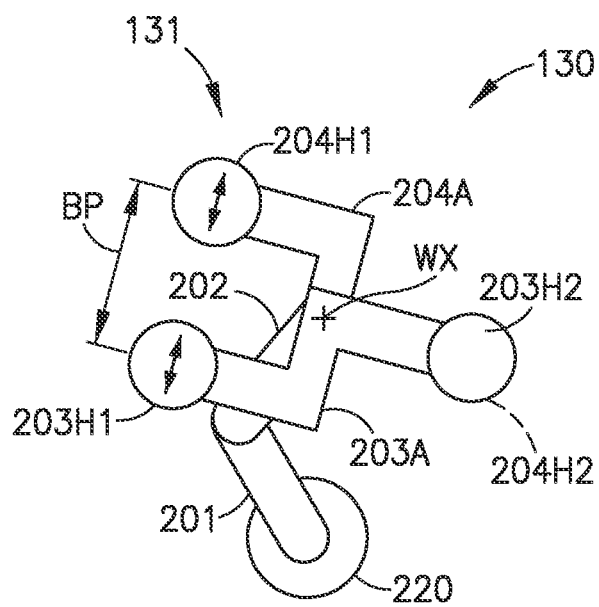
FIG. 9 is a schematic illustration of a substrate transport apparatus incorporating features of the present disclosure.

While the substrate transport apparatus 130 was described above with dual pan substrate holders 203, 204 in other aspects the substrate holders may have any suitable configuration. For example, referring to FIGS. 8, 9, and 10, each of more than one end effector link (e.g., substrate holder) has more than one corresponding substrate holding station, of more than one juxtaposed (e.g., side-by-side) substrate holding station, dependent therefrom and is respectively a substantially rigid unarticulated link between the more than one corresponding substrate holding station dependent from the respective end effector link (e.g., substrate holder). For example, the substrate transport apparatus 130 includes dual pan substrate holders 203A, 204A that are substantially similar to those described above; however, in this aspect the substrate holding stations 203H1, 204H1 are disposed side-by-side in a common plane (separated by the base pitch BP) while the substrate holding stations 203H2, 204H2 are located in different planes and stacked one over the other (separated by any suitable height H10 that may correspond to a distance between stacked holding stations of stacked substrate processing stations 150, stacked vacuum load locks 102A, 102B, 102C, 102D, or any other suitable stacked substrate holding locations—see FIG. 1C). Here, the transport chamber openings to the substrate processing stations may be at different planes/levels (See FIG. 1C), where each plane corresponds with the planes/levels of juxtaposed substrate holding stations 203H1-204H1, 203H2-204H2 of both dual/double ended substrate holders 203, 204. In still other aspects, as shown in FIG. 11, the substrate holding stations 203H1, 204H1 are disposed side-by-side in a common plane (separated by the base pitch BP) while only one of the substrate holders 203A, 204A is configured as a dual pan substrate holder (in this example, substrate holder 203A includes dual substrate holding stations 203H1, 203H2 whole substrate holder 204A includes the single substrate holding station 204H1). Again, each plane 499, 499A (see FIGS. 2D, 10, and 11) of the substrate holder planes (as described herein, and whether the substrate holding station(s) 203H1, 203H2, 204H1, 204H2 of the dual sided substrate holders form one or more planes) corresponds with and are aligned to at least one plane(s) (see FIGS. 1B and 1C) of transport openings in a common transport chamber for transfer at a given Z position of transport opening plane, so that substrate transfer through each respective opening on each plane is effected with at least one substrate holding station 203H1, 203H2, 204H1, 204H2 of each dual ended substrate holder 203, 204 substantially without Z axis movement, i.e., extension into the substrate processing stations (for each plane) with the substrate holding station(s) 203H1, 203H2, 204H1, 204H2 at one end of the substrate holders 203, 204, picking and/or placing of substrate(s) at the substrate processing stations, retraction from the substrate processing stations, and extension into each other different substrate processing station with the same or a different dual substrates at the same or different end of the dual ended substrate holders 203, 204 effects (independent of an intervening Z axis movement or decoupled from intervening Z axis movement between substrate transfers) a fast swapping of substrates substantially independent of Z axis movement. The automatic wafer centering, such as with the aspects of the present disclosure illustrated in FIGS. 8, 9, and 10, is effected by varying the base pitch BP between the substrate holding stations 203H1, 204H1 (e.g., may be increased or decreased) in a manner substantially similar to that described above. As may be realized, the substrate holder(s) 203H2, 204H2 may also be independently rotated about the wrist axis WX to effect automatic wafer centering for substrate holding station 203H2 independent of substrate holding station 204H2 and/or automatic wafer centering for substrate holding station 204H2 independent of substrate holding station 203H2.

Figure 12:
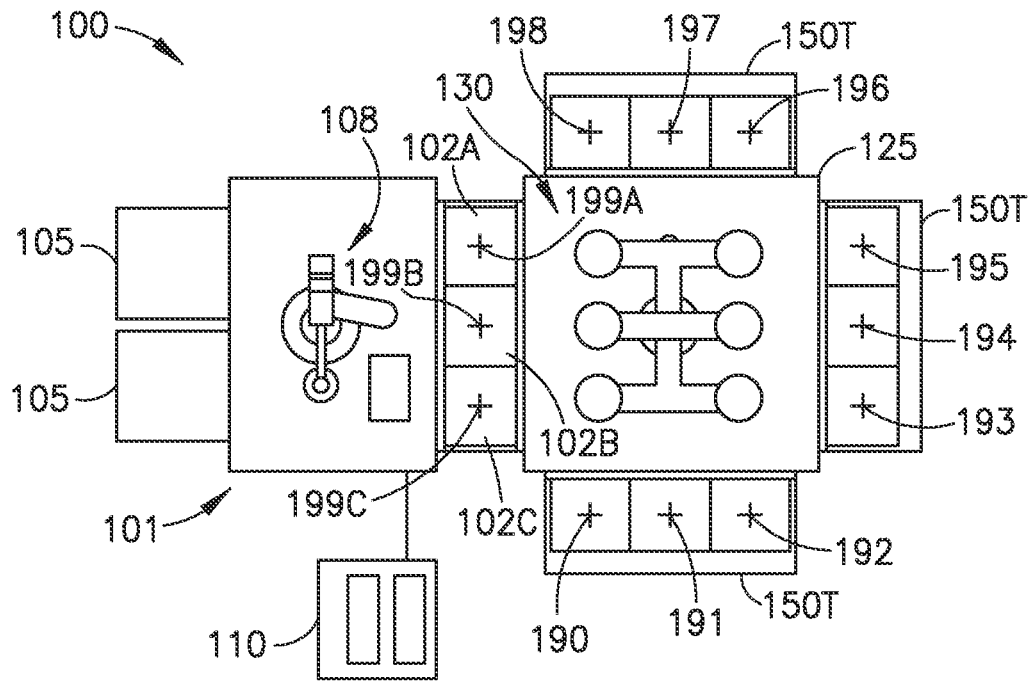
FIG. 12 is a schematic illustration of a substrate processing apparatus incorporating a substrate transport apparatus in accordance with aspects of the present disclosure.
Figure 13:
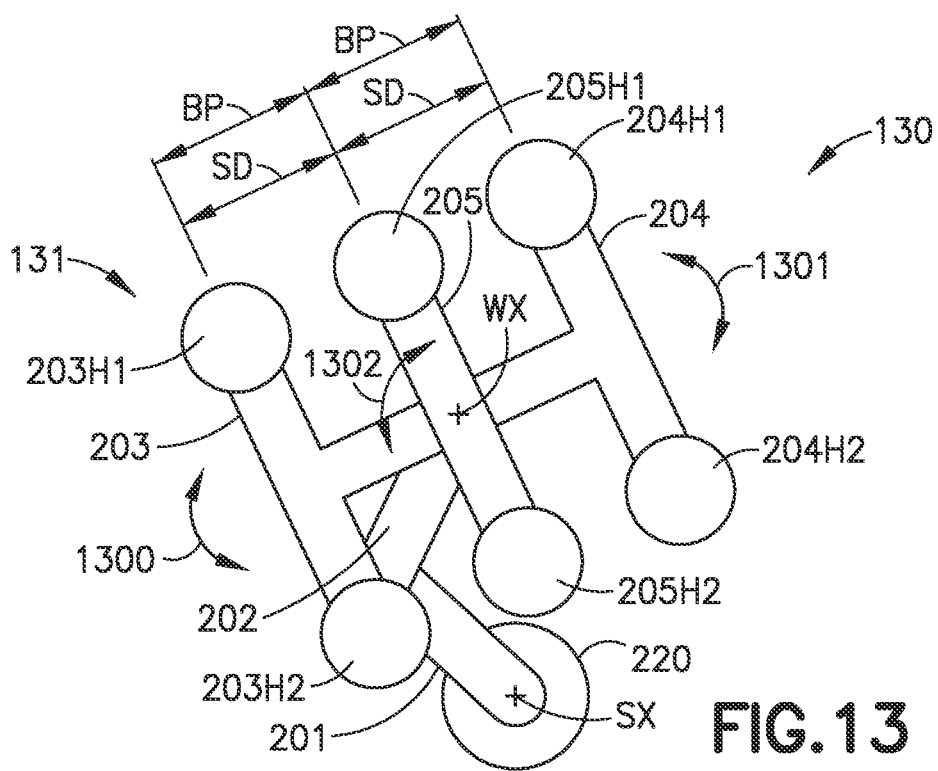
FIG. 13 is a schematic illustration of a substrate transport apparatus incorporating features of the present disclosure.

Referring to FIGS. 12 and 13, the substrate transport apparatus 130 is illustrated, in this aspect, as including three dual pan substrate holders. For example, the substrate transport apparatus 130 includes the substrate holders 203, 204 (as described above) as well as substrate holder 205. The substrate holders 203, 204 are driven by the drive section 220 in the manner described above to pivot about the wrist axis WX in directions 1300, 1301 relative to each other and to substrate holder 205. In this example, the drive section includes an additional drive axis (e.g., a five degree of freedom drive) to independently rotate substrate holder 205 about the wrist axis WX in direction 1302 relative to each of the substrate holders 203, 204; while in other aspects the substrate holder 205 may be slaved to any suitable portion of the substrate transport apparatus 130 such as, for example, the upper arm 201 to as to remain aligned with a radial extension axis that passes through the shoulder axis SX. Again, each plane 499, 499A (see FIGS. 2D, 10, and 11) of the substrate holder planes (as described herein, and whether the substrate holding station(s) 203H1, 203H2, 204H1, 204H2 of the dual sided substrate holders form one or more planes) corresponds with and are aligned to at least one plane(s) (see FIGS. 1B and 1C) of transport openings in a common transport chamber for transfer at a given Z position of transport opening plane, so that substrate transfer through each respective opening on each plane is effected with at least one substrate holding station 203H1, 203H2, 204H1, 204H2 of each dual ended substrate holder 203, 204 substantially without Z axis movement, i.e., extension into the substrate processing stations (for each plane) with the substrate holding station(s) 203H1, 203H2, 204H1, 204H2 at one end of the substrate holders 203, 204, picking and/or placing of substrate(s) at the substrate processing stations, retraction from the substrate processing stations, and extension into each other different substrate processing station with the same or a different dual substrates at the same or different end of the dual ended substrate holders 203, 204 effects (independent of an intervening Z axis movement or decoupled from intervening Z axis movement between substrate transfers) a fast swapping of substrates substantially independent of Z axis movement. In this example, automatic wafer centering is effected such that the base pitch BP between substrate holder 203 and substrate holder 204 may be increased or decreased, the base pitch BP between substrate holder 203 and substrate holder 205 may be increased or decreased, the base pitch BP between substrate holder 204 and substrate holder 205 may be increased or decreased, etc. to effect the automatic wafer centering for any one or more of substrate holding stations 203H1, 204H1, 205H1, 203H2, 204H2, 205H2 with respect to side by side substrate processing stations 190-198 and 199A-199C (see FIG. 12). In other aspects, the substrate holding stations 203H2-205H2 (or 203H1-205H1) may be stacked one above the other in a manner similar to that shown in FIG. 10. In still other aspects, one or more of the substrate holders 203-205 may be a single pan substrate holder in a manner similar to that shown in FIG. 11.

Figure 19:
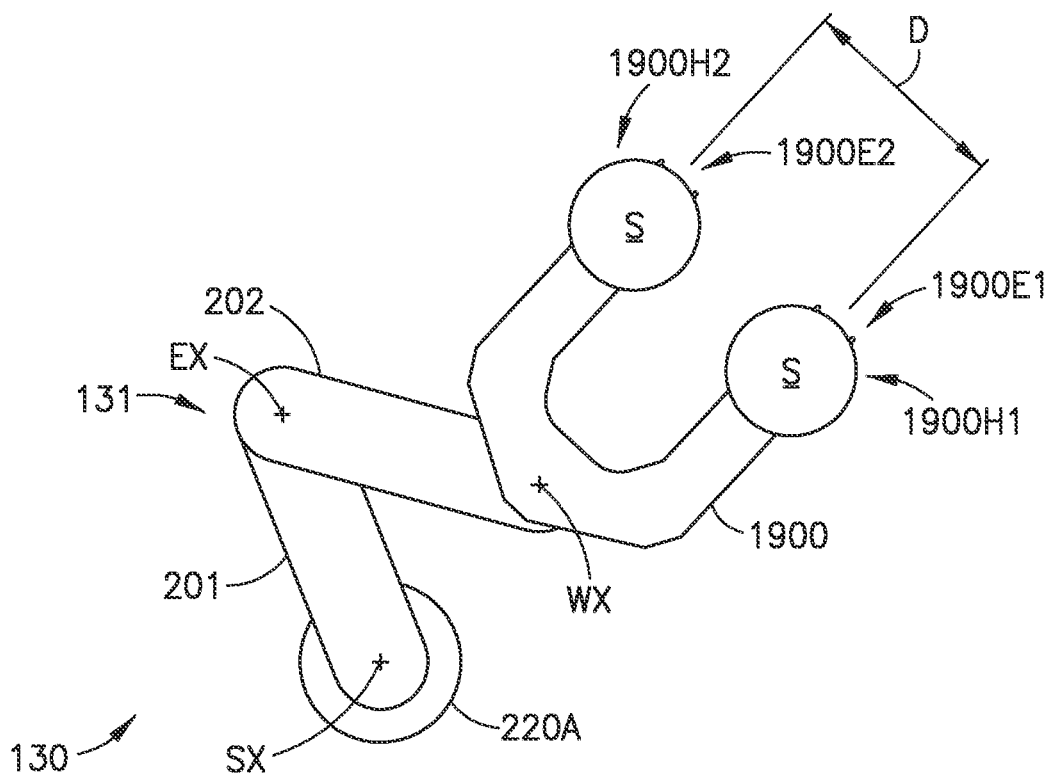
FIG. 19 is a schematic illustration of a substrate transport apparatus of the substrate processing apparatus of FIG. 1 in accordance with aspects of the present disclosure.
Figure 32:
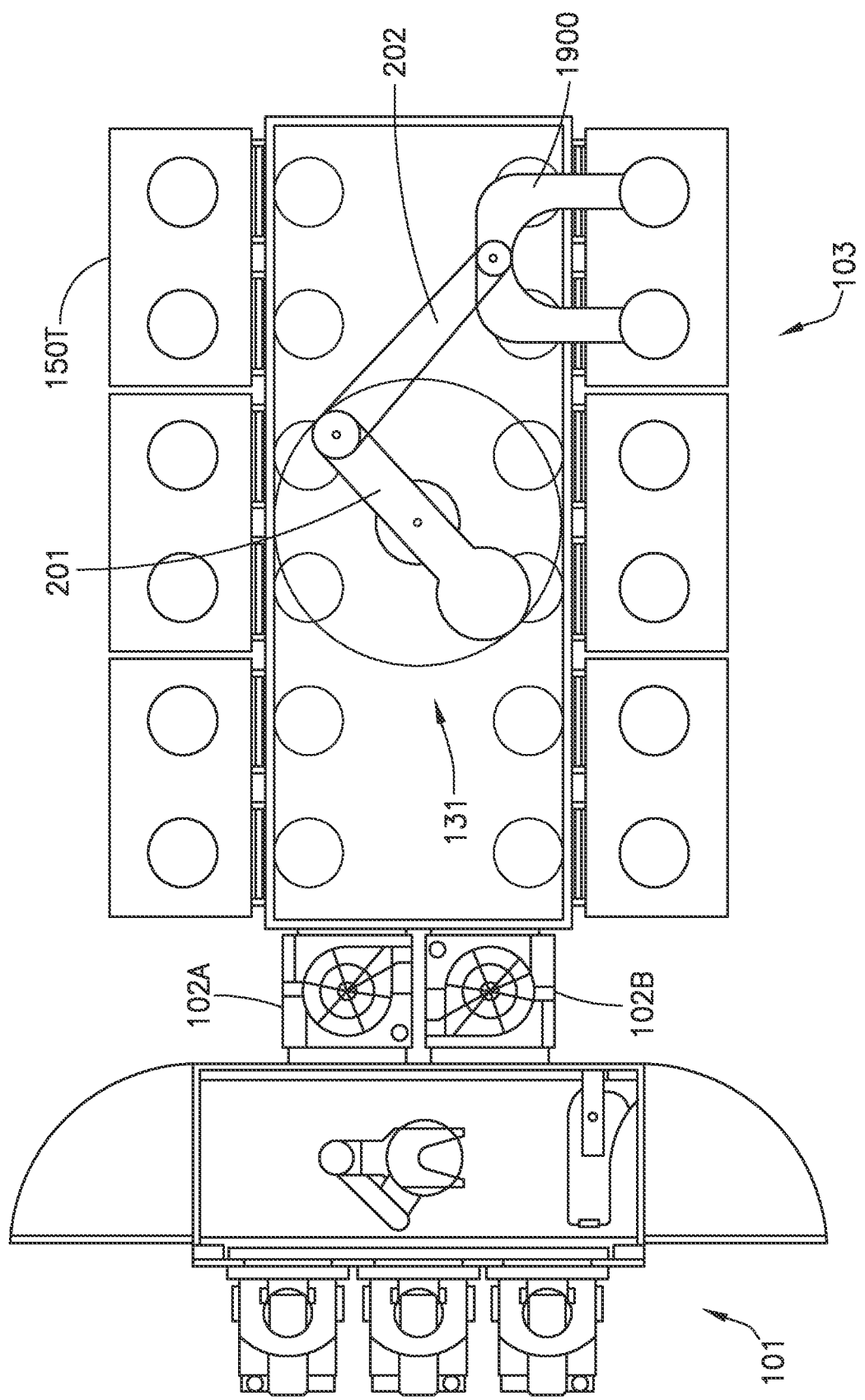
FIG. 32 is a schematic illustration of the substrate transport apparatus of the FIG. 19 in accordance with aspects of the present disclosure.

In still other aspects, the substrate transport apparatus 130 may have substrate holders with any suitable configuration for transporting substrates to and from single substrate stations, any suitable number of substrate stations arranged side-by-side, any suitable number of substrate stations arranged in a stack one above the other, etc. The combination of side-by-side substrate holders and multiple stacked (or a single) substrate holder(s) on opposite sides of the wrist axis WX may be employed such as where a combination of twin, single, triple, etc. (see FIGS. 1A, 8, and 12) substrate station modules are coupled to the transfer chamber 125. For example, referring to FIGS. 19 and 32, the substrate transport apparatus 130 includes one double (side-by-side) substrate holder 1900 rotatably coupled to the arm 131 in a manner similar to that described above. In this aspect, the arm 131 and substrate holder 1900 may be driven in rotation and/or extension (e.g., along radial and/or non-radial linear paths) by the three-axis drive section 220A (FIG. 3A), where one drive axis rotates upper arm 201 about the shoulder axis SX, one drive axis rotates the forearm 202 about the elbow axis EX, and one drive axis rotates the substrate holder 1900 about the wrist axis WX. Each of the upper arm 201, forearm 202, and substrate holder 1900 may be coupled to the three axis drive section 220A (FIG. 3A) by any suitable transmissions such as by cable and pulley transmissions substantially similar to those described above with respect to FIG. 4. Here the substrate holder 1900 includes (i.e., is common to) two side-by-side substrate hold stations 1900H1, 1900H2 that are substantially similar to those described above. A distance between the side-by-side substrate holding stations 1900H1, 1900H2 may be substantially the same as the pitch D between side-by-side substrate processing stations 190-197 (FIG. 1A). The substrate holder 1900 has a first end 1900E1, a second end 1900E2 and is a substantially rigid unarticulated link between the first end 1900E1 and second end 1900E2. The substrate holder 1900 is rotatably coupled to the forearm 202 about the wrist axis WX at a location that is between the first end 1900E1 and second end 1900E2. As described above, the substrate holding stations 1900H1, 1900H2 are disposed on a common plane (substantially similar to plane 499 as described above with respect to FIGS. 2D, 10, and 11). The substrate holder 1900 may be extended by the transport arm 131 and drive section 220A along a non-radial linear path and or a radial linear path in a manner substantially similar to that described herein for substantially simultaneously picking and/or placing substrates to side-by-side substrate station modules along the common plane 499.

Figure 20:
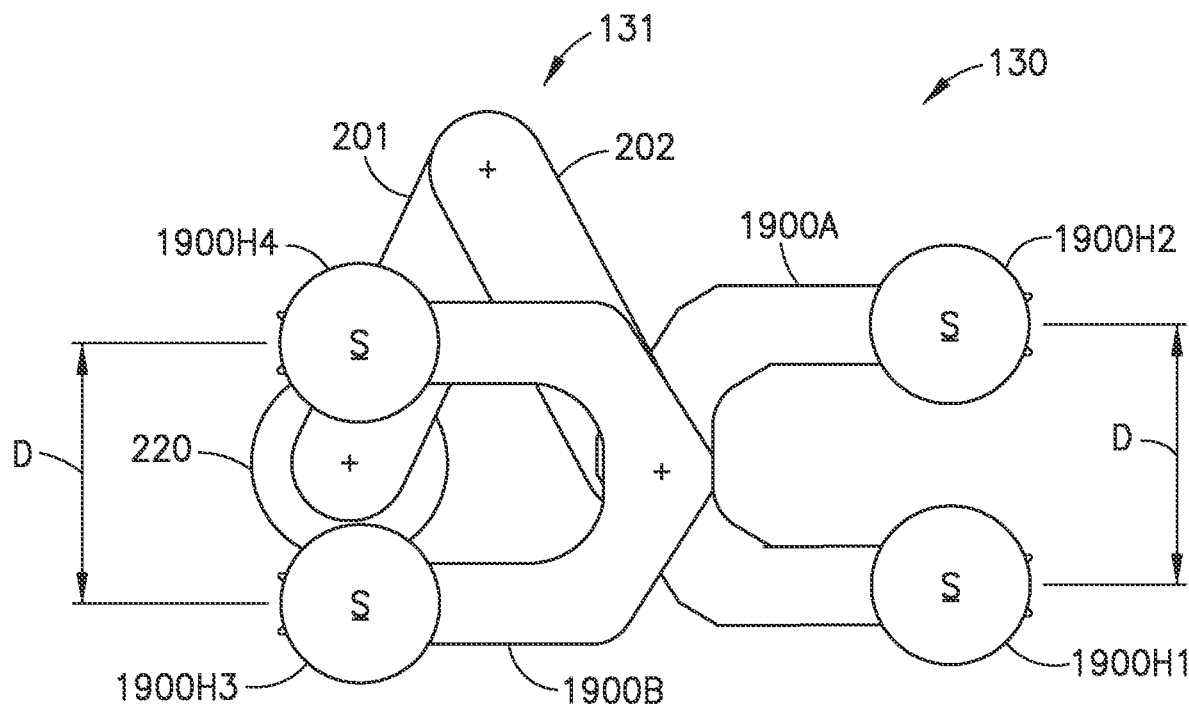
FIG. 20 is a schematic illustration of a substrate transport apparatus of the substrate processing apparatus of FIG. 1 in accordance with aspects of the present disclosure.

Referring to FIG. 20, the substrate transport apparatus 130 is substantially similar to that described above with respect to FIG. 19; however, in this aspect the substrate transport apparatus 130 includes two substrate holders 1900A and 1900B rotatably coupled to the arm 131 about the wrist axis WX. Each of the substrate holders 1900A, 1900B is substantially similar to substrate holder 1900. Here the arm 131 and substrate holders 1900A, 1900B are driven in rotation and/or extension (along a non-radial linear path and/or a radial linear path) by, for example, the four axis drive section 220 (FIG. 3) where one drive axis rotates upper arm 201 about the shoulder axis SX, one drive axis rotates the forearm 202 about the elbow axis EX, one drive axis rotates the substrate holder 1900A about the wrist axis WX, and one drive axis rotates the substrate holder 1900B about wrist axis WX. Each of the upper arm 201, forearm 202, and substrate holders 1900A, 1900B may be coupled to the four axis drive section 220 (FIG. 3) by any suitable transmissions such as by cable and pulley transmissions substantially similar to those described above with respect to FIG. 4. In this aspect, substrate holder 1900A includes substrate holding stations 1900H1, 1900H2 and substrate holder 1900B includes substrate holding station 1900H3, 1900H4. In a manner similar to that described above, the substrate holding stations 1900H1, 1900H2, 1900H3, 1900H4 are disposed on a common plane (substantially similar to plane 499 as described above with respect to FIGS. 2D, 10, and 11). The substrate holders 1900A, 1900B may be extended by the transport arm 131 and drive section 220 along a non-radial linear path and or a radial linear path in a manner substantially similar to that described herein for substantially simultaneously picking and/or placing substrates to side-by-side substrate station modules along the common plane 499. The arm 131 and/or substrate holders 1900A, 1900B may also be driven in rotation to fast swap the substrate holders 1900A, 1900B (and substrates picked or placed thereby) in a manner substantially similar to that described herein.

Figure 21:
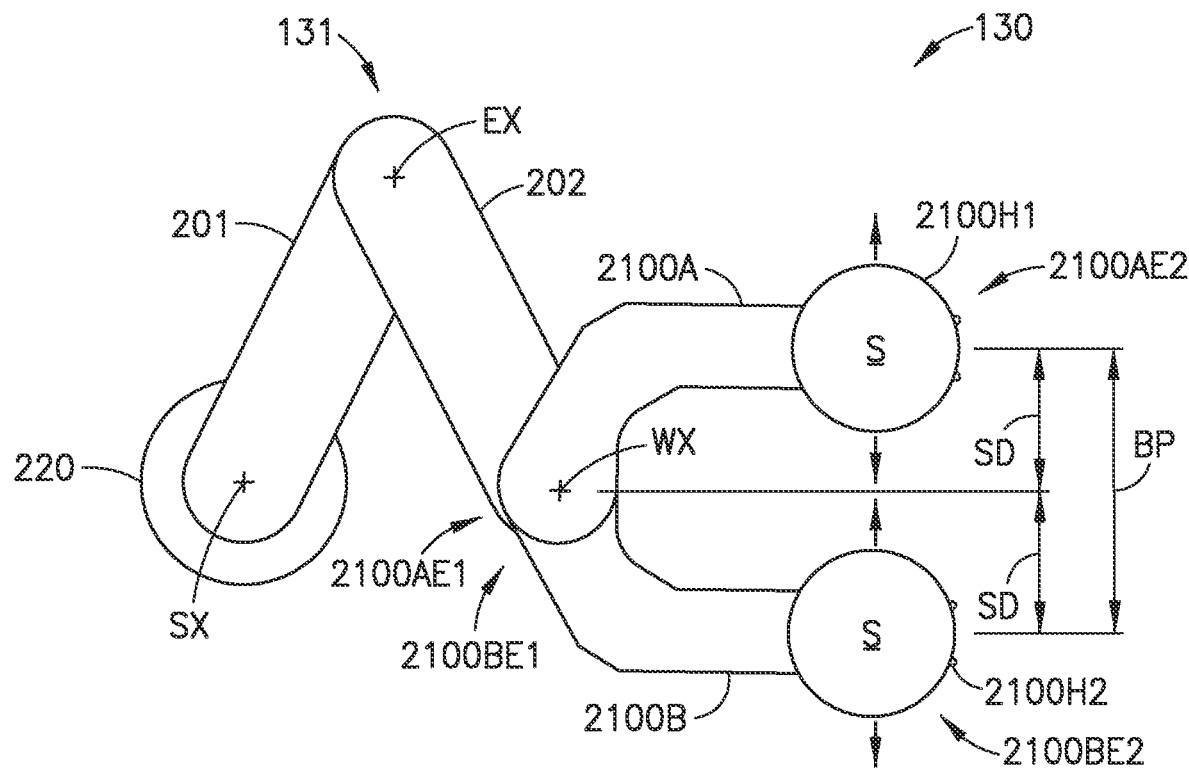
FIG. 21 is a schematic illustration of a substrate transport apparatus of the substrate processing apparatus of FIG. 1 in accordance with aspects of the present disclosure.

Referring to FIG. 21, the substrate transport apparatus 130 is substantially similar to that described above with respect to FIG. 19; however, in this aspect the substrate transport apparatus 130 includes two single sided substrate holders 2100A and 2100B rotatably coupled to the arm 131 about the wrist axis WX. Each of the substrate holders 2100A, 2100B has a respective first end 2100AE1, 2100BE1 coupled to the forearm 202 about the wrist axis and a respective second end 2100AE2, 2100BE2 at which a respective substrate holding station 2100H1, 2100H2 is located. Here the arm 131 and substrate holders 2100A, 2100B are driven in rotation and/or extension (along a non-radial linear path and/or a radial linear path) by, for example, the four axis drive section 220 (FIG. 3) where one drive axis rotates upper arm 201 about the shoulder axis SX, one drive axis rotates the forearm 202 about the elbow axis EX, one drive axis rotates the substrate holder 2100A about the wrist axis WX, and one drive axis rotates the substrate holder 2100B about wrist axis WX. Each of the upper arm 201, forearm 202, and substrate holders 2100A, 2100B may be coupled to the four axis drive section 220 (FIG. 3) by any suitable transmissions such as by cable and pulley transmissions substantially similar to those described above with respect to FIG. 4. In this aspect, substrate holder 2100A includes substrate holding station 2100H1, and substrate holder 2100B includes substrate holding station 2100H2. In a manner similar to that described above, the substrate holding stations 2100H1, 2100H2 are disposed on a common plane (substantially similar to plane 499 as described above with respect to FIGS. 2D, 10, and 11).

The substrate holders 2100A, 2100B may be extended by the transport arm 131 and drive section 220 along a non-radial linear path and or a radial linear path in a manner substantially similar to that described herein for substantially simultaneously picking and/or placing substrates to side-by-side substrate station modules along the common plane 499. It is noted that the independent rotation of the substrate holders 2100A, 2100B about the wrist axis WX provides for automatic wafer centering by varying the base pitch BP (e.g., the distance between the side-by side substrate holding stations 2100H1, 2100H2 may be increased or decreased in a manner similar to that illustrated in FIGS. 2B and 2C) to accommodate variances in the pitch D and/or to effect automatic wafer centering for placing wafers at the substrate processing stations 190-197 (see FIG. 1A).

Figure 22:
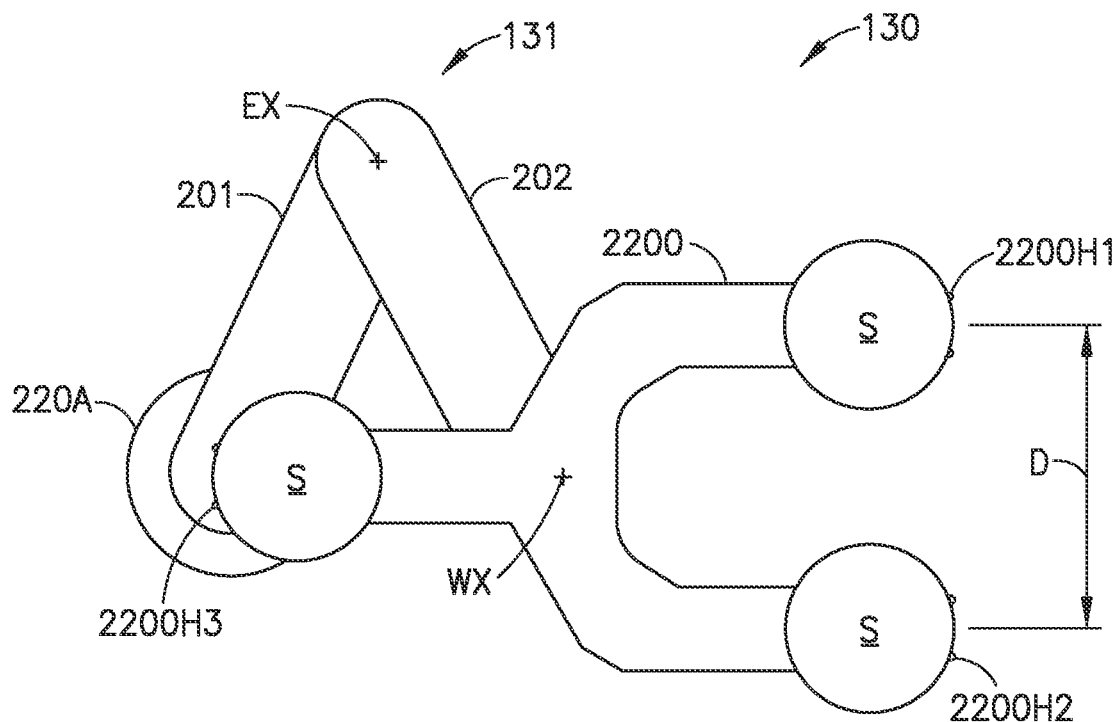
FIG. 22 is a schematic illustration of a substrate transport apparatus of the substrate processing apparatus of FIG. 1 in accordance with aspects of the present disclosure.

Referring to FIG. 22, the substrate transport apparatus 130 includes a substrate holder 2200 that is rotatably coupled to the arm 131 in a manner similar to that described above. In this aspect, the arm 131 and substrate holder 2200 may be driven in rotation and/or extension (e.g., along radial and/or non-radial linear paths) by the three-axis drive section 220A (FIG. 3A), where one drive axis rotates upper arm 201 about the shoulder axis SX, one drive axis rotates the forearm 202 about the elbow axis EX, and one drive axis rotates the substrate holder 2200 about the wrist axis WX. Each of the upper arm 201, forearm 202, and substrate holder 2200 may be coupled to the three axis drive section 220A (FIG. 3A) by any suitable transmissions such as by cable and pulley transmissions substantially similar to those described above with respect to FIG. 4. Here the substrate holder 2200 includes (i.e., is common to) two side-by-side substrate hold stations 2200H1, 2200H2 and one opposing substrate holding station 2200H3 that are substantially similar to those described above and, the substrate holder 2200 is a substantially rigid unarticulated link between the substrate holding stations 2200H1, 2200H2, 2200H3. A distance between the two side-by-side substrate holding stations 2100H1, 2100H2 may be substantially the same as the pitch D between side-by-side substrate processing stations 190-197 (FIG. 1A).

The side-by-side substrate holding stations 2100H1, 2100H2 provide for substantially simultaneous picking and placing of substrates S from and to the side-by-side substrate processing stations 190-197 (FIG. 1) while the opposing substrate holding station 2200H3 provides for the picking and placing of a single substrate to a single substrate processing station (which may be one of the side-by-side substrate processing stations 190-197 (FIG. 1A) or substrate processing station 150S (FIG. 8)) in a manner substantially similar to that described above with respect to FIGS. 8 and 9. The substrate holder 2200 is rotatably coupled to the forearm 202 about the wrist axis WX at a location that is between the substrate holding stations 2200H1, 2200H2, 2200H3. In one aspect, the three substrate holding stations 2200H1, 2200H2, 2200H3 are disposed in the common plane 499 in a manner substantially similar to that described above with respect to FIGS. 2D, 10, and 11; while in other aspects, one or more of the substrate holding stations 2200H1, 2200H2, 2200H3 may be disposed in different stacked planes. The substrate holder 2200 may be extended by the transport arm 131 and drive section 220A along a non-radial linear path and or a radial linear path in a manner substantially similar to that described herein for substantially simultaneously picking and/or placing substrates, with the side-by-side substrate holding stations 2200H1, 2200H2, to side-by-side substrate station modules 150 along the common plane 499 or picking and/or placing a substrate to and from a substrate station module 150, 150S with the substrate holding station 2200H3. In one aspect, the arm 131 and/or end effector 2200 may also be driven in rotation to fast swap (in a manner substantially similar to that described herein) a substrate using the opposing substrate holding station 2200H3 and one of the side-by-side substrate holding stations 2200H1, 2200H2, such as where substrate are picked by the side-by-side substrate holding stations 2200H1, 2200H2 and a substrate is placed by the opposing substrate holding station 2200H3 in one of the locations a substrate was just picked by the side-by-side substrate holding stations 2200H1, 2200H2.

Figure 23:
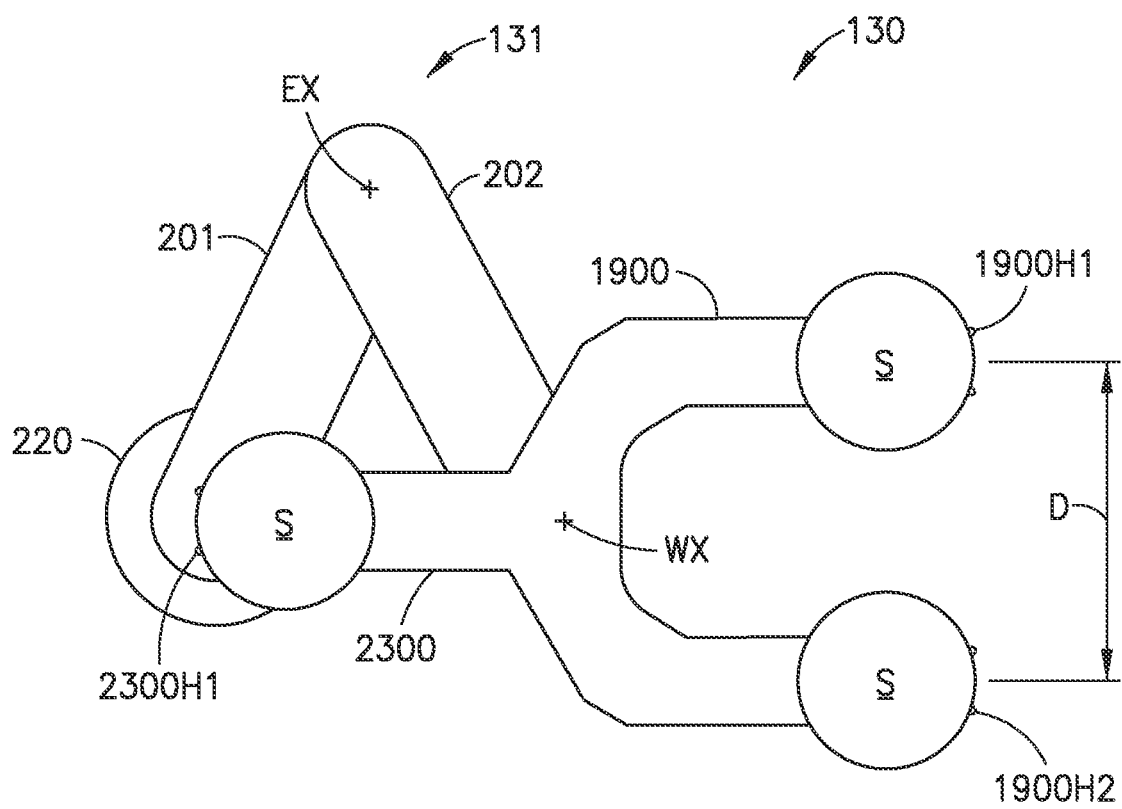
FIG. 23 is a schematic illustration of a substrate transport apparatus of the substrate processing apparatus of FIG. 1 in accordance with aspects of the present disclosure.

Referring to FIG. 23, the substrate transport apparatus 130 includes substrate holders 1900, 2300 that are rotatably coupled to the arm 131 in a manner similar to that described above. In this aspect, the arm 131 and substrate holders 1900, 2300 may be driven in rotation and/or extension (e.g., along radial and/or non-radial linear paths) by the four-axis drive section 220 (FIG. 3), where one drive axis rotates upper arm 201 about the shoulder axis SX, one drive axis rotates the forearm 202 about the elbow axis EX, one drive axis rotates the substrate holder 1900 about the wrist axis WX, and one drive axis rotates the substrate holder 2300 about the wrist axis WX. Each of the upper arm 201, forearm 202, and substrate holders 1900, 2300 may be coupled to the four axis drive section 220 (FIG. 3) by any suitable transmissions such as by cable and pulley transmissions substantially similar to those described above with respect to FIG. 4. Here the substrate holder 1900 includes two side-by-side substrate hold stations 1900H1, 1900H2 as described above. The substrate holder 2300 is an opposing substrate holder (i.e., opposes substrate holder 1900 in a manner substantially similar to that described above with respect to FIGS. 8, 9, and 22) having a single substrate holding station 2300H1. The substrate holding station 2300H1 is substantially similar to those described above. The substrate holder 2300 has a first (or proximate) end coupled to the forearm 202 at the wrist axis WX and an opposite (or distal) end at which the substrate holding station 2300H1 is disposed. The substrate holder 2300 is a substantially rigid unarticulated link between the proximate and distal ends. As described above, the distance or between the two side-by-side substrate holding stations 2100H1, 2100H2 may be substantially the same as the pitch D between side-by-side substrate processing stations 190-197 (FIG. 1A).

As noted above, the side-by-side substrate holding stations 1900H1, 1900H2 provide for substantially simultaneous picking and placing of substrates S from and to the side-by-side substrate processing stations 190-197 (FIG. 1) while the opposing substrate holding station 2300H1 provides for the picking and placing of a single substrate to a single substrate processing station (which may be one of the side-by-side substrate processing stations 190-197 (FIG. 1A) or substrate processing station 150S (FIG. 8)) in a manner substantially similar to that described above with respect to FIGS. 8 and 9.

Figure 23A:
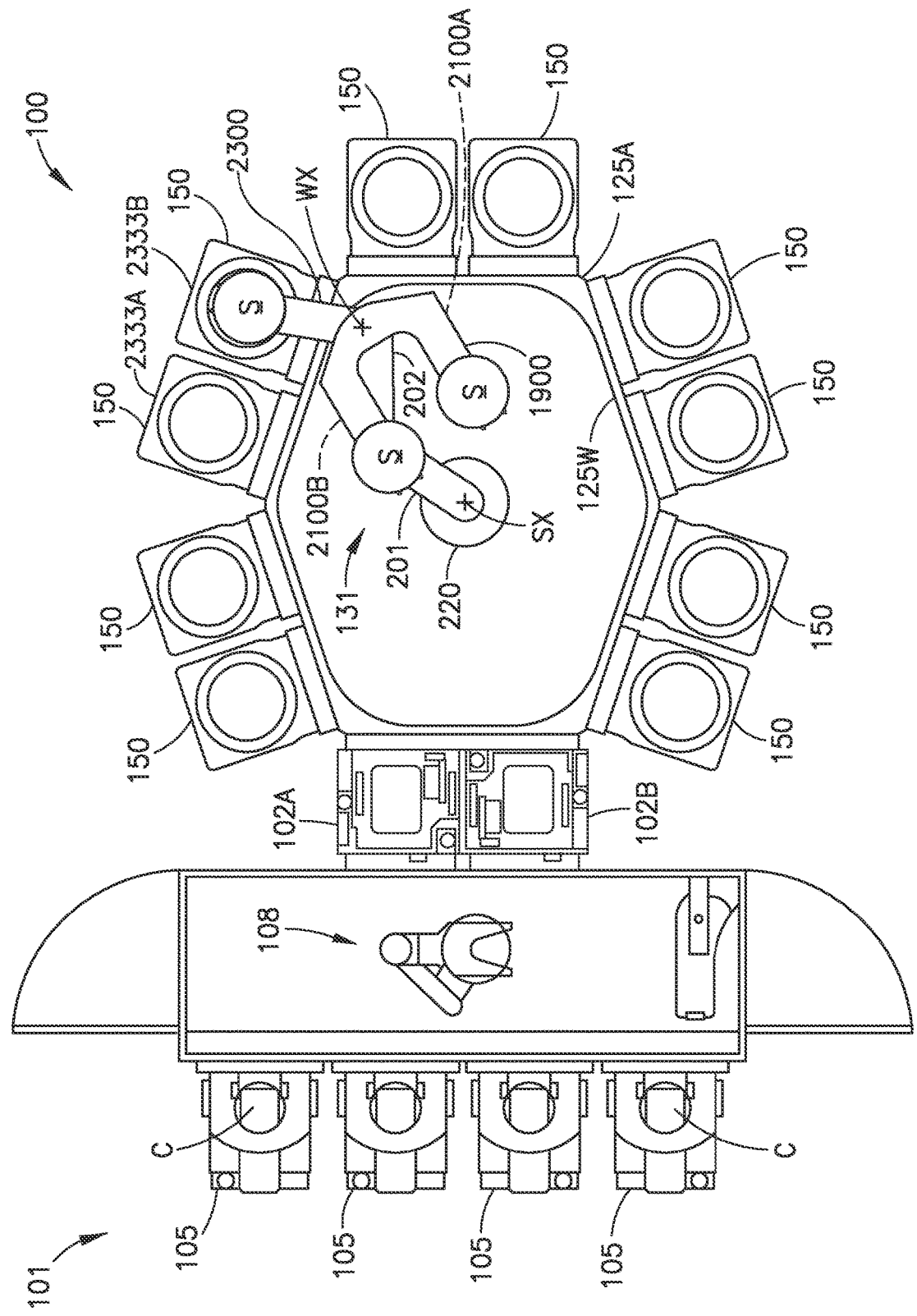
FIG. 23A is a schematic illustration of an exemplary substrate processing apparatus incorporating the substrate transport apparatus of FIG. 23 in accordance with aspects of the present disclosure.

Independent rotation of the substrate holder 2300 provides for automatic wafer centering (as described herein) of substrates held by the substrate holding station 2300H1 during pick/place operations. Independent rotation of the substrate holders 1900, 2300 may also provide for substrate holder conformance of the substrate transport apparatus 130 to a shape (e.g., of the interior side walls 125W) of the transfer chamber 125A. For example, referring also to FIG. 23A, the substrate holders 1900, 2300 may be rotated by the drive section 220 so that the single substrate holder 2300 is rotated, with arm extension movement, so as to extend into the substrate processing station 150 while the substrate holder 1900 is rotated to maintain clearance between the substrate holder 1900 and the walls 125W of the transfer chamber 125A. While the six-sided transfer chamber 125A is illustrated in FIG. 23A, in other aspects, the transfer chamber may have any suitable number of sides and the substrate holders 1900, 2300 may be rotated by the drive section to conform to a shape of the walls of the transfer chamber in any suitable manner.

In one aspect, the three substrate holding stations 1900H1, 1900H2, 2300H1 are disposed in the common plane 499 in a manner substantially similar to that described above with respect to FIGS. 2D, 10, and 11; while in other aspects, one or more of the substrate holding stations 1900H1, 1900H2, 2300H1 may be disposed in different stacked planes. The substrate holders 1900, 2300 may be extended by the transport arm 131 and drive section 220 along a non-radial linear path and or a radial linear path in a manner substantially similar to that described herein for substantially simultaneously picking and/or placing substrates, with the side-by-side substrate holding stations 1900H1, 1900H2, to side-by-side substrate station modules 150 along the common plane 499 or picking and/or placing a substrate to and from a substrate station module 150, 150S with the substrate holding station 2300H1. In one aspect, the arm 131 and/or end effector 2200 may also be driven in rotation to fast swap (in a manner substantially similar to that described herein) a substrate using the opposing substrate holding station 2300H1 and one of the side-by-side substrate holding stations 1900H1, 1900H2, such as where substrates are picked by the side-by-side substrate holding stations 1900H1, 1900H2 and a substrate is placed by the opposing substrate holding station 2300H1 in one of the locations a substrate was just picked by the side-by-side substrate holding stations 1900H1, 1900H2.

Figure 24:
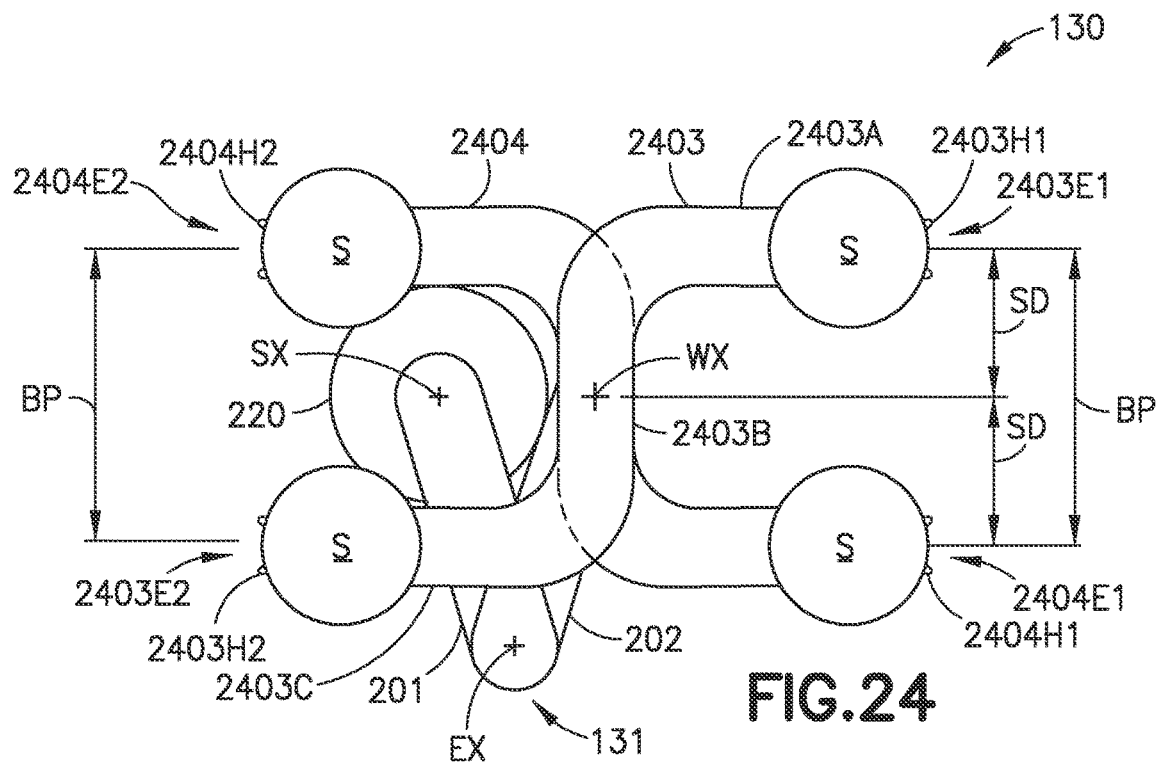
FIG. 24 is a schematic illustration of a substrate transport apparatus of the substrate processing apparatus of FIG. 1 in accordance with aspects of the present disclosure.

Referring to FIG. 24, the substrate transport apparatus 130 is substantially similar to that described above with respect to FIG. 2A-2D; however, in this aspect substrate holders 2403, 2404 have an "S" shaped configuration and cross over one another. For example, substrate holder 2403 has a first portion 2403A, a second portion 2403B that has a longitudinal axis disposed substantially orthogonally to a longitudinal axis of the first portion 2403A, and a third portion that has a longitudinal axis disposed substantially parallel with the longitudinal axis of the first portion 2403A so as to form a substantially "S" shaped substrate holder. A distal end of the first portion forms a first end 2403E1 of the substrate holder 2403 and a distal end of the third portion 2403C forms a second end 2403E2 of the substrate holder 2403. The second portion 2403B is coupled to the forearm 202 about the wrist axis WX, where the substrate holder 2403 is a substantially rigid unarticulated link between the first end 2403E1 and the second end 2403E2. The configuration of substrate holder 2404 is substantially similar, but opposite in hand, to substrate holder 2403.

Here the arm 131 and substrate holders 2403, 2404 are driven in rotation and/or extension (along a non-radial linear path and/or a radial linear path) by, for example, the four axis drive section 220 (FIG. 3) where one drive axis rotates upper arm 201 about the shoulder axis SX, one drive axis rotates the forearm 202 about the elbow axis EX, one drive axis rotates the substrate holder 2403 about the wrist axis WX, and one drive axis rotates the substrate holder 2404 about wrist axis WX. Each of the upper arm 201, forearm 202, and substrate holders 2100A, 2100B may be coupled to the four axis drive section 220 (FIG. 3) by any suitable transmissions such as by cable and pulley transmissions substantially similar to those described above with respect to FIG. 4. In this aspect, substrate holder 2403 includes substrate holding stations 2403H1, 2403H2 and substrate holder 2404 includes substrate holding stations 2404H1, 2404H2. In a manner similar to that described above, the substrate holding stations 2403H1, 2403H2, 2404H1, 2404H2 are disposed on a common plane (substantially similar to plane 499 as described above with respect to FIGS. 2D, 10, and 11). The substrate holding stations 2403H1, 2403H2, 2404H1, 2404H2 may be extended by the transport arm 131 and drive section 220 along a non-radial linear path and or a radial linear path in a manner substantially similar to that described herein for substantially simultaneously picking and/or placing substrates to side-by-side substrate station modules along the common plane 499. It is noted that the independent rotation of the substrate holders 2403, 2404 about the wrist axis WX provides for automatic wafer centering by varying the base pitch BP (e.g., the distance between the side-by side substrate holding stations 2100H1, 2100H2 may be increased or decreased in a manner similar to that illustrated in FIGS. 2B and 2C) to accommodate variances in the pitch D and/or to effect automatic wafer centering for placing wafers at the substrate processing stations 190-197 (see FIG. 1A). In one aspect, the arm 131 and/or end effectors 2403, 2404 may also be driven in rotation to fast swap substrates (in a manner substantially similar to that described herein) in a manner similar to that described above with respect to FIGS. 7A-7L.

Figure 25:
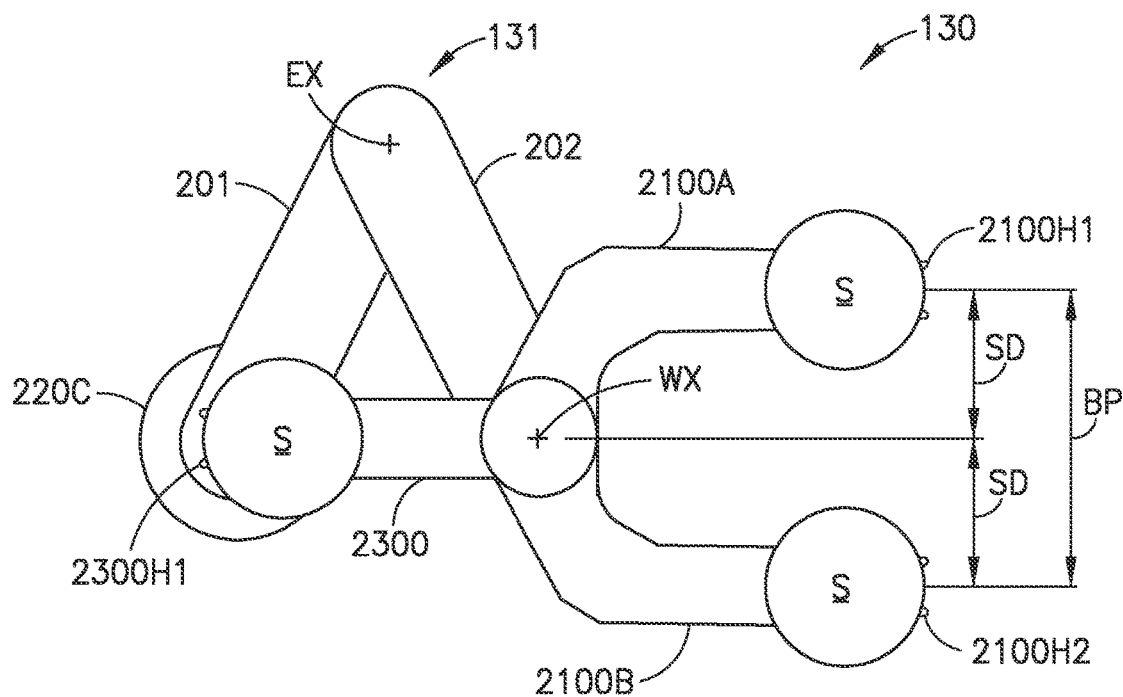
FIG. 25 is a schematic illustration of a substrate transport apparatus of the substrate processing apparatus of FIG. 1 in accordance with aspects of the present disclosure.

Referring to FIG. 25, the substrate transport apparatus 130 is substantially similar to that described above with respect to FIG. 21; however, in this aspect substrate the substrate transport apparatus also include opposing substrate holder 2300 similar to that described above with respect to FIG. 23. Here the arm 131 and substrate holders 2100A, 2100B, 2300 are driven in rotation and/or extension (along a non-radial linear path and/or a radial linear path) by, for example, the five axis drive section 220C (FIG. 3C) where one drive axis rotates upper arm 201 about the shoulder axis SX, one drive axis rotates the forearm 202 about the elbow axis EX, one drive axis rotates the substrate holder 2100A about the wrist axis WX, one drive axis rotates the substrate holder 2100B about wrist axis WX, and one drive axis rotates substrate holder 2300 about wrist axis WX. Each of the upper arm 201, forearm 202, and substrate holders 2100A, 2100B, 2300 may be coupled to the five axis drive section 220C (FIG. 3C) by any suitable transmissions such as by cable and pulley transmissions substantially similar to those described above with respect to FIG. 4. In this aspect, substrate holder 2100A includes substrate holding station 2100H1, substrate holder 2100B includes substrate holding station 2100H2, and substrate holder 2300 includes substrate holding station 2300H1. In a manner similar to that described above, the substrate holding stations 2100H1, 2100H2, 2300H1 are disposed on a common plane (substantially similar to plane 499 as described above with respect to FIGS. 2D, 10, and 11). The substrate holders 2100H1, 2100H2, 2300H1 may be extended by the transport arm 131 and drive section 220C along a non-radial linear path and or a radial linear path in a manner substantially similar to that described herein for substantially simultaneously picking and/or placing substrates to side-by-side substrate station modules along the common plane 499.

It is noted that the independent rotation of the substrate holders 2100H1, 2100H2 about the wrist axis WX provides for automatic wafer centering for picking/placement of substrates S in side-by-side substrate station modules 150 by varying the base pitch BP (e.g., the distance between the side-by side substrate holding stations 2100H1, 2100H2 may be increased or decreased in a manner similar to that illustrated in FIGS. 2B and 2C) to accommodate variances in the pitch D and/or to effect automatic wafer centering for placing wafers at the substrate processing stations 190-197 (see FIG. 1A). It is further noted that the opposing substrate holding station 2300H1 provides for the picking and placing of a single substrate to a single substrate processing station (which may be one of the side-by-side substrate processing stations 190-197 (FIG. 1A) or substrate processing station 150S (FIG. 8)) in a manner substantially similar to that described above with respect to FIGS. 8 and 9. Independent rotation of the substrate holder 2300 provides for further automatic wafer centering (as described herein) of substrates held by the substrate holding station 2300H1 during pick/place operations. In one aspect, the arm 131 and/or end effectors 2100A, 2100B, 2300 may also be driven in rotation to fast swap (in a manner substantially similar to that described herein) a substrate using the opposing substrate holding station 2300H1 and one of the side-by-side substrate holding stations 2100H1, 2100H2, such as where substrates are picked by the side-by-side substrate holding stations 2100H1, 2100H2 and a substrate is placed by the opposing substrate holding station 2300H1 in one of the locations a substrate was just picked by the side-by-side substrate holding stations 2100H1, 2100H2.

In one aspect, independent rotation of the substrate holders 2100A, 2100B, 2300 may also provide for substrate holder conformance of the substrate transport apparatus 130 to a shape (e.g., of the interior walls 125W) of the transfer chamber 125A in a manner similar to that described above with respect to FIG. 23A. However, in this aspect, one or more of the substrate holders 2100A, 2100B may be rotated by the drive section 220C to maintain clearance between the respective substrate holder 2100A, 2100B and the walls 125W of the transfer chamber 125A.

Referring to FIGS. 26A, 26B, 26C, and 26D, the substrate transport apparatus 130 is substantially similar to that described above with respect to FIG. 24; however, in this aspect at least one of the substrate holders 2403, 2404 is movable in the Z direction so that the substrate holders 2403, 2404 (and the respective substrate holding stations 2403H1, 2404H1, 2403H2, 3404H2) pass over one another. For example, a wrist Z-drive 2660 (in addition to or in lieu of the Z-drive 312—see FIGS. 3-3C) is provided in or coupled to the forearm 202. The wrist Z-drive 2660 is configured to move one or more of the substrate holders 2403, 2404 in the Z direction relative to the other one of the substrate holders 2403, 2404. In the example illustrated in FIG. 26C the wrist Z-drive 2660 is configured to move substrate holder 2403 in the Z direction relative to substrate holder 2404 and forearm 202; however, in other aspects both substrate holders may be movable in the Z direction relative to the forearm 202 and/or each other. The wrist Z-drive 2660 may have any suitable configuration for effecting Z movement including but not limited to one or more of a linear actuator, a jack screw, and a magnetic levitation lift. In this aspect, the pulley 476 is coupled to shaft 476S, where shaft 476S includes an outer shaft portion 476B and an inner shaft portion 476A. The inner shaft portion 476A and the outer shaft portion 476B are configured so that the inner shaft portion 476A is movable relative to the outer shaft portion 476B in the Z-direction while rotating with the outer shaft portion 476B as a unit. For example, the inner shaft portion 476A includes an internal spline and the outer shaft portion 476B includes an external spline configured to mate with the internal spline. While an exemplary configuration of the wrist Z-drive 2660 and shaft 276S is provided, in other aspects the wrist Z-drive 2660 and shaft 276S may have any suitable configuration to effect Z-axis movement of substrate holder 2403.

Figure 26A:
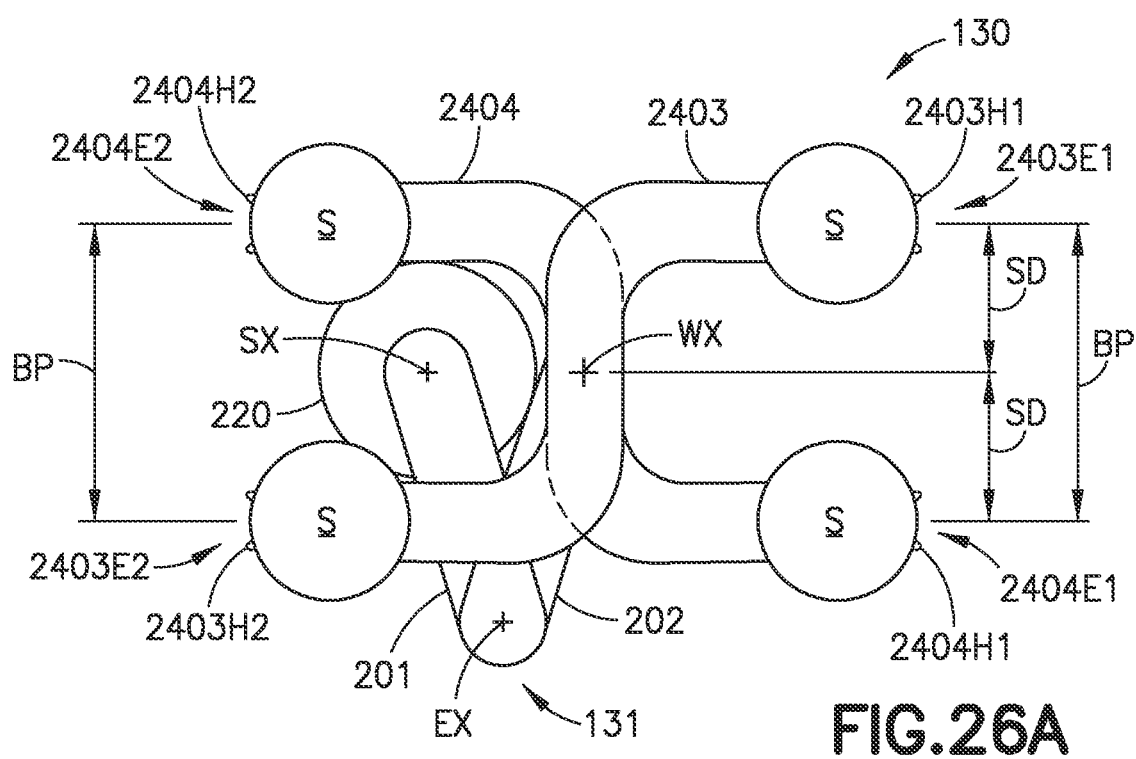
FIGS. 26A, 26B, 26C, and 26D are schematic illustrations of a substrate transport apparatus of the substrate processing apparatus of FIG. 1 in accordance with aspects of the present disclosure.
Figure 26B:
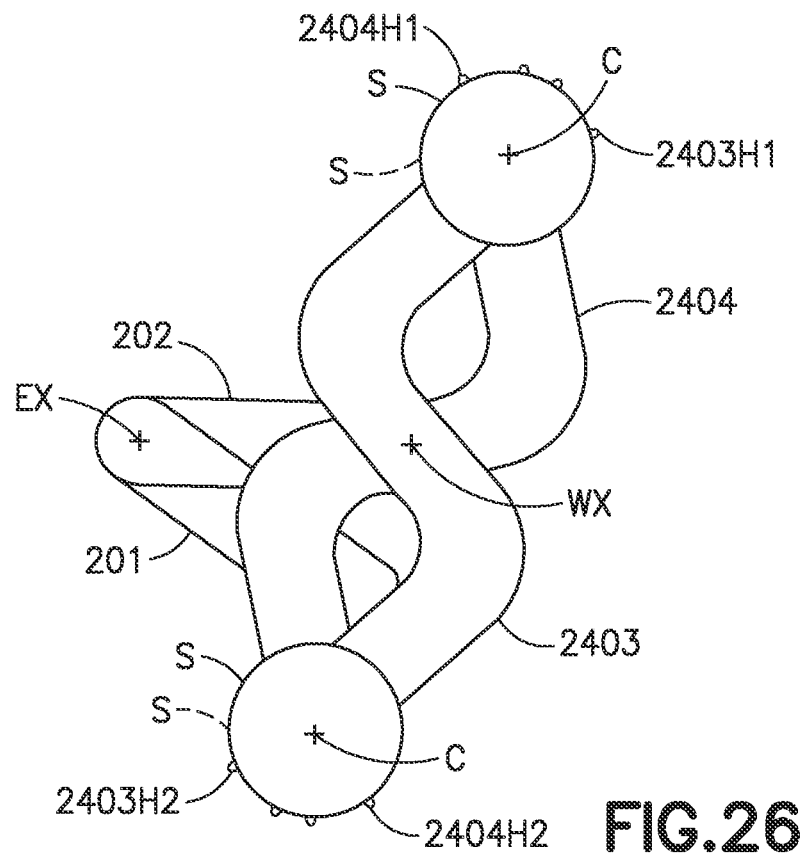
Figure 26C:
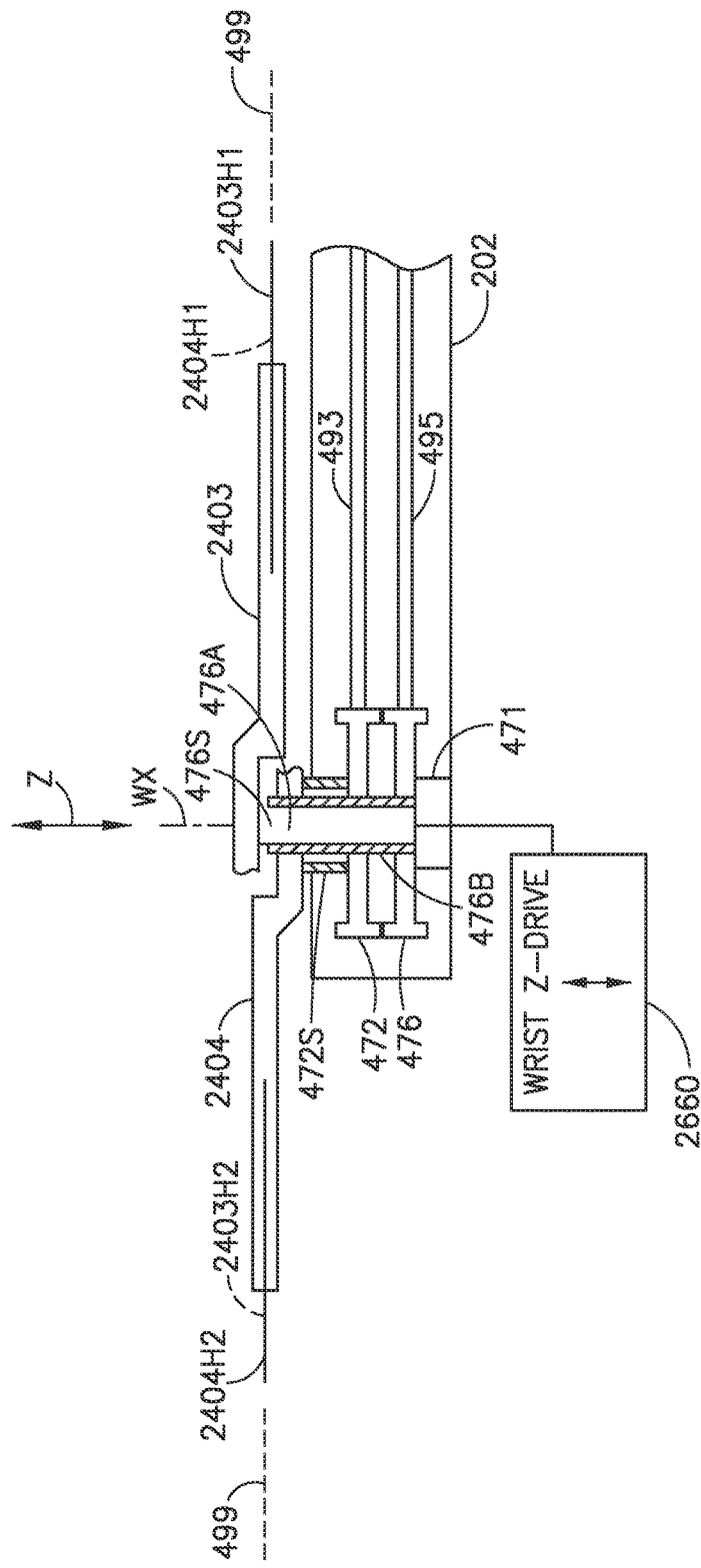

The wrist Z-drive 2660 is configured to raise and lower the substrate holder 2403 so that, in a manner similar to that described above, the substrate holding stations 2403H1, 2403H2, 2404H1, 2404H2 are disposed on a common plane (substantially similar to plane 499 as described above with respect to FIGS. 2D, 10, and 11) as illustrated in FIG. 26C for picking/placing substrates to side-by-side substrate station modules 150. As noted above, the substrate holding stations 2403H1, 2403H2, 2404H1, 2404H2 may be extended by the transport arm 131 and drive section 220 along a non-radial linear path and or a radial linear path in a manner substantially similar to that described herein for substantially simultaneously picking and/or placing substrates to side-by-side substrate station modules along the common plane 499. It is noted that the independent rotation of the substrate holders 2403, 2404 about the wrist axis WX provides for automatic wafer centering by varying the base pitch BP (e.g., the distance between the side-by side substrate holding stations 2100H1, 2100H2 may be increased or decreased in a manner similar to that illustrated in FIGS. 2B and 2C) to accommodate variances in the pitch D and/or to effect automatic wafer centering for placing wafers at the substrate processing stations 190-197 (see FIG. 1A). In one aspect, the arm 131 and/or end effectors 2403, 2404 may also be driven in rotation to fast swap (in a manner substantially similar to that described herein) in a manner similar to that described above with respect to FIGS. 7A-7L.

Figure 26D:
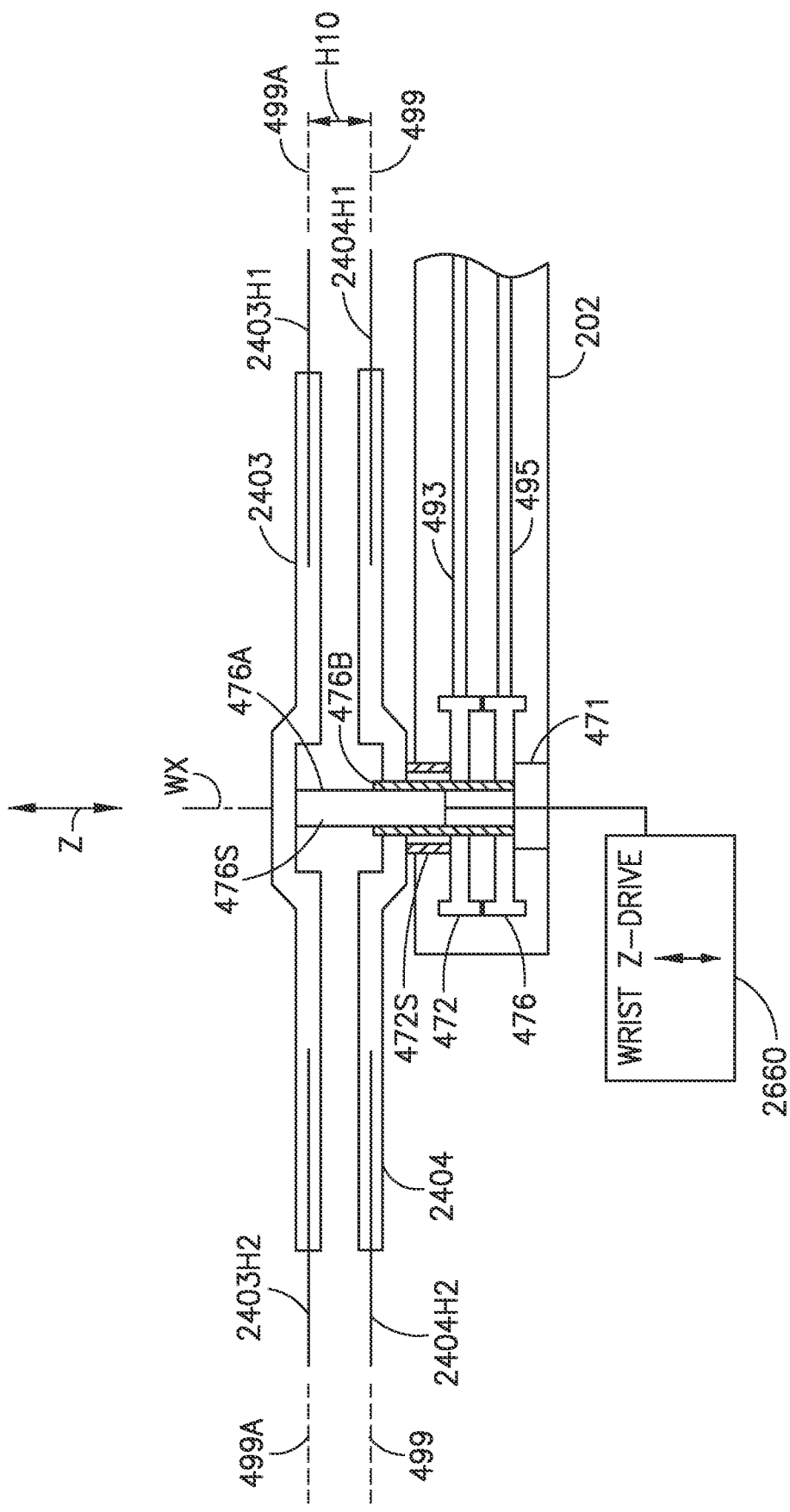

The wrist Z-drive 2660 is also configured to raise and lower the substrate holder 2403 so that the substrate holding stations 2403H1, 2403H3 of substrate holder 24033 are disposed in a different plane than the substrate holding stations 2404H1, 2404H2 of substrate holder 2404 as can be seen in FIG. 26D. Here, the substrate holding stations 2403H1, 2403H2 are disposed in plane 499A while substrate holding stations 2404H1, 2404H2 are disposed in plane 499. The planes 499, 499A may be separated by the distance or height H10 described above. With the substrate holders 2403, 2404 located in different planes 499, 499A, the substrate holders 2403, 2404 may be rotated about the wrist axis WX relative to each other so that the centers C of substrates S held by each of the substrate holding stations 2403H1, 2404H1 (or 2403H2, 2404H2) are substantially coincident with each other along the Z-direction as shown in FIG. 26B.

Referring also to FIG. 1C the substrate holders 2403, 2404 may be independently rotated about the wrist axis and one or more of the substrate holders 2403, 2404 may be moved in the Z-direction by the wrist Z-drive 2660 to effect picking substrates from various stacked and/or side-by-side substrate holding locations. For example in one aspect, the substrate holding stations 2403H1, 2404H1 (or 2403H2, 2404H2) are disposed along a common plane such as for substantially simultaneously picking/placing substrates from side-by-side load locks 102A, 102B or side-by-side load locks 102C, 102D (or other substrate holding location)). In one aspect, the substrate holding stations 2403H1, 2404H1 (or 2403H2, 2404H2) are disposed one above the other (see FIG. 26B as described above) in stacked planes such as for substantially simultaneously picking/placing substrates from stacked load locks 102A, 102C or from stacked load locks 102B, 102D (or other substrate holding location). In still other aspects, the substrate holding stations 2403H1, 2404H1 (or 2403H2, 2404H2) are disposed in different planes and horizontally offset such as for substantially simultaneously picking/placing substrates from stacked and horizontally offset load locks 102A, 102D (or other substrate holding location).

Figure 27A:
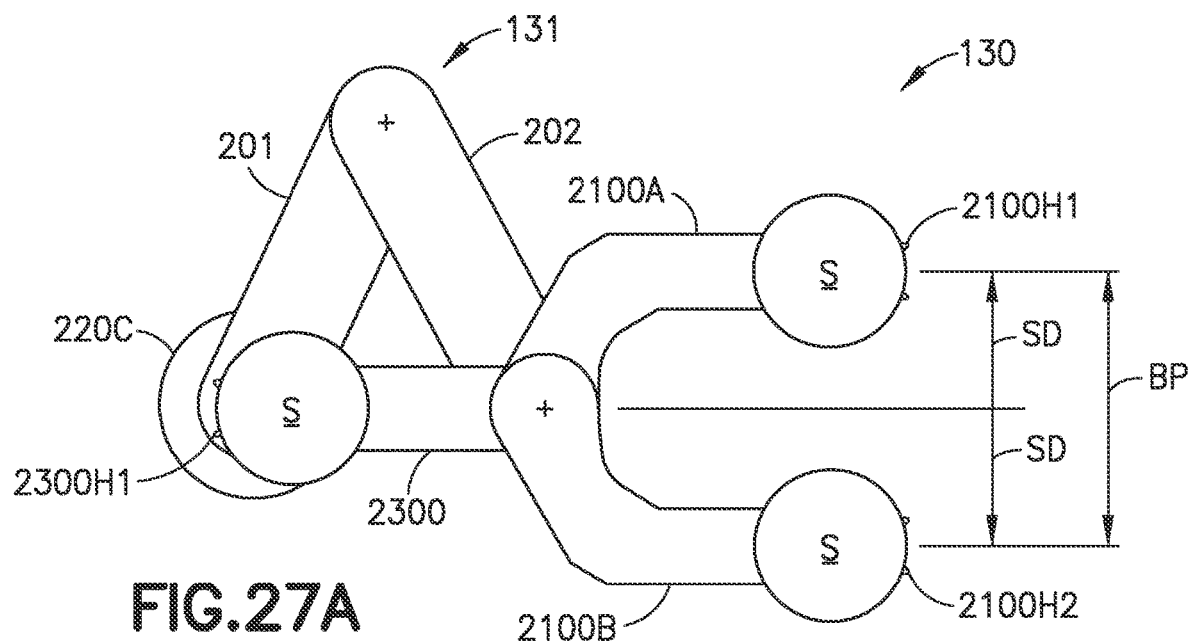
FIGS. 27A, 27B, and 27C are schematic illustrations of a substrate transport apparatus of the substrate processing apparatus of FIG. 1 in accordance with aspects of the present disclosure.
Figure 27B:
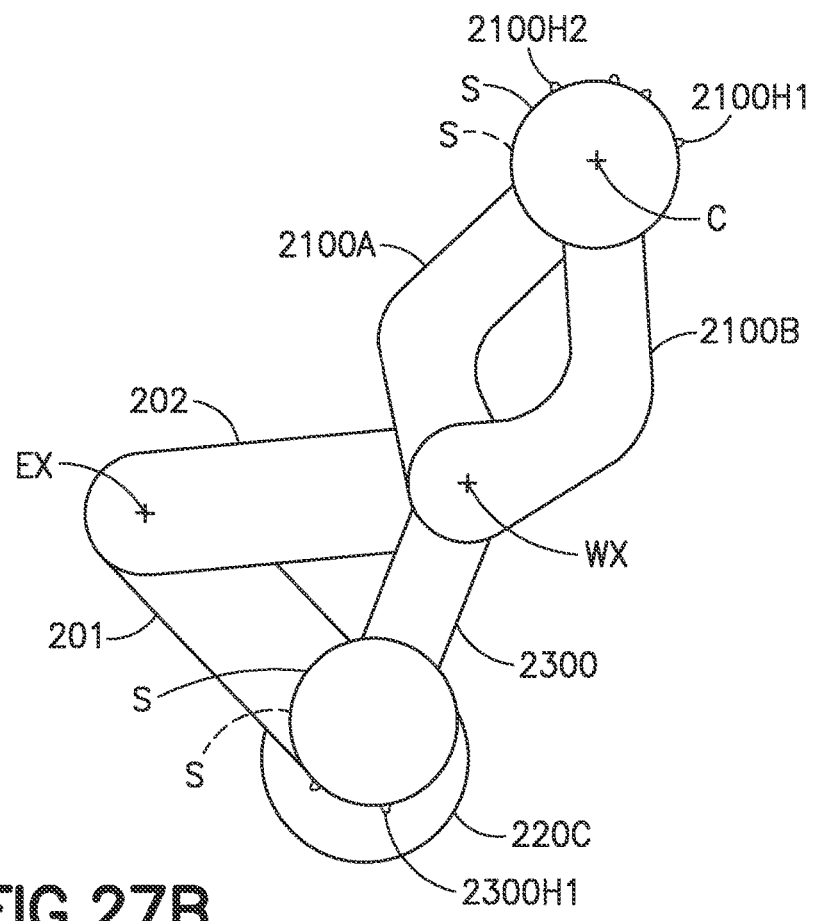
Figure 27C:
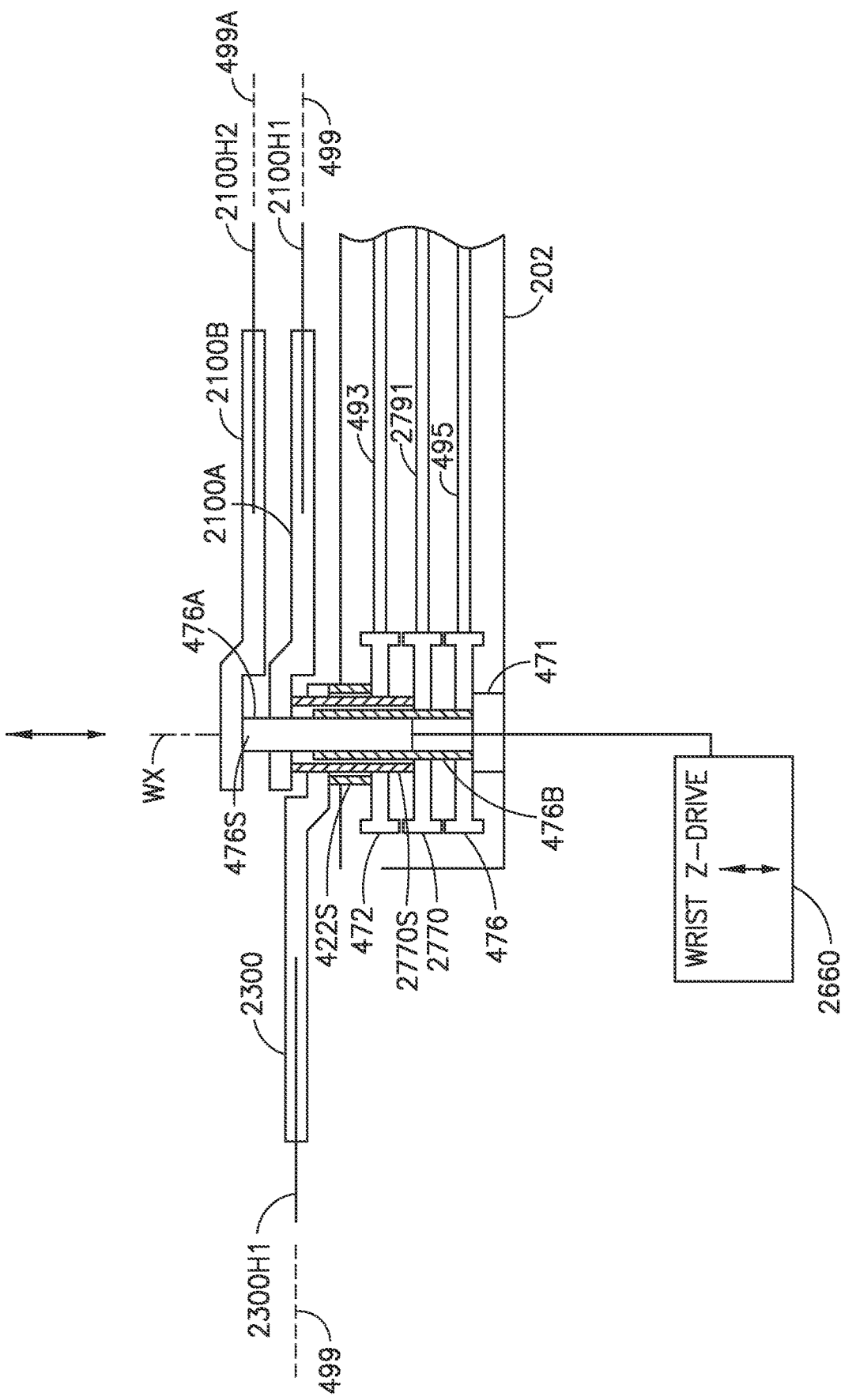

Referring to FIGS. 27A, 27B, and 27C, the substrate transport apparatus 130 is substantially similar to that described above with respect to FIG. 25; however, in this aspect at least one of the substrate holders 2100A, 2100B, 2300 is movable in the Z direction so that the substrate holders 2100A, 2100B, 2300 (and the respective substrate holding stations 2100H1, 2100H2, 2300H1) pass over one another. For example, the wrist Z-drive 2660 (in addition to or in lieu of the Z-drive 312—see FIGS. 3-3C) is provided in or coupled to the forearm 202. The wrist Z-drive 2660 is configured to move one or more of the substrate holders 2100A, 2100B, 2300 in the Z direction relative to the other substrate holders 2100A, 2100B, 2300. In the example illustrated in FIG. 27C the wrist Z-drive 2660 is configured to move substrate holder 2100B in the Z direction relative to substrate holders 2100A, 2300 and forearm 202; however, in other aspects both substrate holders 2100A, 2100B or all three substrate holders 2100A, 2100B, 2300 may be movable in the Z direction relative to the forearm 202 and/or each other. It is noted that pulley 2770, shaft 2770S, and transmission members 2791 are illustrated for driving rotation of substrate holder 2100A about the wrist axis WX, where the pulley 2770 is coupled to the drive section 220C through transmissions similar to those illustrated in FIG. 4 and described above.

The wrist Z-drive 2660 is configured to raise and lower the substrate holder 2100B so that, in a manner similar to that described above, the substrate holding stations 2100H1, 2100H2, 2300H1 are disposed on a common plane (substantially similar to plane 499 as described above with respect to FIGS. 2D, 10, and 11) for picking/placing substrates as described above with respect to FIGS. 8, 9, and 25. The wrist Z-drive 2660 is also configured to raise and lower the substrate holder 2100B so that the substrate holding station 2100H2 of substrate holder 2100B is disposed in a different plane than the substrate holding stations 2100H1, 2300H1 of substrate holders 2100A, 2300 as can be seen in FIG. 26C. Here, the substrate holding station 2100H2 is disposed in plane 499A while substrate holding stations 2100H1, 2300H1 are disposed in plane 499. The planes 499, 499A may be separated by the distance or height H10 described above. With the substrate holders 2100A, 2100B located in different planes 499, 499A, the substrate holders 2100A, 2100B may be rotated about the wrist axis WX relative to each other so that the centers C of substrates S held by each of the substrate holding stations 21000H1, 2100H2 are substantially coincident with each other along the Z-direction as shown in FIG. 27B.

As noted above, the substrate holders 2100A, 2100B, 2300 may be extended by the transport arm 131 and drive section 220 along a non-radial linear path and or a radial linear path in a manner substantially similar to that described herein for substantially simultaneously picking and/or placing substrates to side-by-side substrate station modules along the common plane 499. It is noted that the independent rotation of the substrate holders 2100A, 2100B about the wrist axis WX provides for automatic wafer centering by varying the base pitch BP (e.g., the distance between the side-by side substrate holding stations 2100H1, 2100H2 may be increased or decreased in a manner similar to that illustrated in FIGS. 2B and 2C) to accommodate variances in the pitch D and/or to effect automatic wafer centering for placing wafers at the substrate processing stations 190-197 (see FIG. 1A). As described above, independent rotation of the substrate holder 2300 also provides for automatic wafer centering of substrates held by the substrate holding station 2300H1 during pick/place operations. As also described above, in one aspect the arm 131 and/or end effector 2200 may also be driven in rotation to fast swap (in a manner substantially similar to that described herein) a substrate using the opposing substrate holding station 2300H1 and one of the side-by-side substrate holding stations 2100H1, 2100H2, such as where substrates are picked by the side-by-side substrate holding stations 2100H1, 2100H2 and a substrate is placed by the opposing substrate holding station 2300H1 in one of the locations a substrate was just picked by the side-by-side substrate holding stations 2100H1, 2100H2.

Referring also to FIG. 1C the substrate holders 2100A, 2100B may be independently rotated about the wrist axis and one or more of the substrate holders 2100A, 2100B may be moved in the Z-direction by the wrist Z-drive 2660 to effect picking substrates from various stacked and/or side-by-side substrate holding locations. For example in one aspect, the substrate holding stations 2100H1, 2100H2 are disposed along a common plane such as for substantially simultaneously picking/placing substrates from side-by-side load locks 102A, 102B or side-by-side load locks 102C, 102D (or other substrate holding location)). In one aspect, the substrate holding stations 2100H1, 2100H2 are disposed one above the other (see FIGS. 27B, 27C as described above) in stacked planes such as for substantially simultaneously picking/placing substrates from stacked load locks 102A, 102C or from stacked load locks 102B, 102D (or other substrate holding location).

It should be understood that while the wrist Z-drive 2660 is illustrated and described with respect to FIGS. 26A-26D and 27A-27C, in other aspects the wrist Z-drive may be incorporated into any of the arm configurations described herein, where more than one substrate holder is employed, in a manner substantially similar to that illustrated in FIGS. 26C, 26D, and 27C so that substrates may be transferred to side-by-side substrate station modules 150 in a common plane or to stacked substrate station modules 150 (see FIG. 1C) in stacked planes as described herein.

Figure 29:
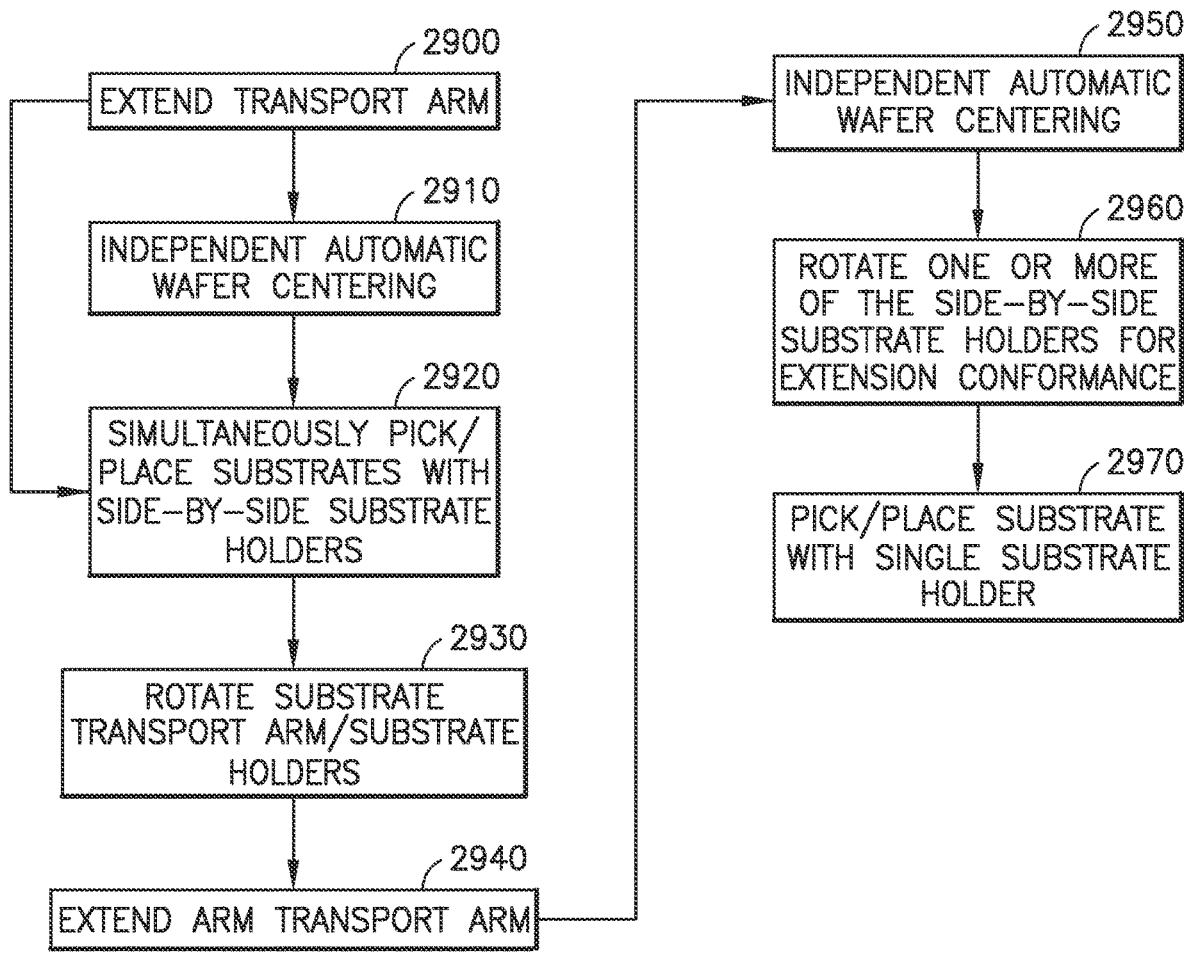
FIG. 29 is a flow diagram of an exemplary method in accordance with aspects of the present disclosure.
Figure 30:
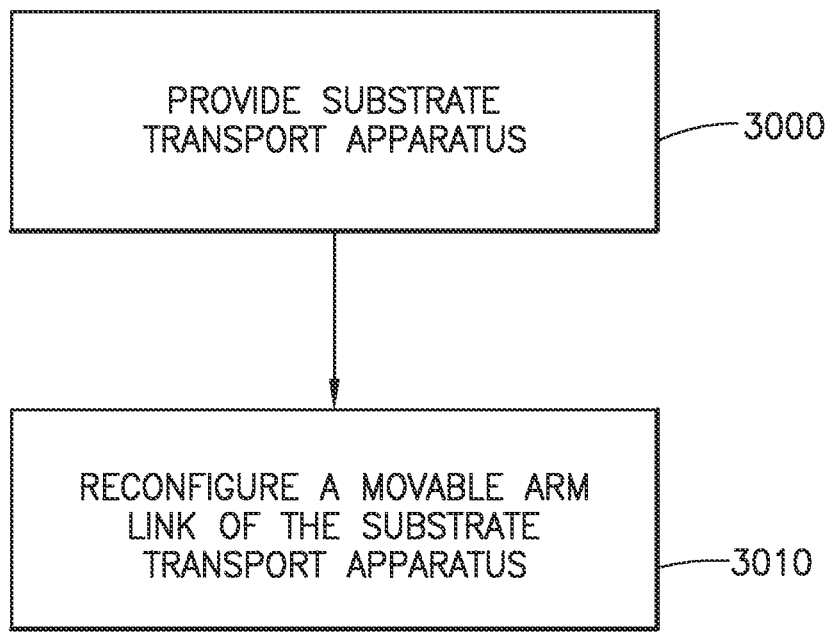
FIG. 30 is a flow diagram of an exemplary method in accordance with aspects of the present disclosure.
Figure 31:
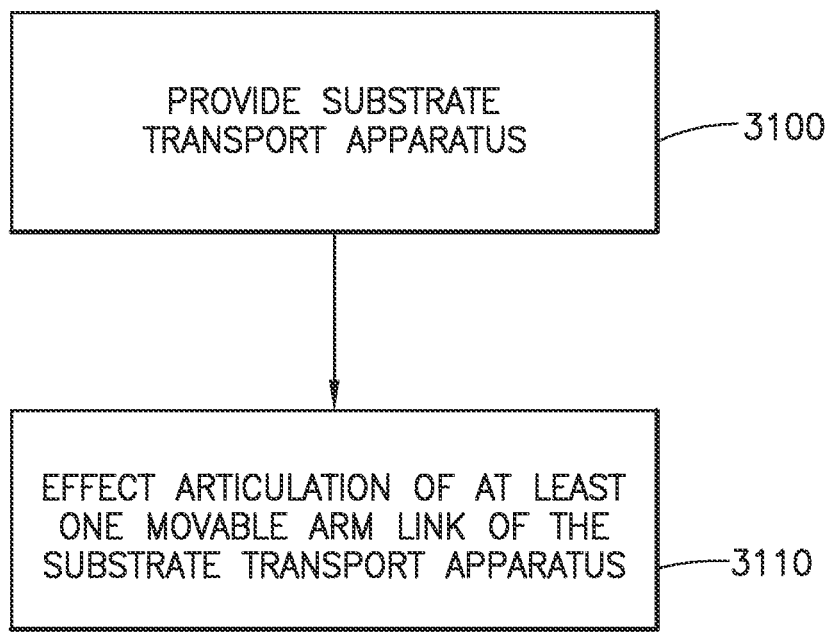
FIG. 31 is a flow diagram of an exemplary method in accordance with aspects of the present disclosure.

In one aspect, similar to that described above with respect to FIGS. 23 and 25, independent rotation of the substrate holders 2100A, 2100B, 2300 may also provide for substrate holder conformance of the substrate transport apparatus 130 to a shape (e.g., of the interior walls 125W) of the transfer chamber 125A in a manner similar to that described above with respect to FIG. 23A. However, in this aspect, one or more of the substrate holders 2100A, 2100B may be rotated by the drive section 220C to maintain clearance between the respective substrate holder 2100A, 2100B and the walls 125W of the transfer chamber 125A. For example, referring also to FIG. 29 as well as FIGS. 23, 23A, and 25 the substrate transport apparatus 130 may be positioned as shown in FIG. 23A so that the substrate holding stations of substrate holder 1900 (or substrate holders 2100A, 2100B) are aligned for picking/placing substrates from a respective one of substrate processing stations 2333A, 2333B. The transport arm 131 is extended (FIG. 29, Block 2900). In one aspect (such as with independently rotatably substrate holders 2100A, 2100B), independent automatic wafer centering is provided (FIG. 29, Block 2910) in a manner similar to that described herein so that the substrate holding stations of the substrate holders 2100A, 2100B are centered under substrates to be picked or substrates to be placed are centered at the substrate processing stations 2333A, 2333B. Substrates are simultaneously picked or placed by the substrate holder 1900 (or substrate holders 2100A, 2100B) from or to the substrate processing stations 2333A, 2333B (FIG. 29, Block 2920). The substrate transport arm 131 is retracted and the substrate transport arm 131 and/or substrate holders 1900 (or 2100A, 2100B) and substrate holder 2300 are rotated (FIG. 29, Block 2930) so as to align the (single) substrate holder 2300 with, for example, substrate processing station 2333B. The transport arm 131 is extended (FIG. 29, Block 2940) and automatic wafer centering may be provided (FIG. 29, Block 2950) for picking or placing a substrate with the substrate holder 2300. As can be seen in FIG. 23A, to extend the single substrate holder 2300 into substrate processing station 2333B, the substrate holder 1900 (or one or more of substrate holders 2100A, 2100B) (e.g., the side-by-side substrate holding stations) are rotated (FIG. 29, Block 2960) to provide clearance between the substrate holder 1900 (or one or more of substrate holders 2100A, 2100B) and the interior side wall 125W of the transfer chamber 125 to effect extension of the substrate holder 2300 into substrate holding station 2333B. With the substrate holder 1900 (or one or more of the substrate holders 2100A, 2100B) rotated to provide the above-noted clearance a substrate is picked or placed from or to the substrate processing station 2333B with the single substrate holder 2300. (FIG. 29, Block 2970).

Figure 28:
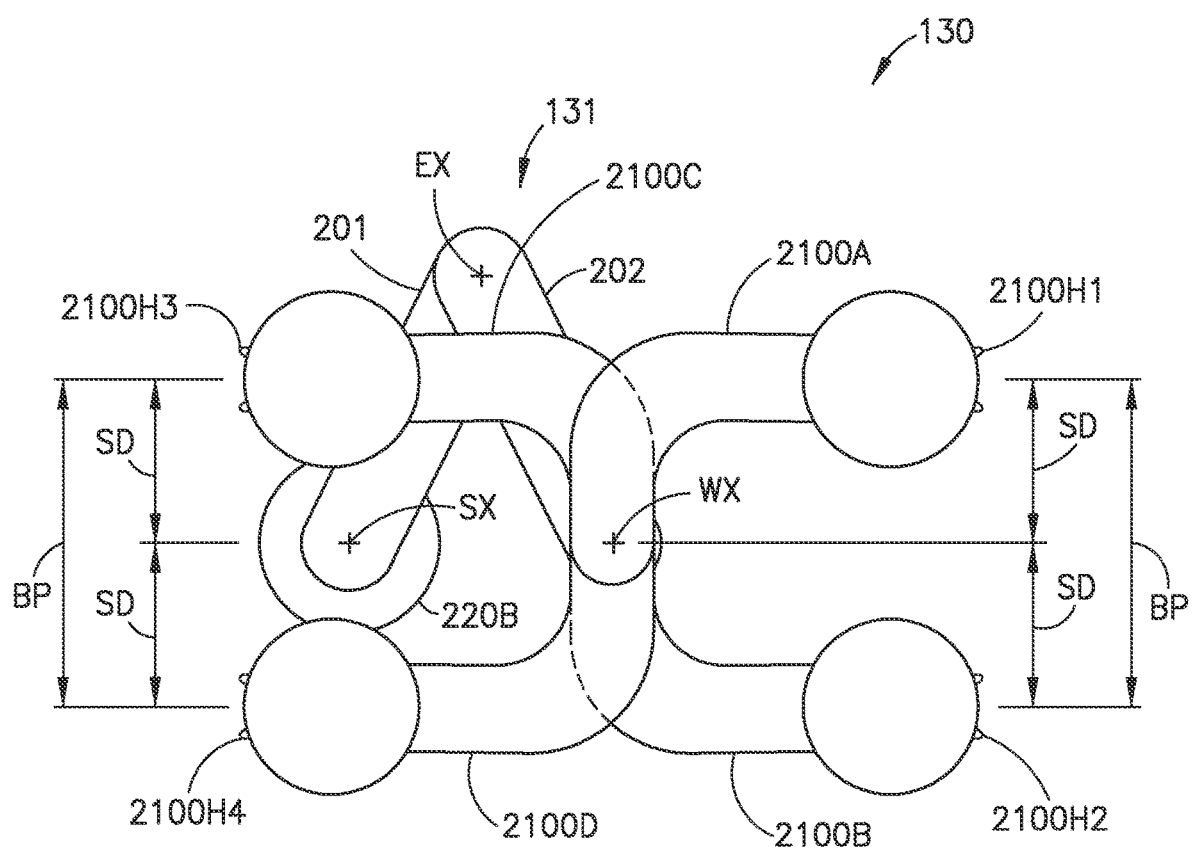
FIG. 28 is a schematic illustration of a substrate transport apparatus of the substrate processing apparatus of FIG. 1 in accordance with aspects of the present disclosure.

Referring to FIG. 28, the substrate transport apparatus 130 is substantially similar to that described above with respect to FIG. 21; however, in this aspect the substrate transport apparatus 130 includes two opposing single sided substrate holders 2100C and 2100D rotatably coupled to the arm 131 about the wrist axis WX in an opposing relationship with respect to substrate holders 2100A, 2100B. The substrate holders 2100C, 2100D are substantially similar to substrate holders 2100A, 2100B and include respective substrate holding stations 2100H3, 2100H4. Here the arm 131 and substrate holders 2100A, 2100B, 2100C, 2100D are driven in rotation and/or extension (along a non-radial linear path and/or a radial linear path) by, for example, the six axis drive section 220B (FIG. 3B) where one drive axis rotates upper arm 201 about the shoulder axis SX, one drive axis rotates the forearm 202 about the elbow axis EX, one drive axis rotates the substrate holder 2100A about the wrist axis WX, one drive axis rotates the substrate holder 2100B about wrist axis WX, one drive axis rotates the substrate holder 2100C about wrist axis WX, and one drive axis rotates the substrate holder 2100D about wrist axis WX. Each of the upper arm 201, forearm 202, and substrate holders 2100A, 2100B, 2100C, 2100D may be coupled to the six axis drive section 220B (FIG. 3B) by any suitable transmissions such as by cable and pulley transmissions substantially similar to those described above with respect to FIG. 4. In this aspect, substrate holder 2100A includes substrate holding station 2100H1, substrate holder 2100B includes substrate holding station 2100H2, substrate holder 2100C includes substrate holder 2100H3, and substrate holder 2100D includes substrate holder 2100H4. In a manner similar to that described above, the substrate holding stations 2100H1, 2100H2, 2100H3, 2100H4 are disposed on a common plane (substantially similar to plane 499 as described above with respect to FIGS. 2D, 10, and 11); while in other aspects, one or more of the substrate holding stations may be moveable in the Z-direction by a wrist Z-drive in a manner similar to that described above.

The substrate holders 2100A, 2100B, 2100C, 2100D may be extended by the transport arm 131 and drive section 220B along a non-radial linear path and or a radial linear path in a manner substantially similar to that described herein for substantially simultaneously picking and/or placing substrates to side-by-side substrate station modules along the common plane 499. It is noted that the independent rotation of the substrate holders 2100A, 2100B and/or substrate holders 2100C, 2100D about the wrist axis WX provides for automatic wafer centering by varying the base pitch BP (e.g., the distance between the side-by side substrate holding stations 2100H1, 2100H2 or 2100H3, 2100H4 may be increased or decreased in a manner similar to that illustrated in FIGS. 2B and 2C) to accommodate variances in the pitch D and/or to effect automatic wafer centering for placing wafers at the substrate processing stations 190-197 (see FIG. 1A). In one aspect, the arm 131 and/or end effectors 2403, 2404 may also be driven in rotation to fast swap substrates (in a manner substantially similar to that described herein) in a manner similar to that described above with respect to FIGS. 7A-7L.

Referring to FIGS. 19, 20, 22, and 23, in one aspect, more than one juxtaposed (e.g., side-by-side) substrate holding station are dependent from a common end effector link (e.g., substrate holder) that is a substantially rigid unarticulated link between the more than one juxtaposed substrate holding station.

Referring to FIGS. 2A-2D, 8-9, 20, 21, 23, 24, 25, 26A-26D, 27A-27C, and 28, at least one end effector link (e.g., substrate holder) comprises more than one end effector link (e.g. substrate holder) joined to the distal end 202E2 of the forearm 202 to rotate relative to the forearm 202 about the common axis of rotation (e.g., wrist axis WX), and each of the more than one end effector link (e.g., substrate holder) has at least one corresponding substrate holding station, of more than one juxtaposed (e.g., side-by-side) substrate holding station, dependent therefrom.

Referring to FIGS. 2A-2D, 8, 9, 21, 24, 25, 26A-26D, 27A-27C, and 28, at least one end effector link (e.g., substrate holder) comprises more than one end effector link joined to the distal end 202E2 of the forearm 202 to rotate relative to the forearm 202 about the common axis of rotation (e.g., wrist axis WX), wherein the drive section 220, 220A, 220B, 220C is configured so that each of the more than one end effector link respectively rotates independent of another of the more than one end effector link about the common axis of rotation, and each respective one of the more than one end effector link has at least one corresponding substrate holding station, of the more than one juxtaposed (e.g., side-by-side) substrate holding station, dependent therefrom.

Referring to FIGS. 23, 23A, 25, and 27A-27C, in one aspect, the multi-link arm 131 has at least one substrate holder (e.g., end effector link) 1900, 2100A, 2100B, 2300 rotatably joined to a joint (e.g., the wrist joint/axis WX) at an end of the forearm 202 so that the at least one substrate holder 1900, 2100A, 2100B, 2300 rotates relative to the forearm 202 about a common axis of rotation at the wrist joint/axis WX. The at least one substrate holder 1900, 2100A, 2100B, 2300 has more than one substrate holding station 1900H1, 1900H2, 2100H1, 2100H2, 2300H1 dependent therefrom and disposed on a common plane (e.g., plane 499—see e.g., FIGS. 2D and 4) with respect to each other and configured so that rotation of the at least one substrate holder 1900, 2100A, 2100B, 2300 about the wrist axis WX of rotation rotates each of the more than one substrate holding station 1900H1, 1900H2, 2100H1, 2100H2, 2300H1 about the wrist axis WX. Here, the drive section 220, 220C is configured to at least extend and retract the multi-link arm 131 along a radial or non-radial linear path, relative to the shoulder axis SX (fixed location), so at least two juxtaposed substrate holding stations 1900H1, 1900H2 or 2100H1, 2100H2, of the more than one substrate holding station, each traverse linearly along the radial or non-radial path, with extension and retraction of the arm 131, and pass substantially simultaneously through separate corresponding openings (see. e.g., FIGS. 1B and 1C) of the more than one juxtaposed substrate transport openings on the common level, and so at least another of the more than one substrate holding station 2300H1, different from each of the two juxtaposed substrate holding stations 1900H1, 1900H2 or 2100H1, 2100H2, is rotatable about the wrist axis WX independent of the at least two juxtaposed substrate holding stations 1900H1, 1900H2 or 2100H1, 2100H2.

Still referring to FIGS. 23, 23A, 25, and 27A-27C, the at least two juxtaposed substrate holding stations 1900H1, 1900H2 or 2100H1, 2100H2 and the at least another substrate holding station 2300H1 are disposed on the at least one substrate holder 1900, 2100A, 2100B, 2300 so that the at least two juxtaposed substrate holding stations 1900H1, 1900H2 or 2100H1, 2100H2 and the at least another substrate holding station 2300H1 are arranged on opposite sides of the wrist axis WX. In one aspect, as can be seen in FIG. 23A, the at least two juxtaposed substrate holding stations 1900H1, 1900H2 or 2100H1, 2100H2 and the at least another substrate holding station 2300H1 are disposed on the at least one substrate holder 1900, 2100A, 2100B, 2300 to rotate about the wrist axis WX, with extension and retraction of the arm 131 along the radial or non-radial path, to selectably conform a position of the at least one substrate holder to another side wall 125W of the transport chamber 125 different than the side wall 125W on which openings of the of the transport chamber are located and which the at least one of the more than one substrate holding stations 1900H1, 1900H2, 2100H1, 2100H2, 2300H1 of the at least one substrate holder 1900, 2100A, 2100B, 2300 pass through with extension and retraction of the arm.

Referring to FIG. 23, the at least two juxtaposed substrate holding stations 1900H1, 1900H2 are disposed on the at least one substrate holder 1900 operably connected to the drive section 220 and arranged so that the at least one substrate holder 1900 rotates the at least two juxtaposed substrate holding stations 1900H1, 1900H2 about the wrist axis WX of rotation with a common independent degree of freedom.

Referring to FIGS. 25 and 27A-27C, the at least two juxtaposed substrate holding stations 2100H1, 2100H2 are disposed on the at least one substrate holder 2100A, 2100B operably connected to the drive section 220C and arranged so that the at least one substrate holder 2100A, 2100B rotates each of the at least two juxtaposed substrate holding stations 2100H1, 2100H2 about the wrist axis WX of rotation with a different respective independent degree of freedom so that each of the at least two juxtaposed substrate holding stations 2100H1, 2100H2 is independently rotated with respect to each other about the wrist axis WX of rotation.

Referring to FIGS. 26A-26D and 27A-27C, in one aspect, the multi-link arm 131 has at least one substrate holder 2403, 2404 or 2100A, 2100B rotatably joined to a joint (e.g., wrist axis WX) at an end of the forearm 202 so that the at least one substrate holder 2403, 2404 or 2100A, 2100B rotates relative to the forearm 202 about a common axis of rotation at the wrist axis WX, the at least one substrate holder 2403, 2404 or 2100A, 2100B has more than one substrate holding station 3403H1, 3403H2, 3404H1, 2404H2, 2100H1, 2100H2 dependent therefrom juxtaposed along different planes 499, 499A (FIGS. 26D, 27C), offset in height with respect to each other, and configured so that rotation of the at least one substrate holder 2403, 2404 or 2100A, 2100B about the wrist axis WX of rotation rotates each of the more than one substrate holding station 3403H1, 3403H2, 3404H1, 2404H2, 2100H1, 2100H2 about the wrist axis WX of rotation. The drive section 220, 220C is configured to at least extend and retract the multi-link arm 131 along a radial or non-radial linear path, relative to the shoulder axis SX (e.g., fixed location), so at least two juxtaposed substrate holding stations 2403H1, 2404H1 or 2403H2, 2404H2 or 2100H1, 2100H2 of the more than one substrate holding station 3403H1, 3403H2, 3404H1, 2404H2, 2100H1, 2100H2, each traverse linearly along the radial or non-radial path, with extension and retraction of the arm, and are each rotatable about the wrist axis WX of rotation independent of each other so as to pass separately through a respective (or in other aspects a common) opening (see FIGS. 1B and 1C) of the more than one juxtaposed substrate transport openings on the common plane (or level) 499, and at least another of the more than one substrate holding station 2403H1, 2404H1 or 2403H2, 2404H2 or 2300H1, different from each of the two juxtaposed substrate holding stations 2403H1, 2404H1 or 2403H2, 2404H2 or 2100H1, 2100H2, is disposed on the at least one substrate holder 2403, 2404, 2300 substantially opposite each of the at least two juxtaposed substrate holding stations 2403H1, 2404H1 or 2403H2, 2404H2 or 2100H1, 2100H2. Here, the drive section 220, 220C includes a wrist Z-drive 2660 that is configured to move the more than one substrate holding station of the at least one end effector link in height with respect to each other so as to place the more than one substrate holding station on the common level juxtaposed to one another.

Figure 15:
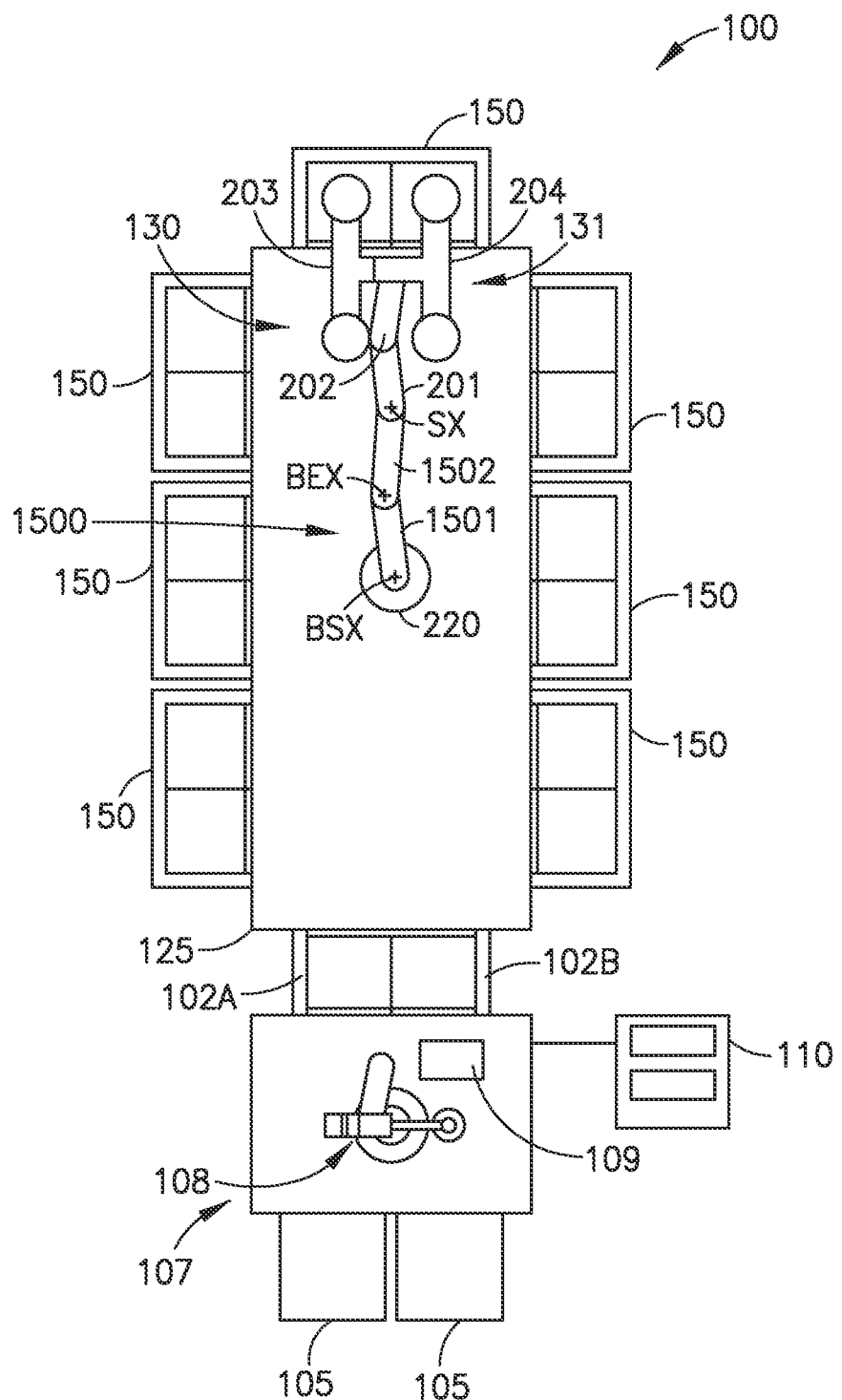
FIG. 15 is a schematic illustration of a substrate processing apparatus incorporating a substrate transport apparatus in accordance with aspects of the present disclosure.
Figure 16:
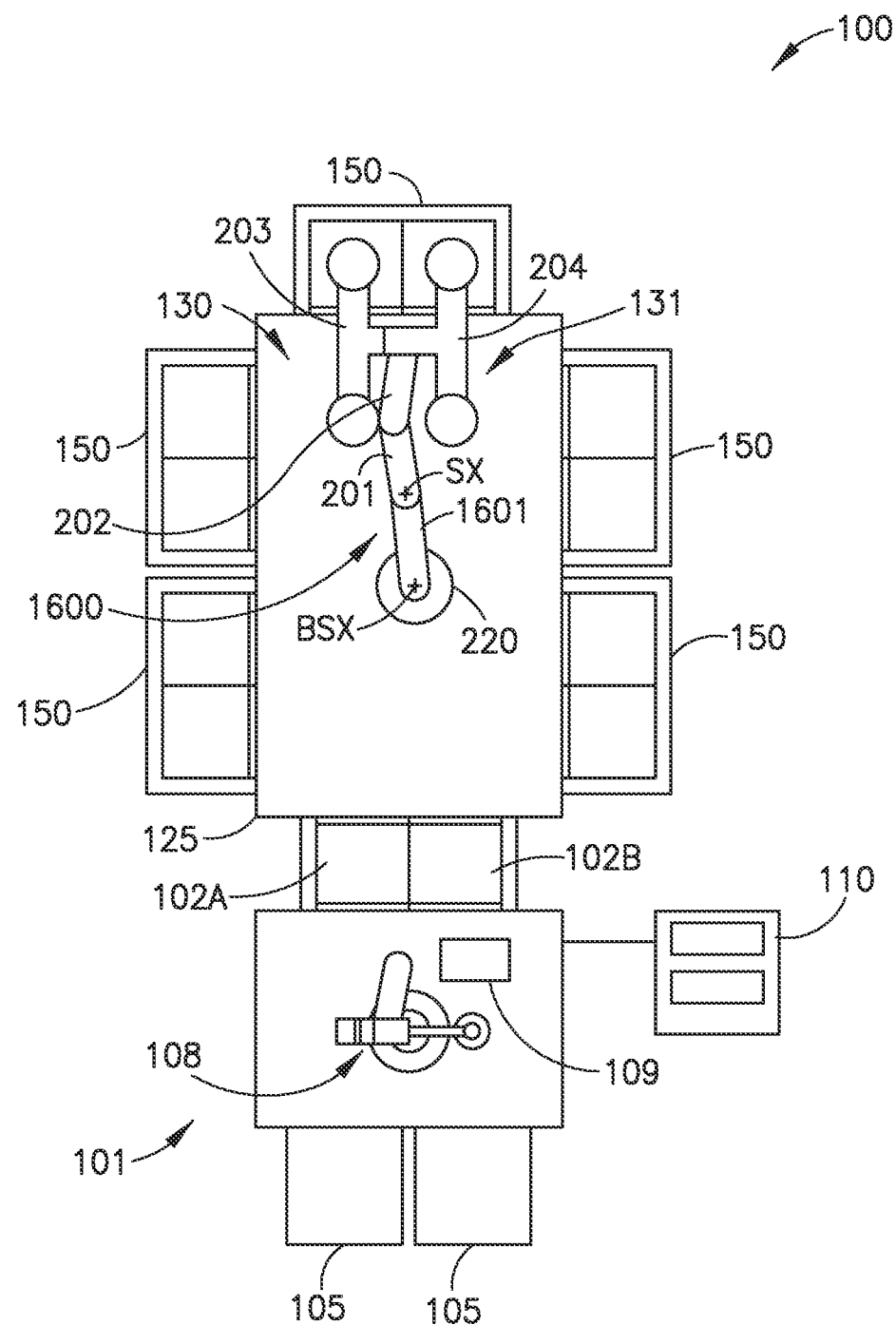
FIG. 16 is a schematic illustration of a substrate processing apparatus incorporating a substrate transport apparatus in accordance with aspects of the present disclosure.

As described above, the substrate transport apparatus 130 (with any suitable end effector(s) such as those described herein) may be mounted on a boom arm. For exemplary purposes, FIG. 15 illustrates the arm 131 mounted to a two link boom arm 1500. The two link boom arm 1500 includes an upper link 1501 and a forearm link 1502. A first end of the upper link 1501 is rotatably coupled to a drive section (such as drive section 220 described herein) about a boom shoulder axis BSX. A first end of the forearm link 1502 is rotatably coupled to a second end of the upper link 1501 about a boom elbow axis BEX. The arm 131 is rotatably coupled to a second end of the forearm link 1502 about arm shoulder axis SX. Each of the upper link 1501 and the forearm link 1502 are substantially rigid and unarticulated between the respective ends. In another aspect, FIG. 16 illustrates the arm 131 mounted to a single link boom arm 1600. The single link boom arm 1600 includes boom link 1601. A first end of the boom link 1601 is rotatably coupled to a drive section (such as drive section 220 described herein) about a boom shoulder axis BSX. The arm 131 is rotatably coupled to a second end of the boom link 1601 about arm shoulder axis SX. The boom link 1601 is substantially rigid and unarticulated between the two ends of the boom link 1601. While a single link boom arm 1600 and a two link boom arm 1500 are illustrated it should be understood that the boom arm may have any suitable number of links.

Referring also to FIG. 3, for rotating the boom arm 1500, 1600, the drive section 220, 220A, 220B, 220C may include at least one boom arm drive axis (or motor) 390, 391. For example, a single boom arm drive axis 390 may be provided where, for example, the single link boom arm 1600 is employed. A single boom arm drive axis 390 may also be provided where rotation of the forearm link 1502 of the two link boom arm 1500 about the boom elbow axis BEX is slaved to, for example the housing 310. In other aspects, two boom arm drive axes 390, 391 may be provided where the upper link 1501 and forearm link 1502 of the two link boom arm 1500 are independently rotated about the respective boom shoulder axis BSX and the boom elbow axis BEX. The boom arm drive axis 390, 391 may be coaxially arranged with the motors 342, 344, 346, 348; while in other aspects, the boom arm drive axis 390, 391 may have any suitable configuration such as a side-by-side motor configuration; while in still other aspects, the boom arm drive axis 390, 391 may be arranged at the boom arm shoulder axis BEX while the drive motors 342, 344, 346, 348 are arranged at the shoulder axis SX of the arm 131. Any suitable transmissions (e.g., which in one aspects are substantially similar to the cable and pulley transmissions shown in FIGS. 4-6B) are provided to couple the link(s) of the boom arm 1500, 1600 to the drive axis/axes 390, 391.

Figure 18:
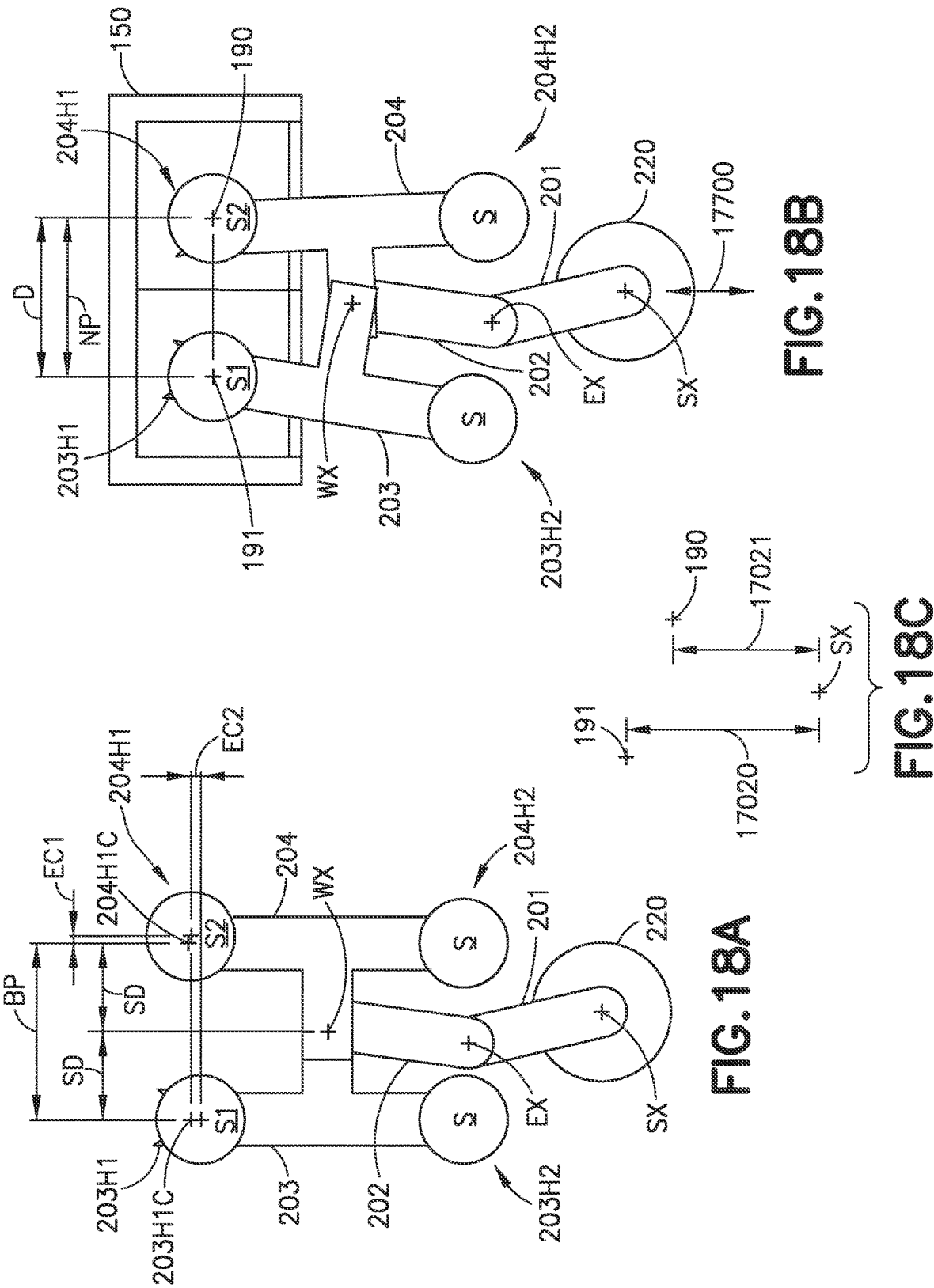
FIGS. 18A-18C are exemplary schematic illustrations of multi-axis automatic wafer centering in accordance with aspects of the present disclosure.

Referring to FIGS. 18A and 18B, the automatic wafer centering provided by the aspects of the present disclosure may provide for substantially simultaneous placement (or pick) of dual substrates S regardless of a relative eccentricity between each of the dual substrates S and a respective substrate holding station(s) 203H1, 203H2, 204H1, 204H2. For example, with the substrate holding stations 203H1, 204H1 at the base pitch BP automatic wafer centering may determine that an eccentricity EC2 of substrate S1 is closer to the shoulder axis SX than a center 203H1C of the substrate holding station 203H1, and an eccentricity EC1 of substrate S2 is to, e.g., the right (noting the direction term "right" is used here for convenience of explanation only) of a center 204H1C of the substrate holding station 204H1. Accordingly, to place the substrates S1, S2 at, for example, substrate processing stations 190, 191 the position of each the substrate S1, S2 is not only independently adjusted, via automatic wafer centering, with respect to the distance D between substrate processing stations 190, 191 but also independently in the direction of extension/retraction 17700 to accommodate both eccentricities EC1, EC2. For example, the substrate holders 203, 204 are each independently rotated about the wrist axis WX (where the wrist axis positioned along an axis of radial extension 700 (see FIG. 7B) or a non-radial path 701 of extension (see FIG. 7F)) to effect independent automatic wafer centering of the substrates S1, S2 at the respective substrate processing stations 190, 191. Similarly, referring to FIG. 18C, automatic wafer centering may also effect placement of the substrates at substrate processing stations 190, 191 having different radial distances 17020, 17021 from, for example, the shoulder axis SX of the substrate transport apparatus 130, where independent rotation of each substrate holding station 203H1, 203H2, 204H1, 204H2 about the wrist axis and/or placement of the wrist axis effects an increased extension distance (relative to the shoulder axis) of one of the side-by-side substrate holding stations 203H1-204H1, 203H2, 204H2 relative to another of the side-by-side substrate holding stations 203H1-204H1, 203H2, 204H2.

Referring to FIGS. 2A-2D, 7A-7L, and 15, an exemplary method of transporting substrates with the substrate transport apparatus 130 will be described. In the example described, the substrate processing apparatus 100 includes a transfer chamber 125A that has six sides but is otherwise substantially similar to that described above with respect to FIG. 1; however in other aspects the transfer chamber may have any suitable number of sides where side-by-side substrate station modules are coupled to respective sides of the transfer chamber in a manner similar to that illustrated in FIGS. 1A, 7A, 8, 12, 15, and 16. Further, in the example described the arm 131 includes dual substrate holders 203, 204, each of which has substrate holding stations 203H1, 203H2, 204H1, 204H2 at opposite ends of the respective substrate holders 203, 204; however, it should be understood that the method described herein is equally applicable to arm 131 and aspects of the present disclosure illustrated in and described with respect to FIGS. 8-16.

As will be described below, the controller 110 is operably coupled to the drive section 220 and configured to extend the arm 131 for substantially simultaneously picking or placing dual first substrates (see, e.g., substrates S1, S2) with the corresponding at least one substrate holding stations (e.g., substrate holding stations 203H1, 204H1 or 203H2, 204H2) of the dual substrate holders 203, 204 through the respective separate openings (see slot valves SV) in the transport chamber wall 125W. As will also be described below, the controller 110 is configured to substantially simultaneously fast swap the dual first substrates with at least one second substrate (see, e.g., substrates S3, S4) held on the corresponding at least one substrate holding stations (e.g., substrate holding stations 203H1, 204H1 or 203H2, 204H2) of the dual substrate holders 203, 204, through the respective separate openings in the transfer chamber wall 125W, with the dual first substrates S1, S2 held simultaneously on the corresponding at least one substrate holding stations (e.g., substrate holding stations 203H1, 204H1 or 203H2, 204H2) of the dual substrate holders 203, 204. In some aspects, the drive section, under control of controller 110, is configured to independently align at least one of the corresponding substrate holding station 203H1, 203H2, 204H1, 204H2 relative to another of the substrate holder(s).

Figure 17:
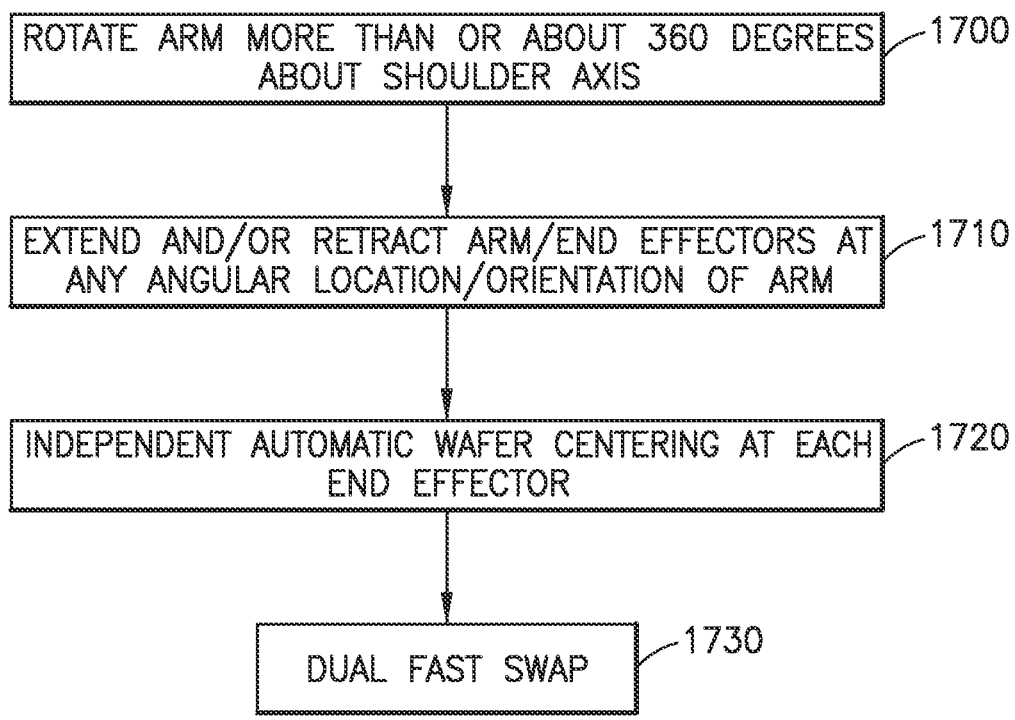
FIG. 17 is a flow diagram of an exemplary method in accordance with aspects of the present disclosure.

In accordance with aspects of the present disclosure, the dual link SCARA with at least one end effector (and/or the other arm configurations as described herein) fulfills greater than or about a 360° SCARA arm rotation 6 about the shoulder axis SX (see, e.g., FIGS. 1A and 7A) (FIG. 17, Block 1700) with extension and retraction of the arm 131 and end effectors 203, 204 thereon (i.e., at/from any angular 6 location/orientation of the dual SCARA arm) throughout the interior space of the transfer chamber (FIG. 17, Block 1710). The dual link SCARA with the at least one end effector, as described herein (and/or the other arm configurations as described herein) provides for independent automatic wafer centering at each end effector common with extension of the arm 131 and end effector 203, 204 (FIG. 17, Block 1720) as described below. As also described herein, the dual link SCARA with the at least one end effector provides for dual "fast swap" without Z axis movement (as described herein with the substrate holding stations 203H1, 203H2, 204H1, 204H2 of the end effectors 203, 204, in one aspect, on the common plane 499 (see, e.g., FIGS. 2D and 11), and in other aspects, with the substrate holding stations 203H1, 203H2, 204H1, 204H2 of the end effectors 203, 204 on different planes 499, 499A (see, e.g., FIG. 10)) (FIG. 7, Block 1730), where the end effectors 203, 204 have side-by-side substrate holding stations and at least one of the end effectors 203, 204 is a double sided end effector (e.g., has at least one substrate holding station located at opposite longitudinally spaced ends of the end effector).

Figure 14:
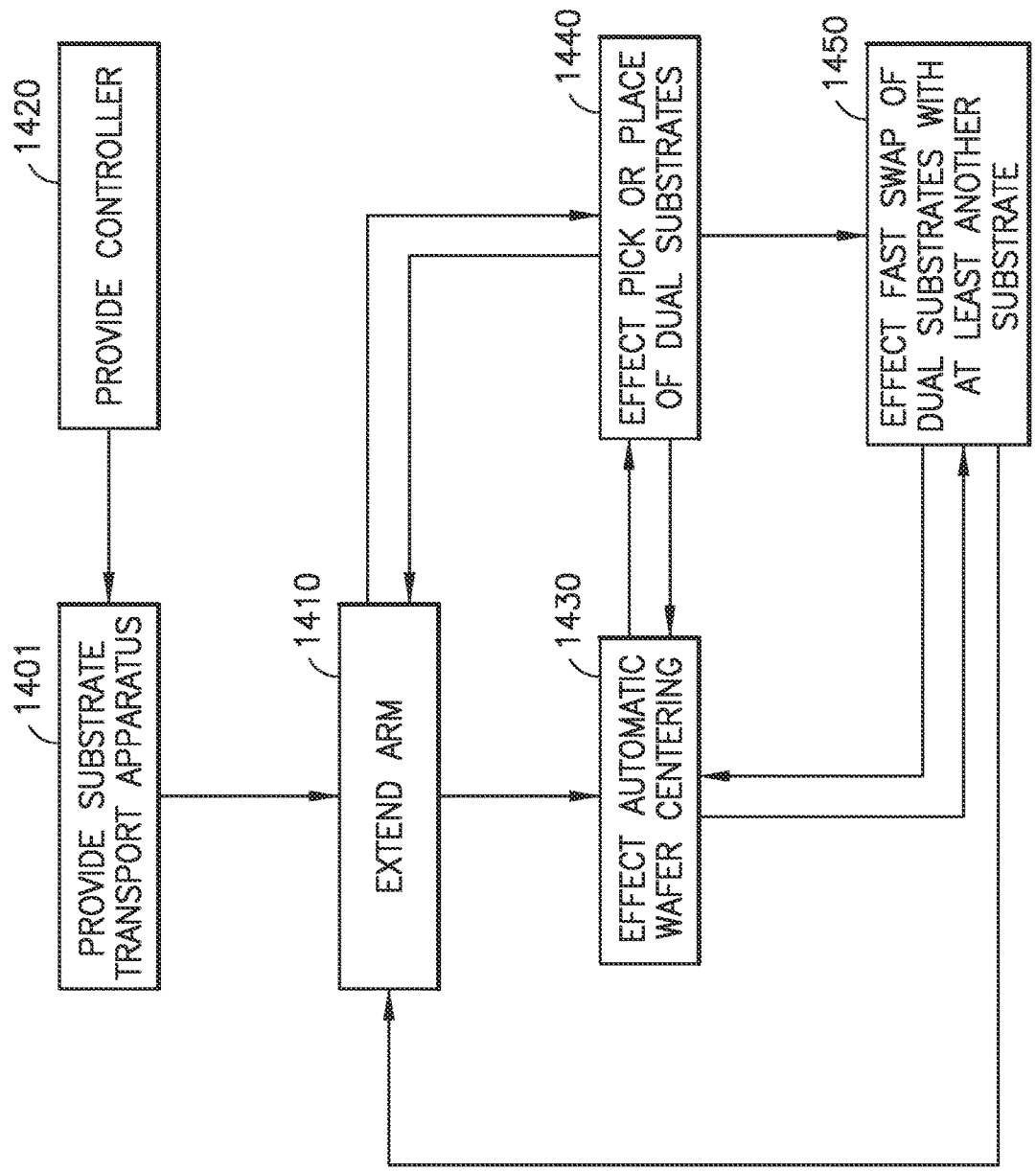
FIG. 14 is a flow diagram of an exemplary method in accordance with aspects of the present disclosure.

In the exemplary method, the substrate transport apparatus 130 described herein is provided (FIG. 14, Block 1401). The controller 110 may also be provided (FIG. 14, Block 1420) and connected to the substrate transport apparatus 130. The controller is configured to extend the at least one arm 131 of the substrate transport apparatus 130 so that the substrate holders 203, 204 (and in the case of FIG. 13, substrate holder 205) extend through a side wall 125W of the transport chamber 125, 125A. For example, FIG. 7A illustrates the arm 131 of the substrate transport apparatus 130 in a home or retracted configuration relative to the shoulder axis SX. In this example the retracted configuration is where the arm links 201, 202 are located one above the other and substantially aligned with each other; while in other aspects the retracted configuration is where the wrist axis WX is disposed substantially above the shoulder axis SX, such as when the upper link 201 and forearm link 202 have substantially the same length from joint center to joint center. The controller 110 is configured to effect motion of the drive section 220 to effect independent automatic wafer centering of each substrate where the base pitch BP of the substrate holding stations 203H2, 204H2 is increased (FIG. 2B) or decreased (FIG. 2C) to effect the automatic wafer centering (in this case centering of the substrates S3, S4 on the respective substrate holding stations 203H2, 204H2) so that the distance between substrate holding stations 203H2, 204H2 substantially matches the pitch between substrate processing stations 196, 197. As noted above, the automatic wafer centering may be effect along more than one axis (e.g., along an axis corresponding to the spacing between the substrate processing stations and along an axis corresponding to an extension direction of the substrate holders). The controller 110 is further configured to effect motion of the drive section 220 so that the wrist axis WX moves, in one aspect, in radial direction 700 and the substrate holding stations 203H2, 204H2 extend, through openings in the wall 125W of the transport chamber 125A, into load locks 102A, 102B (see FIGS. 7B and 7C).

In one aspect, the controller 110 may effect actuation of the Z-axis drive 312 to lift the substrate holding stations 203H2, 204H2 (while in other aspects the Z-motion may be provided at least in part by the substrate processing stations 196, 197) for picking dual substrates S3, S4 substantially simultaneously from substrate processing stations 196, 197 of the load locks 102A, 102B. With the substrates S3, S4 held on the substrate holding stations 203H2, 204H2, the controller 110 effects motion of the drive section 220 to retract the arm 131 to, for example, the retracted configuration so that the substrates S3, S4 are removed from the load locks 102A, 102B (see FIG. 7D). The arm 131 is rotated in direction 777 so as to position the substrate holding stations 203H1, 204H1 adjacent any suitable substrate processing stations (such as processing stations 188, 189) from which another set of dual substrates S1, S2 are to be picked.

Figure 7E:
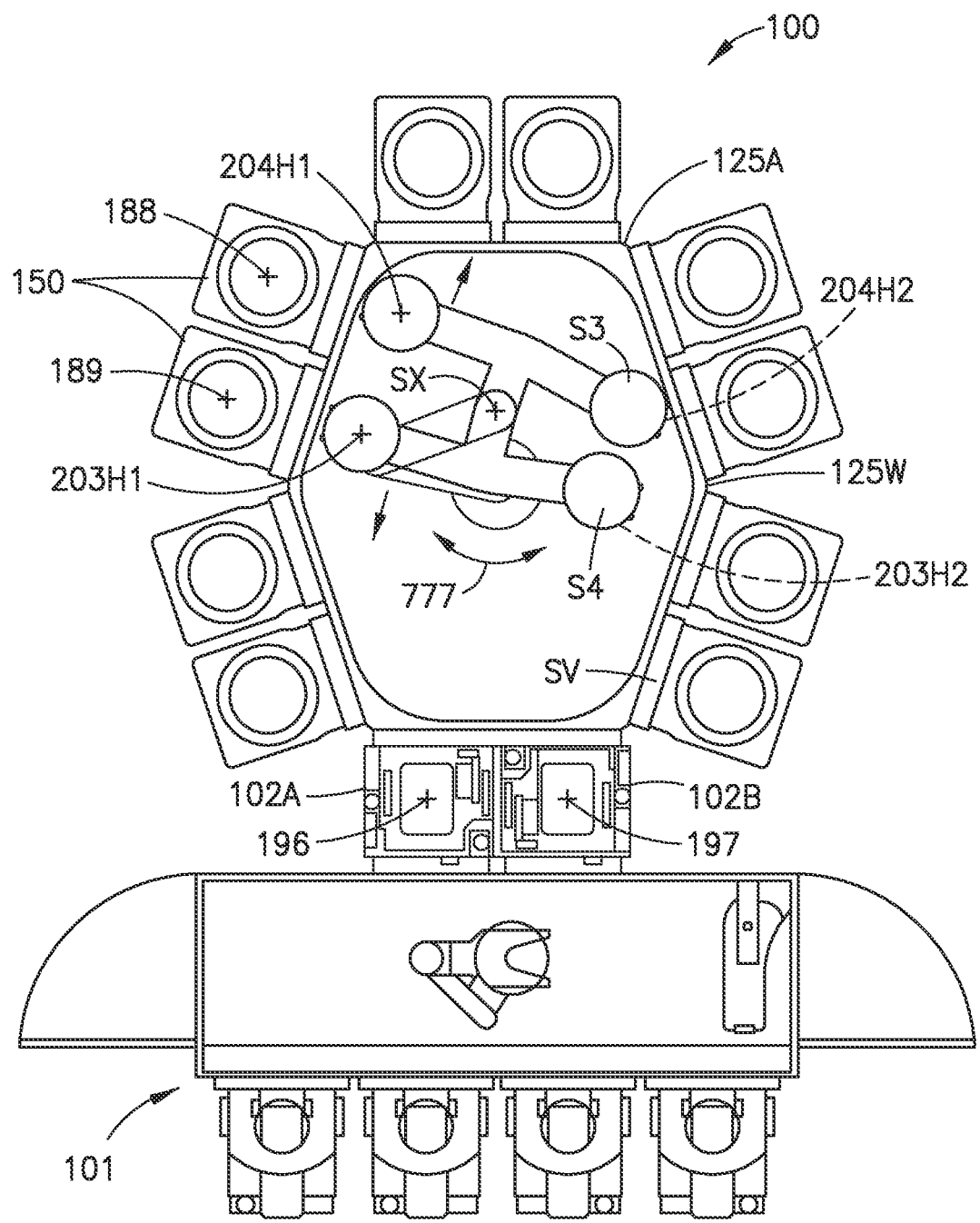
Figure 7F:
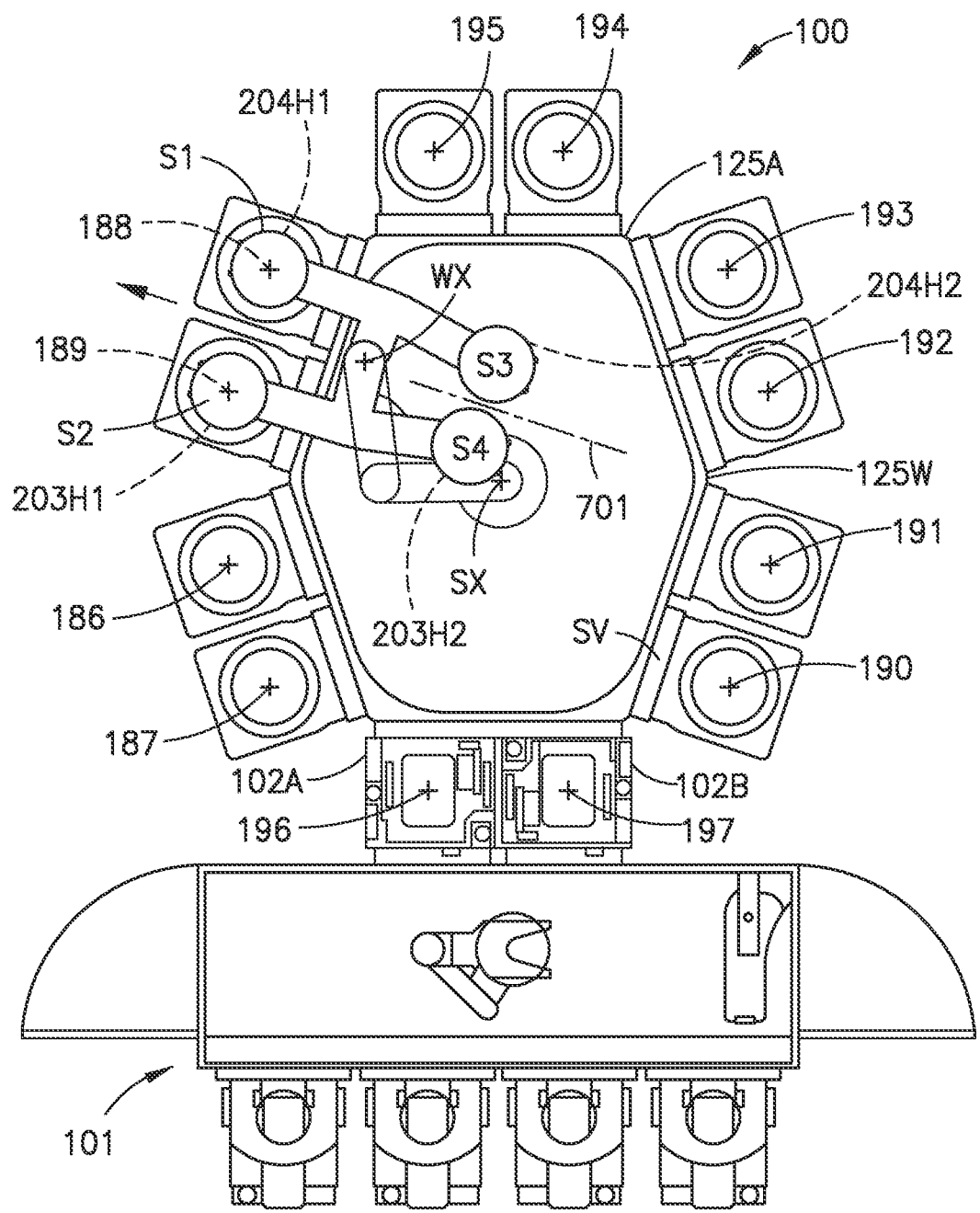
Figure 7G:
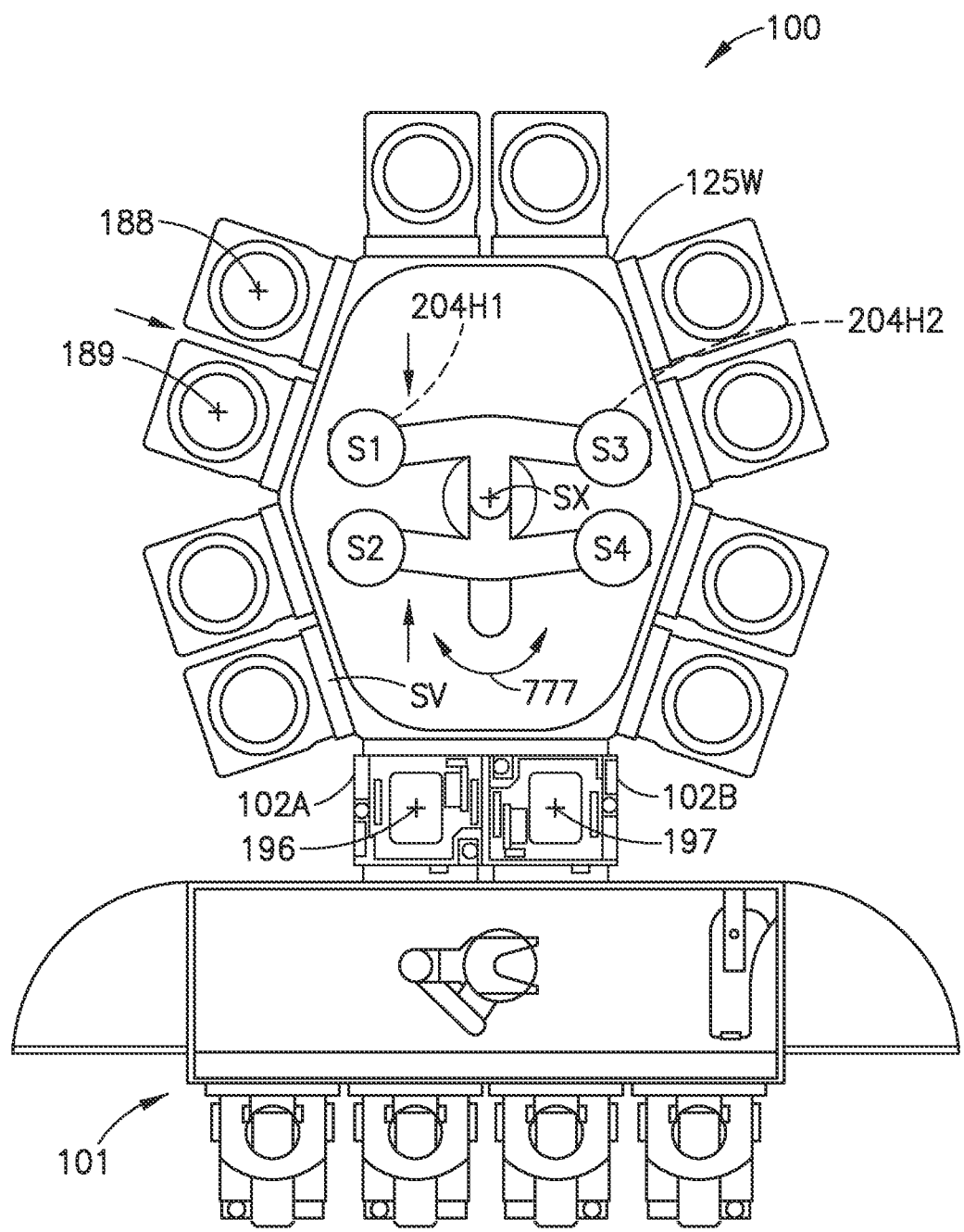
Figure 7H:
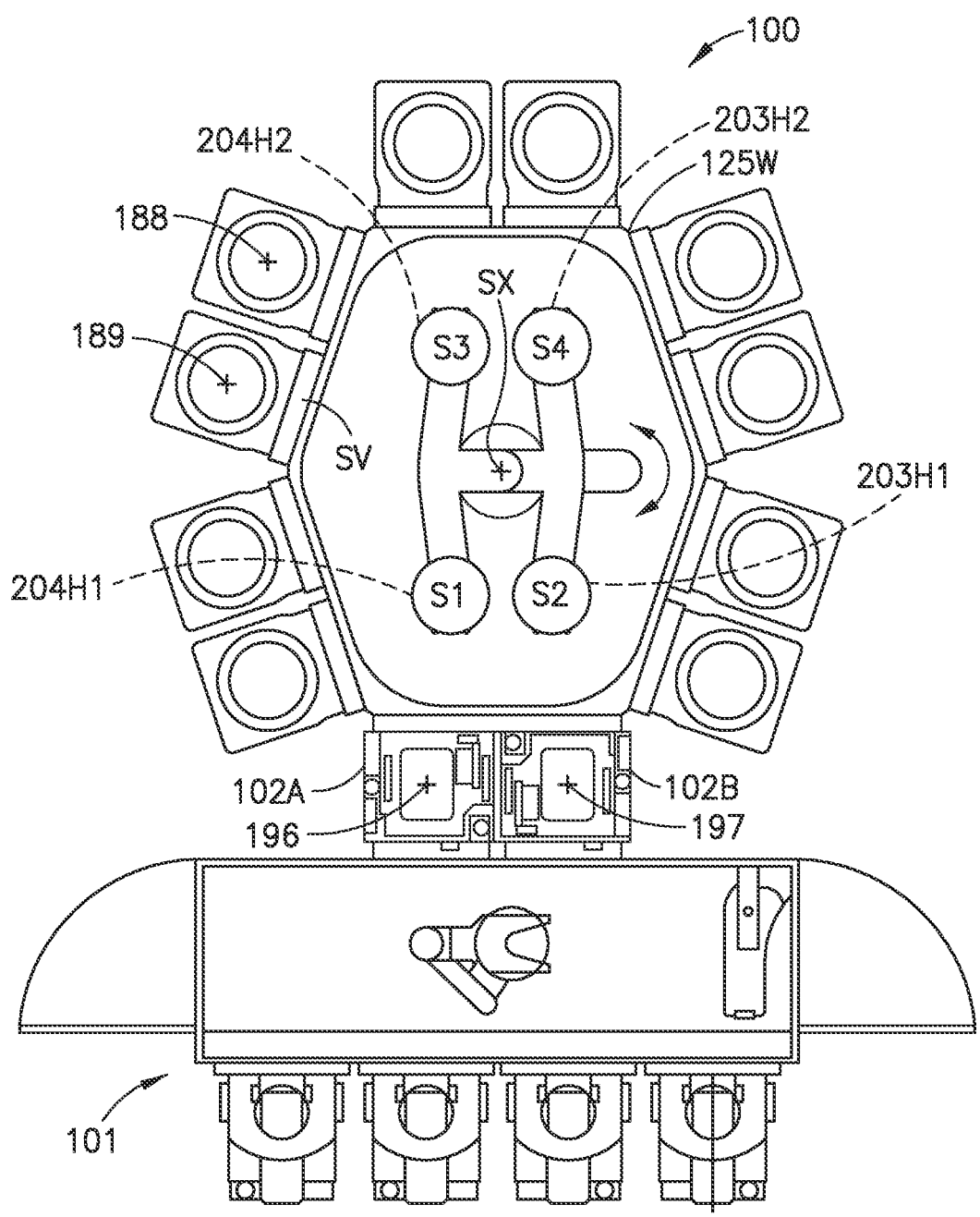
Figure 7I:
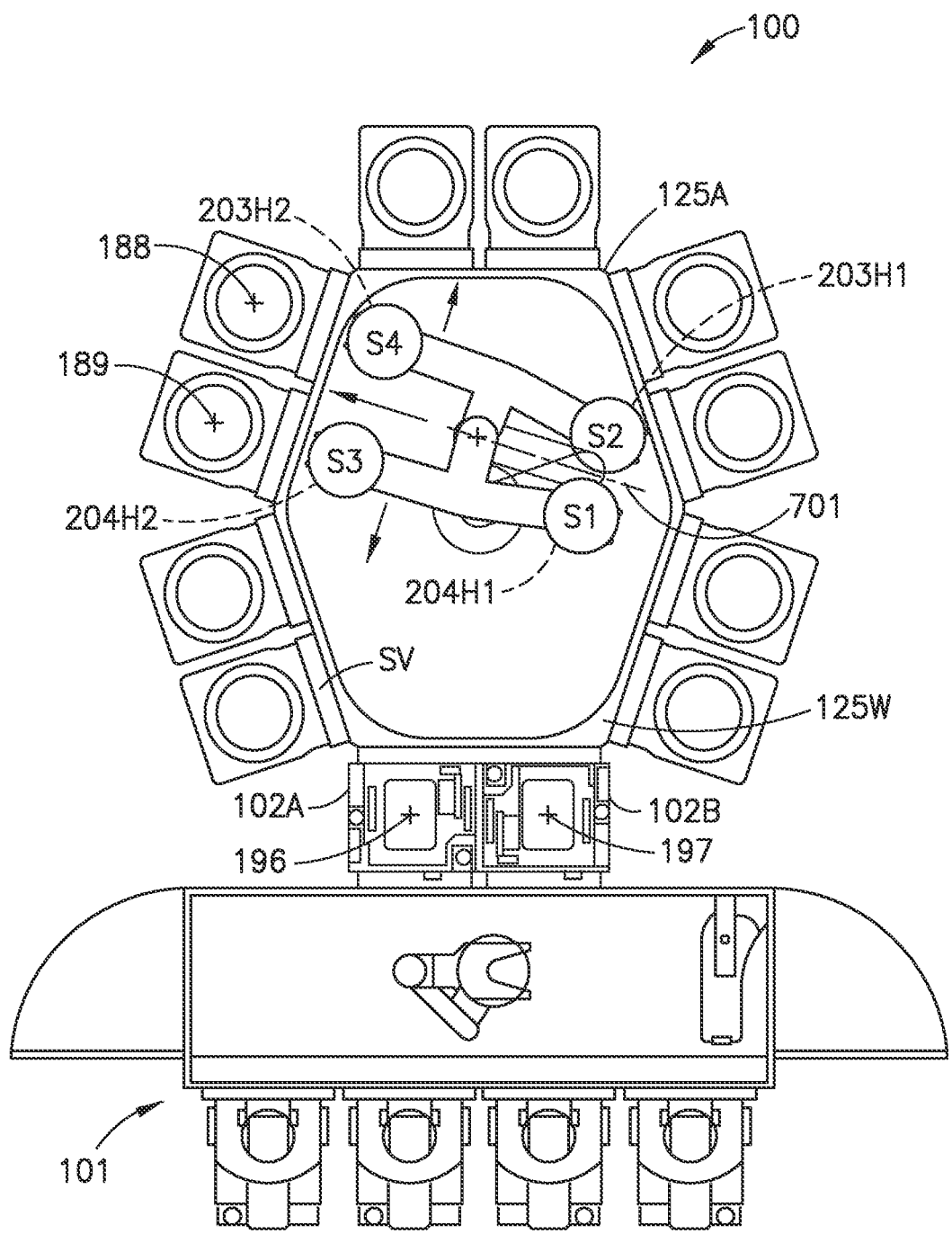

In a manner similar to that described above, the controller 110 is configured to effect motion of the drive section 220 to extend the arm 131 (FIG. 14, Block 1410) and so that the base pitch BP of the substrate holding stations 203H1, 204H1 is increased (FIG. 2B) or decreased (FIG. 2C) to effect automatic wafer centering (FIG. 14, Block 1430—in this case centering of the substrates S1, S2 on the respective substrate holding stations 203H1, 204H1) so that the distance between substrate holding stations 203H1, 204H1 substantially matches the pitch between substrate processing stations 188, 189 (see FIG. 7E). It is noted that automatic wafer centering (e.g., increasing or decreasing of the base pitch BP) may be performed substantially simultaneously with arm extension/retraction or with the arm 131 substantially in the retracted configuration prior to extension of the arm 131. To pick/place substrates from substrate processing stations 188, 189 the controller 110 is configured to effect motion of the drive section 220 so that the wrist axis WX moves in non-radial extension where movement of the wrist WX travels along, in one aspect, the path 701 (FIG. 7F) that is offset and/or angled from the axis of radial extension/retraction (i.e., the path 701 does not pass through or radiate from the shoulder axis SX). Movement of the wrist WX along path 701 extends the substrate holding stations 203H1, 204H1, through openings in the wall 125W of the transport chamber 125A, into substrate processing stations 188, 189.

In one aspect, the controller 110 may effect actuation of the Z-axis drive 312 to lift the substrate holding stations 203H1, 204H1 (while in other aspects the Z-motion may be provided at least in part by the substrate processing stations 188, 189) for picking the dual substrates S1, S2 (FIG. 14, Block 1440) substantially simultaneously from substrate processing stations 188, 189 of the side-by-side substrate station modules 150. With the substrates S1, S2 held on the substrate holding stations 203H1, 204H1, the controller 110 effects motion of the drive section 220 to retract the arm 131 to, for example, the retracted configuration so that the substrates S1, S2 are removed from the side-by-side substrate station modules 150 (see FIG. 7G). The base pitch BP of the substrate holding stations 203H1, 204H1 may be restored during (substantially simultaneous with) retraction of the arm 131 from the substrate processing stations 188, 189 or with the arm substantially in the retracted configuration (see FIG. 7G).

Figure 7J:
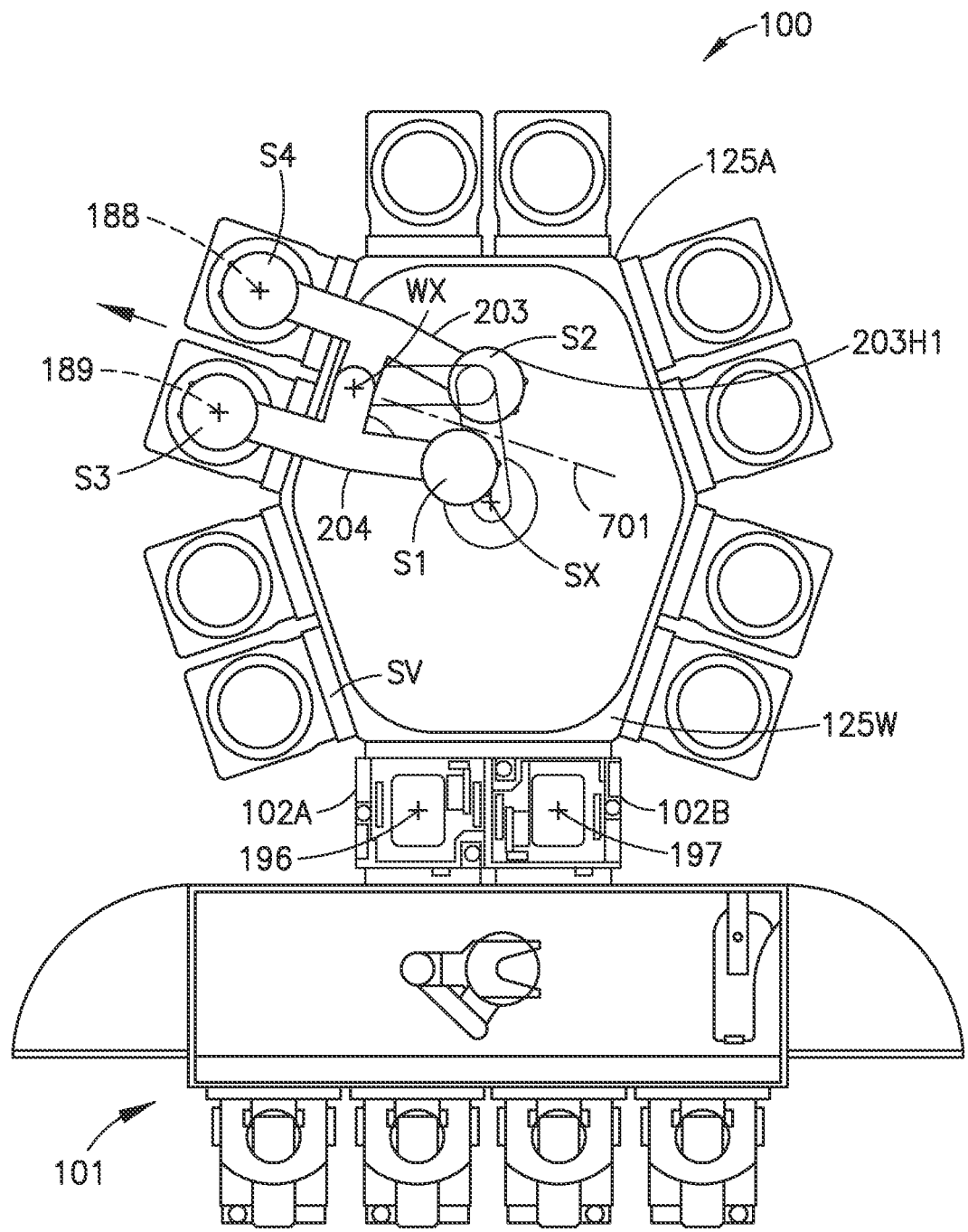
Figure 7K:
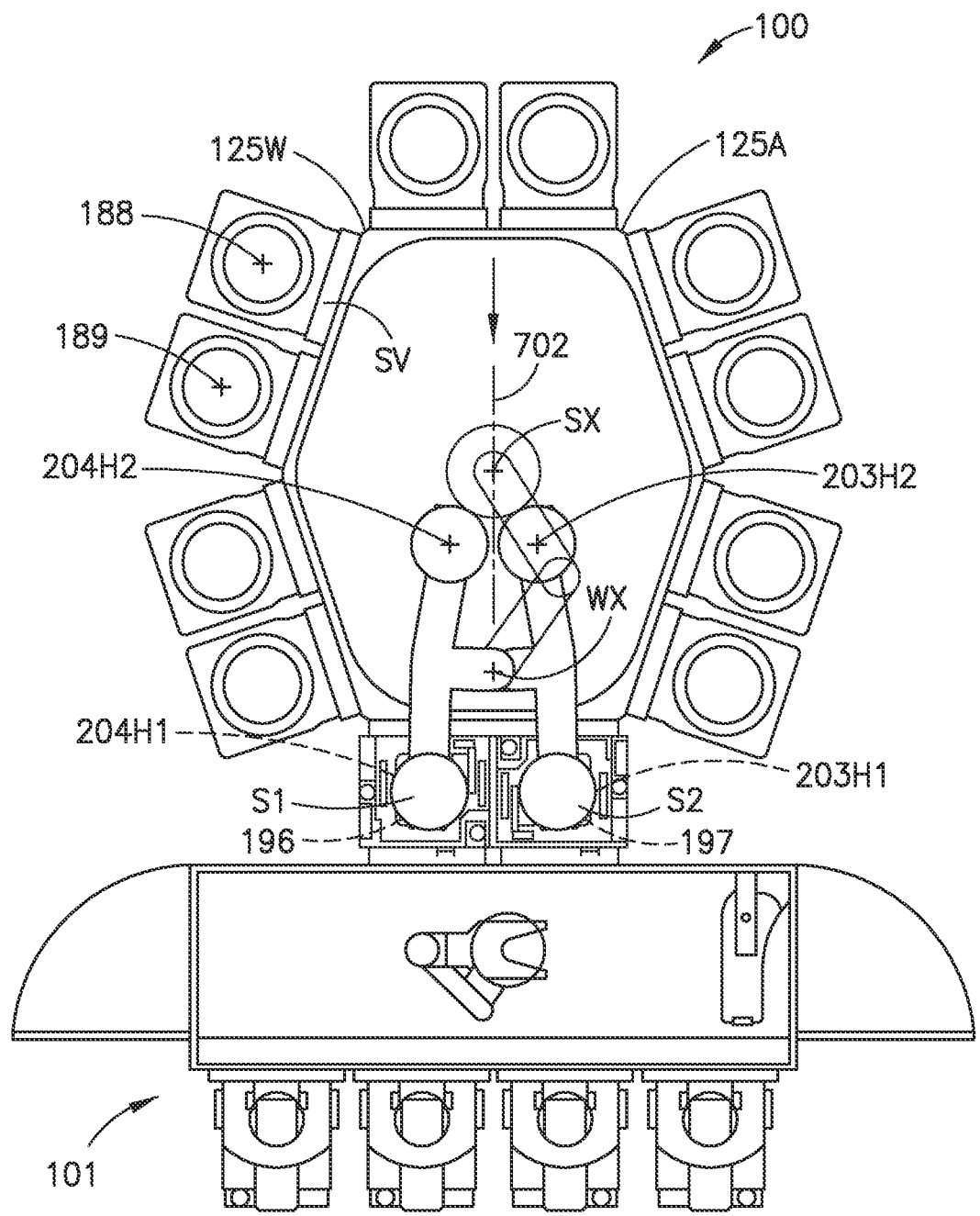
Figure 7L:
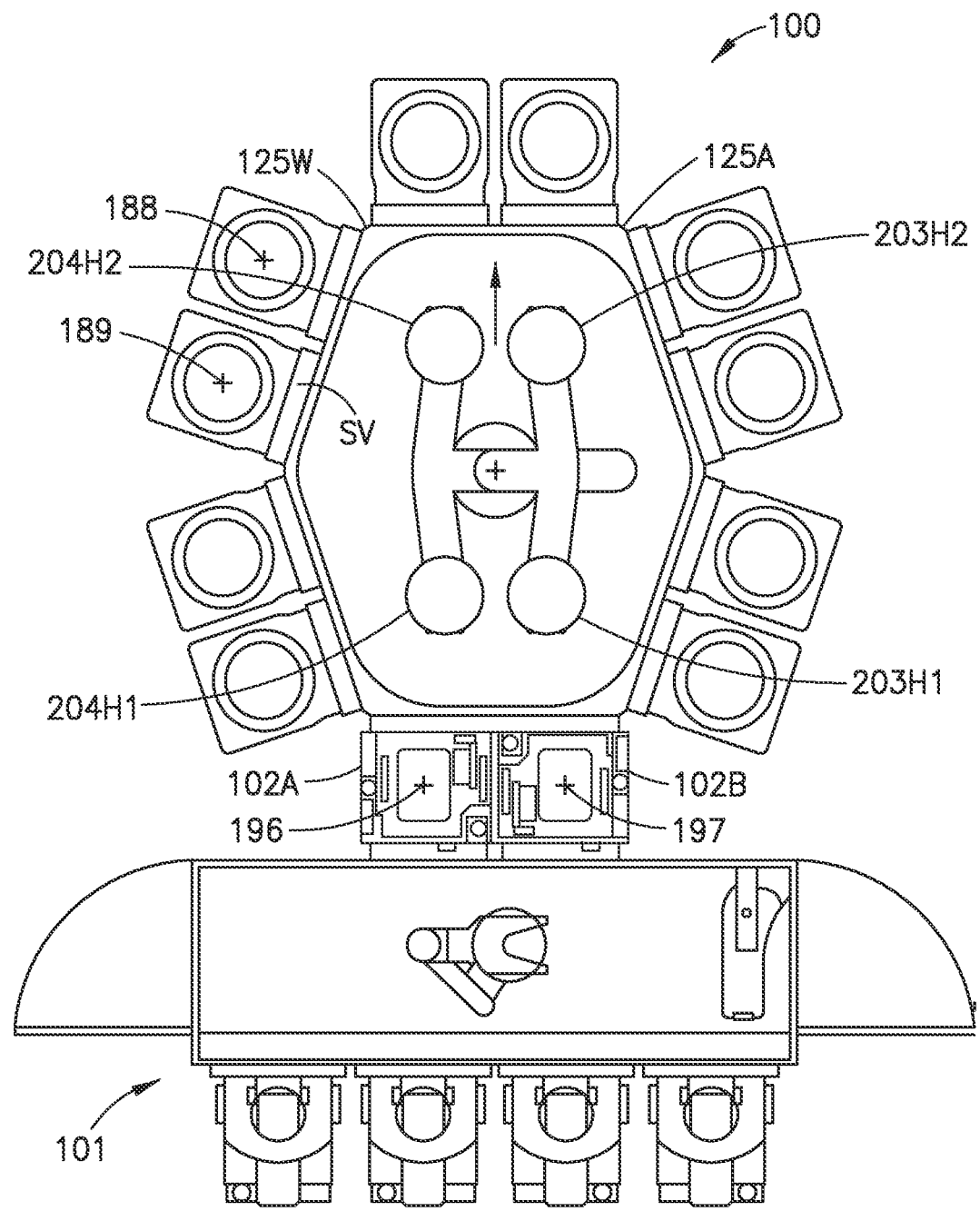

In one aspect a fast swapping of the substrates S1, S2 with substrates S3, S4 is effected (FIG. 14, Block 1450) in the manner descried above where each plane 499, 499A (see FIGS. 2D, 10, and 11) of the substrate holder planes (as described herein, and whether the substrate holding station (s) 203H1, 203H2, 204H1, 204H2 of the dual sided substrate holders form one or more planes) corresponds with and are aligned to at least one plane(s) (see FIGS. 1B and 1C) of transport openings in a common transport chamber for transfer at a given Z position of transport opening plane, so that substrate transfer through each respective opening on each plane is effected with at least one substrate holding station 203H1, 203H2, 204H1, 204H2 of each dual ended substrate holder 203, 204 substantially without Z axis movement, i.e., extension into the substrate processing stations (for each plane) with the substrate holding station(s) 203H1, 203H2, 204H1, 204H2 at one end of the substrate holders 203, 204, picking and/or placing of substrate(s) at the substrate processing stations, retraction from the substrate processing stations, and extension into each other different substrate processing station with the same or a different dual substrates at the same or different end of the dual ended substrate holders 203, 204 effects (independent of an intervening Z axis movement or decoupled from intervening Z axis movement between substrate transfers) a fast swapping of substrates substantially independent of Z axis movement. For example, the arm 131 is rotated in direction 777 (see FIGS. 7G-7I) so as to position the substrate holding stations 203H2, 204H2 (with substrates S1-S4 held by the arm 131), adjacent processing stations 188, 189 from which substrates S1, S2 were removed and to which dual substrates S3, S4 are to be placed. The controller 110 effects motion of the drive section 220 to extend the arm 131 (FIG. 14, Block 1410) and so that the base pitch BP of the substrate holding stations 203H2, 204H2 is increased (FIG. 2B) or decreased (FIG. 2C) to effect automatic wafer centering (FIG. 14, Block 1430—in this case centering of the substrates S3, S4 at the respective substrate processing stations 188, 189) so that the distance between substrate holding stations 203H2, 204H2 substantially matches the pitch between substrate processing stations 188, 189 (see FIG. 7I). It is noted that automatic wafer centering (e.g., increasing or decreasing of the base pitch BP) may be performed substantially simultaneously with arm extension/retraction or with the arm 131 substantially in the retracted configuration prior to extension of the arm 131. To place the substrates S3, S4 to the respective substrate processing stations 188, 189 the controller 110 is configured to effect motion of the drive section 220 so that the wrist axis WX moves in the non-radial extension along the path 701 (FIG. 7J). Movement of the wrist WX along path 701 extends the substrate holding stations 203H2, 204H2, through openings in the wall 125W of the transport chamber 125A, into substrate processing stations 188, 189.

In one aspect, the controller 110 may effect actuation of the Z-axis drive 312 to lower the substrate holding stations 203H2, 204H2 (while in other aspects the Z-motion may be provided at least in part by the substrate processing stations 188, 189) for placing the dual substrates S3, S4 (FIG. 14, Block 1440) substantially simultaneously to substrate processing stations 188, 189 of the side-by-side substrate station modules 150. The controller 110 effects motion of the drive section 220 to retract the arm 131 to, for example, the retracted configuration so that the substrate holding stations 203H2, 204H2 are removed from the side-by-side substrate station modules 150. The base pitch BP of the substrate holding stations 203H1, 204H1 may be restored during (substantially simultaneous with) retraction of the arm 131 from the substrate processing stations 188, 189 or with the arm substantially in the retracted configuration. While fast swapping of the substrates S1, S2 with substrates S3, S4 is described, it should be understood that in other aspects, the substrates S3, S4 may be placed in another location different from where substrates S1, S2 were picked.

The controller 110 may effect operation of the drive section 220 so that the arm 131 extends into load locks 102A, 102B, in the manner described above, so as to place the dual substrates S1, S2 to the substrate processing stations 196, 197 (see FIG. 7K) in a manner substantially similar to that described above with respect to placement of substrates S3, S4 at substrate processing stations 188, 189. The arm 131 is retracted from the load locks 102A, 102B to, for example, the retracted configuration (see FIG. 7L) for further picking/placing of substrates.

Referring to FIGS. 4, 5A-5F, and 30, according to aspects of the present disclosure, a method includes providing a substrate transport apparatus (FIG. 30, Block 3000) such as those described above. The movable arm link 201, 202 of the substrate transport apparatus is reconfigured (FIG. 30, Block 3010), where as described above, the movable arm link 201, 202 is a reconfigurable arm link 201R, 202R having a modular composite arm link casing 201C, 202C, formed of link case modules rigidly coupled to each other, and a pulley system 255A-255E cased in and extending through the rigidly coupled link case modules substantially end to end of the modular composite arm link casing 201C, 202C. As described above, the rigidly coupled link case modules include link case end modules (e.g., end couplings 511, 512, 513, 514 connected by at least one interchangeable link case extension module (e.g., central arm section 510A, 510B) having a predetermined characteristic determining a length OAL, OALn of the movable arm link 201, 202. In reconfiguring the movable arm link 201, 202, the at least one interchangeable link case extension module 510A, 510B is selectable, for connection to the link case end modules 511, 512, 513, 514 and forming the reconfigurable arm link 201R, 202R, from a number of different interchangeable link case extension modules (e.g., central arm sections) 510A, 510A1-510An, 510B, 510B1-510Bn each with a different corresponding predetermined characteristic determining a corresponding different length OAL, OALn of the movable arm link 201, 202, so as to selectably set the modular composite arm link casing 201C, 202C and reconfigurable arm link 201R, 202R to a predetermined arm link length OAL, OALn from a number of predetermined arm link lengths OAL, OALn.

Referring to FIGS. 4, 5A-5F, and 31, according to aspects of the present disclosure, a method includes providing a substrate transport apparatus (FIG. 31, Block 3100) such as those described above. Articulation of the at least one movable arm link or the end effector relative to the at least one movable arm link (such as those articulations described above for transport sub substrates to different substrate holding locations) is effected (FIG. 31, Block 3110) with a pulley system 655A-655E that is mounted and engaged to a modular composite arm link casing 201C, 202C of the at least one movable arm link 201, 202, wherein the modular composite arm link casing 201C, 202C is formed of link case modules (as described herein) rigidly coupled to each other and the pulley system 655A-655E is cased in and extends through the rigidly coupled link case modules substantially end to end of the modular composite arm link casing 201C, 202C. The rigidly coupled link case modules include link case end modules (e.g. end couplings) 511, 512, 513, 514 connected by at least one link case extension module (e.g., central arm section) 510A, 510B that is mechanically fastened to each of the link case end modules 511, 512, 513, 514 to form the modular composite arm link casing 201C, 202C and arranged so that the modular arm link casing 201C, 202C formed matches a misalignment tolerance of a pulley transmission (such as transmissions 490, 492, 493, 494, 495) connecting pulley wheels 480, 484, 488, 482, 486, 491, 470, 474, 472, 476 of the pulley system 655A-655E housed in the link case end modules 511, 512, 513, 514 at the ends of the modular composite arm link casing 201C, 202C.

Figure 33A:
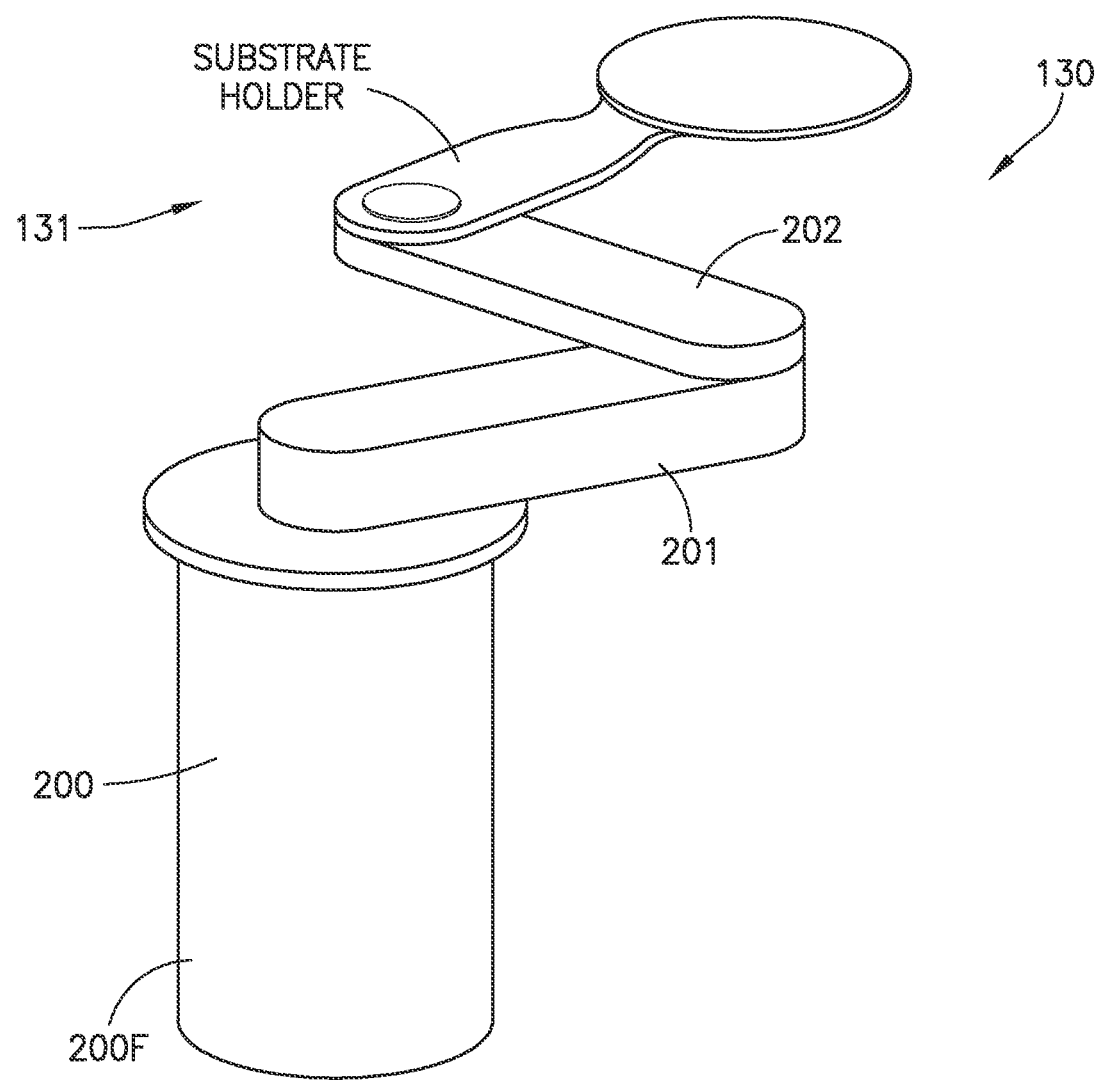
Figure 34A:
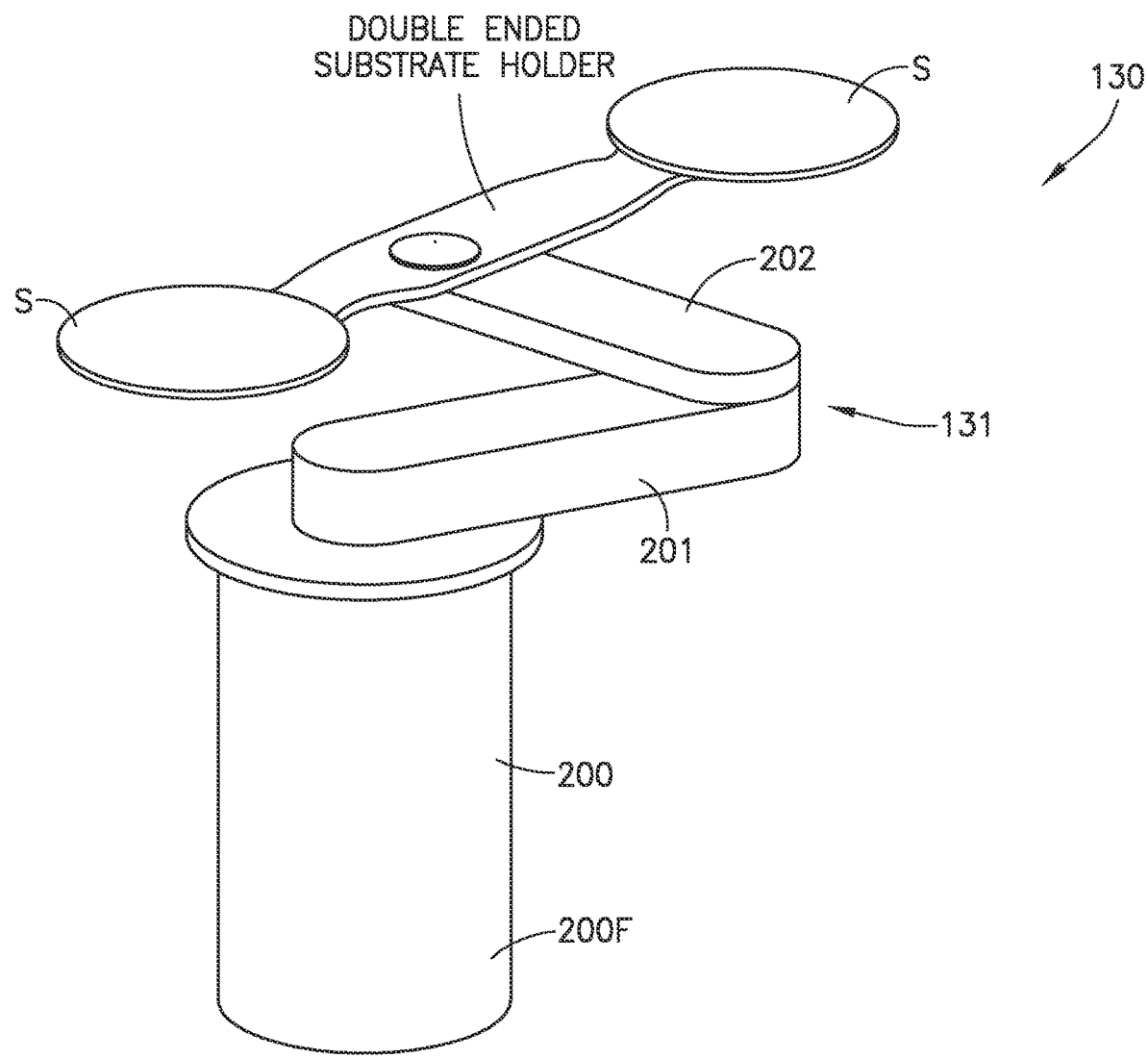
FIGS. 34A and 34B are schematic illustrations of a substrate transport apparatus in accordance with aspects of the present disclosure.
Figure 34B:
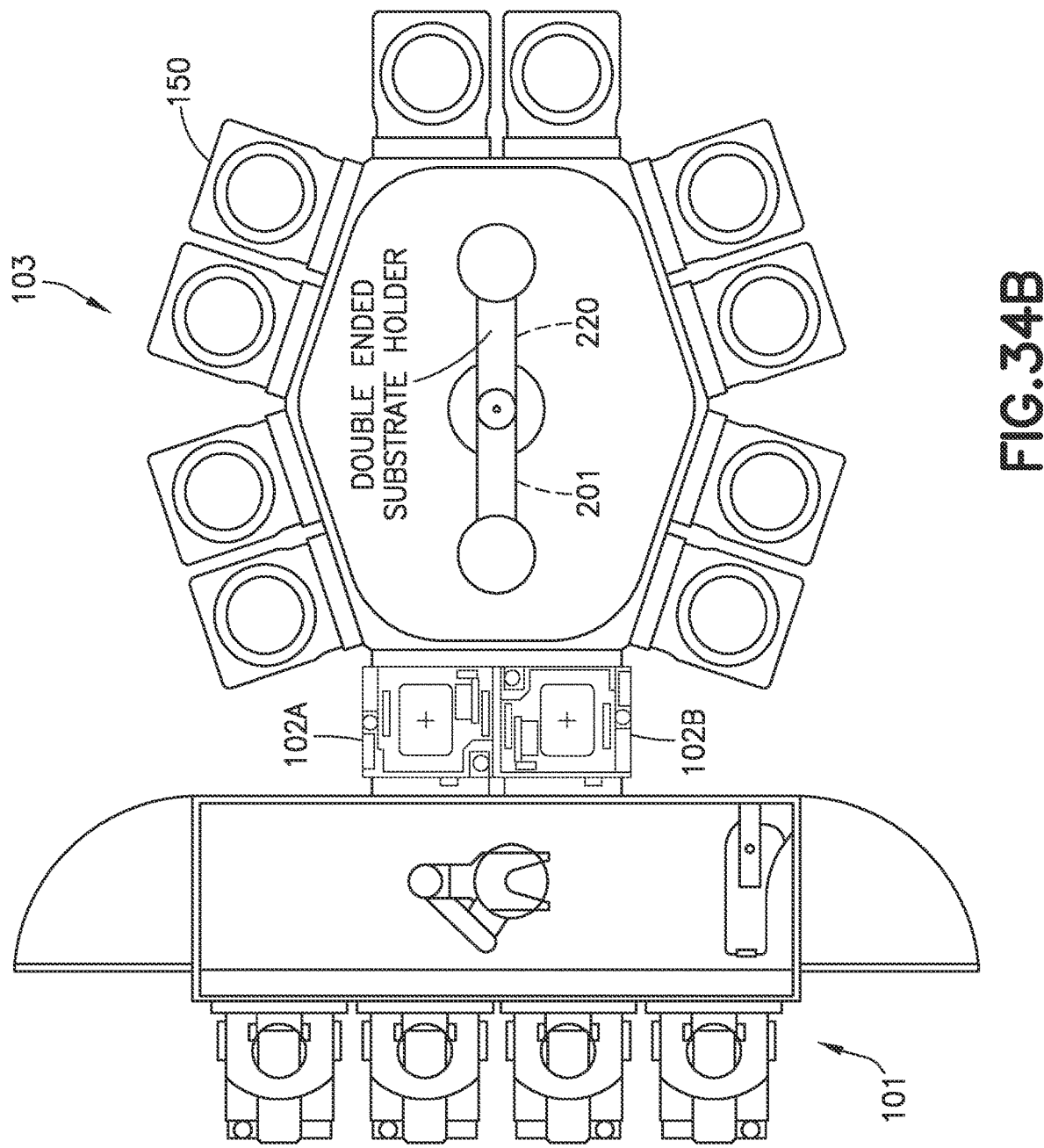
Figure 35A:
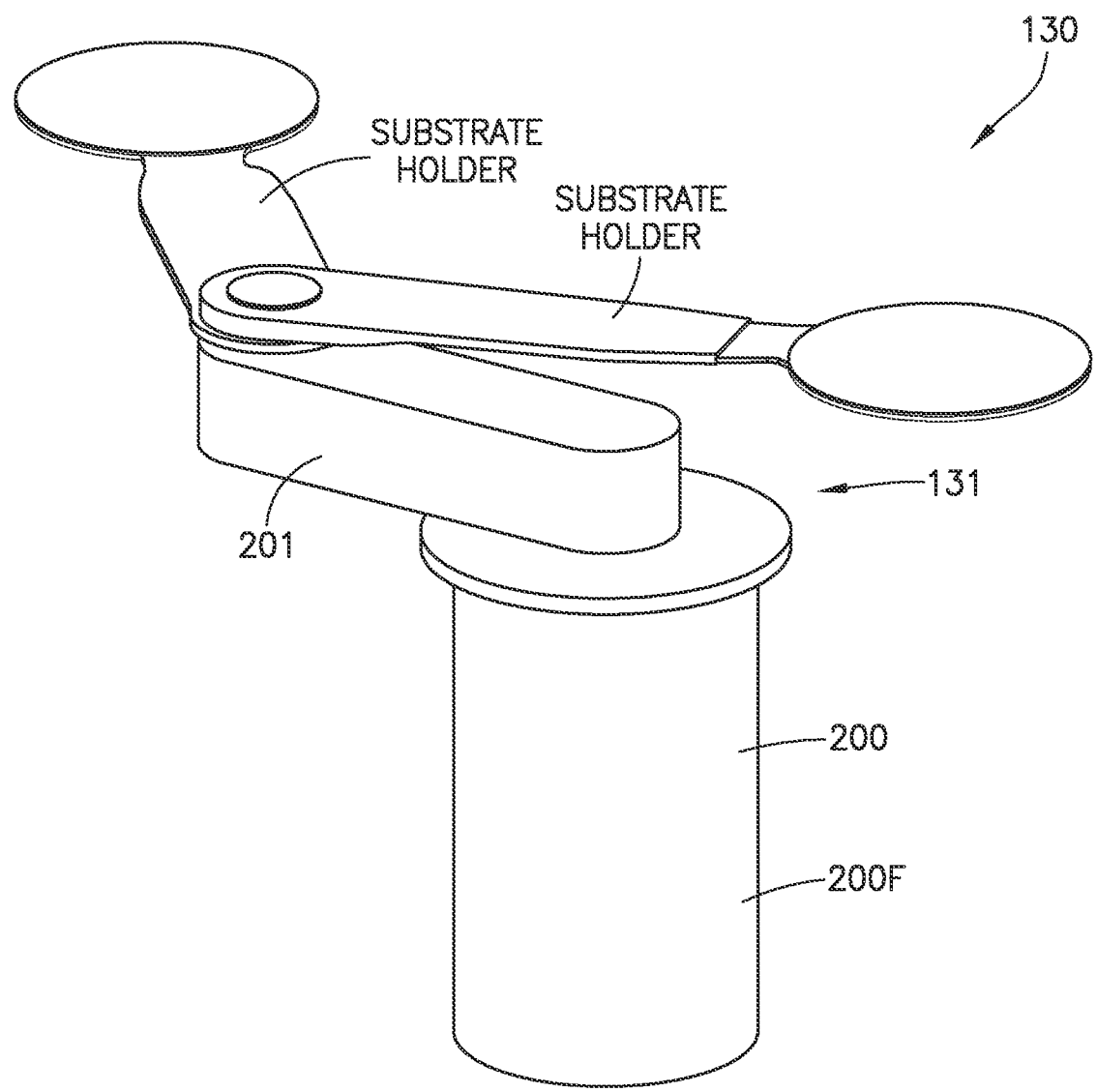
FIGS. 35A and 35B are schematic illustrations of a substrate transport apparatus in accordance with aspects of the present disclosure.
Figure 35B:
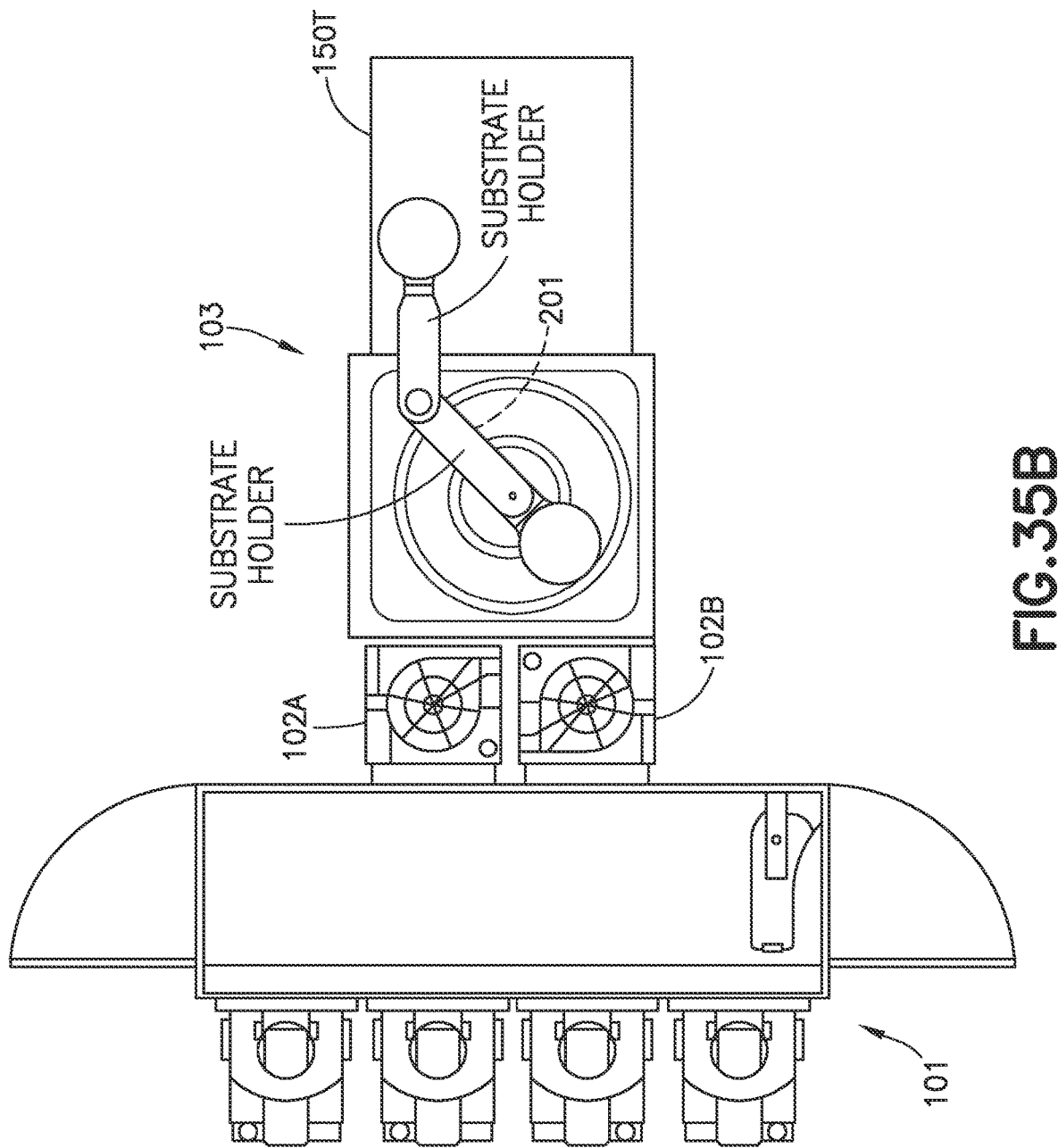
Figure 36A:
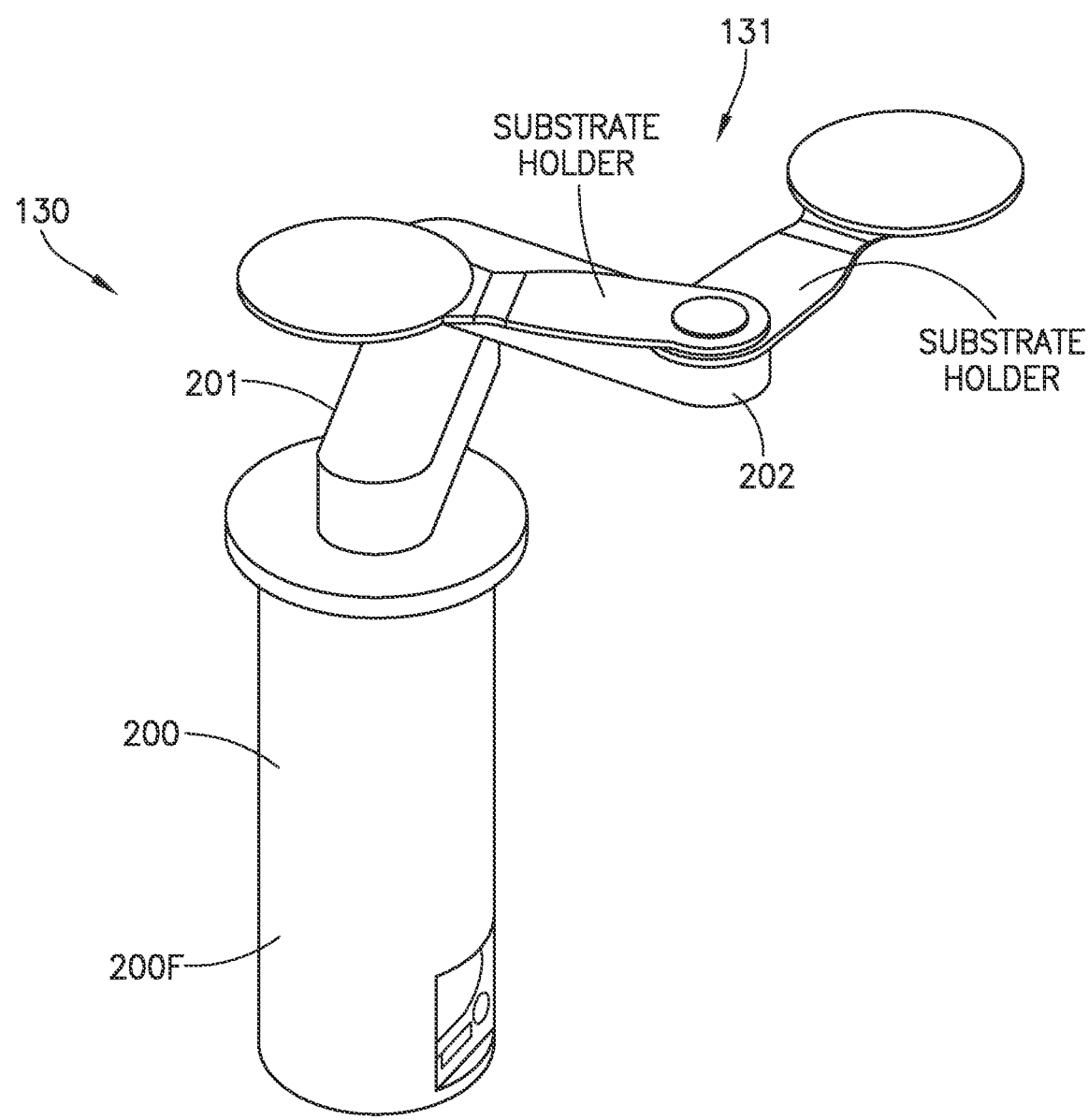
FIGS. 36A and 36B are schematic illustrations of a substrate transport apparatus in accordance with aspects of the present disclosure
Figure 36B:
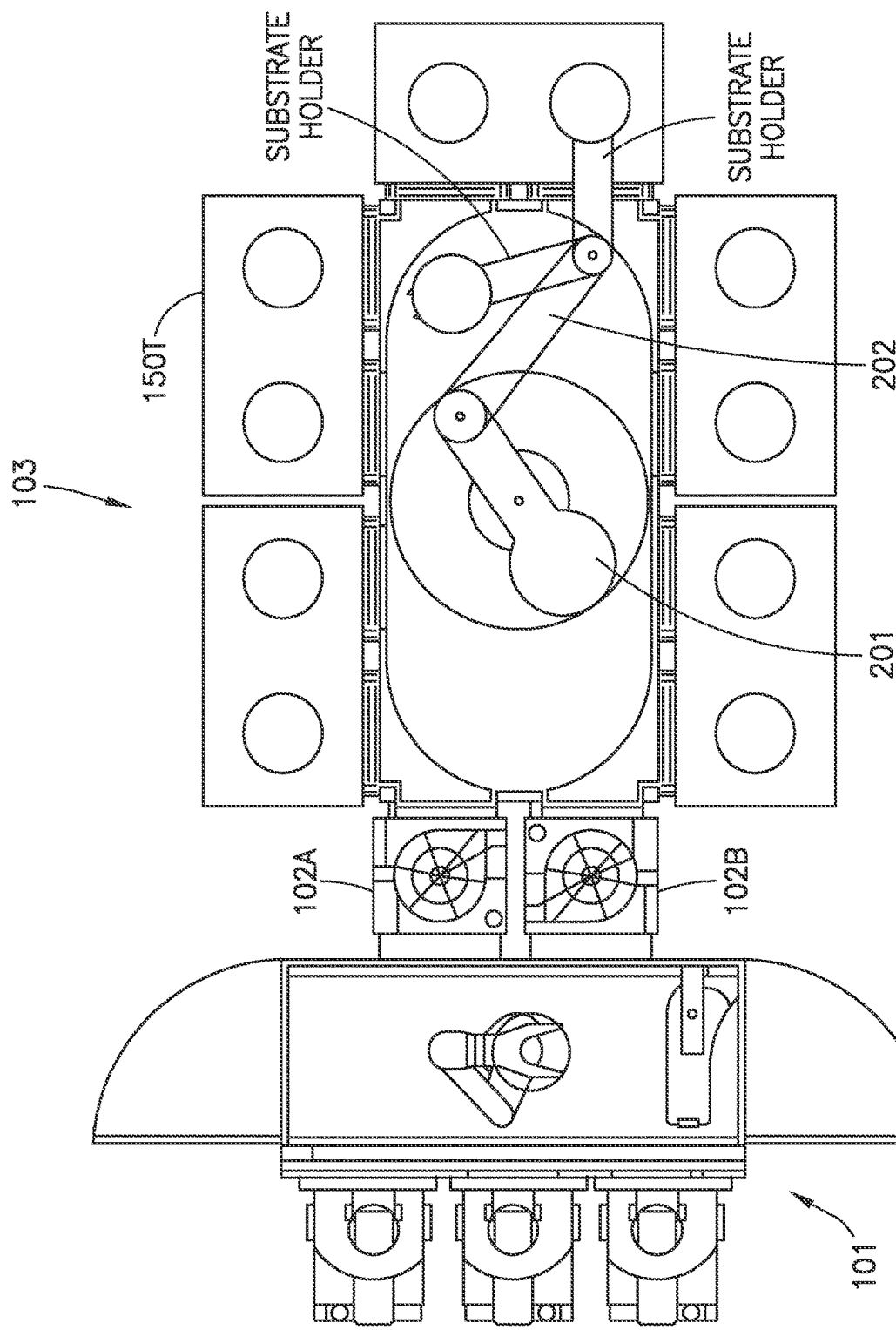

Referring to FIGS. 33A-36B, other exemplary substrate transport apparatus 130 are illustrated and in which the above aspects of the present disclosure may be employed. In FIG. 33A-36B the arm link(s) and end effector(s) may be independently rotated or in some aspects the rotation of one or more of the arm link(s) and end effector(s) may be slaved to another arm link. It is noted that the arm links and end effector may be driven in rotation with, for example, the motors/drives and pulley systems substantially similar to those described above. For example, FIGS. 33A and 33B illustrate s substrate transport arm 131 having upper arm 201, forearm 202, and a single ended substrate holder. FIGS. 34A and 34B illustrate a transport arm 131 having upper arm 201, forearm 202, and a single double sided end effector. FIGS. 35A and 35B illustrate a transport arm 131 having a single arm link (e.g., upper arm 201) and two independently rotatable single ended end effectors. FIGS. 36A and 36B illustrate a transport arm 131 having upper arm 201, forearm 202, and two independently rotatable single ended end effectors. While examples of the transport arms have been provided herein, in other aspects the transport arm employing the aspects of the present disclosure described herein may have any suitable configuration (e.g., any suitable number of arm links, any suitable number of end effectors, where each end effector may hold a single substrate or more than one substrate, etc.).

In accordance with one or more aspects of the present disclosure a substrate transport apparatus comprises:
a support frame;
an articulated arm connected to the support frame and having at least one movable arm link and an end effector, connected to the movable arm link, with a substrate holding station located thereon;
wherein the movable arm link is a reconfigurable arm link having a modular composite arm link casing, formed of link case modules rigidly coupled to each other, and a pulley system cased in and extending through the rigidly coupled link case modules substantially end to end of the modular composite arm link casing, and wherein the rigidly coupled link case modules include link case end modules connected by at least one interchangeable link case extension module having a predetermined characteristic determining a length of the movable arm link; and
wherein the at least one interchangeable link case extension module is selectable, for connection to the link case end modules and forming the reconfigurable arm link, from a number of different interchangeable link case extension modules each with a different corresponding predetermined characteristic determining a corresponding different length of the movable arm link, so as to selectably set the modular composite arm link casing and reconfigurable arm link to a predetermined arm link length from a number of predetermined arm link lengths.

In accordance with one or more aspects of the present disclosure the at least one interchangeable link case extension module and each of the number of different interchangeable link case extension modules have a box shape cross section corresponding thereto, and the predetermined characteristic is that the interchangeable link case extension module and each of the number of different interchangeable link case extension modules have a different corresponding length and the corresponding box shape cross section being sized and shaped commensurate to the different corresponding lengths so as to maintain a predetermined stiffness (end to end) for each different interchangeable link case extension module.

In accordance with one or more aspects of the present disclosure the at least one interchangeable link case extension module and each of the number of different interchangeable link case extension modules have a box shape cross section corresponding thereto, and the predetermined characteristic is that the interchangeable link case extension module and each of the number of different interchangeable link case extension modules have a different corresponding length and the corresponding box shape cross section being sized and shaped commensurate to the different corresponding length so as to maintain a predetermined stiffness (end to end) for each different selectable predetermined arm link length.

In accordance with one or more aspects of the present disclosure the at least one interchangeable link case extension module and each of the number of different interchangeable link case extension modules is an extrusion member having a box shape cross section.

In accordance with one or more aspects of the present disclosure the at least one interchangeable link case extension module and each of the number of different interchangeable link case extension modules has a box shape cross section made of a material different from a material of (one or both of) the link case end modules.

In accordance with one or more aspects of the present disclosure a material of the at least one link case extension module and each of the number of different interchangeable link case extension modules has a higher stiffness (spring modulus) than a material of the link case end modules.

In accordance with one or more aspects of the present disclosure a material of the at least one link case extension module and each of the number of different interchangeable link case extension modules has a stiffness commensurate with a material stiffness of a pulley transmission of the pulley system.

In accordance with one or more aspects of the present disclosure the pulley system is engaged to the modular composite arm link casing, and is arranged so that, powered by a drive section, the pulley system effects articulation of the at least one arm link or the end effector.

In accordance with one or more aspects of the present disclosure the at least one interchangeable link case extension module and each of the number of different interchangeable link case extension modules has a box shape cross section made of stainless steel.

In accordance with one or more aspects of the present disclosure the at least one interchangeable link case extension module is mechanically fastened to each of the link case end modules to form the modular composite arm link casing and arranged so that the modular composite arm link casing formed matches a misalignment tolerance of a pulley transmission connecting pulley wheels of the pulley system for a selected predetermined arm link length.

In accordance with one or more aspects of the present disclosure the at least one interchangeable link case extension module is mechanically fastened with mechanical fastener joints (including removable mechanical fasteners) to each of the link case end modules to form the modular composite arm link casing, and the mechanical fastener joints are configured so that the modular composite arm link casing formed matches a misalignment tolerance of a pulley transmission connecting pulley wheels of the pulley system for a selected predetermined arm link length.

In accordance with one or more aspects of the present disclosure at least one of the link case end modules houses a pulley wheel of the pulley system.

In accordance with one or more aspects of the present disclosure the modular composite arm link casing is a low profile casing having a compact height for a selected predetermined arm length commensurate with a bi-symmetrically flexible pulley transmission, connecting pulley wheels of the pulley system, that has a compact substantially by-symmetrical cross section.

In accordance with one or more aspects of the present disclosure the compact height is smaller than a band pulley transmission housing height for a comparable number of pulley systems having comparable lengths.

In accordance with one or more aspects of the present disclosure the flexible pulley transmission connecting the pulley wheels is a cable or wire pulley transmission.

In accordance with one or more aspects of the present disclosure at least one of the link case end modules houses a pulley wheel of the pulley system mounted with a crossed roller bearing so that position and alignment of the pulley wheel is dependent and controlled by engagement with the crossed roller bearing.

In accordance with one or more aspects of the present disclosure the modular composite arm link casing is a low profile casing having a compact height for a selected predetermined arm length commensurate with a crossed roller bearing mounted pulley wheel of the pulley system housed in at least one of the link case end modules.

In accordance with one or more aspects of the present disclosure a pulley transmission to pulley wheel engagement of a respective pulley wheel of the pulley system is arranged so as to determine rotation of a respective pulley wheel of the pulley system through at least 360° rotation of the respective pulley wheel between wound and unwound positions of the pulley transmission on the respective pulley wheel.

In accordance with one or more aspects of the present disclosure a pulley transmission to pulley wheel engagement of a respective pulley wheel of the pulley system is arranged so as to determine rotation of the end effector through at least 360° rotation of the end effector relative to the at least one movable arm link between wound and unwound positions of the pulley transmission on a respective pulley wheel.

In accordance with one or more aspects of the present disclosure a substrate transport apparatus comprises:
  a support frame;
  an articulated arm connected to the support frame and having at least one movable arm link and an end effector, connected to the at least one movable arm link, with a substrate holding station located thereon;
  wherein the at least one movable arm link has a modular composite arm link casing, formed of link case modules rigidly coupled to each other, and a pulley system cased in and extending through the rigidly coupled link case modules substantially end to end of the modular composite arm link casing, the pulley system is mounted and engaged to the modular composite arm link casing, and is arranged so that, powered by a drive section, the pulley system effects articulation of the at least one movable arm link or the end effector relative to the at least one movable arm link, and
  wherein the rigidly coupled link case modules include link case end modules connected by at least one link case extension module that is mechanically fastened to each of the link case end modules to form the modular composite arm link casing and arranged so that the modular arm link casing formed matches a misalignment tolerance of a pulley transmission connecting pulley wheels of the pulley system housed in the link case end modules at the ends of the modular composite arm link casing.

In accordance with one or more aspects of the present disclosure the at least one movable arm link is a reconfigurable arm link, wherein the link case extension module is interchangeable from a number of different interchangeable link case extension modules each having a different corresponding predetermined characteristic determining a length of the at least one movable arm link.

In accordance with one or more aspects of the present disclosure the link case extension module and each of the number of different interchangeable link case extension modules have a box shape cross section corresponding thereto, and the predetermined characteristic is that the link case extension module and each of the number of different interchangeable link case extension modules have a different corresponding length and the corresponding box shape cross section being sized and shaped commensurate to the different corresponding lengths so as to maintain a predetermined stiffness (end to end) for each different interchangeable link case extension module.

In accordance with one or more aspects of the present disclosure the link case extension module and each of the number of different interchangeable link case extension modules have a box shape cross section corresponding thereto, and the predetermined characteristic is that the link case extension module and each of the number of different interchangeable link case extension modules have a different corresponding length and the corresponding box shape cross section being sized and shaped commensurate to the different corresponding length so as to maintain a predetermined stiffness (end to end) for each different selectable predetermined arm link length.

In accordance with one or more aspects of the present disclosure the link case extension module and each of the number of different interchangeable link case extension modules is an extrusion member having a box shape cross section.

In accordance with one or more aspects of the present disclosure the link case extension module and each of the number of different interchangeable link case extension modules has a box shape cross section made of a material different from a material of (one or both of) the link case end modules.

In accordance with one or more aspects of the present disclosure a material of the link case extension module and each of the number of different interchangeable link case extension modules has a higher stiffness (spring modulus) than a material of the link case end modules.

In accordance with one or more aspects of the present disclosure a material of the link case extension module and each of the number of different interchangeable link case extension modules has a stiffness commensurate with a material stiffness of the pulley transmission of the pulley system.

In accordance with one or more aspects of the present disclosure the link case extension module and each of the number of different interchangeable link case extension modules has a box shape cross section made of stainless steel.

In accordance with one or more aspects of the present disclosure the pulley transmission is a bi-symmetrically flexible pulley transmission and the modular composite arm link casing is a low profile casing having a compact height for a selected predetermined arm length commensurate with the bi-symmetrically flexible pulley transmission, connecting the pulley wheels of the pulley system, that has a compact substantially by-symmetrical cross section.

In accordance with one or more aspects of the present disclosure the compact height is smaller than a band pulley transmission housing height for a comparable number of pulley systems having comparable lengths.

In accordance with one or more aspects of the present disclosure the flexible pulley transmission connecting the pulley wheels is a cable or wire pulley transmission.

In accordance with one or more aspects of the present disclosure the modular composite arm link casing is a low profile casing having a compact height for a selected predetermined arm length commensurate with a crossed roller bearing mounted pulley wheel of the pulley system housed in at least one of the link case end modules.

In accordance with one or more aspects of the present disclosure at least one of the pulley wheels of the pulley system is mounted with a crossed roller bearing so that position and alignment of the at least one of the pulley wheels is dependent and controlled by engagement with the crossed roller bearing.

In accordance with one or more aspects of the present disclosure a pulley transmission to pulley wheel engagement of the pulley wheels of the pulley system is arranged so as to determine rotation of at least one of the pulley wheels of the pulley system through at least 360° rotation of the at least one of the pulley wheels between wound and unwound positions of the pulley transmission on the at least one of the pulley wheels.

In accordance with one or more aspects of the present disclosure a pulley transmission to pulley wheel engagement of the pulley wheels of the pulley system is arranged so as to determine rotation of the end effector through at least 360° rotation of the end effector relative to the at least one movable arm link between wound and unwound positions of the pulley transmission on at least one of the pulley wheels.

In accordance with one or more aspects of the present disclosure a method comprises:
providing a substrate transport apparatus that includes
a support frame, and
an articulated arm connected to the support frame and having at least one movable arm link and an end effector, connected to the movable arm link, with a substrate holding station located thereon; and
reconfiguring the movable arm link, where the movable arm link is a reconfigurable arm link having a modular composite arm link casing, formed of link case modules rigidly coupled to each other, and a pulley system cased in and extending through the rigidly coupled link case modules substantially end to end of the modular composite arm link casing, and wherein the rigidly coupled link case modules include link case end modules connected by at least one interchangeable link case extension module having a predetermined characteristic determining a length of the movable arm link; and
wherein the at least one interchangeable link case extension module is selectable, for connection to the link case end modules and forming the reconfigurable arm link, from a number of different interchangeable link case extension modules each with a different corresponding predetermined characteristic determining a corresponding different length of the movable arm link, so as to selectably set the modular composite arm link casing and reconfigurable arm link to a predetermined arm link length from a number of predetermined arm link lengths.

In accordance with one or more aspects of the present disclosure the at least one interchangeable link case extension module and each of the number of different interchangeable link case extension modules have a box shape cross section corresponding thereto, and the predetermined characteristic is that the interchangeable link case extension module and each of the number of different interchangeable link case extension modules have a different corresponding length and the corresponding box shape cross section being sized and shaped commensurate to the different corresponding lengths so as to maintain a predetermined stiffness (end to end) for each different interchangeable link case extension module.

In accordance with one or more aspects of the present disclosure the at least one interchangeable link case extension module and each of the number of different interchangeable link case extension modules have a box shape cross section corresponding thereto, and the predetermined characteristic is that the interchangeable link case extension module and each of the number of different interchangeable link case extension modules have a different corresponding length and the corresponding box shape cross section being sized and shaped commensurate to the different corresponding length so as to maintain a predetermined stiffness (end to end) for each different selectable predetermined arm link length.

In accordance with one or more aspects of the present disclosure the at least one interchangeable link case extension module and each of the number of different interchangeable link case extension modules is an extrusion member having a box shape cross section.

In accordance with one or more aspects of the present disclosure the at least one interchangeable link case extension module and each of the number of different interchangeable link case extension modules has a box shape cross section made of a material different from a material of (one or both of) the link case end modules.

In accordance with one or more aspects of the present disclosure a material of the at least one link case extension module and each of the number of different interchangeable link case extension modules has a higher stiffness (spring modulus) than a material of the link case end modules.

In accordance with one or more aspects of the present disclosure a material of the at least one link case extension module and each of the number of different interchangeable link case extension modules has a stiffness commensurate with a material stiffness of a pulley transmission of the pulley system.

In accordance with one or more aspects of the present disclosure the pulley system is engaged to the modular composite arm link casing, and is arranged so that, powered by a drive section, the pulley system effects articulation of the at least one arm link or the end effector.

In accordance with one or more aspects of the present disclosure the at least one interchangeable link case extension module and each of the number of different interchangeable link case extension modules has a box shape cross section made of stainless steel.

In accordance with one or more aspects of the present disclosure the method further comprises mechanically fastening the at least one interchangeable link case extension module to each of the link case end modules to form the modular composite arm link casing where modular composite arm link casing formed matches a misalignment tolerance of a pulley transmission connecting pulley wheels of the pulley system for a selected predetermined arm link length.

In accordance with one or more aspects of the present disclosure the method further comprises mechanically fastening the at least one interchangeable link case extension module with mechanical fastener joints (including removable mechanical fasteners) to each of the link case end modules to form the modular composite arm link casing, and the mechanical fastener joints are configured so that the modular composite arm link casing formed matches a misalignment tolerance of a pulley transmission connecting pulley wheels of the pulley system for a selected predetermined arm link length.

In accordance with one or more aspects of the present disclosure at least one of the link case end modules houses a pulley wheel of the pulley system.

In accordance with one or more aspects of the present disclosure the modular composite arm link casing is a low profile casing having a compact height for a selected predetermined arm length commensurate with a bi-symmetrically flexible pulley transmission, connecting pulley wheels of the pulley system, that has a compact substantially by-symmetrical cross section.

In accordance with one or more aspects of the present disclosure the compact height is smaller than a band pulley transmission housing height for a comparable number of pulley systems having comparable lengths.

In accordance with one or more aspects of the present disclosure the flexible pulley transmission connecting the pulley wheels is a cable or wire pulley transmission.

In accordance with one or more aspects of the present disclosure at least one of the link case end modules houses a pulley wheel of the pulley system mounted with a crossed roller bearing so that position and alignment of the pulley wheel is dependent and controlled by engagement with the crossed roller bearing.

In accordance with one or more aspects of the present disclosure the modular composite arm link casing is a low profile casing having a compact height for a selected predetermined arm length commensurate with a crossed roller bearing mounted pulley wheel of the pulley system housed in at least one of the link case end modules.

In accordance with one or more aspects of the present disclosure a pulley transmission to pulley wheel engagement of a respective pulley wheel of the pulley system is arranged so as to determine rotation of a respective pulley wheel of the pulley system through at least 360° rotation of the respective pulley wheel between wound and unwound positions of the pulley transmission on the respective pulley wheel.

In accordance with one or more aspects of the present disclosure a pulley transmission to pulley wheel engagement of a respective pulley wheel of the pulley system is arranged so as to determine rotation of the end effector through at least 360° rotation of the end effector relative to the at least one movable arm link between wound and unwound positions of the pulley transmission on a respective pulley wheel.

In accordance with one or more aspects of the present disclosure a method comprises:
providing a substrate transport apparatus that includes
a support frame,
an articulated arm connected to the support frame and having at least one movable arm link and an end effector, connected to the at least one movable arm link, with a substrate holding station located thereon; and
effecting, with a pulley system that is mounted and engaged to a modular composite arm link casing of the at least one movable arm, articulation of the at least one movable arm link or the end effector relative to the at least one movable arm link wherein the modular composite arm link casing is formed of link case modules rigidly coupled to each other and the pulley system is cased in and extends through the rigidly coupled link case modules substantially end to end of the modular composite arm link casing;
wherein the rigidly coupled link case modules include link case end modules connected by at least one link case extension module that is mechanically fastened to each of the link case end modules to form the modular composite arm link casing and arranged so that the modular arm link casing formed matches a misalignment tolerance of a pulley transmission connecting pulley wheels of the pulley system housed in the link case end modules at the ends of the modular composite arm link casing.

In accordance with one or more aspects of the present disclosure the method further comprises reconfiguring the at least one movable arm link, wherein the link case extension module is interchangeable from a number of different interchangeable link case extension modules each having a different corresponding predetermined characteristic determining a length of the at least one movable arm link.

In accordance with one or more aspects of the present disclosure the link case extension module and each of the number of different interchangeable link case extension modules have a box shape cross section corresponding thereto, and the predetermined characteristic is that the link case extension module and each of the number of different interchangeable link case extension modules have a different corresponding length and the corresponding box shape cross section being sized and shaped commensurate to the different corresponding lengths so as to maintain a predetermined stiffness (end to end) for each different interchangeable link case extension module.

In accordance with one or more aspects of the present disclosure the link case extension module and each of the number of different interchangeable link case extension modules have a box shape cross section corresponding thereto, and the predetermined characteristic is that the link case extension module and each of the number of different interchangeable link case extension modules have a different corresponding length and the corresponding box shape cross section being sized and shaped commensurate to the different corresponding length so as to maintain a predetermined stiffness (end to end) for each different selectable predetermined arm link length.

In accordance with one or more aspects of the present disclosure the link case extension module and each of the number of different interchangeable link case extension modules is an extrusion member having a box shape cross section.

In accordance with one or more aspects of the present disclosure the link case extension module and each of the number of different interchangeable link case extension modules has a box shape cross section made of a material different from a material of (one or both of) the link case end modules.

In accordance with one or more aspects of the present disclosure a material of the link case extension module and each of the number of different interchangeable link case extension modules has a higher stiffness (spring modulus) than a material of the link case end modules.

In accordance with one or more aspects of the present disclosure a material of the link case extension module and each of the number of different interchangeable link case extension modules has a stiffness commensurate with a material stiffness of the pulley transmission of the pulley system.

In accordance with one or more aspects of the present disclosure the link case extension module and each of the number of different interchangeable link case extension modules has a box shape cross section made of stainless steel.

In accordance with one or more aspects of the present disclosure the pulley transmission is a bi-symmetrically flexible pulley transmission and the modular composite arm link casing is a low profile casing having a compact height for a selected predetermined arm length commensurate with the bi-symmetrically flexible pulley transmission, connecting the pulley wheels of the pulley system, that has a compact substantially by-symmetrical cross section.

In accordance with one or more aspects of the present disclosure the compact height is smaller than a band pulley transmission housing height for a comparable number of pulley systems having comparable lengths.

In accordance with one or more aspects of the present disclosure the flexible pulley transmission connecting the pulley wheels is a cable or wire pulley transmission.

In accordance with one or more aspects of the present disclosure the modular composite arm link casing is a low profile casing having a compact height for a selected predetermined arm length commensurate with a crossed roller bearing mounted pulley wheel of the pulley system housed in at least one of the link case end modules.

In accordance with one or more aspects of the present disclosure at least one of the pulley wheels of the pulley system is mounted with a crossed roller bearing so that position and alignment of the at least one of the pulley wheels is dependent and controlled by engagement with the crossed roller bearing.

In accordance with one or more aspects of the present disclosure a pulley transmission to pulley wheel engagement of the pulley wheels of the pulley system is arranged so as to determine rotation of at least one of the pulley wheels of the pulley system through at least 360° rotation of the at least one of the pulley wheels between wound and unwound positions of the pulley transmission on the at least one of the pulley wheels.

In accordance with one or more aspects of the present disclosure a pulley transmission to pulley wheel engagement of the pulley wheels of the pulley system is arranged so as to determine rotation of the end effector through at least 360° rotation of the end effector relative to the at least one movable arm link between wound and unwound positions of the pulley transmission on at least one of the pulley wheels.

In accordance with one or more aspects of the present disclosure a substrate transport apparatus comprises:
  a frame;
  a drive section connected to the frame;
  at least one articulated multi-link arm having an upper arm and a forearm, the upper arm being rotatably joined at one end to the drive section, the forearm being rotatably joined to the upper arm at an opposite end of the upper arm and the upper arm being a substantially rigid unarticulated link between the one end and the opposite end, where one or more of the upper arm and forearm includes end couplings and a central arm section, the central arm section being selectable from a number of different central arm sections each having a different length so as to define a respective arm link length from joint center to joint center; and
  at least one end effector link rotatably joined to the forearm.

In accordance with one or more aspects of the present disclosure, the at least one end effector link comprises dual end effector links that are separate and distinct from each other, each of which is rotatably and separately joined to a common end of the forearm so that each end effector link rotates relative to the forearm about a common axis of rotation, each end effector link has a corresponding at least one substrate holding station dependent therefrom.

In accordance with one or more aspects of the present disclosure the corresponding at least one substrate holding station dependent from at least one end effector link of the dual end effector links includes one substrate holding station at opposite ends of the at least one end effector link that is substantially rigid and unarticulated between the opposite ends, and wherein the substrate holding station at one of the opposite ends is substantially coplanar with the corresponding at least one substrate holding station of each other separate and distinct end effector link.

In accordance with one or more aspects of the present disclosure the dual end effector links are disposed so that radial extension and retraction of the multi-link arm effects substantially simultaneous extension and retraction of the corresponding at least one substrate holding station of each end effector link through respective separate openings in a transport chamber wall that are juxtaposed with respect to each other at a substantially common level.

In accordance with one or more aspects of the present disclosure the substrate holding station at opposite ends of the at least one end effector link are substantially coplanar with each other.

In accordance with one or more aspects of the present disclosure the substrate holding station at opposite ends of the at least one end effector link are substantially coplanar with the corresponding at least one substrate holding station of each other separate and distinct end effector link.

In accordance with one or more aspects of the present disclosure the corresponding at least one substrate holding station of each separate and distinct end effector link includes one substrate holding station at opposite ends of the at least one end effector link, and each of the separate and distinct end effector link is substantially rigid and unarticulated between opposite ends.

In accordance with one or more aspects of the present disclosure the drive section is a multi-axis drive section that defines an independent degree of freedom for at least one end effector link relative to the other.

In accordance with one or more aspects of the present disclosure the independent degree of freedom for each end effector link enables independent automatic wafer centering at the corresponding at least one substrate holding station of each one of the dual end effector links.

In accordance with one or more aspects of the present disclosure the drive section is a multi-axis drive section configured to effect independent automatic wafer centering at the corresponding at least one substrate holding station of each one of the dual end effector links substantially coincident with substantially simultaneous extension of the corresponding at least one substrate holding station of each of the dual end effector links through respective separate openings in a transport chamber wall.

In accordance with one or more aspects of the present disclosure the substrate transport apparatus further comprises a controller operably coupled to the drive section and configured to extend the multi-link arm for substantially simultaneously picking or placing dual first substrates with the corresponding at least one substrate holding stations of the dual end effector links through the respective separate openings in the transport chamber wall.

In accordance with one or more aspects of the present disclosure the controller is configured to substantially simultaneously fast swap the dual first substrates with at least one second substrate held on the corresponding at least one substrate holding stations of the dual end effector links, through the respective separate openings, with the dual first substrates held simultaneously on the corresponding at least one substrate holding stations of the dual end effector links.

In accordance with one or more aspects of the present disclosure a substrate processing apparatus comprises:

a transport chamber configured to hold an isolated atmosphere therein, and having a side wall with more than one substrate transport openings separate and juxtaposed with respect to each other along the side wall on a common level;

at least one articulated multi-link arm with a drive section connected to the transport chamber at a fixed location and having an upper arm and a forearm located in the transport chamber, the upper arm being rotatably joined at one end to the drive section, the forearm being rotatably joined to the upper arm at an opposite end of the upper arm and the upper arm being a substantially rigid unarticulated link between the one end and the opposite end, where one or more of the upper arm and forearm includes end couplings and a central arm section, the central arm section being selectable from a number of different central arm sections each having a different length so as to define a respective arm link length from joint center to joint center; and wherein the multi-link arm has more than one separate and distinct end effector links, each of which is rotatably and separately joined to a joint at a common end of the forearm so that each end effector link rotates relative to the forearm about a common axis of rotation at the joint, each end effector link has a corresponding at least one substrate holding station dependent therefrom, and extends from the joint so that the more than one end effector links are juxtaposed along a common plane with respect to each other.

In accordance with one or more aspects of the present disclosure the drive section is configured to at least extend and retract the multi-link arm along a radial axis, which extension and retraction effects substantially simultaneous extension and retraction of the corresponding at least one substrate holding station of each end effector link respectively through the separate openings juxtaposed along the side wall, and to independently align at least one of the corresponding substrate holding station relative to another of the more than one end effector links.

In accordance with one or more aspects of the present disclosure the drive section is configured to independently align the corresponding at least one substrate holding station of each of the end effector links relative to the corresponding substrate holding station of another of the end effector links.

In accordance with one or more aspects of the present disclosure the corresponding at least one substrate holding station dependent from at least one of the end effector links includes one substrate holding station at opposite ends of the at least one of the end effector links that is substantially rigid and unarticulated between the opposite ends.

In accordance with one or more aspects of the present disclosure the corresponding at least one substrate holding station at one of the opposite ends is substantially coplanar with the corresponding at least one substrate holding station of each other separate and distinct end effector link.

In accordance with one or more aspects of the present disclosure the corresponding at least one substrate holding station at opposite ends of the at least one of the end effector links are substantially coplanar with each other.

In accordance with one or more aspects of the present disclosure the drive section is a multi-axis drive section that defines an independent degree of freedom for at least one end effector link relative to the other.

In accordance with one or more aspects of the present disclosure the independent degree of freedom for each end effector link enables independent automatic wafer centering at the corresponding at least one substrate holding station of each one of the more than one separate and distinct end effector links.

In accordance with one or more aspects of the present disclosure the drive section is a multi-axis drive section configured to effect independent automatic wafer centering at the corresponding at least one substrate holding station of each one of the more than one separate and distinct end effector links substantially coincident with substantially simultaneous extension of the corresponding at least one substrate holding station of each of the more than one separate and distinct end effector links through respective substrate transport openings in the side wall of the transport chamber.

In accordance with one or more aspects of the present disclosure the substrate transport apparatus further comprises a controller operably coupled to the drive section and configured to extend the multi-link arm for substantially simultaneously picking or placing dual first substrates with the corresponding at least one substrate holding stations of the more than one separate and distinct end effector links through the respective substrate transport openings in the side wall of the transport chamber.

In accordance with one or more aspects of the present disclosure the controller is configured to substantially simultaneously fast swap the dual first substrates with at least one second substrate held on the corresponding at least one substrate holding stations of the more than one separate and distinct end effector links, through the respective substrate transport openings, with the dual first substrates held simultaneously on the corresponding at least one substrate holding stations of the more than one separate and distinct end effector links.

In accordance with one or more aspects of the present disclosure, the one or more of the upper arm and forearm includes at least one cable and pulley transmission that effects greater than +/−160° rotation of at least one of the dual end effector links about the common axis of rotation.

In accordance with one or more aspects of the present disclosure, each of the at least one cable and pulley transmission includes pulleys and opposing cable segments wound around the pulleys.

In accordance with one or more aspects of the present disclosure each pulley includes guide grooves in which a respective one of the opposing cables in received and guided in winding movement of a respective pulley.

In accordance with one or more aspects of the present disclosure one or more of the opposing cable segments includes an inline cable tensioner.

In accordance with one or more aspects of the present disclosure the inline cable tensioner comprises a turnbuckle cable tensioner.

In accordance with one or more aspects of the present disclosure the inline cable tensioner comprises a resilient cable tensioner.

In accordance with one or more aspects of the present disclosure, one or more of the pulleys comprises a crossed roller pulley.

In accordance with one or more aspects of the present disclosure wherein the at least one articulated multi-link arm comprises at least one crossed roller bearing at an articulated joint of the at least one articulated multi-link arm.

In accordance with one or more aspects of the present disclosure a substrate transport apparatus comprises:
 a frame;
 a drive section connected to the frame;

at least one two link SCARA arm having a first arm link and a second arm link joined to each other at an elbow joint of the SCARA arm, the first arm link being joined at a shoulder joint to the drive section; and more than one end effector links that are separate and distinct from each other, each of which is rotatably and separately joined at a common wrist joint to the second arm link so that each end effector link rotates relative to the second arm link about a common axis of rotation at the common wrist joint, each end effector link has a corresponding at least one substrate holding station dependent therefrom;

wherein one or more of the elbow joint, the shoulder joint and the common wrist joint includes a crossed roller bearing and the crossed roller bearing forms a pulley of drive transmission of the at least one two link SCARA arm.

In accordance with one or more aspects of the present disclosure, the transmission comprises a cable and pulley transmission where the cable is wound around an outer peripheral surface of the crossed roller bearing.

In accordance with one or more aspects of the present disclosure, the cable comprises two opposing cable segments that are wound around the crossed roller bearing in opposing winding directions.

In accordance with one or more aspects of the present disclosure, one or more of the opposing cable segments includes an inline cable tensioner.

In accordance with one or more aspects of the present disclosure the inline cable tensioner comprises a turnbuckle cable tensioner.

In accordance with one or more aspects of the present disclosure the inline cable tensioner comprises a resilient cable tensioner.

In accordance with one or more aspects of the present disclosure, the cable and pulley transmission effects greater than +/−160° rotation of at least one of the more than one end effector links about the common axis of rotation.

In accordance with one or more aspects of the present disclosure, one or more of the first arm link and the second arm link includes end couplings and a central arm section, the central arm section being selectable from a number of different central arm sections each having a different length so as to define a respective arm link length from joint center to joint center.

In accordance with one or more aspects of the present disclosure the corresponding at least one substrate holding station dependent from each of the more than one end effector links is disposed substantially coplanar with the corresponding at least one substrate holding station dependent from each other of the more than one end effector links on a common plane determined by at least three of the corresponding at least one substrate holding station of the more than one end effector links.

In accordance with one or more aspects of the present disclosure two substrate holding stations of the at least three of the corresponding at least one substrate holding station, correspond to a common end effector link of the more than one end effector links.

In accordance with one or more aspects of the present disclosure the two substrate holding stations are disposed one each at opposite ends of the common end effector link.

In accordance with one or more aspects of the present disclosure the two substrate holding stations at opposite ends of the common end effector link are substantially coplanar with each other.

In accordance with one or more aspects of the present disclosure the two substrate holding stations at opposite ends of the common end effector link are substantially coplanar with the corresponding at least one substrate holding station of each other separate and distinct end effector link.

In accordance with one or more aspects of the present disclosure the common end effector link is substantially rigid and unarticulated between the opposite ends.

In accordance with one or more aspects of the present disclosure the more than one end effector links are disposed so that radial extension and retraction of the SCARA arm effects substantially simultaneous extension and retraction of the corresponding at least one substrate holding station of each end effector link through respective separate openings in a transport chamber wall that are juxtaposed with respect to each other at a substantially common level.

In accordance with one or more aspects of the present disclosure the drive section is a multi-axis drive section that defines an independent degree of freedom for at least one end effector link relative to other end effector links of the more than one end effector links.

In accordance with one or more aspects of the present disclosure the independent degree of freedom for each end effector link enables independent automatic wafer centering at the corresponding at least one substrate holding station of each one of the more than one effector links.

In accordance with one or more aspects of the present disclosure the drive section is a multi-axis drive section configured to effect independent automatic wafer centering at the corresponding at least one substrate holding station of each one of the more than one end effector links substantially coincident with substantially simultaneous extension of the corresponding at least one substrate holding station of each of the more than one end effector links through respective separate openings in a transport chamber wall.

In accordance with one or more aspects of the present disclosure the substrate transport apparatus further comprises a controller operably coupled to the drive section and configured to extend the SCARA arm for substantially simultaneously picking or placing dual first substrates with the corresponding at least one substrate holding stations of the more than one end effector links through the respective separate openings in the transport chamber wall.

In accordance with one or more aspects of the present disclosure the controller is configured to substantially simultaneously fast swap the dual first substrates with at least one second substrate held on the corresponding at least one substrate holding stations of the more than one end effector links, through the respective separate openings, with the dual first substrates held simultaneously on the corresponding at least one substrate holding stations of the more than one end effector links.

In accordance with one or more aspects of the present disclosure, a substrate transport apparatus comprises:
a support frame;
an articulated arm connected to the support frame and having at least one movable arm link and an end effector, connected to the at least one movable arm link, with a substrate holding station located thereon;
wherein the at least one movable arm link has a modular composite arm link casing that includes at least one extruded arm casing component and a pulley system cased in and extending through the extruded arm casing component substantially end to end of the modular composite arm link casing, the pulley system is mounted and engaged to the modular composite arm link casing, and is arranged so that, powered by a drive section, the pulley system effects articulation of the at least one movable arm link or the end effector relative to the at least one movable arm link, and wherein the modular composite arm link casing includes link case end modules connected by the at least one extruded arm casing component that is mechanically fastened to each of the link case end modules to form the modular composite arm link casing and arranged so that the modular arm link casing formed matches a misalignment tolerance of a pulley transmission connecting pulley wheels of the pulley system housed in the link case end modules at the ends of the modular composite arm link casing.

It should be understood that the foregoing description is only illustrative of the aspects of the present disclosure. Various alternatives and modifications can be devised by those skilled in the art without departing from the aspects of the present disclosure. Accordingly, the aspects of the present disclosure are intended to embrace all such alternatives, modifications and variances that fall within the scope of any claims appended hereto. Further, the mere fact that different features are recited in mutually different dependent or independent claims does not indicate that a combination of these features cannot be advantageously used, such a combination remaining within the scope of the aspects of the present disclosure.

What is claimed is:

1. A substrate transport apparatus comprising:
a support frame;
an articulated arm connected to the support frame and having at least one movable arm link and an end effector, connected to the movable arm link, with a substrate holding station located thereon;
wherein the movable arm link is a reconfigurable arm link having a modular composite arm link casing, formed of link case modules rigidly coupled to each other, and a pulley system cased in and extending through the rigidly coupled link case modules substantially end to end of the modular composite arm link casing so that each link case module cases a corresponding portion of the pulley system, and wherein the rigidly coupled link case modules include link case end modules connected by at least one interchangeable link case extension module having a predetermined characteristic determining a length of the movable arm link; and
wherein the at least one interchangeable link case extension module is selectable, for connection to the link case end modules and forming the reconfigurable arm link, from a number of different interchangeable link case extension modules each with a different corresponding predetermined characteristic determining a corresponding different length of the movable arm link, so as to selectably set the modular composite arm link casing and reconfigurable arm link to a predetermined arm link length from a number of predetermined arm link lengths, where a material of the at least one interchangeable link case extension module and each of the number of different interchangeable link case extension modules has a stiffness commensurate with a material stiffness of a corresponding portion of a pulley transmission of the pulley system.

2. The substrate transport apparatus of claim 1, wherein the at least one interchangeable link case extension module and each of the number of different interchangeable link case extension modules have a box shape cross section corresponding thereto, and the predetermined characteristic is that the interchangeable link case extension module and each of the number of different interchangeable link case extension modules have a different corresponding length and the corresponding box shape cross section being sized and shaped commensurate to the different corresponding lengths so as to maintain a predetermined stiffness for each different interchangeable link case extension module.

3. The substrate transport apparatus of claim 1, wherein the at least one interchangeable link case extension module and each of the number of different interchangeable link case extension modules have a box shape cross section corresponding thereto, and the predetermined characteristic is that the interchangeable link case extension module and each of the number of different interchangeable link case extension modules have a different corresponding length and the corresponding box shape cross section being sized and shaped commensurate to the different corresponding length so as to maintain a predetermined stiffness for each different selectable predetermined arm link length.

4. The substrate transport apparatus of claim 1, wherein the at least one interchangeable link case extension module and each of the number of different interchangeable link case extension modules is an extrusion member having a box shape cross section.

5. The substrate transport apparatus of claim 1, wherein the at least one interchangeable link case extension module and each of the number of different interchangeable link case extension modules has a box shape cross section made of a material different from a material of the link case end modules.

6. The substrate transport apparatus of claim 1, wherein a material of the at least one link case extension module and each of the number of different interchangeable link case extension modules has a higher stiffness than a material of the link case end modules.

7. The substrate transport system of claim 1, wherein the pulley system is engaged to the modular composite arm link casing, and is arranged so that, powered by a drive section, the pulley system effects articulation of the at least one arm link or the end effector.

8. The substrate transport apparatus of claim 1, wherein the at least one interchangeable link case extension module and each of the number of different interchangeable link case extension modules has a box shape cross section made of stainless steel.

9. The substrate transport apparatus of claim 1, wherein the at least one interchangeable link case extension module is mechanically fastened to each of the link case end modules to form the modular composite arm link casing and arranged so that the modular composite arm link casing formed matches a misalignment tolerance of a pulley transmission connecting pulley wheels of the pulley system for a selected predetermined arm link length.

10. The substrate transport apparatus of claim 1, wherein the at least one interchangeable link case extension module is mechanically fastened with mechanical fastener joints to each of the link case end modules to form the modular composite arm link casing, and the mechanical fastener joints are configured so that the modular composite arm link casing formed matches a misalignment tolerance of a pulley transmission connecting pulley wheels of the pulley system for a selected predetermined arm link length.

11. The substrate transport apparatus of claim 1, wherein at least one of the link case end modules houses a pulley wheel of the pulley system.

12. The substrate transport apparatus of claim 1, wherein the modular composite arm link casing is a low profile casing having a compact height for a selected predetermined arm length commensurate with a bi-symmetrically flexible pulley transmission, connecting pulley wheels of the pulley system, that has a compact substantially bi-symmetrical cross section.

13. The substrate transport apparatus of claim 12, wherein the flexible pulley transmission connecting the pulley wheels is a cable or wire pulley transmission.

14. The substrate transport apparatus of claim 1, wherein at least one of the link case end modules houses a pulley wheel of the pulley system mounted with a crossed roller bearing so that position and alignment of the pulley wheel is dependent and controlled by engagement with the crossed roller bearing.

15. The substrate transport apparatus of claim 1, wherein the modular composite arm link casing is a low profile casing having a compact height for a selected predetermined arm length commensurate with a crossed roller bearing mounted pulley wheel of the pulley system housed in at least one of the link case end modules.

16. The substrate transport apparatus of claim 1, wherein a pulley transmission to pulley wheel engagement of a respective pulley wheel of the pulley system is arranged so as to determine rotation of a respective pulley wheel of the pulley system through at least 360° rotation of the respective pulley wheel between wound and unwound positions of the pulley transmission on the respective pulley wheel.

17. The substrate transport apparatus of claim 1, wherein a pulley transmission to pulley wheel engagement of a respective pulley wheel of the pulley system is arranged so as to determine rotation of the end effector through at least 360° rotation of the end effector relative to the at least one movable arm link between wound and unwound positions of the pulley transmission on a respective pulley wheel.

18. A substrate transport apparatus comprising:
a support frame;
an articulated arm connected to the support frame and having at least one movable arm link and an end effector, connected to the at least one movable arm link, with a substrate holding station located thereon;
wherein the at least one movable arm link has a modular composite arm link casing, formed of link case modules rigidly coupled to each other, and a pulley system cased in and extending through the rigidly coupled link case modules substantially end to end of the modular composite arm link casing so that each link case module cases a corresponding portion of the pulley system, the pulley system is mounted and engaged to the modular composite arm link casing, and is arranged so that, powered by a drive section, the pulley system effects articulation of the at least one movable arm link or the end effector relative to the at least one movable arm link, where a material of each link case module has a stiffness commensurate with a material stiffness of a corresponding portion of a pulley transmission of the pulley system, and
wherein the rigidly coupled link case modules include link case end modules connected by at least one link case extension module that is mechanically fastened to each of the link case end modules to form the modular composite arm link casing and arranged so that the modular arm link casing formed matches a misalignment tolerance of a pulley transmission connecting pulley wheels of the pulley system housed in the link case end modules at the ends of the modular composite arm link casing.

19. The substrate transport apparatus of claim 18, wherein the at least one movable arm link is a reconfigurable arm link, wherein the link case extension module is interchangeable from a number of different interchangeable link case extension modules each having a different corresponding predetermined characteristic determining a length of the at least one movable arm link.

20. The substrate transport apparatus of claim 19, wherein the link case extension module and each of the number of different interchangeable link case extension modules have a box shape cross section corresponding thereto, and the predetermined characteristic is that the link case extension module and each of the number of different interchangeable link case extension modules have a different corresponding length and the corresponding box shape cross section being sized and shaped commensurate to the different corresponding lengths so as to maintain a predetermined stiffness for each different interchangeable link case extension module.

21. The substrate transport apparatus of claim 19, wherein the link case extension module and each of the number of different interchangeable link case extension modules have a box shape cross section corresponding thereto, and the predetermined characteristic is that the link case extension module and each of the number of different interchangeable link case extension modules have a different corresponding length and the corresponding box shape cross section being sized and shaped commensurate to the different corresponding length so as to maintain a predetermined stiffness for each different selectable predetermined arm link length.

22. The substrate transport apparatus of claim 19, wherein the link case extension module and each of the number of different interchangeable link case extension modules is an extrusion member having a box shape cross section.

23. The substrate transport apparatus of claim 19, wherein the link case extension module and each of the number of different interchangeable link case extension modules has a box shape cross section made of a material different from a material of the link case end modules.

24. The substrate transport apparatus of claim 19, wherein a material of the link case extension module and each of the number of different interchangeable link case extension modules has a higher stiffness than a material of the link case end modules.

25. The substrate transport apparatus of claim 19, wherein a material of each of the number of different interchangeable link case extension modules has a stiffness commensurate with a material stiffness of the pulley transmission of the pulley system.

26. The substrate transport apparatus of claim 19, wherein the link case extension module and each of the number of different interchangeable link case extension modules has a box shape cross section made of stainless steel.

27. The substrate transport apparatus of claim 19, wherein the pulley transmission is a bi-symmetrically flexible pulley transmission and the modular composite arm link casing is a low profile casing having a compact height for a selected predetermined arm length commensurate with the bi-symmetrically flexible pulley transmission, connecting the pulley wheels of the pulley system, that has a compact substantially bi-symmetrical cross section.

28. The substrate transport apparatus of claim 27, wherein the flexible pulley transmission connecting the pulley wheels is a cable or wire pulley transmission.

29. The substrate transport apparatus of claim 19, wherein the modular composite arm link casing is a low profile casing having a compact height for a selected predetermined arm length commensurate with a crossed roller bearing mounted pulley wheel of the pulley system housed in at least one of the link case end modules.

30. The substrate transport apparatus of claim 18, wherein at least one of the pulley wheels of the pulley system is mounted with a crossed roller bearing so that position and alignment of the at least one of the pulley wheels is dependent and controlled by engagement with the crossed roller bearing.

31. The substrate transport apparatus of claim 18, wherein a pulley transmission to pulley wheel engagement of the pulley wheels of the pulley system is arranged so as to determine rotation of at least one of the pulley wheels of the pulley system through at least 360° rotation of the at least one of the pulley wheels between wound and unwound positions of the pulley transmission on the at least one of the pulley wheels.

32. The substrate transport apparatus of claim 18, wherein a pulley transmission to pulley wheel engagement of the pulley wheels of the pulley system is arranged so as to determine rotation of the end effector through at least 360° rotation of the end effector relative to the at least one movable arm link between wound and unwound positions of the pulley transmission on at least one of the pulley wheels.

33. A method comprising:
providing a substrate transport apparatus that includes
a support frame, and
an articulated arm connected to the support frame and having at least one movable arm link and an end effector, connected to the movable arm link, with a substrate holding station located thereon; and
reconfiguring the movable arm link, where the movable arm link is a reconfigurable arm link having a modular composite arm link casing, formed of link case modules rigidly coupled to each other, and a pulley system cased in and extending through the rigidly coupled link case modules substantially end to end of the modular composite arm link casing so that each link case module cases a corresponding portion of the pulley system, and wherein the rigidly coupled link case modules include link case end modules connected by at least one interchangeable link case extension module having a predetermined characteristic determining a length of the movable arm link, where a material of each link case module has a stiffness commensurate with a material stiffness of a corresponding portion of a pulley transmission of the pulley system; and
wherein the at least one interchangeable link case extension module is selectable, for connection to the link case end modules and forming the reconfigurable arm link, from a number of different interchangeable link case extension modules each with a different corresponding predetermined characteristic determining a corresponding different length of the movable arm link, so as to selectably set the modular composite arm link casing and reconfigurable arm link to a predetermined arm link length from a number of predetermined arm link lengths.

34. The method of claim 33, wherein the at least one interchangeable link case extension module and each of the number of different interchangeable link case extension modules have a box shape cross section corresponding thereto, and the predetermined characteristic is that the interchangeable link case extension module and each of the number of different interchangeable link case extension modules have a different corresponding length and the corresponding box shape cross section being sized and shaped commensurate to the different corresponding lengths so as to maintain a predetermined stiffness for each different interchangeable link case extension module.

35. The method of claim 33, wherein the at least one interchangeable link case extension module and each of the number of different interchangeable link case extension modules have a box shape cross section corresponding thereto, and the predetermined characteristic is that the interchangeable link case extension module and each of the number of different interchangeable link case extension modules have a different corresponding length and the corresponding box shape cross section being sized and shaped commensurate to the different corresponding length so as to maintain a predetermined stiffness for each different selectable predetermined arm link length.

* * * * *